US012660249B2

(12) United States Patent (10) Patent No.: US 12,660,249 B2
Kanagawa et al. (45) Date of Patent: Jun. 16, 2026

(54) METAL OXIDE AND TRANSISTOR INCLUDING METAL OXIDE

(71) Applicant: Semiconductor Energy Laboratory Co., Ltd., Atsugi (JP)

(72) Inventors: Tomosato Kanagawa, Omihachiman (JP); Masahiro Takahashi, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 497 days.

(21) Appl. No.: 17/616,426

(22) PCT Filed: Jun. 1, 2020

(86) PCT No.: PCT/IB2020/055157
§ 371 (c)(1),
(2) Date: Dec. 3, 2021

(87) PCT Pub. No.: WO2020/250079
PCT Pub. Date: Dec. 17, 2020

(65) Prior Publication Data
US 2022/0238718 A1 Jul. 28, 2022

(30) Foreign Application Priority Data

Jun. 12, 2019 (JP) ................................. 2019-109490
Jul. 2, 2019 (JP) ................................. 2019-123682
(Continued)

(51) Int. Cl.
*C30B 1/02* (2006.01)
*H10B 12/00* (2023.01)
(Continued)

(52) U.S. Cl.
CPC ......... *H10D 30/6755* (2025.01); *H10B 12/00* (2023.02); *H10D 30/6734* (2025.01);
(Continued)

(58) Field of Classification Search
CPC ................. H01L 29/7869; H01L 29/24; H01L 29/78649; H01L 29/78696; H01L 27/124;
(Continued)

(56) References Cited

U.S. PATENT DOCUMENTS 8,564,331 B2 * 10/2013 Yoneda ............ H03K 19/00315
326/98
8,728,883 B2 5/2014 Yamazaki et al.
(Continued)

FOREIGN PATENT DOCUMENTS

CN 103229304 A 7/2013
JP 2012-134467 A 7/2012
(Continued)

OTHER PUBLICATIONS

Kimizuka.N et al., "YbFe2O4 Type of Compounds with a Layered Structure", J. Cryst. Soc. Jpn. (Journal of the Crystallographic Society of Japan), 1984, vol. 26, No. 6, pp. 334-343, The Crystallographic Society of Japan.
(Continued)

*Primary Examiner* — Robert M Kunemund
(74) *Attorney, Agent, or Firm* — Eric J. Robinson; Robinson Intellectual Property Law Office, P.C.

(57) ABSTRACT
A novel metal oxide is provided. The metal oxide includes a crystal. The crystal has a structure in which a first layer, a second layer, and a third layer are stacked. The first layer, the second layer, and the third layer are each substantially parallel to a formation surface of the metal oxide. The first layer includes a first metal and oxygen. The second layer includes a second metal and oxygen. The third layer includes a third metal and oxygen. The first layer has an octahedral structure. The second layer has a trigonal bipyramidal structure or a tetrahedral structure. The third layer has a trigonal bipyramidal structure or a tetrahedral structure. The octahe-
(Continued)

10

51 260
250
230
231a 234 231b dral structure of the first layer includes an atom of the first metal at a center. The trigonal bipyramidal structure or the tetrahedral structure of the second layer includes an atom of the second metal at a center. The trigonal bipyramidal structure or the tetrahedral structure of the third layer includes an atom of the third metal at a center. The valence of the first metal is equal to the valence of the second metal. The valence of the first metal is different from the valence of the third metal.

10 Claims, 52 Drawing Sheets

(30) Foreign Application Priority Data

| Aug. 30, 2019 | (JP) | ................................. | 2019-157820 |
| Oct. 25, 2019 | (JP) | ................................. | 2019-194248 |

(51) Int. Cl.

| *H10D 30/67* | (2025.01) |
| *H10D 62/80* | (2025.01) |
| *H10D 86/40* | (2025.01) |
| *H10D 86/60* | (2025.01) |

(52) U.S. Cl.
CPC ......... *H10D 30/6757* (2025.01); *H10D 62/80* (2025.01); *H10D 86/423* (2025.01); *H10D 86/441* (2025.01); *H10D 86/481* (2025.01); *H10D 86/60* (2025.01)

(58) Field of Classification Search
CPC ....... H01L 27/1255; H01B 12/00; C30B 1/00; C30B 1/02
See application file for complete search history.

(56) References Cited

U.S. PATENT DOCUMENTS

| 9,267,199 | B2 | 2/2016 | Yamazaki et al. | |
| 9,281,358 | B2 | 3/2016 | Yamazaki et al. | |
| 9,508,864 | B2 | 11/2016 | Yamazaki | |
| 9,634,082 | B2 | 4/2017 | Yamazaki et al. | |
| 9,762,246 | B2 * | 9/2017 | Fujita | ............... H03K 19/17772 |
| 9,859,117 | B2 | 1/2018 | Yamazaki | |
| 10,096,628 | B2 | 10/2018 | Yamazaki | |
| 10,181,531 | B2 | 1/2019 | Sasagawa et al. | |
| 10,424,676 | B2 | 9/2019 | Sasagawa et al. | |
| 10,516,060 | B2 | 12/2019 | Yamazaki | |
| 10,522,347 | B2 | 12/2019 | Yamazaki et al. | |
| 10,692,452 | B2 | 6/2020 | Kobayashi et al. | |
| 11,139,166 | B2 | 10/2021 | Yamazaki et al. | |
| 11,600,489 | B2 | 3/2023 | Yamazaki et al. | |
| 2012/0132903 | A1 | 5/2012 | Yamazaki et al. | |
| 2014/0241978 | A1 | 8/2014 | Yamazaki et al. | |
| 2016/0160342 | A1 | 6/2016 | Yamazaki et al. | |
| 2018/0204532 | A1 * | 7/2018 | Kobayashi | ............ G06F 1/1652 |
| 2021/0065640 | A1 | 3/2021 | Kobayashi et al. | |

FOREIGN PATENT DOCUMENTS

| JP | 2014-194076 | A | 10/2014 |
| JP | 2017-050530 | A | 3/2017 |
| JP | 2018-116274 | A | 7/2018 |
| JP | 2018-180436 | A | 11/2018 |
| KR | 2013-0140802 | A | 12/2013 |
| TW | 201236155 | | 9/2012 |
| TW | 201613107 | | 4/2016 |
| WO | WO-2012/073918 | | 6/2012 |
| WO | WO-2017/006207 | | 1/2017 |

OTHER PUBLICATIONS

International Search Report (Application No. PCT/IB2020/055157) Dated Sep. 8, 2020.
Written Opinion (Application No. PCT/IB2020/055157) Dated Sep. 8, 2020.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.
Toyoshima.H et al., "Growth by molecular-beam epitaxy and characterization of (InAs)m(GaAs)m short period superlattices on InP substrates", J. Appl. Phys. (Journal of Applied Physics), Aug. 1, 1990, vol. 68, No. 3, pp. 1282-1286.
Fukui.T et al., "(InAs)1(GaAs)1 layered crystal grown by MOCVD.", Jpn. J. Appl. Phys. (Japanese Journal of Applied Physics) , Aug. 1, 1984, vol. 23, No. 8, pp. L521-L523.

* cited by examiner

FIG. 2A
FIG. 2B
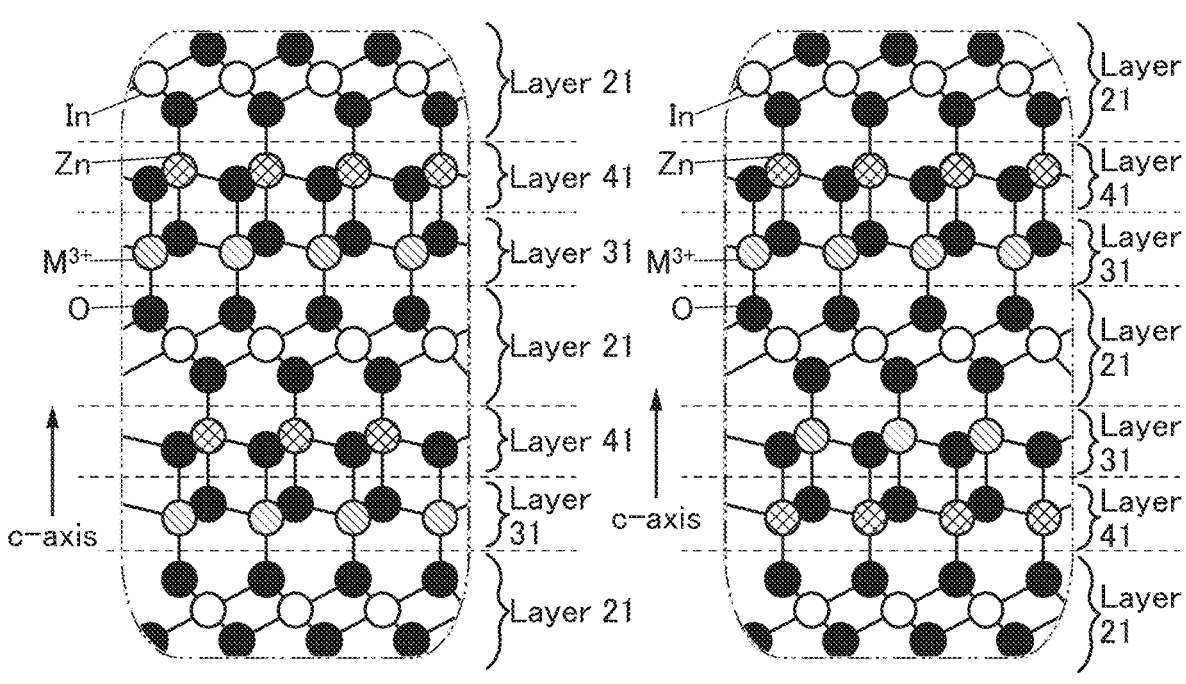
FIG. 2C
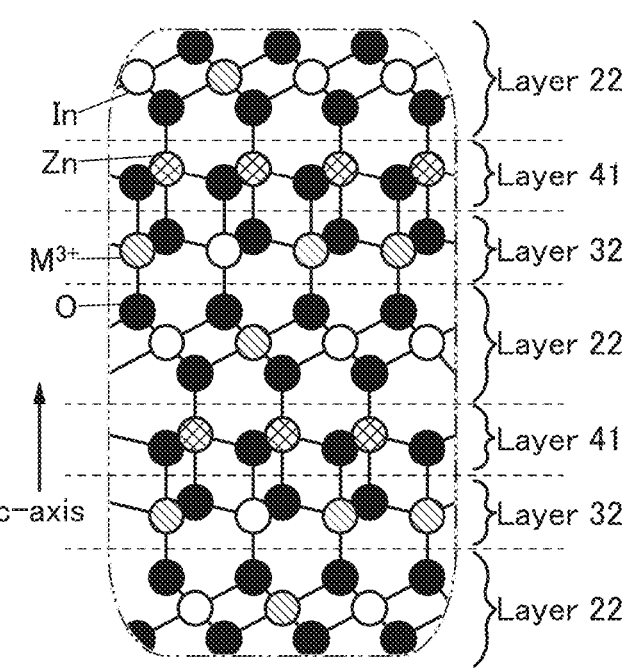

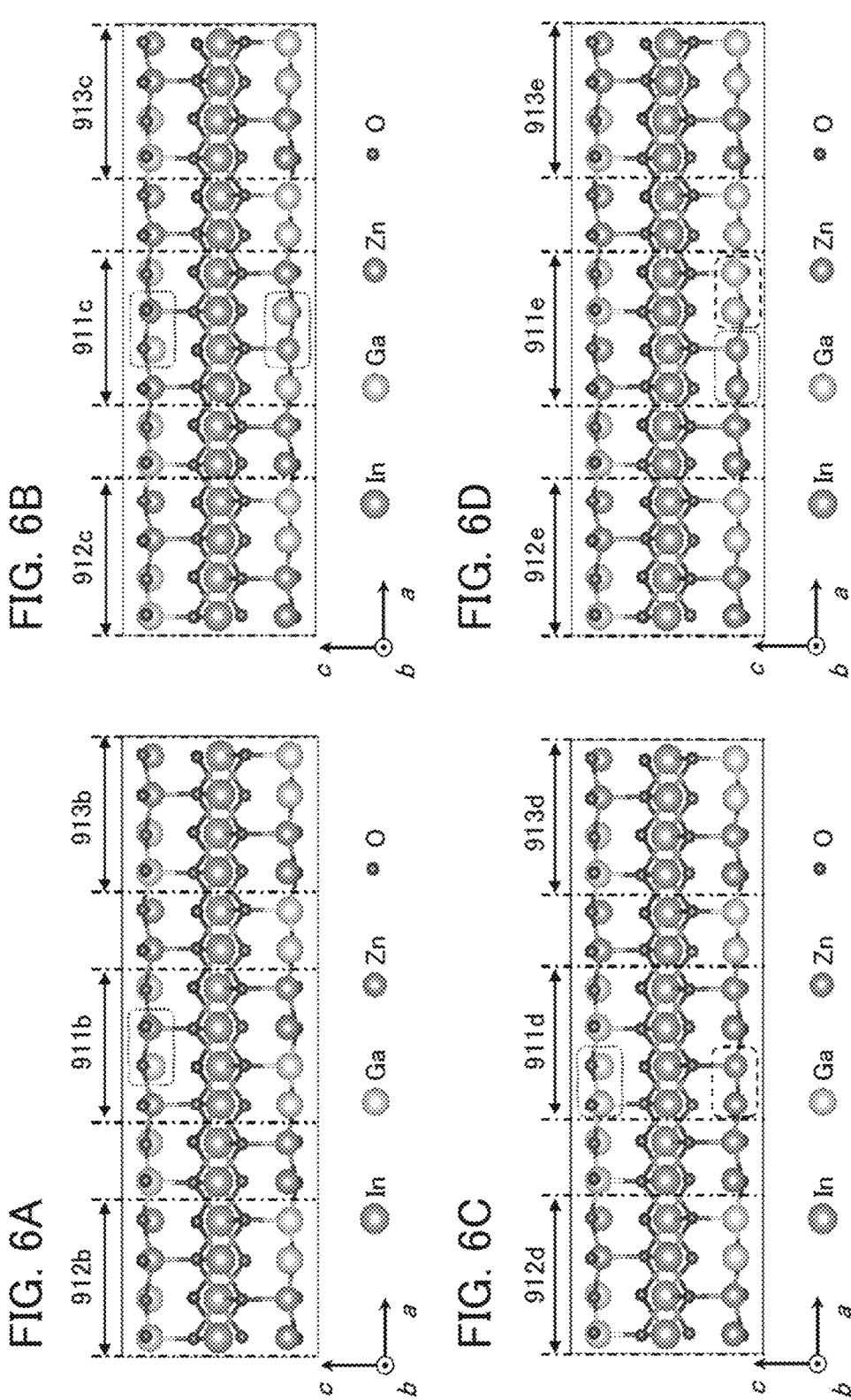

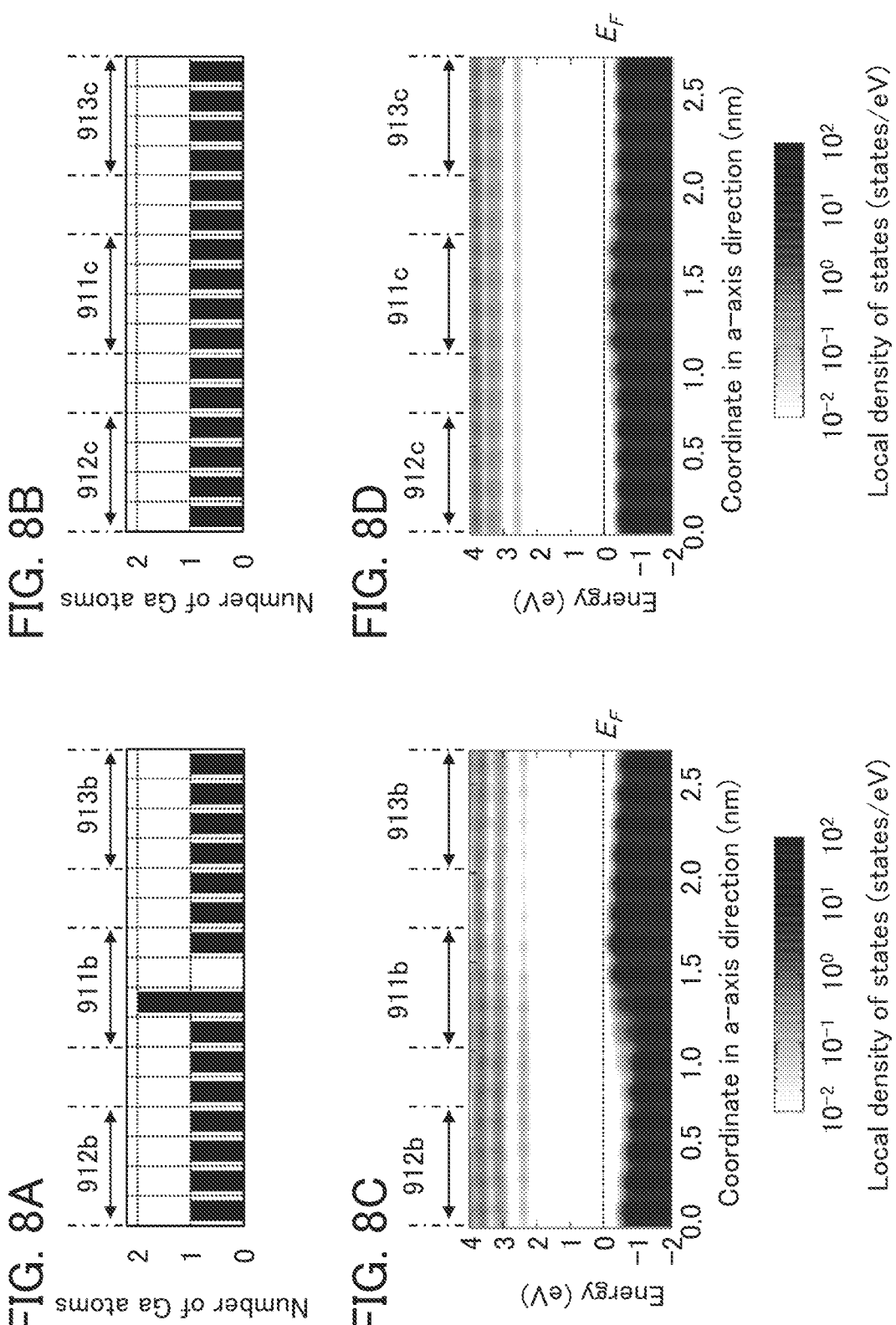

601

602

230

53    50

53

In
Zn
M
O
c-axis

Layer 21
Layer 41
Layer 31
Layer 21
Layer 41
Layer 31
Layer 21

230

50    54

54 c-axis

O  M  Zn  In

Layer 21    Layer 31    Layer 41    Layer 21    Layer 31    Layer 41    Layer 21

FIG. 16A
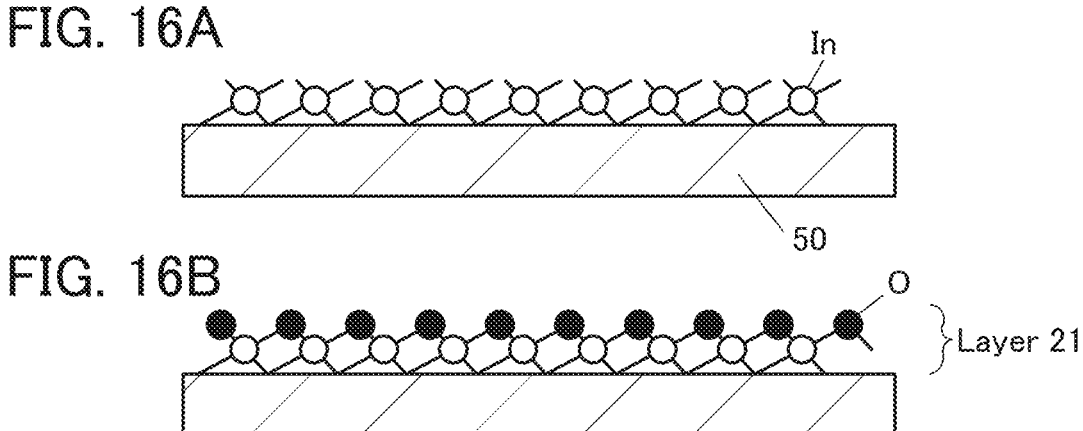
FIG. 16B
FIG. 16C
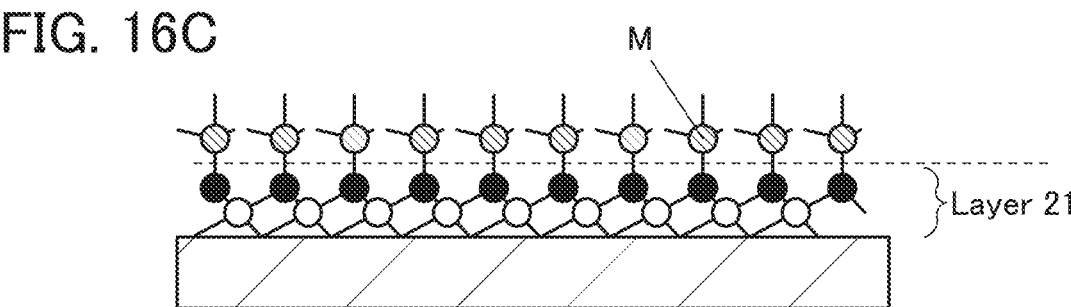
FIG. 16D
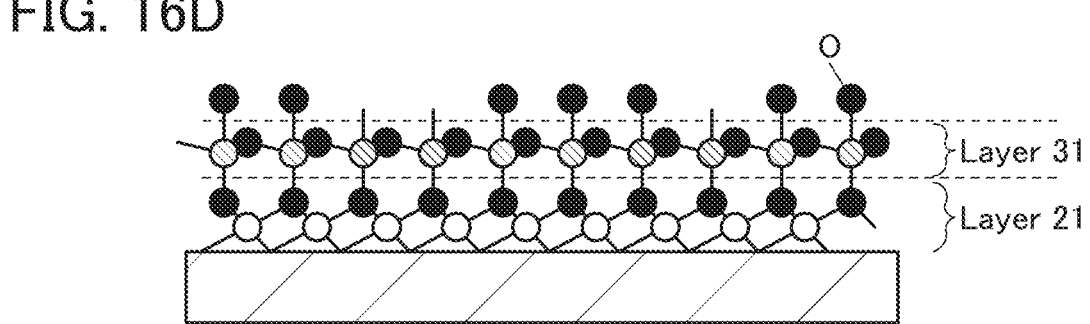

4100

4200

4300

FIG. 20A
| S101 | S102 | S103 | S104 |
|------|------|------|------|
FIG. 20B
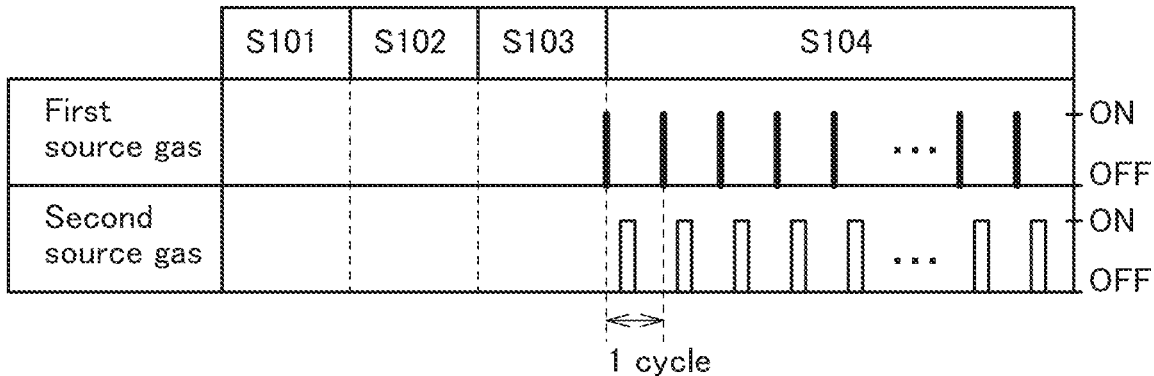
FIG. 20C
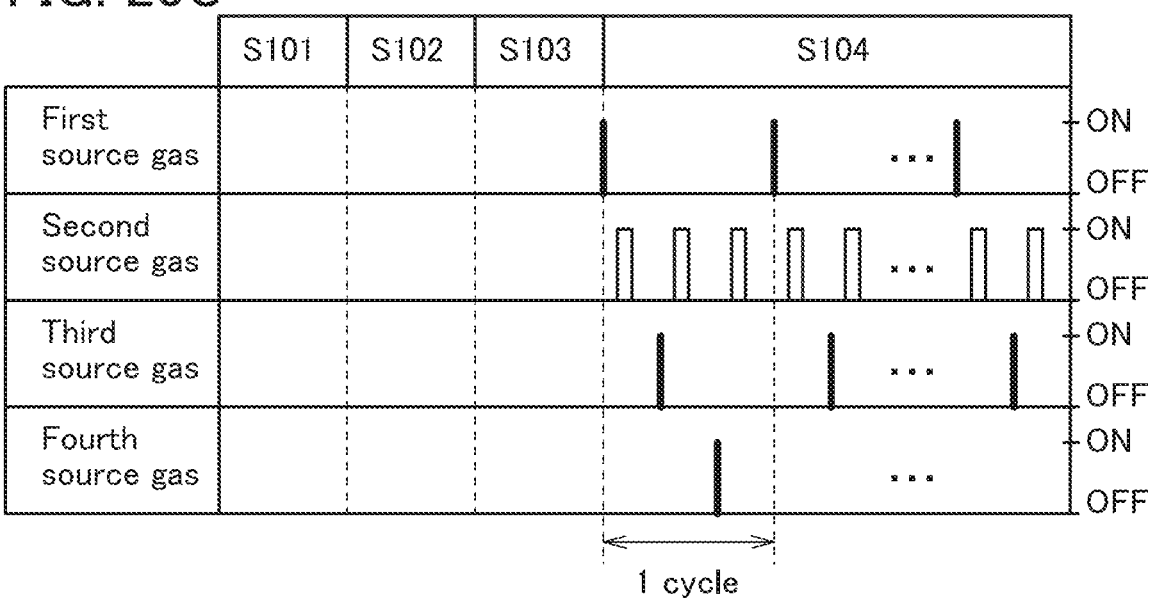

FIG. 21A
FIG. 21C
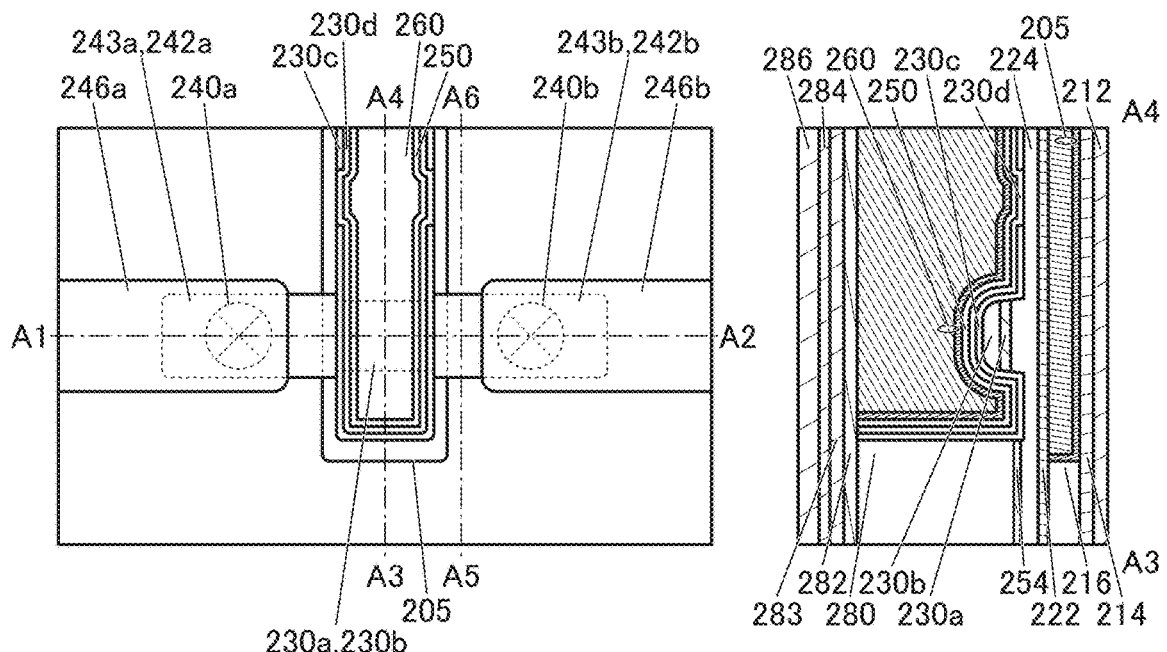
FIG. 21B
FIG. 21D
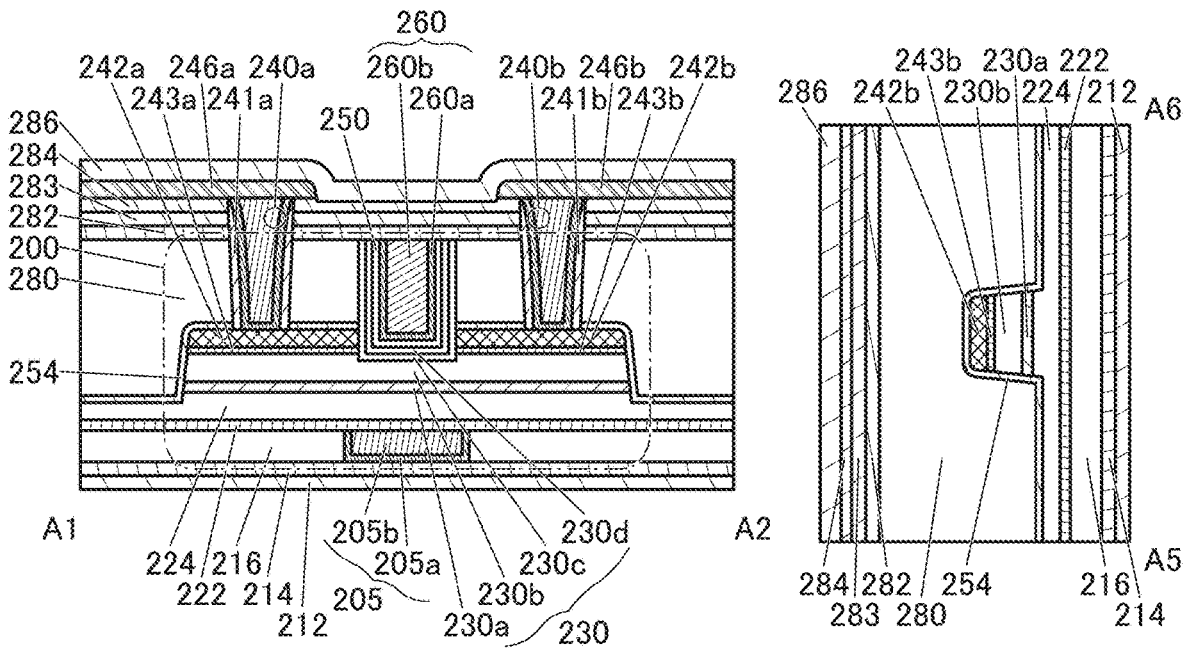

◯ In  ● Ga  ◯ Zn  ◯ O  ● H

◯ In  ● Ga  ◯ Zn  ◯ O  ● H

◯ In  ● Ga  ◉ Zn  ◯ O  • H

◯ In  ● Ga  ◉ Zn  ◯ O  • H

◯ In  ● Ga  ◉ Zn  ◯ O  • H

◯ In  ● Ga  ◉ Zn  ◯ O  • H

◯ In  ● Ga  ◉ Zn  ◯ O  • H

◯ In  ● Ga  ◉ Zn  ◯ O  • H

◯ In  ● Ga  ◉ Zn  ◯ O  • H

Reaction coordinate

Reaction coordinate

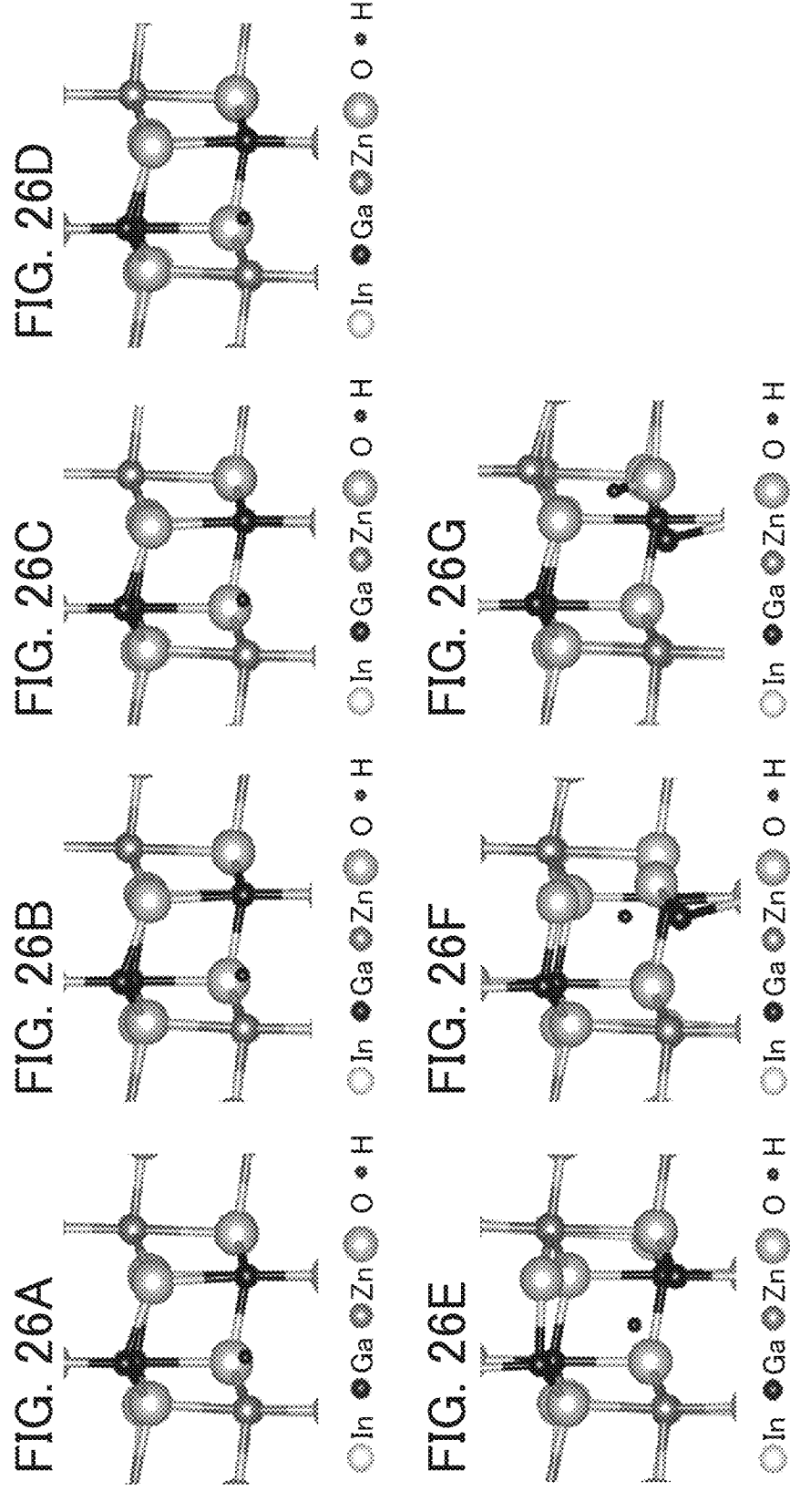

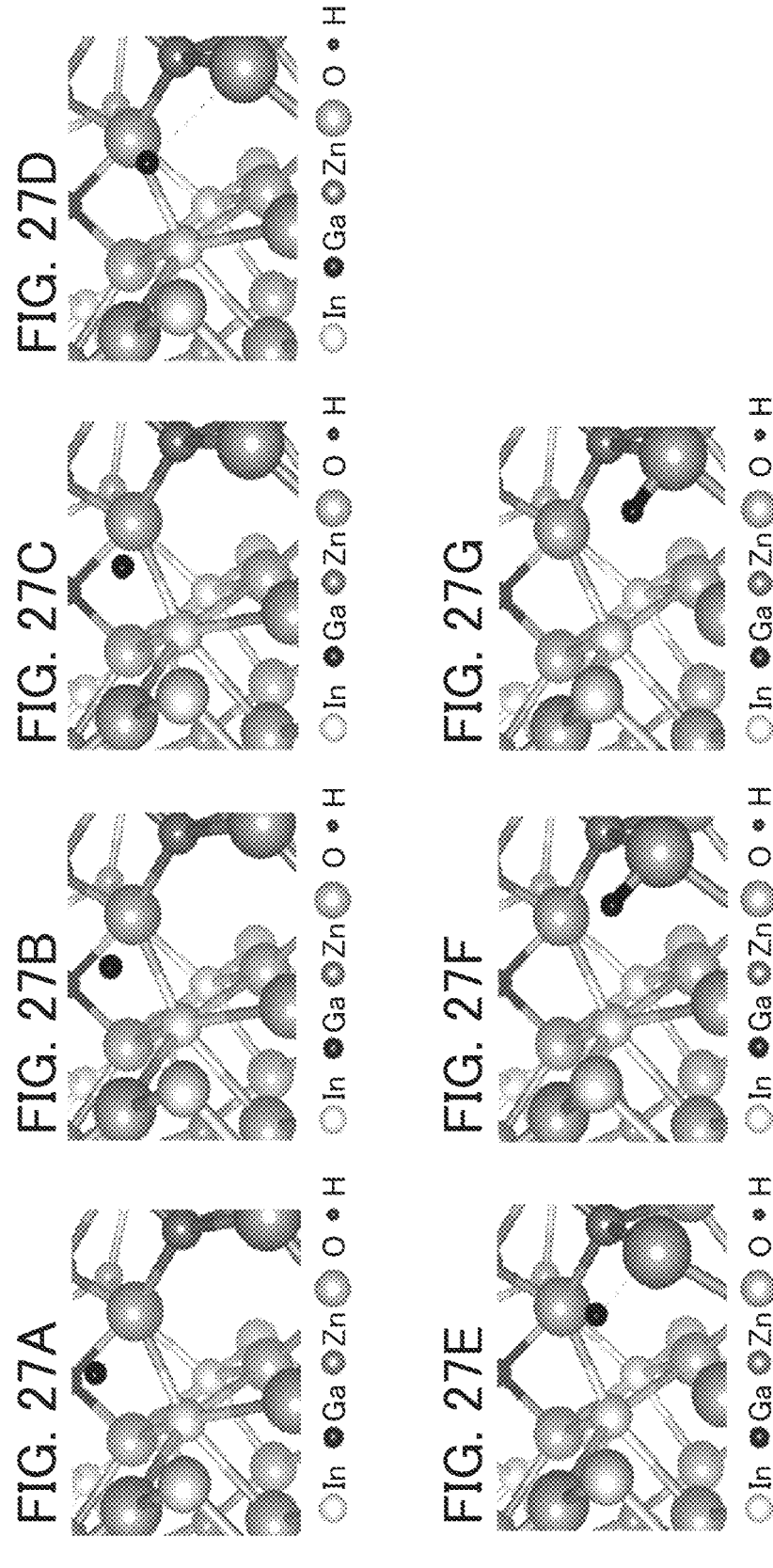

FIG. 29A
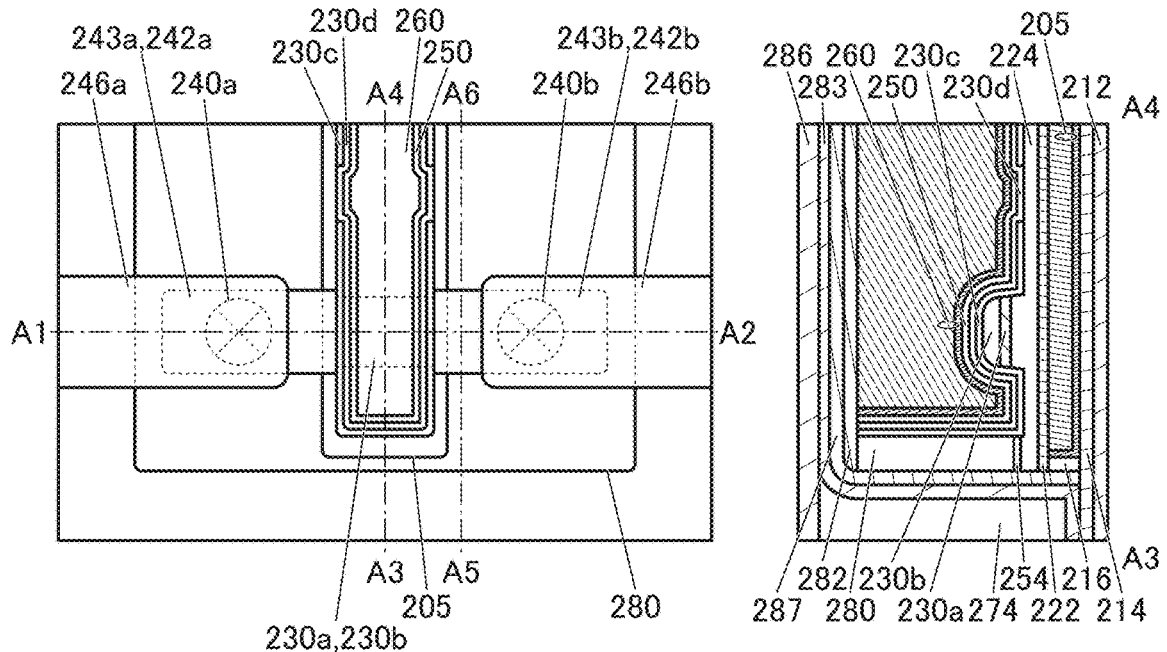
FIG. 29C
FIG. 29B
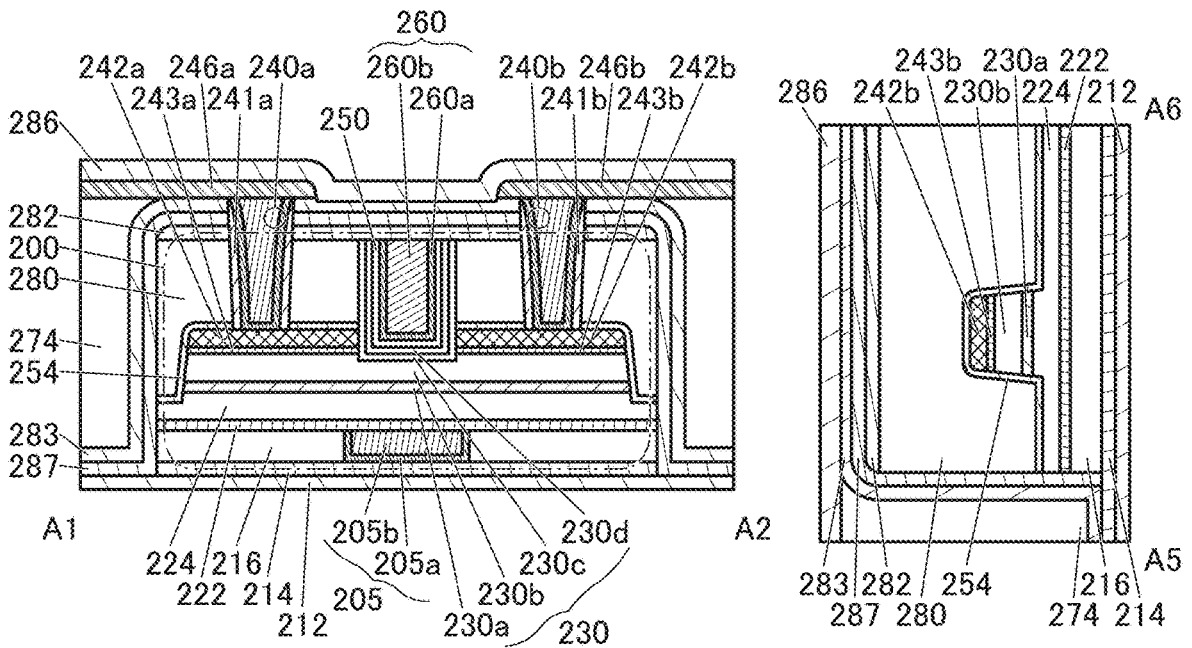
FIG. 29D

FIG. 31A
FIG. 31C
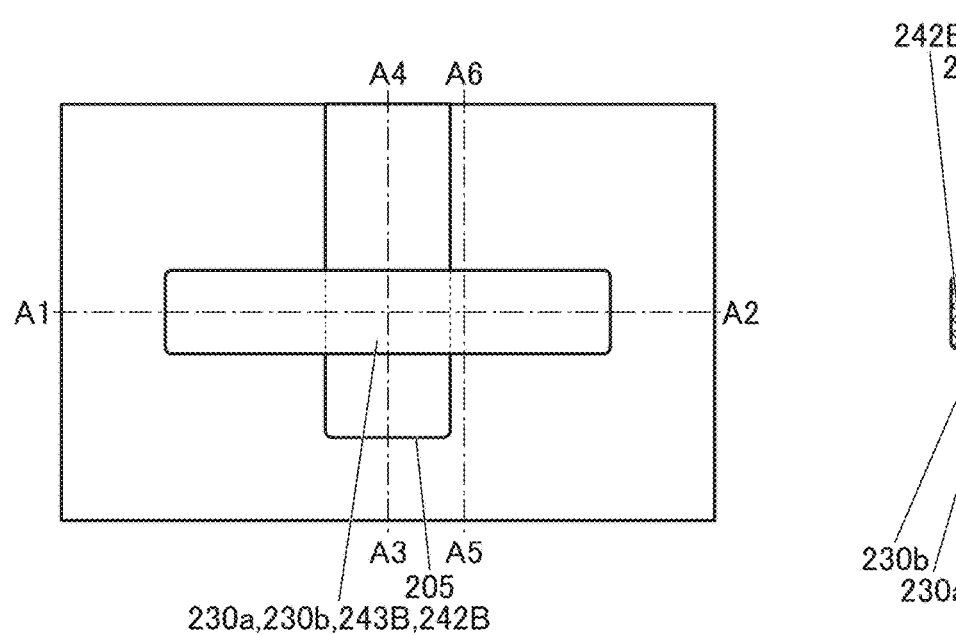
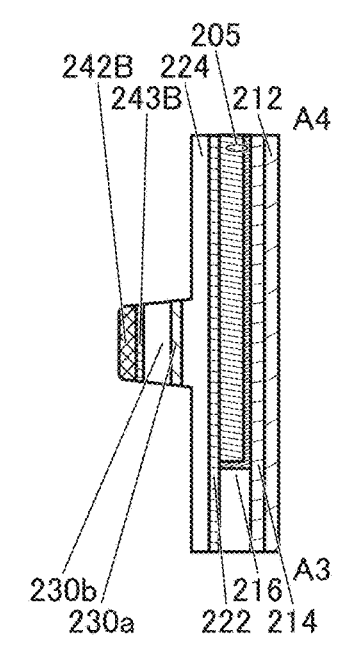
FIG. 31B
FIG. 31D
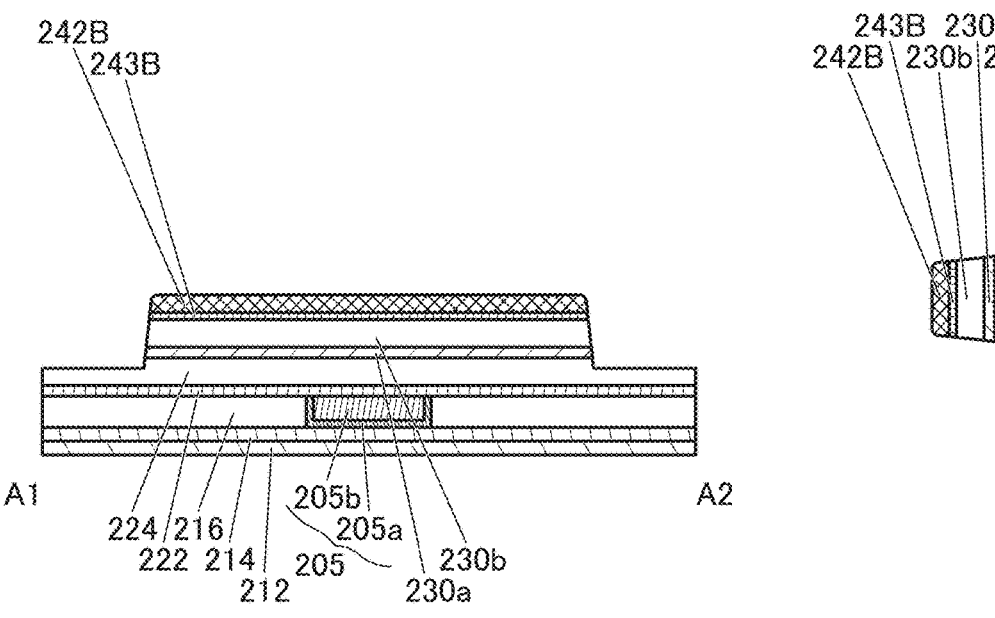

FIG. 32A
FIG. 32C
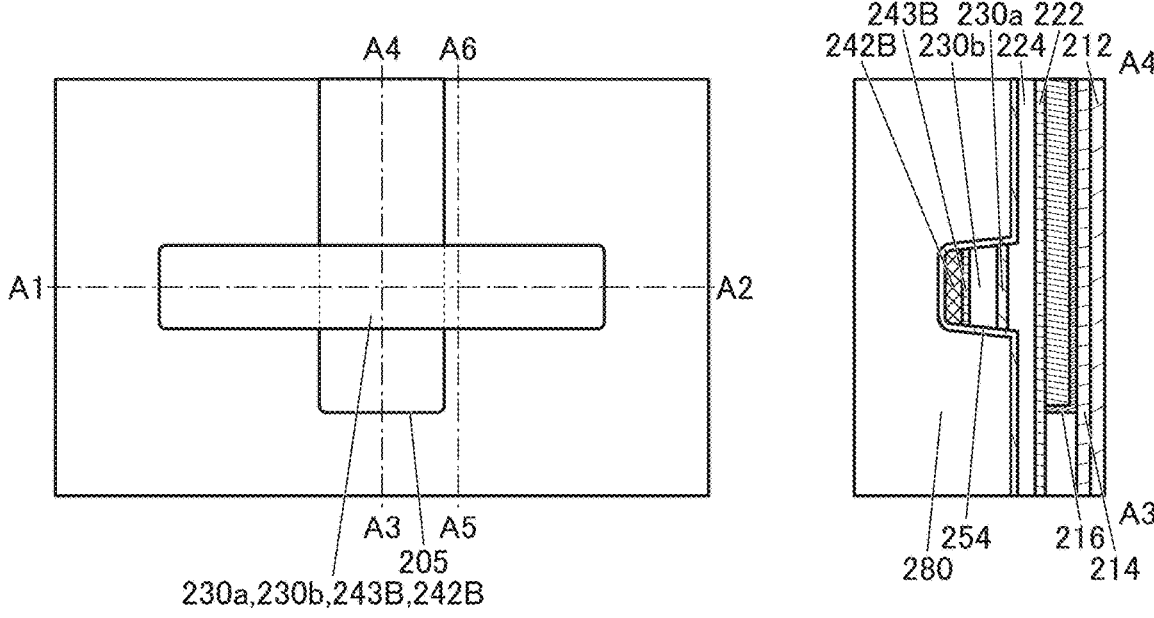
FIG. 32B
FIG. 32D
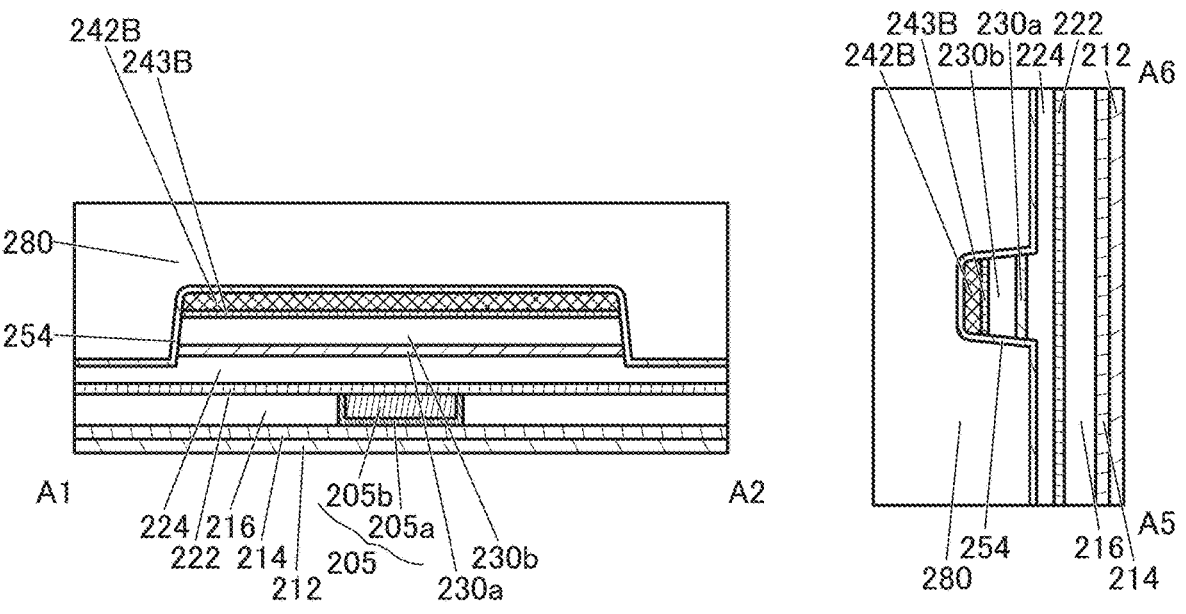

FIG. 33A
FIG. 33C
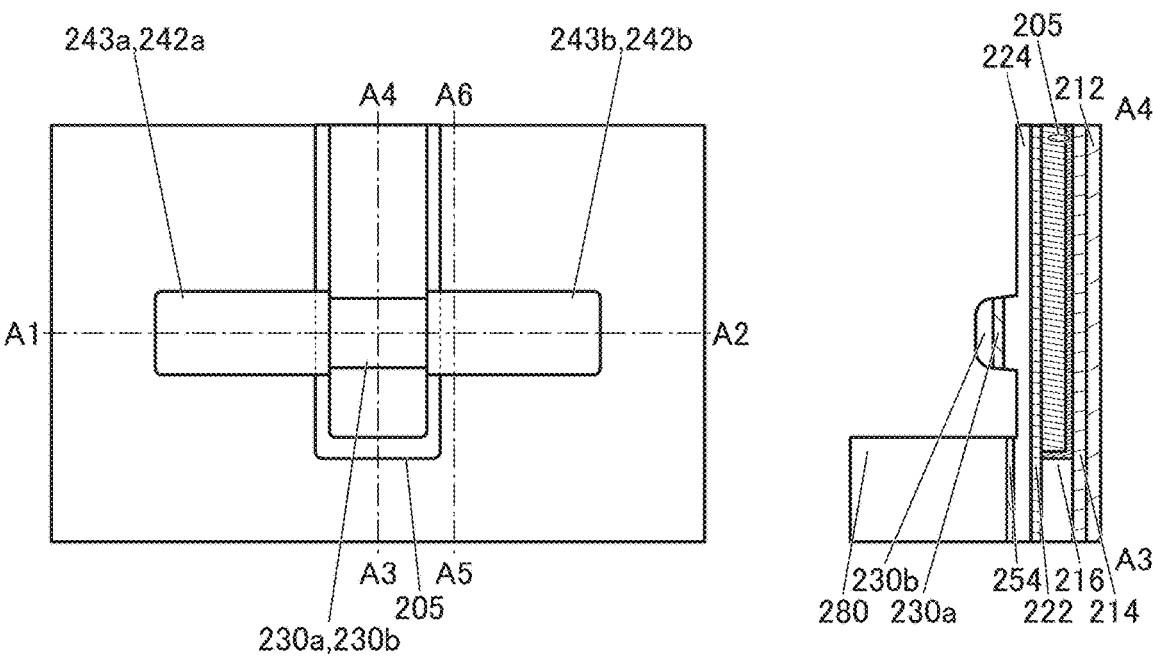
FIG. 33B
FIG. 33D
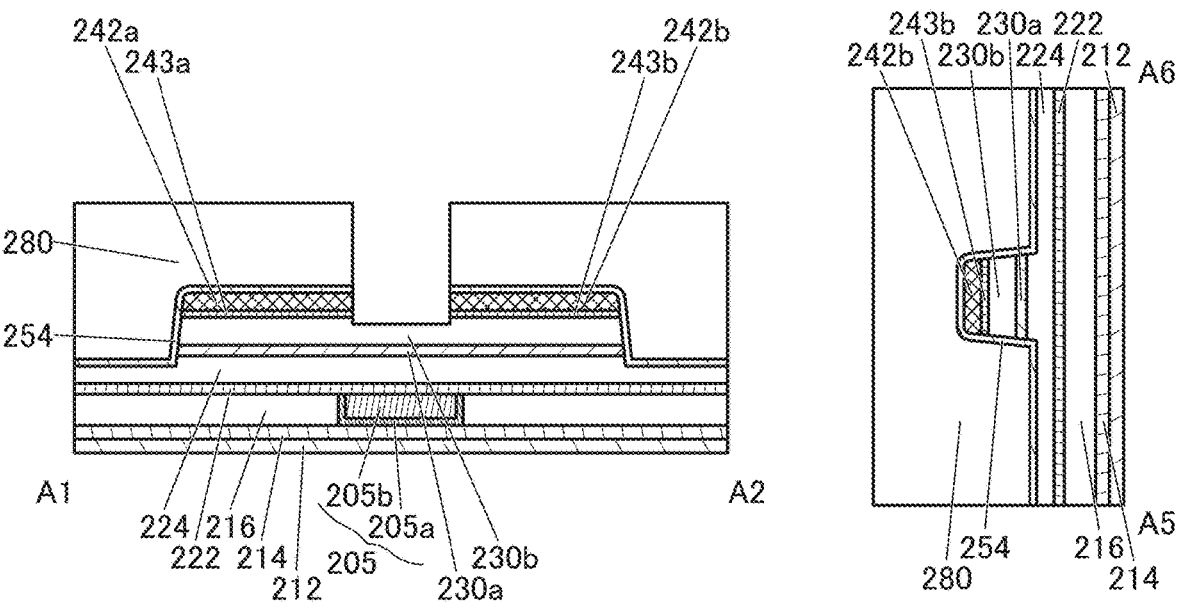

FIG. 34A
FIG. 34C
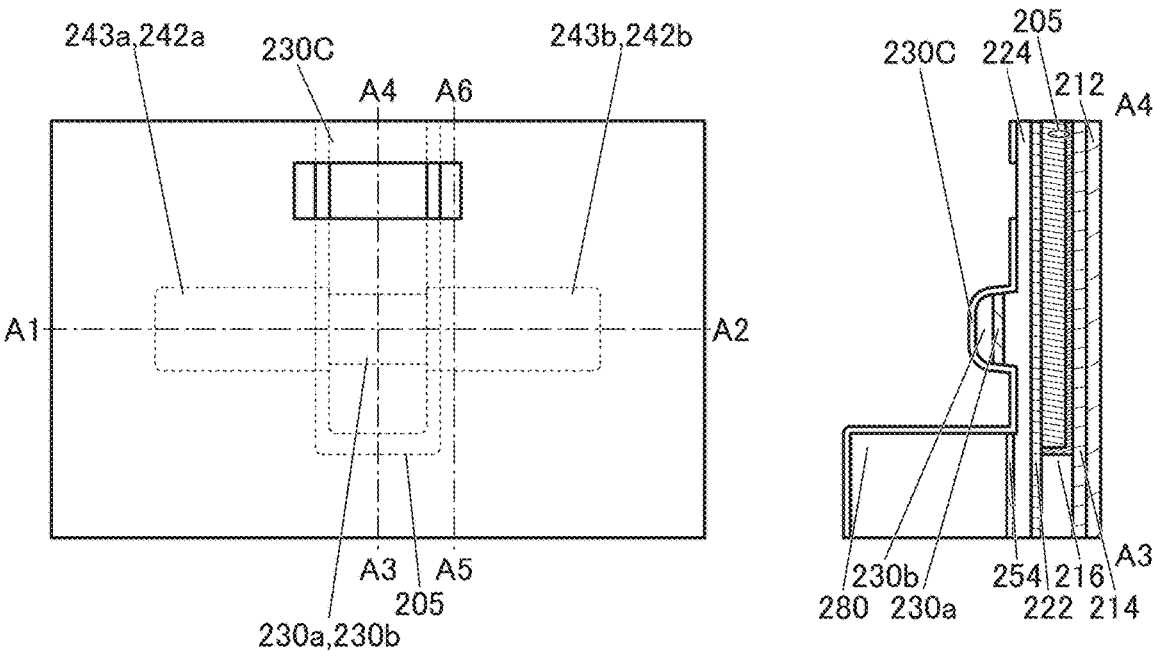
FIG. 34B
FIG. 34D
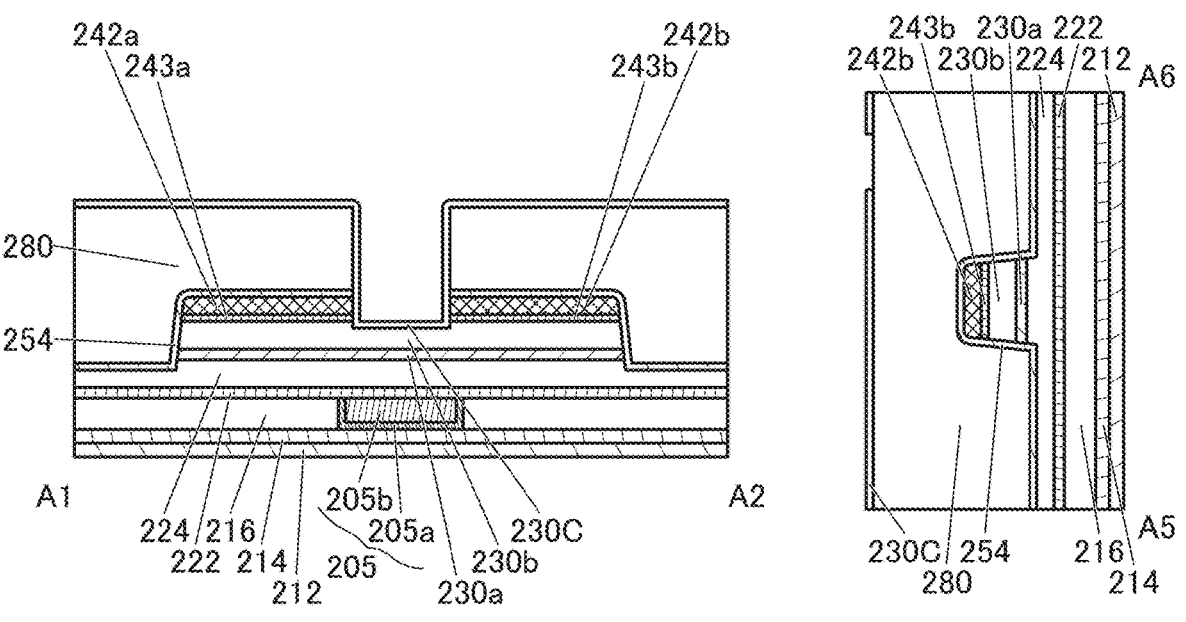

FIG. 35A
FIG. 35C
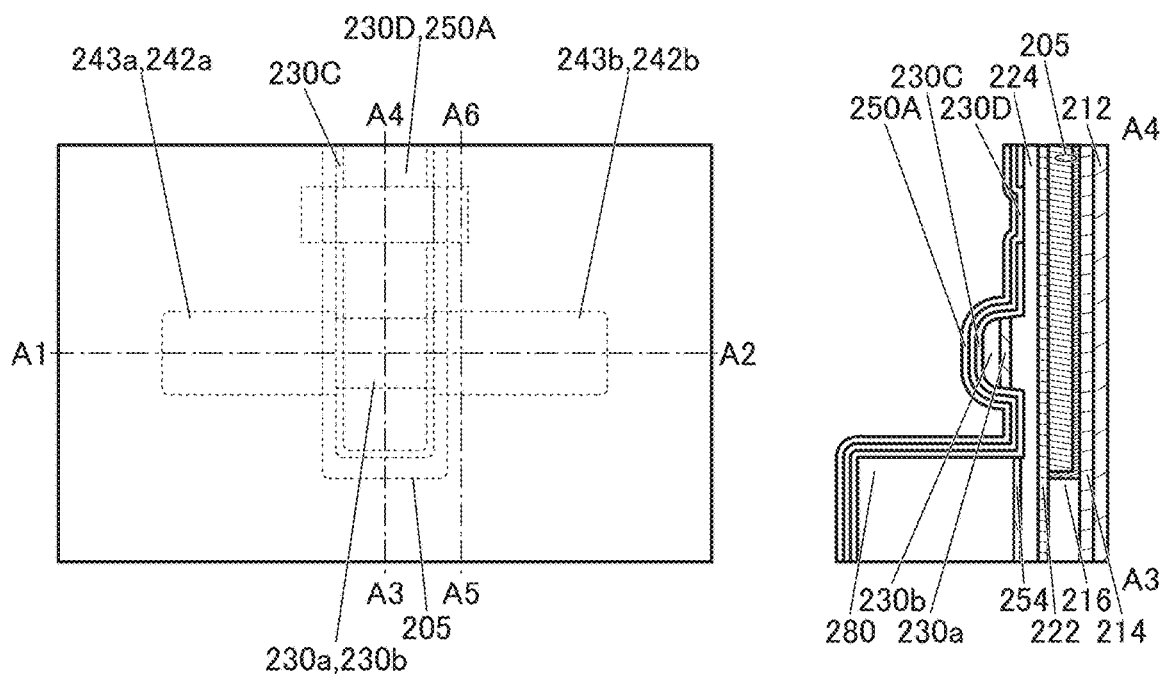
FIG. 35B
FIG. 35D
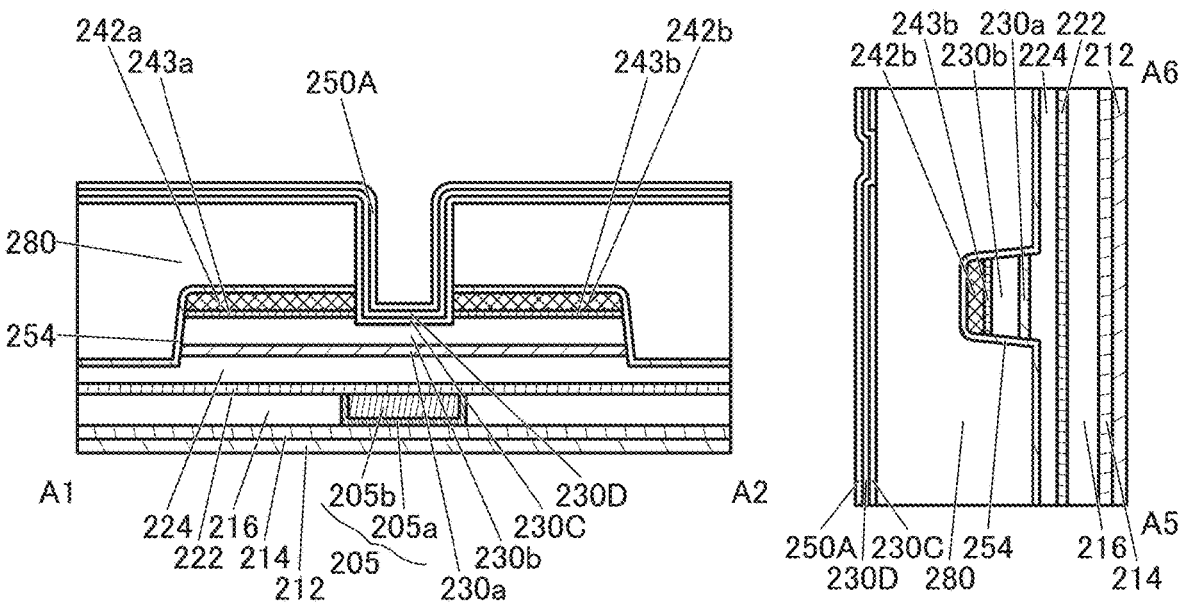

FIG. 36A
FIG. 36C
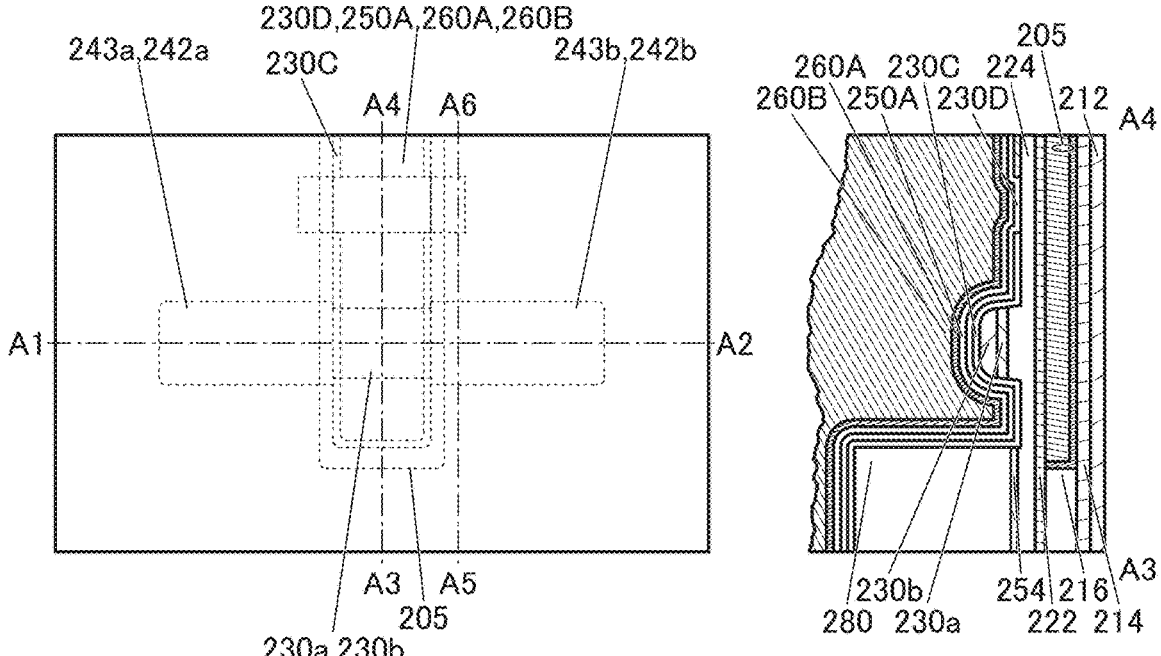
FIG. 36B
FIG. 36D
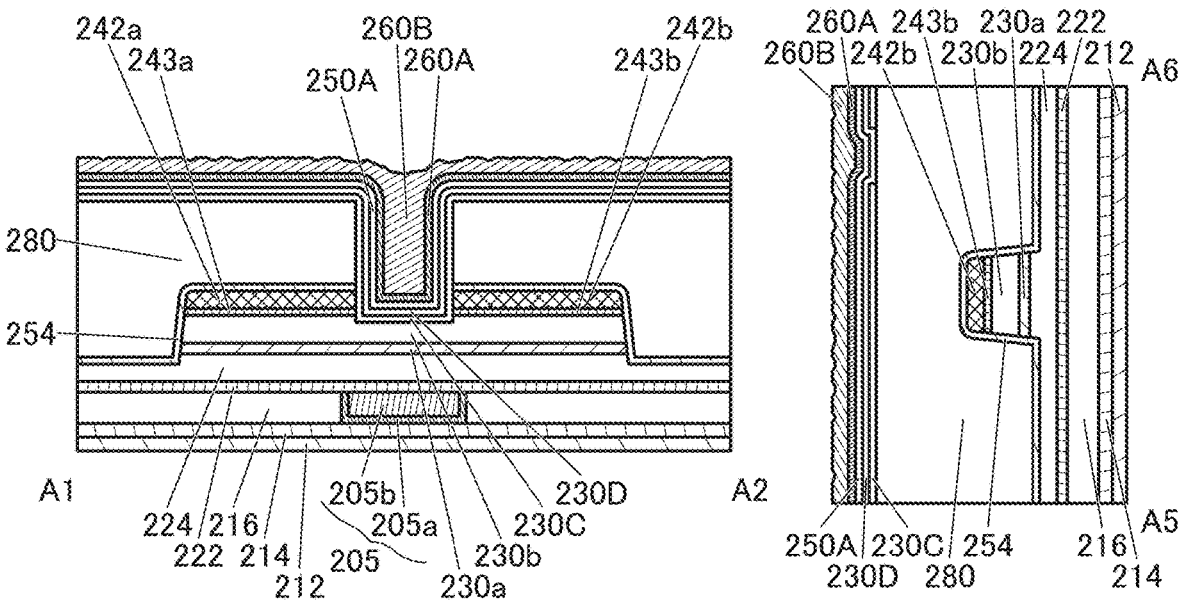

FIG. 38A
FIG. 38C
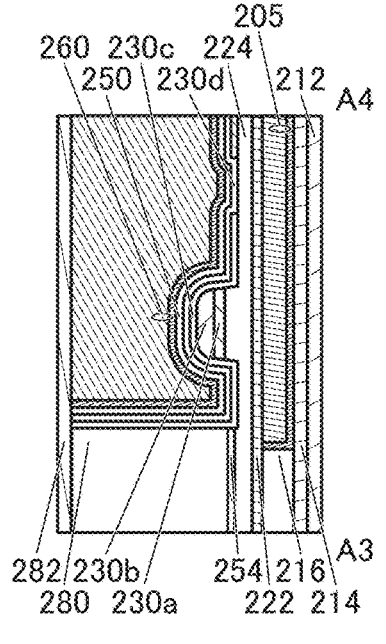
FIG. 38B
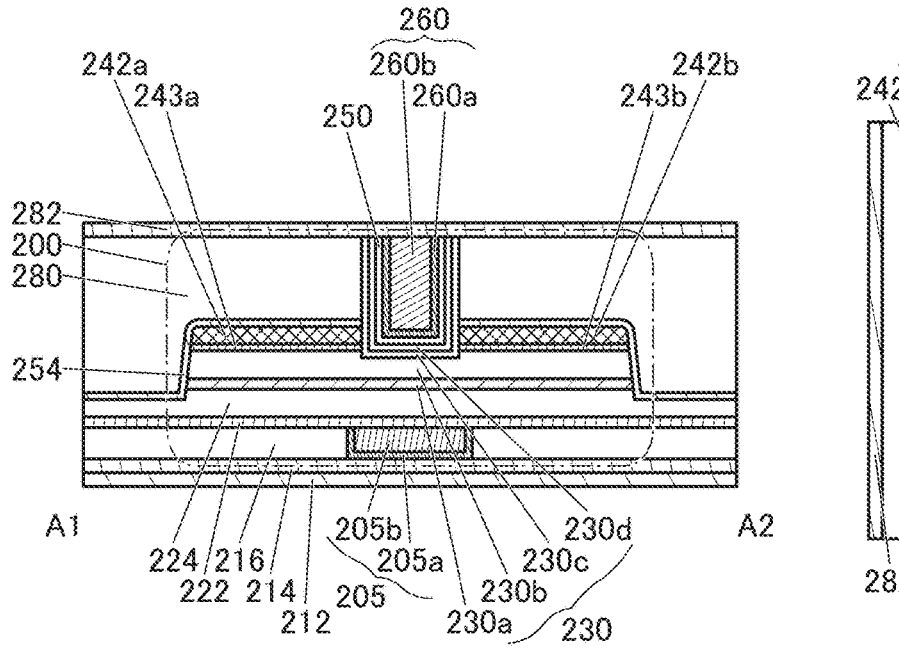
FIG. 38D
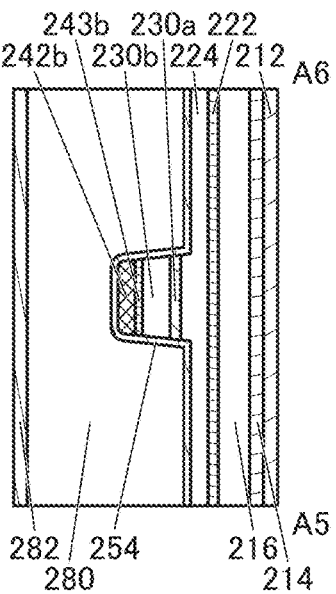

FIG. 39A
FIG. 39C
FIG. 39B
FIG. 39D
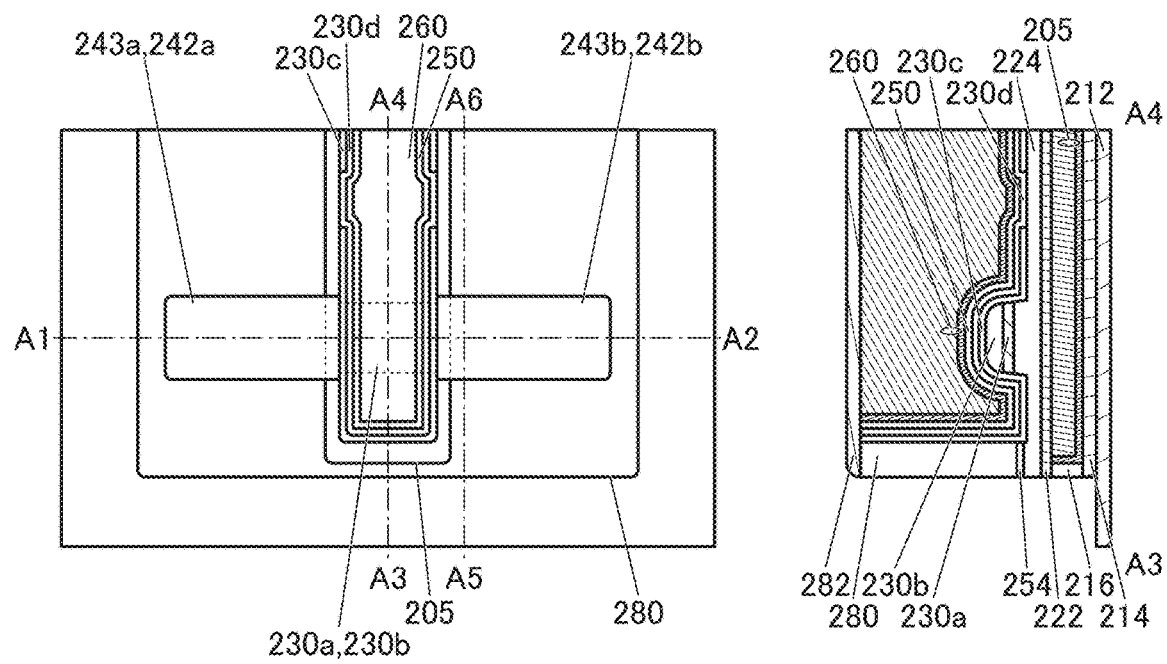
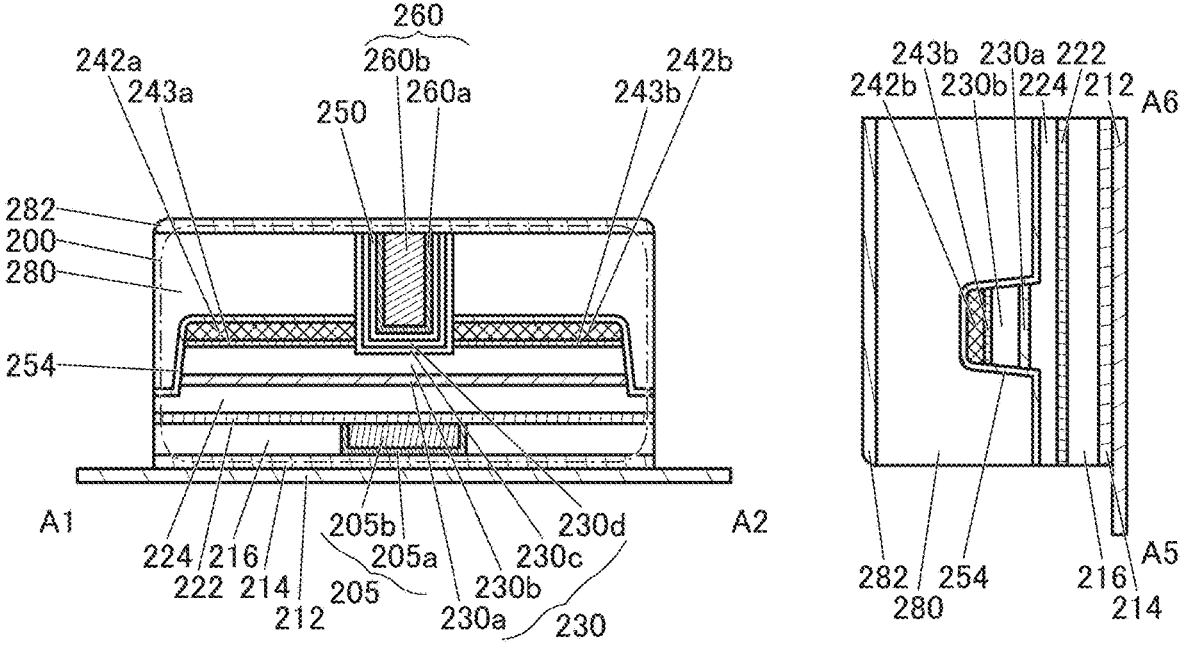

FIG. 40A
FIG. 40C
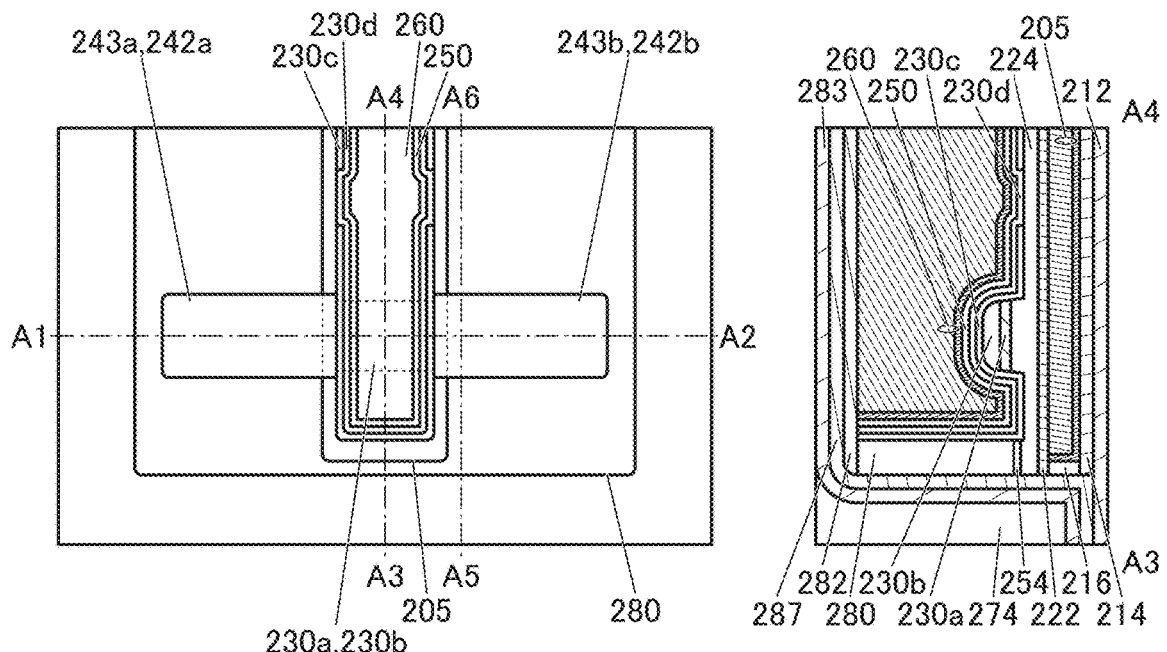
FIG. 40B
FIG. 40D
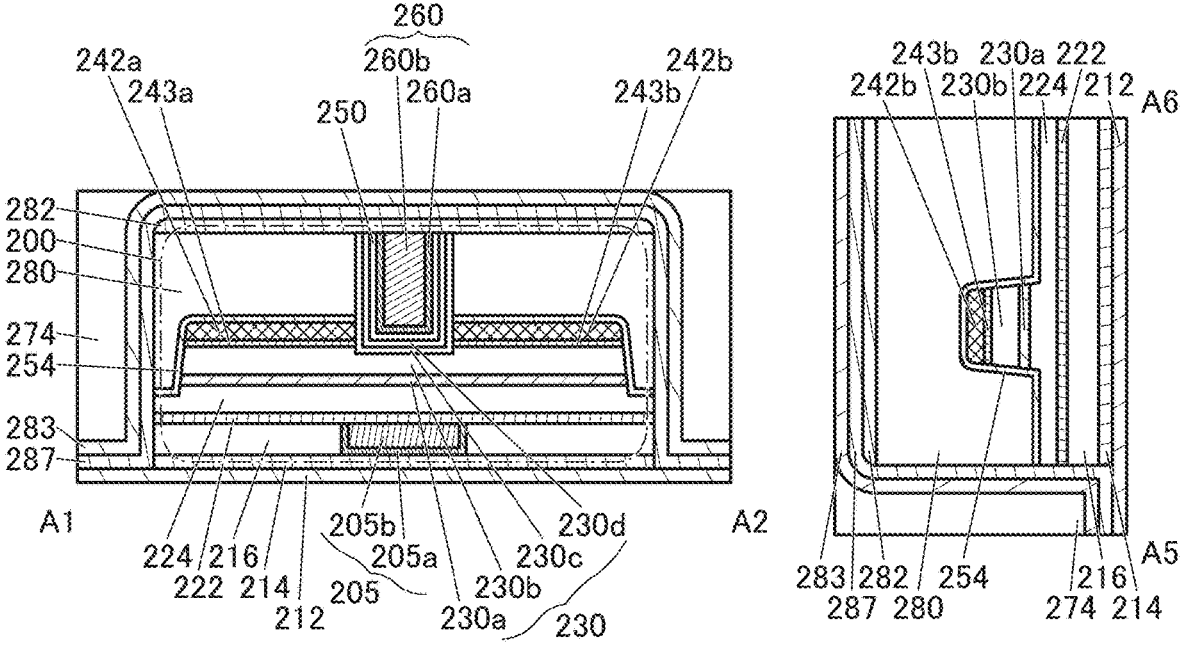

FIG. 41A
FIG. 41C
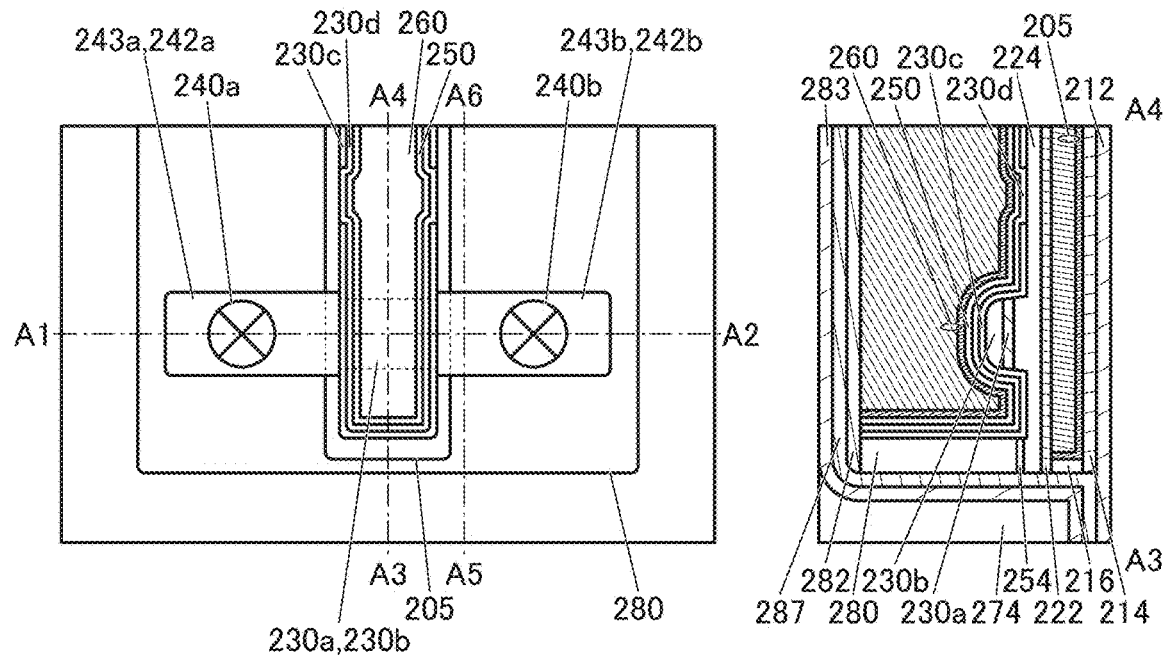
FIG. 41B
FIG. 41D
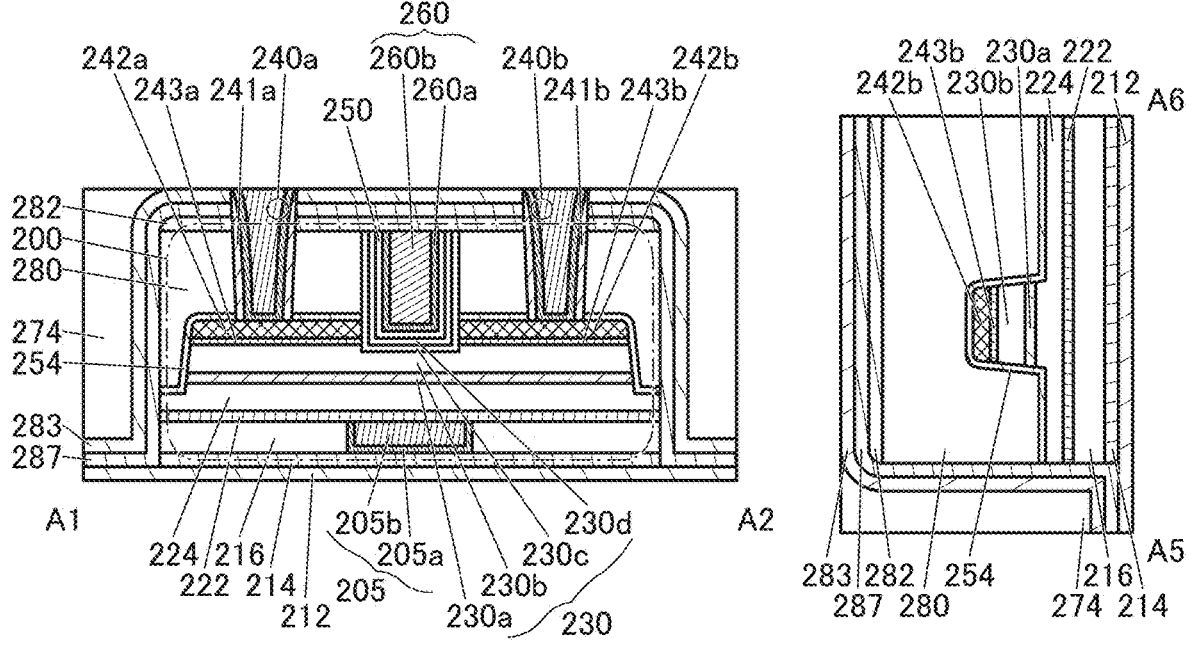

FIG. 42A
FIG. 42C
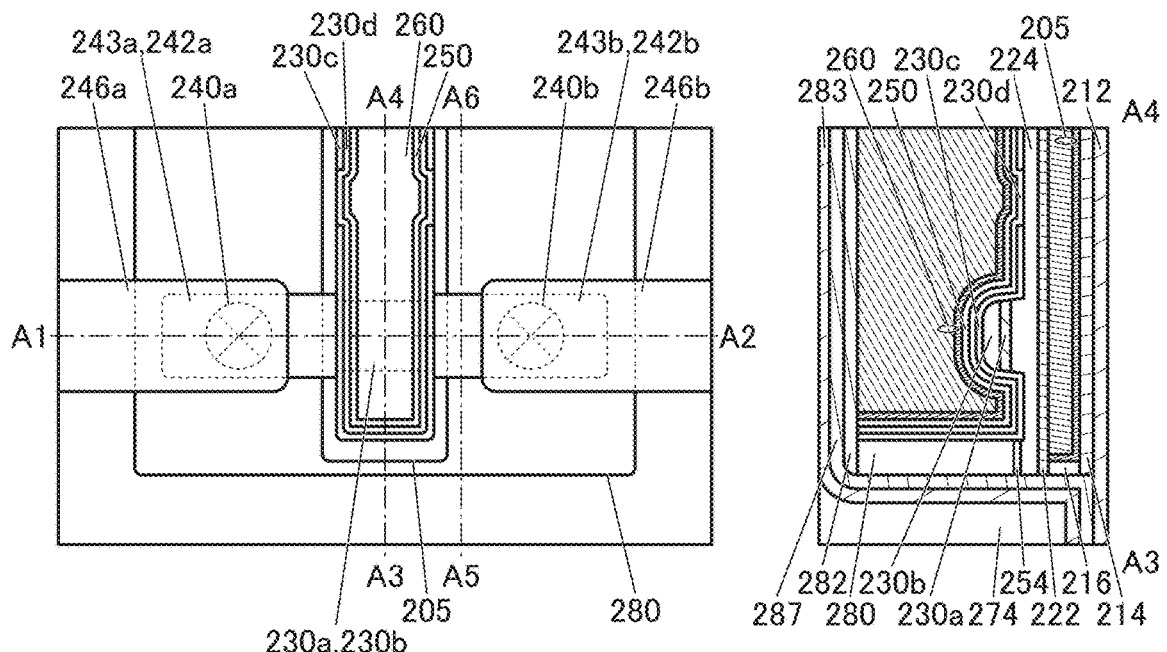
FIG. 42B
FIG. 42D
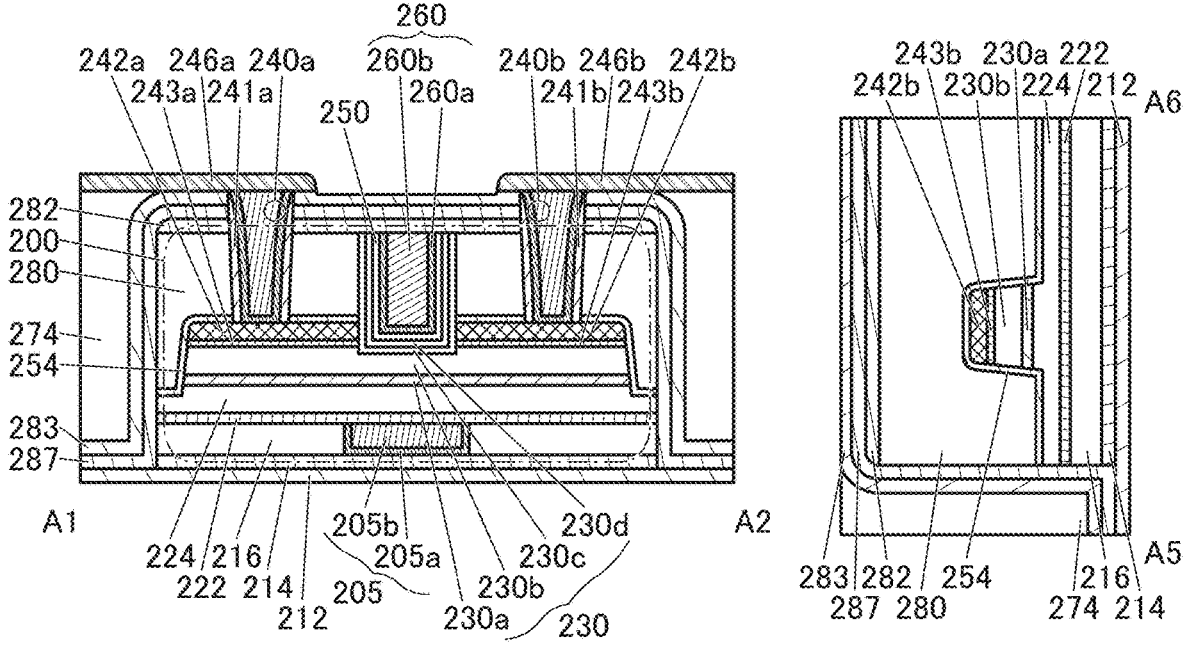

FIG. 43A
FIG. 43C
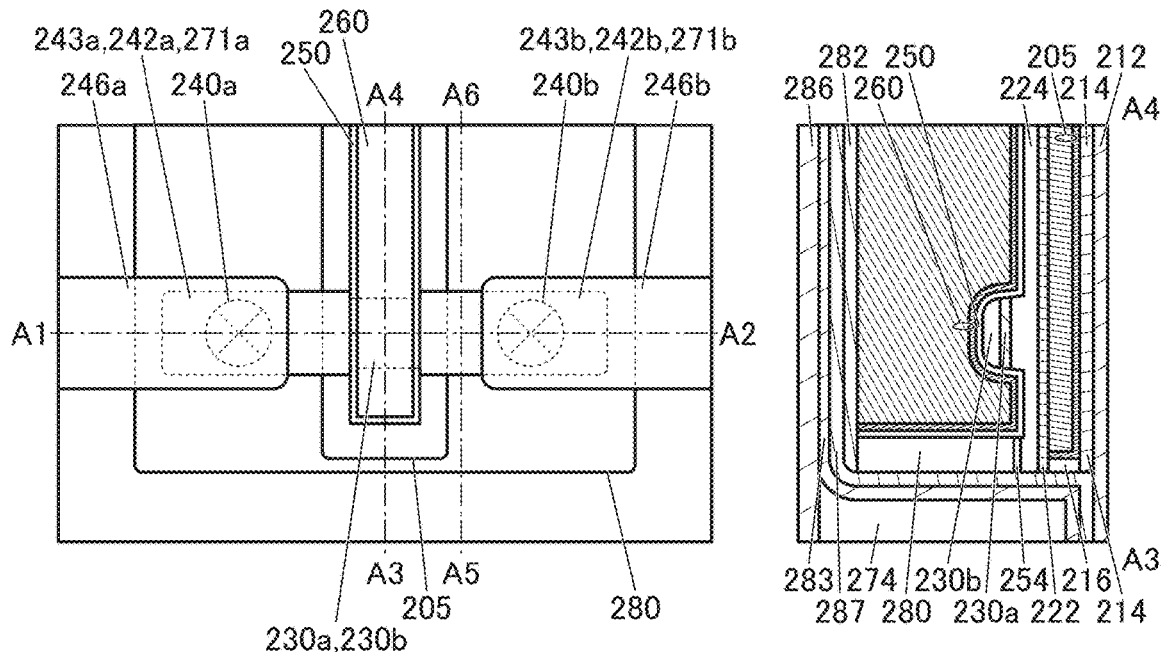
FIG. 43B
FIG. 43D
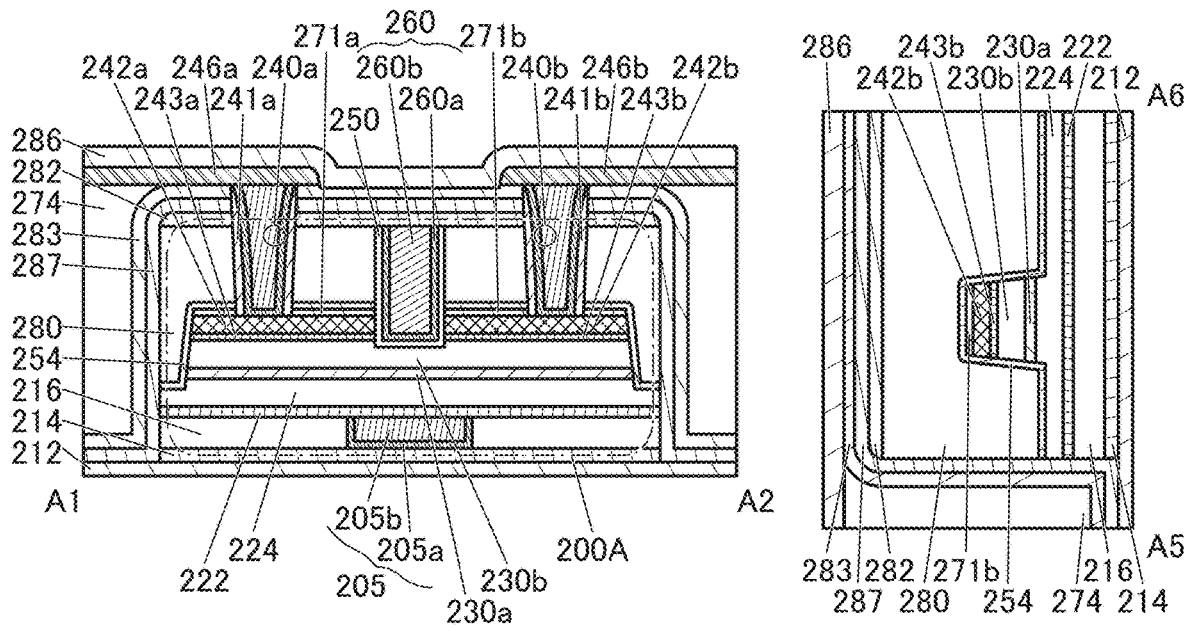

VDD    VIL

1411

1470

MC    -------    MC

ADDR

CE

WE

RE

1420

MC    -------    MC

1460

1430

1440

WDATA    VSS    RDATA

METAL OXIDE AND TRANSISTOR INCLUDING METAL OXIDE

TECHNICAL FIELD

One embodiment of the present invention relates to a metal oxide and a transistor including the metal oxide. One embodiment of the present invention relates to a semiconductor device and a method for manufacturing the semiconductor device. One embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A technique by which a transistor is formed using a semiconductor thin film formed over a substrate having an insulating surface has attracted attention. The transistor is widely used in electronic devices such as an integrated circuit (IC) or an image display device (also simply referred to as a display device). A silicon-based semiconductor material is widely known as a semiconductor thin film applicable to the transistor; in addition, an oxide semiconductor has attracted attention as another material.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCES

Non-Patent Documents

[Non-Patent Document 1] S. Yamazaki et al., "SID Symposium Digest of Technical Papers", 2012, volume 43, issue 1, p. 183-186
[Non-Patent Document 2] S. Yamazaki et al., "Japanese Journal of Applied Physics", 2014, volume 53, Number 4S, p. 04ED18-1-04ED18-10

SUMMARY OF THE INVENTION

Problems to be Solved by the Invention

An object of one embodiment of the present invention is to provide a novel metal oxide. Another object of one embodiment of the present invention is to provide a novel transistor. An object of one embodiment of the present invention is to provide a semiconductor device with a high on-state current. Another object of one embodiment of the present invention is to provide a semiconductor device having high frequency characteristics. An object of one embodiment of the present invention is to provide a highly reliable semiconductor device. An object of one embodiment of the present invention is to provide a semiconductor device with favorable electrical characteristics.

Another object of one embodiment of the present invention is to provide a semiconductor device capable of retaining data for a long time. Another object of one embodiment of the present invention is to provide a semiconductor device with high-speed data writing. Another object of one embodiment of the present invention is to provide a semiconductor device capable of reducing power consumption.

Note that the description of these objects does not preclude the existence of other objects. One embodiment of the present invention does not have to achieve all these objects. Other objects will be apparent from the description of the specification, the drawings, the claims, and the like, and other objects can be derived from the description of the specification, the drawings, the claims, and the like.

Means for Solving the Problems

One embodiment of the present invention is a metal oxide including a crystal. The crystal has a structure in which a first layer, a second layer, and a third layer are stacked. The first layer, the second layer, and the third layer are each substantially parallel to a formation surface of the metal oxide. The first layer includes a first metal and oxygen. The second layer includes a second metal and oxygen. The third layer includes a third metal and oxygen. The first layer has an octahedral structure. The second layer has a trigonal bipyramidal structure or a tetrahedral structure. The third layer has a trigonal bipyramidal structure or a tetrahedral structure. In the octahedral structure of the first layer, an atom of the first metal exists at a center and an oxygen atom exists at a vertex. In the trigonal bipyramidal structure or the tetrahedral structure of the second layer, an atom of the second metal exists at a center and an oxygen atom exists at a vertex. In the trigonal bipyramidal structure or the tetrahedral structure of the third layer, an atom of the third metal exists at a center and an oxygen atom exists at a vertex. The valence of the first metal is equal to the valence of the second metal. The valence of the first metal is different from the valence of the third metal.

Another embodiment of the present invention is a metal oxide including a crystal. The crystal has a structure in which a first layer, a second layer, and a third layer are stacked. The first layer, the second layer, and the third layer are each substantially parallel to a formation surface of the metal oxide. The first layer and the second layer each include a first metal, a second metal, and oxygen. The third layer includes a third metal and oxygen. The first layer has an octahedral structure. The second layer has a trigonal bipyramidal structure or a tetrahedral structure. The third layer has a trigonal bipyramidal structure or a tetrahedral structure. In the octahedral structure of the first layer, an atom of the first metal or the second metal exists at a center and an oxygen atom exists at a vertex. In the trigonal bipyramidal structure or the tetrahedral structure of the second layer, an atom of the first metal or an atom of the second metal exists at a center and an oxygen atom exists at a vertex. In the trigonal bipyramidal structure or the tetrahedral structure of the third layer, an atom of the third metal exists at a center and an oxygen atom exists at a vertex. The valence of the first metal is equal to the valence of the second metal. The valence of the first metal is different from the valence of the third metal.

In the above metal oxide, the crystal preferably has a $YbFe_2O_4$ type structure or a $Yb_2Fe_3O_7$ type structure.

In the above metal oxide, preferably, the first metal is indium, the second metal is gallium, and the third metal is zinc.

Another embodiment of the present invention is a transistor including the above-described metal oxide in a channel formation region.

Effect of the Invention

One embodiment of the present invention can provide a novel metal oxide. According to another embodiment of the present invention, a novel transistor can be provided. According to another embodiment of the present invention, a semiconductor device with a high on-state current can be provided. According to another embodiment of the present invention, a semiconductor device having high frequency characteristics can be provided. According to another embodiment of the present invention, a highly reliable semiconductor device can be provided. According to another embodiment of the present invention, a semiconductor device with favorable electrical characteristics can be provided.

According to one embodiment of the present invention, a semiconductor device that can retains data for a long time can be provided. According to another embodiment of the present invention, a semiconductor device with high-speed data writing can be provided. According to another embodiment of the present invention, a semiconductor device capable of reducing power consumption can be provided.

Note that the description of these effects does not preclude the existence of other effects. One embodiment of the present invention does not have to have all these effects. Note that effects other than these will be apparent from the description of the specification, the drawings, the claims, and the like, and effects other than these can be derived from the description of the specification, the drawings, the claims, and the like.

BRIEF DESCRIPTION OF THE DRAWINGS

FIG. 2A to FIG. 2C are diagrams each illustrating a crystal included in a metal oxide which is one embodiment of the present invention.

FIG. 6A to FIG. 6D are diagrams illustrating simulation models.

FIG. 8A and FIG. 8B are diagrams each illustrating the number of Ga atoms. FIG. 8C and FIG. 8D are diagrams each illustrating a map of LDOS.

FIG. 16A to FIG. 16D are cross-sectional views illustrating a deposition method.

FIG. 20A to FIG. 20C are diagrams illustrating a deposition method.

FIG. 21A is a top view of a semiconductor device. FIG. 21B to FIG. 21D are cross-sectional views of the semiconductor device.

FIG. 26A to FIG. 26G are diagrams illustrating atomic structures.

FIG. 27A to FIG. 27G are diagrams illustrating atomic structures.

FIG. 29A is a top view of a semiconductor device. FIG. 29B to FIG. 29D are cross-sectional views of the semiconductor device.

FIG. 31A is a top view illustrating the method for manufacturing the semiconductor device. FIG. 31B to FIG. 31D are cross-sectional views illustrating the method for manufacturing the semiconductor device.

FIG. 32A is a top view illustrating the method for manufacturing the semiconductor device. FIG. 32B to FIG. 32D are cross-sectional views illustrating the method for manufacturing the semiconductor device.

FIG. 33A is a top view illustrating the method for manufacturing the semiconductor device. FIG. 33B to FIG. 33D are cross-sectional views illustrating the method for manufacturing the semiconductor device.

FIG. 34A is a top view illustrating the method for manufacturing the semiconductor device. FIG. 34B to FIG. 34D are cross-sectional views illustrating the method for manufacturing the semiconductor device.

FIG. 35A is a top view illustrating the method for manufacturing the semiconductor device. FIG. 35B to FIG. 35D are cross-sectional views illustrating the method for manufacturing the semiconductor device.

FIG. 36A is a top view illustrating the method for manufacturing the semiconductor device. FIG. 36B to FIG. 36D are cross-sectional views illustrating the method for manufacturing the semiconductor device.

FIG. 38A is a top view illustrating the method for manufacturing the semiconductor device. FIG. 38B to FIG. 38D are cross-sectional views illustrating the method for manufacturing the semiconductor device.

FIG. 39A is a top view illustrating the method for manufacturing the semiconductor device. FIG. 39B to FIG. 39D are cross-sectional views illustrating the method for manufacturing the semiconductor device.

FIG. 40A is a top view illustrating the method for manufacturing the semiconductor device. FIG. 40B to FIG. 40D are cross-sectional views illustrating the method for manufacturing the semiconductor device.

FIG. 41A is a top view illustrating the method for manufacturing the semiconductor device. FIG. 41B to FIG. 41D are cross-sectional views illustrating the method for manufacturing the semiconductor device.

FIG. 42A is a top view illustrating the method for manufacturing the semiconductor device. FIG. 42B to FIG. 42D are cross-sectional views illustrating the method for manufacturing the semiconductor device.

FIG. 43A is a top view of a semiconductor device. FIG. 43B to FIG. 43D are cross-sectional views of the semiconductor device.

FIG. 44A and FIG. 44B are each a cross-sectional view of a semiconductor device.

FIG. 51A to FIG. 51E are schematic views of memory devices.

MODE FOR CARRYING OUT THE INVENTION

Figure 1:
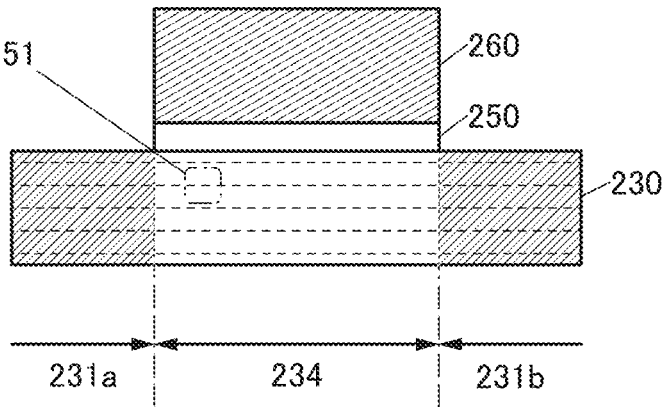
FIG. 1 is a cross-sectional view of a transistor according to one embodiment of the present invention.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers that are used to specify one embodiment of the present invention in some cases.

In this specification and the like, terms for describing arrangement, such as "over" and "below", are used for convenience to describe the positional relation between components with reference to drawings. The positional relation between components is changed as appropriate in accordance with a direction in which each component is described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts. Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter, also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter, also referred to as an "effective channel width") is sometimes different from a channel width shown in a top view of a transistor (hereinafter, also referred to as an "apparent channel width"). For example, when a gate electrode covers a side surface of a semiconductor, an effective channel width is larger than an apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, transition metals other than main components of the oxide semiconductor, and the like; hydrogen, lithium, sodium, silicon, boron, phosphorus, carbon, nitrogen, and the like are given as examples. Note that water also serves as an impurity in some cases. Entry of an impurity may cause oxygen vacancies (referred to as Vo in some cases) in an oxide semiconductor, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to $-10°$ and less than or equal to $10°$. Accordingly, the case where the angle is greater than or equal to $-5°$ and less than or equal to $5°$ is also included. Furthermore, "substantially parallel" indicates a state where two straight lines are placed at an angle greater than or equal to $-30°$ and less than or equal to $30°$. Moreover, "perpendicular" indicates a state where two straight lines are placed at an angle greater than or equal to $80°$ and less than or equal to $100°$. Accordingly, the case where the angle is greater than or equal to $85°$ and less than or equal to $95°$ is also included. Furthermore, "substantially perpendicular" indicates a state where two straight lines are placed at an angle greater than or equal to $60°$ and less than or equal to $120°$.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

Note that in this specification and the like, a metal oxide containing nitrogen is also collectively referred to as a metal oxide in some cases. A metal oxide containing nitrogen may be referred to as a metal oxynitride.

In this specification and the like, normally off means drain current per micrometer of channel width flowing through a transistor being $1×10^{-20}$ A or less at room temperature, $1×10^{-18}$ A or less at 85° C., or $1×10^{-16}$ A or less at 125° C. when a potential is not applied to a gate or a ground potential is applied to the gate.

Embodiment 1

In this embodiment, a metal oxide that can be used for a semiconductor layer of a transistor and a formation method thereof are described with reference to FIG. 1 to FIG. 20C.

FIG. 1 is a cross-sectional view of a transistor 10 including a metal oxide of one embodiment of the present invention in the channel length direction.

As illustrated in FIG. 1, the transistor 10 includes an oxide 230 placed over a substrate (not illustrated), an insulator 250 placed over the oxide 230, and a conductor 260 placed over the insulator 250. The oxide 230 includes a region 234 functioning as a region where a channel is formed (hereinafter also referred to as a channel formation region) of the transistor 10 and a region 231a and a region 231b functioning as a source region and a drain region. The insulator 250 functions as a gate insulator. The conductor 260 functions as a gate electrode.

A conductor functioning as a source electrode or a drain electrode may be provided to be in contact with the oxide 230. At this time, in the case where an element included in the conductor has a function of absorbing oxygen in the oxide 230, a low-resistance region might be formed partly between the oxide 230 and the conductor or in the vicinity of a surface of the oxide 230. In this case, in the low-resistance region, an oxygen vacancy, an impurity entering an oxygen vacancy (hydrogen, nitrogen, a metal element, or the like), or the like might function as a donor, which increases the carrier concentration. At least part of the low-resistance region is included in the region 231a or the region 231b functioning as the source region or the drain region.

The resistance of the channel portion of the transistor can be controlled by a potential applied to the gate. That is, conduction (the on state of the transistor) or non-conduction (the off state of the transistor) between the source and the drain can be controlled by a potential applied to the gate.

In the transistor, a metal oxide functioning as a semiconductor (hereinafter also referred to as an oxide semiconductor) is preferably used in the semiconductor layer including the channel formation region.

The band gap of the metal oxide functioning as a semiconductor is preferably greater than or equal to 2.0 eV, further preferably greater than or equal to 2.5 eV. With use of a metal oxide having such a wide band gap, the off-state current of the transistor can be reduced.

The transistor using an oxide semiconductor in the channel formation region has an extremely low leakage current (off-state current) in a non-conduction state; thus, a semiconductor device with low power consumption can be provided.

Oxide semiconductors (metal oxides) are classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

For the channel formation region of a transistor, a metal oxide that can increase the on-state current of the transistor is preferably used. The on-state current of the transistor can be increased by an increase in the mobility of the metal oxide used for the transistor. To increase the mobility of the metal oxide, the transfer of carriers (electrons in the case of an n-channel transistor) needs to be facilitated or scattering factors that affect the carrier transfer needs to be reduced. Note that the carriers flow from the source to the drain through the channel formation region. Hence, the on-state current of the transistor can be increased by providing a channel formation region through which carriers can easily flow in the channel length direction.

In the case where the metal oxide is composed of a plurality of metal elements, one of the scattering factors that affect the carrier transfer is randomness in the arrangement of metal atoms in cation sites (what is called cation disorder). This means that the cation disorder in the metal oxide is preferably reduced to increase the mobility of the metal oxide used for the transistor.

Thus, as the metal oxide including the channel formation region, a metal oxide including a crystal (also referred to as a crystalline metal oxide) is preferably used. The crystal preferably has a crystal structure in which a first layer, a second layer, and a third layer are stacked. That is, the crystal has a layered crystal structure (also referred to as a layered crystal or a layered structure). At this time, the direction of the c-axis of the crystal is the direction in which the first layer, the second layer, and the third layer are stacked. Examples of a metal oxide including the crystal include a single crystal oxide semiconductor, a CAAC-OS which is described later, and the like.

The c-axis of the above crystal is preferably aligned in the normal direction with respect to the formation surface or film surface of the metal oxide. This enables the first layer to the third layer to be placed substantially parallel to the formation surface or film surface of the metal oxide. In other words, the first layer to the third layer extend in the channel length direction.

The first layer has an octahedral structure in which a metal atom included in the first layer is positioned at the center and oxygen atoms are positioned at vertexes. The second layer has a trigonal bipyramidal or tetrahedral structure in which a metal atom included in the second layer is positioned at the center and oxygen atoms are positioned at vertexes. The third layer has a trigonal bipyramidal or tetrahedral structure in which a metal atom included in the third layer is positioned at the center and oxygen atoms are positioned at vertexes.

Examples of the crystal structure of the above crystal are a $YbFe_2O_4$ type structure, a $Yb_2Fe_3O_7$ type structure, their deformed structures, and the like.

Preferably, each of the first layer to the third layer is composed of one metal element or a plurality of metal elements with the same valence and oxygen. The valence of the one or plurality of metal elements included in the first layer is preferably equal to the valence of the one or plurality of metal elements included in the second layer. The first layer and the second layer may include the same metal element. The valence of the one or plurality of metal elements included in the first layer is preferably different from the valence of the one or plurality of metal elements included in the third layer.

The above structure can reduce the cation disorder in the metal oxide, which leads to an increase in the mobility of the metal oxide. Thus, the use of the metal oxide for the channel formation region of the transistor increases the on-state current of the transistor, leading to an improvement in the electrical characteristics of the transistor. Note that the cation disorder in the metal oxide including a crystal is described later.

Preferably, at least indium or zinc is contained in the metal oxide. In particular, indium and zinc are preferably contained. In addition to them, a metal element with the same valence as that of indium or zinc is preferably contained. Examples of the metal element are aluminum, gallium, yttrium, and the like. One or more kinds selected from iron, cobalt, nickel, lanthanum, cerium, neodymium, magnesium, calcium, and the like may be contained.

Here, the case where the metal oxide is an In-M-Zn oxide containing indium (In), an element M, and zinc (Zn) is considered. The element M is aluminum, gallium, yttrium, or the like. Other elements that can be used as the element M include iron, cobalt, nickel, lanthanum, cerium, neodymium, magnesium, calcium, and the like. A plurality of the above-described elements may be used in combination as the element M.

Atomic arrangement in the crystal included in the metal oxide when the metal oxide is an In-M-Zn oxide is described here.

FIG. 2A to FIG. 2C are drawings illustrating the atomic arrangement in the crystal included in the oxide 230. FIG. 2A to FIG. 2C are also enlarged views of a region 51 of the oxide 230 illustrated in FIG. 1. The composition of the oxide 230 illustrated in FIG. 2A to FIG. 2C is In:M:Zn=1:1:1 [atomic ratio], and the crystal structure is a $YbFe_2O_4$ type structure. The element M is a metal element having a valence of +3. Note that in FIG. 2A to FIG. 2C, the element M is referred to as $M^{3+}$ for convenience. In FIG. 2A to FIG. 2C, an atom is represented by a sphere (a circle) and a bond between a metal atom (In, $M^{3+}$, or Zn) and an oxygen atom (0) is represented by a line.

In FIG. 2A to FIG. 2C, the c-axis direction in the crystal structure of the In-M-Zn oxide is indicated by the arrows. The a-b plane direction is in the crystal structure of the In-M-Zn oxide is the direction perpendicular to the c-axis direction indicated by the arrows in FIG. 2A to FIG. 2C.

As illustrated in FIG. 2A, the crystal included in the oxide 230 has repetitive stacking of the layer 21 including indium (In) and oxygen, a layer 31 including the element M and oxygen, and a layer 41 including zinc (Zn) and oxygen in this order. Here, the layer 21 corresponds to the above first layer, the layer 31 corresponds to the above second layer, and the layer 41 corresponds to the above third layer.

When the layer 21, the layer 31, and the layer 41 included in the above crystal are each composed of one metal element and oxygen as illustrated in FIG. 2A, the cation disorder can be reduced to increase the mobility of the metal oxide.

Note that the stacking order of the layer 21, the layer 31, and the layer 41 is not limited to the stacking order illustrated in FIG. 2A and there is no limitation on the stacking order of the layer 31 and the layer 41 positioned between the two layers 21. Examples thereof may include repetitive stacking of the layer 21, the layer 41, and the layer 31 in this order and repetitive stacking of the layer 21, the layer 41, the layer 31, the layer 21, the layer 31, and the layer 41 in this order as illustrated in FIG. 2B.

As illustrated in FIG. 2C, the crystal included in the oxide 230 has repetitive stacking of a layer 22 including indium, the element M, and oxygen, a layer 32 including indium, the element M, and oxygen, and the layer 41 including zinc and oxygen in this order. Here, the layer 22 corresponds to above the first layer, and the layer 32 corresponds to the above second layer. Like the stacking order of the layer 21, the layer 31, and the layer 41, the stacking order of the layer 22, the layer 32, and the layer 41 imposes no limitation on the stacking order of the layer 32 and the layer 41 positioned between the two layers 22.

In the case where the ion radius of indium is larger than that of the element M, the atomic proportion of indium to the element M in the layer 22 is preferably higher than the atomic proportion of indium to the element M in the layer 32. In this case, the crystal can be easily formed in the In-M-Zn oxide.

In FIG. 2A to FIG. 2C, the atomic arrangement in the crystal is represented with the spheres (circles) and the lines.

Figure 3A:
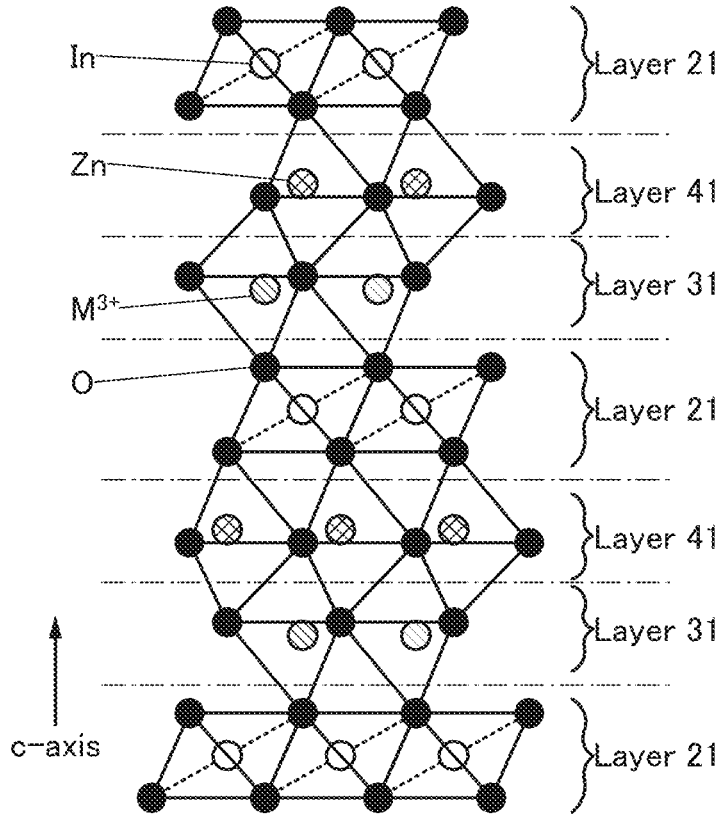
FIG. 3A is a diagram illustrating a crystal included in a metal oxide which is one embodiment of the present invention.

Next, the atomic arrangement in the crystal is expressed as polyhedrons. FIG. 3A is a drawing where the atomic arrangement of the crystal illustrated in FIG. 2A is expressed as polyhedrons. Note that the polyhedron included in the layer 21 is illustrated in FIG. 3B, the polyhedron that can be included in the layer 31 is illustrated in FIG. 3C, and the polyhedron that can be included in the layer 41 is illustrated in FIG. 3D.

Figure 3B:
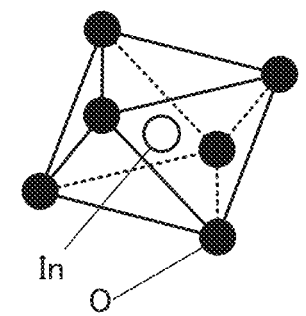
FIG. 3B to FIG. 3D are diagrams each illustrating a polyhedron included in the crystal.

The polyhedron illustrated in FIG. 3B is an octahedral structure. The octahedral structure is a structure including an indium atom at the center and oxygen atoms at vertexes. In the layer 21, such octahedral structures are edge-shared. Note that an atom of the element M exists at the center of the octahedral structure in some cases.

Figure 3C:
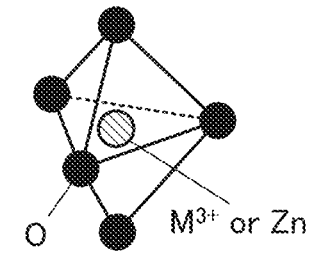
Figure 3D:
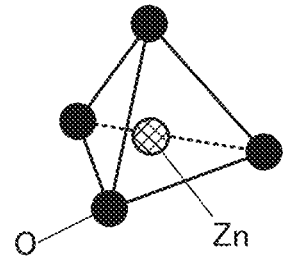

The polyhedron illustrated in FIG. 3C is a trigonal bipyramidal structure. The trigonal bipyramidal structure is a structure including an atom of the element M or a zinc atom at the center and oxygen atoms at vertexes. The polyhedron illustrated in FIG. 3D is a tetrahedral structure. The tetrahedral structure is a structure including a zinc atom at the center and oxygen atoms at vertexes. In the layer 31 and the layer 41, trigonal bipyramidal structures are edge-shared. The trigonal bipyramidal structures are vertex-shared. The tetrahedral structures are vertex-shared. Note that an indium atom exists at the center of the trigonal bipyramidal structure in some cases.

The layer 21 and the layer 31 or the layer 41 are vertex-shared. The layer 31 and the layer 41 are vertex-shared or edge-shared.

Although the crystalline In-M-Zn oxide whose composition is In:M:Zn=1:1:1 [atomic ratio] is given as an example of the oxide 230 in FIG. 2A to FIG. 2C and FIG. 3A, the composition of the oxide 230 is not limited thereto. The oxide 230 may be, for example, a crystalline In-M-Zn oxide whose composition formula is represented by $In_{(1+\alpha)}M_{(1-\alpha)}O_3(ZnO)_m$ ($\alpha$ is a real number greater than 0 and less than 1 and m is a positive number). If m is a real number greater than 0 and less than 1, a plurality of parts where the layers are positioned between the two layers 21 exist and some of the parts might be composed of only the layer 31. Alternatively, if m is a real number greater than 1, some of the plurality of parts where the layer are positioned between the two layers 21 might be composed of the layer 31 and two or more layers 41.

As the element M, elements having different valences may be combined. For example, an In-M-Zn oxide containing, as the elements M, a metal element having a valence of +3 (an element Ma) and a metal element having a valence of +2 (an element Mb) preferably includes a crystal having repetitive stacking of a first layer including one or both of indium and the element Ma and oxygen, a second layer including one or both of indium and the element Ma and oxygen, and a third layer including the element Mb, zinc, and oxygen in this order. This enables a reduction in the cation disorder, which leads to an increase in the mobility of the metal oxide.

<Effect of Random Arrangement in Cations on Metal Oxide>

In this section, an effect of random arrangement in cations on the metal oxide is described with first-principles calculation results.

A path for carriers (also referred to as conduction electrons), i.e., the wave function of the conduction band is important for examination of the carrier transfer mechanism. For example, if the wave function of the conduction band is localized, the carrier transfer is inhibited, which lowers the mobility. Thus, first-principles calculation in this section is performed focusing on distribution of the valences of cations and localization of the wave function of the conduction band in the crystal structure of the In—Ga—Zn oxide.

As a simulation model used for the first-principles calculation, a crystal structure of an In—Ga—Zn oxide with In:Ga:Zn:O=1:1:1:4 [atomic ratio] is prepared. The crystal structure has the layered structure illustrated in FIG. 2A, and Ga having a valence of +3 or Zn having a valence of +2 is placed in a cation site of a layer positioned between layers each including In and O.

Figure 4A:
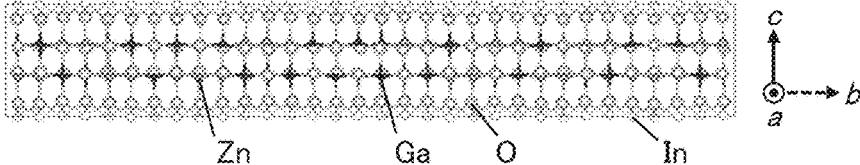
FIG. 4A is a diagram illustrating a simulation model.

FIG. 4A illustrates the simulation model. In FIG. 4A, the c-axis direction of the simulation model is indicated by the solid arrow. The b-axis direction of the simulation model is indicated by the dashed arrow. The a-axis direction of the simulation model is the direction perpendicular to the c-axis direction indicated by the solid arrow and the b-axis direction indicated by the dashed arrow. At this time, the a-c plane is the direction perpendicular to the b-axis direction indicated by the dashed arrow. The number of atoms placed in the simulation model is 288.

Figure 4B:
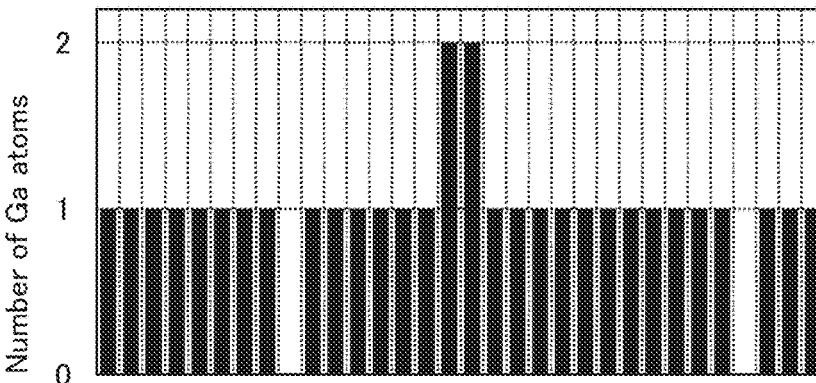
FIG. 4B is a diagram illustrating the number of Ga atoms.

FIG. 4B shows the number of Ga atoms in the a-c plane. In FIG. 4B, the horizontal axis represents the coordinates along the b-axis and the vertical axis represents the number of Ga atoms in the a-c plane. As shown in FIG. 4B, a region where Ga atoms are aggregated (a region where the number of Ga atoms is 2 in FIG. 4B) in the a-c plane and a region where Zn atoms are aggregated (a region where the number of Ga atoms is 0 in FIG. 4B) in the a-c plane are provided in the simulation model.

The first-principles calculation is performed using the simulation model illustrated in FIG. 4A to calculate the wave function of the conduction band. For the simulation, the first-principles simulation software VASP (Vienna Ab initio simulation Package) was used. The simulation conditions are listed in Table 1.

TABLE 1

| Simulation program | VASP |
|---|---|
| Basis function | Plane wave |
| Functional | GGA-PBE |
| Pseudopotential | PAW |
| Cut-off energy | 500 eV |
| The number of electrons | Neutral |
| k-point grid | $4 \times 1 \times 3$ |
| The number of atoms | 288 |

As a pseudopotential of electronic states, a potential generated by a Projector Augmented Wave (PAW) method was used, and as a functional, GGA-PBE (Generalized-Gradient-Approximation-Perdew-Burke-Emzerhof) was used.

Next, the wave function of the conduction band minimum obtained by the above simulation is projected along the b-axis. Then, the square of the absolute value of the wave function of the conduction band minimum projected along the b-axis is calculated. Note that the square of the absolute value of the wave function wave function is referred to as electron density in some cases.

Figure 4C:
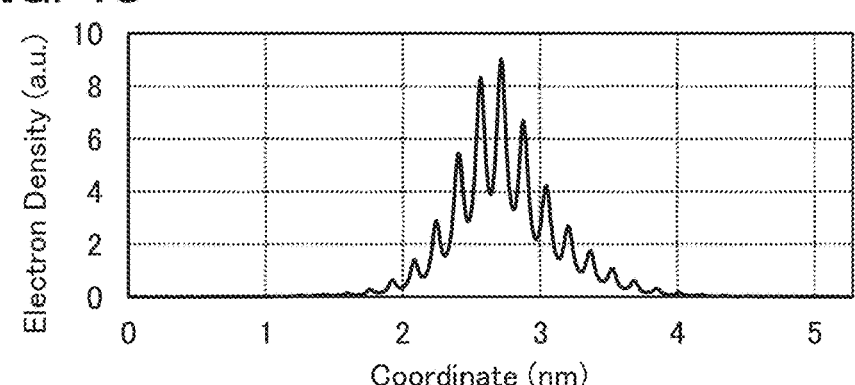
FIG. 4C is a diagram illustrating electron density of the conduction band minimum.

FIG. 4C shows electron density of the conduction band minimum projected along the b-axis direction. In FIG. 4C, the horizontal axis represents a coordinate [nm] along the b-axis, and the vertical axis represents the electron density of the conduction band minimum [a. u.] projected along the b-axis direction. As shown in FIG. 4C, the state where the electron density of the conduction band minimum is localized mostly in the region where Ga atoms are aggregated can be seen. That is, the wave function of the conduction band minimum is localized in the region where Ga atoms are aggregated. In other words, localization of conduction electrons in the region where Ga atoms are aggregated is suggested.

Then, the state density projected into the real space is calculated. The state density projected into the real space is also referred to as local density of states (LDOS). The LDOS is calculated from the following formula.

[Formula 1]

$$LDOS(E, z) =$$

$$\frac{1}{\sqrt{2\pi}\sigma} \int_{Emin}^{Emax} \int_{x=0}^{x=a} \int_{y=0}^{y=b} \sum_{ik,ib} |\psi_{ik}^{ib}(x, y, z)|^2 \exp\left(-\frac{E - \varepsilon_{ik,ib}}{2\sigma^2}\right) dxdydE$$

Figure 4D:
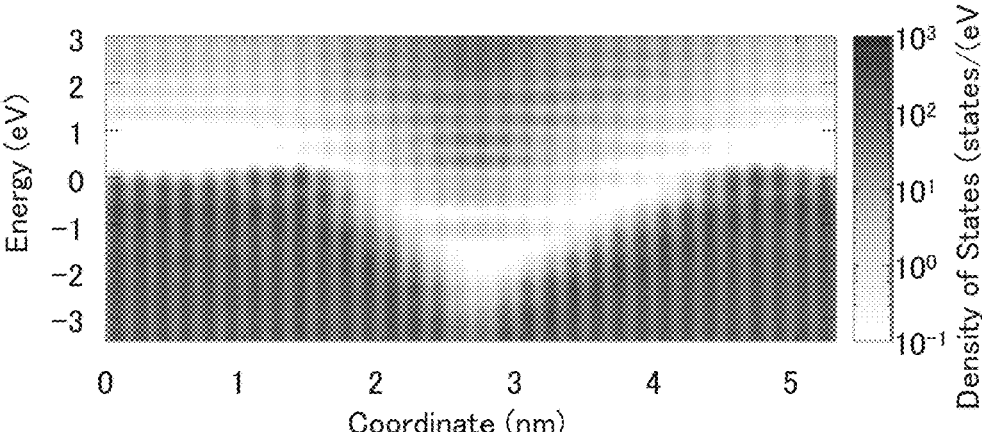
FIG. 4D is a diagram illustrating a map of LDOS.

Here, E is energy, x, y, and z are coordinates, $\sigma$ is a blur width, $\psi$ is a wave function, and E is a characteristic value. FIG. 4D illustrates a map of the calculated LDOS. In FIG. 4D, the horizontal axis represents a coordinate [nm] along the b-axis, and the vertical axis represents energy [eV]. Specifically, the LDOS value is larger as the color becomes darker (blacker), and the LDOS value is smaller as the color becomes lighter (whiter).

In FIG. 4D, the valence band maximum is located on the low energy side in the energy values within a range where the LDOS value significantly changes. For example, at a horizontal axis value of 0 nm, the valence band maximum is located around an energy value of 0 eV. The conduction band minimum is located on the high energy side in the energy values within a range where the LDOS value significantly changes. For example, at a horizontal axis value of 0 nm, the conduction band minimum is located around an energy value of 1.5 eV.

According to FIG. 4D, the state where the conduction band minimum is depressed on the low energy side in the region where Ga atoms are aggregated is observed. In other words, the state where the conduction band (also referred to as a band) is significantly bent in a region where conduction electrons are localized is observed. It can be seen that the bending of the band is saturated from the Ga aggregation region to a region with less Ga (much Zn), and a flat band is formed in the other region (the vicinity of a horizontal axis value of 0 nm or the vicinity of a horizontal axis value of 5 nm).

Thus, in the layer positioned between the layers including In and O, the localization of Ga with a high valence (the occurrence of a valence bias) results in an electrostatic potential slope. Then, an electric field is applied and the band is bent, which probably causes the localization of the wave function of the conduction band minimum (localization of conduction electrons).

The above indicates that the aggregation of Ga atoms in cation sites where different valences can be arranged (valence bias) causes the bending of the band (localization of conduction electrons), which is a factor of the scattering of electric conduction, resulting in a reduction in mobility. Hence, reducing the aggregation of Ga atoms can inhibit the reduction in mobility.

Next, a simulation model different from the above simulation model is described below.

Figures 5A, 5B:
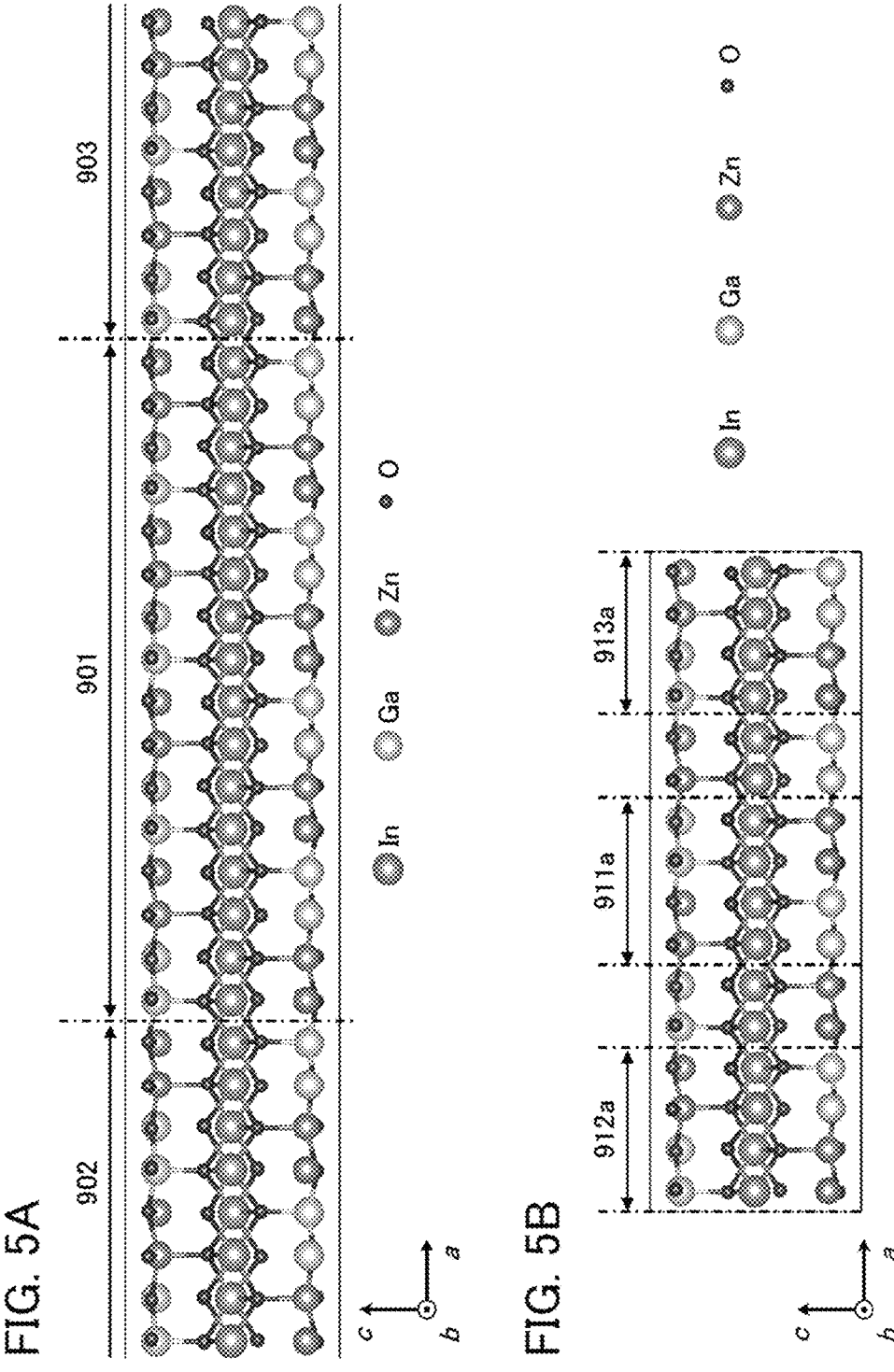
FIG. 5A and FIG. 5B are diagrams illustrating simulation models.

The simulation model different from the simulation model used for the above simulation is illustrated in FIG. 5A. The simulation model illustrated in FIG. 5A is a crystal model of IGZO including In, Ga, Zn, and O. A region 901 corresponds to a channel formation region, a region 902 corresponds to one of a source region and a drain region, and a region 903 corresponds to the other of the source region and the drain region.

In the simulation model of this simulation, as illustrated in FIG. 5A, the a-axis direction is the direction from the region 902 toward the region 903, the c-axis direction is the direction perpendicular to a layer composed of In and O (referred to as an InO layer in some cases), and the b-axis direction is the direction perpendicular to the a-axis direction and the c-axis direction.

Here, simulation models (Model 1A to Model 1E), between which the region 902 and the region 903 are common and the region 901 has a difference in the cation arrangement, are prepared. The region 901 of Model 1A is illustrated in FIG. 5B, the region 901 of Model 1B is illustrated in FIG. 6A, the region 901 of Model 1C is illustrated in FIG. 6B, the region 901 of Model 1D is illustrated in FIG. 6C, and the region 901 of Model 1E is illustrated in FIG. 6D.

A region 911a illustrated in FIG. 5B is a region for rearrangement of the cations in Model 1A. A region 912a and a region 913a are fixed layers in Model 1A. The term fixed layer refers to an electrode region (the region 902 or the region 903) in conductance calculation. As illustrated in FIG. 5B, arrangement of Ga atoms is not biased with respect to the a-axis and the c-axis in Model 1A.

A region 911b illustrated in FIG. 6A is a region for rearrangement of the cations in Model 1B. A region 912b and a region 913b are fixed layers in Model 1B. In the region 911b, the cation arrangement in the region surrounded by the dotted line in FIG. 6A is different from that in the corresponding portion of the region 911a. Specifically, the region 911b has the cation arrangement where Ga and Zn in the region surrounded by the dotted line in FIG. 6A are transposed from those in the corresponding portion of the region 911a are transposed. That is, arrangement of Ga atoms is biased with respect to the a-axis in Model 1B.

A region 911c illustrated in FIG. 6B is a region for rearrangement of the cations in Model 1C. A region 912c and a region 913c are fixed layers in Model 1C. In the region 911c, the cation arrangement in the two regions surrounded by the dotted lines in FIG. 6B is different from that in the corresponding portions of the region 911a. Specifically, region 911c has the cation arrangement where Ga and Zn in the two regions surrounded by the dotted line in FIG. 6A are transposed from those in the corresponding portion of the region 911a are transposed. That is, arrangement of Ga atoms is not biased with respect to the a-axis in Model 1C.

A region 911d illustrated in FIG. 6C is a region for rearrangement of the cations in Model 1D. A region 912d and a region 913d are fixed layers in Model 1D. In the region 911d, the cation arrangement in the region surrounded by the dotted line and the region surrounded by the broken line in FIG. 6C is different from that in the corresponding portion of the region 911a. Specifically, the region 911d has the arrangement where the cations in the region 911a corresponding to the region surrounded by the dotted line in FIG. 6C and the cations in the region 911a corresponding to the region surrounded by the broken line in FIG. 6C are transposed. That is, arrangement of Ga atoms is biased with respect to the c-axis in Model 1D.

A region 911e illustrated in FIG. 6D is a region for rearrangement of the cations in Model 1E. A region 912e and a region 913e are fixed layers in Model 1E. In the region 911e, the cation arrangement in the region surrounded by the dotted line and the region surrounded by the broken line in FIG. 6D is different from that in the corresponding portion of the region 911a. Specifically, the region 911e has the arrangement where the cations in the region 911a corresponding to the region surrounded by the dotted line in FIG. 6D and the cations in the region 911a corresponding to the region surrounded by the broken line in FIG. 6D are transposed. That is, arrangement of Ga atoms is biased with respect to the a-axis in Model 1E.

First-principles calculation is performed using Model 1A to Model 1E to calculate state density and LDOS. For the simulation, first-principles calculation software VASP capable of electronic state calculation based on density functional theory (DFT) is used. The simulation conditions are listed in Table 2.

TABLE 2

| Simulation program (Software) | VASP |
|---|---|
| Exchange-Correlation Functional | GGA + U |
| Pseudopotentials | PAW |
| Cut-off Energy | 500 eV |
| k-point grid (k-point spacing) | <0.5 (1/nm) |
| U-parameters | Metal: 10 eV, O: 20 eV |

Here, a DFT+U method is employed in the first-principles calculation. In a DFT+U method, the on-site•Coulomb U parameter (U-parameter) is set for each of the atoms (In, Ga, Zn, and O in the case of IGZO) forming the simulation models. As shown in Table 2, the U parameter of each metal atom (In, Ga, and Zn) is set to 10 eV and the U parameter of an oxygen atom is set to 20 eV in the case where VASP is used as the first-principles calculation software. Accordingly, the value of the band gap obtained by the simulation can be close to the actually measured value of the band gap.

Figures 7A, 7B:
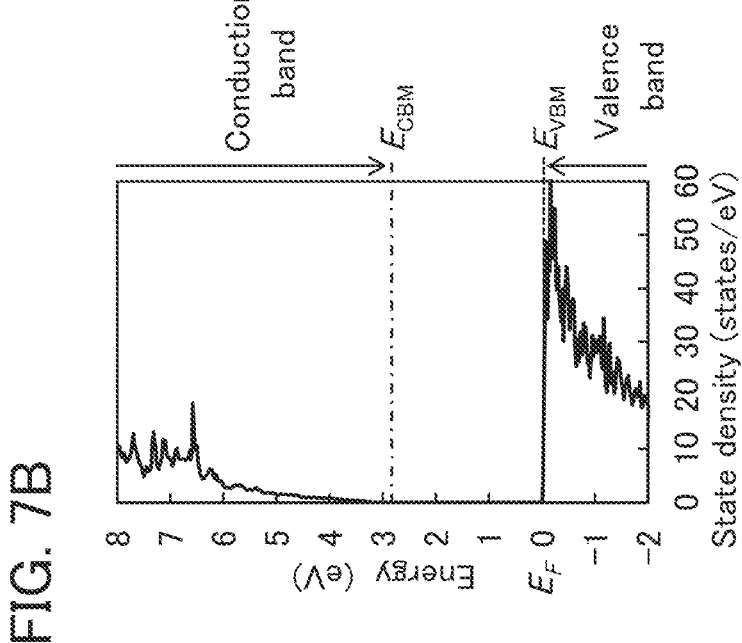
FIG. 7A is a diagram illustrating a map of LDOS.
FIG. 7B is a diagram illustrating state density.

FIG. 7A illustrates a map of the LDOS calculated for Model 1A. In FIG. 7A, the horizontal axis represents a coordinate in the a-axis direction [nm] and the vertical axis represents energy [eV]. Specifically, the LDOS value is larger as the color becomes darker (blacker), and the LDOS value is smaller as the color becomes lighter (whiter). In FIG. 7A, $E_F$ denotes Fermi energy.

According to FIG. 7A, almost no bending of the band in the region 911a is confirmed. This means that a flat band can be obtained in Model 1A where the number of Ga atoms is not biased with respect to the a-axis direction (carrier conduction direction).

FIG. 7B shows the state density calculated for Model 1A. In FIG. 7B, the horizontal axis represents state density [states/eV], and the vertical axis represents energy [eV]. In FIG. 7B, $E_F$ denotes Fermi energy, $E_{VBM}$ denotes energy of the valence band maximum, and $E_{CBM}$ denotes energy of the conduction band minimum.

Figures 9A, 9B, 9C, 9D:
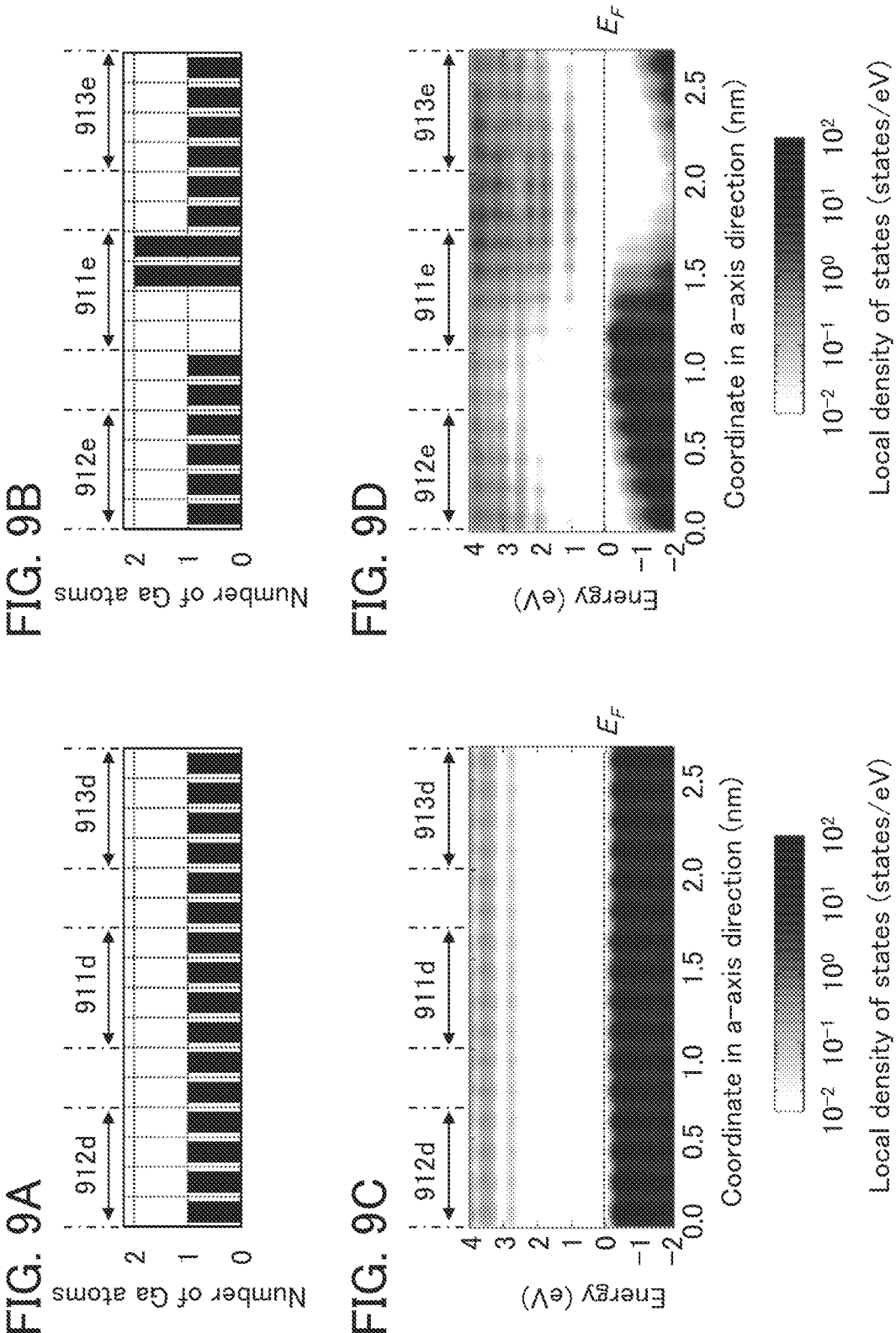
FIG. 9A and FIG. 9B are diagrams each illustrating the number of Ga atoms.
FIG. 9C and FIG. 9D are diagrams each illustrating a map of LDOS.

FIG. 8A illustrates the number of Ga atoms in the b-c plane in Model 1B. FIG. 8B illustrates the number of Ga atoms in the b-c plane in Model 1C. FIG. 9A illustrates the number of Ga atoms in the b-c plane in Model 1D. FIG. 9B illustrates the number of Ga atoms in the b-c plane in Model 1E. In each of FIG. 8A, FIG. 8B, FIG. 9A, and FIG. 9B, the horizontal axis corresponds to a coordinate in the a-axis direction, and the vertical axis represents the number of Ga atoms in the b-c plane.

As illustrated in FIG. 8A and FIG. 9B, arrangement of Ga atoms is biased with respect to the a-axis in Model 1B and Model 1E. As illustrated in FIG. 8B and FIG. 9A, arrangement of Ga atoms is not biased with respect to the a-axis in Model 1C and Model 1D.

FIG. 8C illustrates a map of the LDOS calculated for Model 1B. FIG. 8D illustrates a map of the LDOS calculated for Model 1C. FIG. 9C illustrates a map of the LDOS calculated for Model 1D. FIG. 9D illustrates a map of the LDOS calculated for Model 1E. In FIG. 8C, FIG. 8D, FIG. 9C, and FIG. 9D, the horizontal axis represents a coordinate in the a-axis direction [nm] and the vertical axis represents energy [eV]. Specifically, the LDOS value is larger as the color becomes darker (blacker), and the LDOS value is smaller as the color becomes lighter (whiter).

According to FIG. 8C and FIG. 9D, bending of the band can be confirmed in Model 1B and Model 1E. According to FIG. 8D, slight bending of the band can be confirmed in Model 1C. According to FIG. 9C, almost no bending of the band can be confirmed in Model 1D.

According to the above, owing to the structure where arrangement of Ga atoms is biased with respect to the a-axis, the difference between the valence of Ga (+3) and the valence of Zn (+2) presumably allows electric dipole formation, which results in an electrostatic potential slope. At this time, the conduction band minimum fluctuates, so that the conduction of carriers is hindered (mainly electrons in the case of IGZO). This presumably causes carrier scattering in the real space. By contrast, the above indicates that unbiased arrangement of Ga atoms with respect to the a-axis does not cause carrier scattering.

Next, carrier scattering is described using the first-principles calculation results. Specifically, an examination is made of whether carrier flowing from the fixed layer (the region 912a to the region 912e) in contact with the region 902 to the fixed layer (the region 913a to the region 913e) in contact with the region 903 is scattered in the region (the region 911a to the region 911e) where the cation arrangement is transposed. In this case, the direction of carrier conduction is the direction along the a-axis.

Here, conductance calculation based on first principles is performed using the non-equilibrium Green's function (NEGF) method to find conductance and transmittance.

Conductance is the reciprocal of electric resistance and is an indicator of the ease of current flow. A conductance G is calculated by the following formula.

$$G = \left(\frac{e^2}{h}\right)\int_{-\infty}^{+\infty} dE \, \mathcal{T}(E)\left(-\frac{\partial f(E)}{\partial E}\right)_{E=\mu_c} \qquad \text{[Formula 2]}$$

In the above formula, E is energy, T(E) is transmittance at the energy E, f(E) is the Fermi distribution function, and $\mu_C$ is a chemical potential. In other words, the conductance G can be calculated by calculation of the transmittance T(E) at the energy E. The transmittance T(E) at the energy E is simply referred to as transmittance T in some cases below.

The transmittance T(E) at the energy E is calculated by the following formula.

$$\tau(E) = Tr[\text{Im}\Sigma_L(E)G^\dagger(E)\text{Im}\Sigma_R(E)G(E)] \qquad \text{[Formula 3]}$$

In the above formula, $\Sigma_L(E)$ and $\Sigma_R(E)$ are self-energies at the energy E, and G(E) is the Green's function at the energy E.

First-principles calculation is performed using Model 1A to Model 1E to calculate transmittance and conductance. For the calculation, simulation program software OpenMX based on DFT is used. The simulation conditions are listed in Table 3.

TABLE 3

| Simulation program (Software) | OpenMX |
|---|---|
| Exchange-Correlation Functional | GGA + U |

TABLE 3-continued

| Pseudo Atomic Orbitals | Metal: s1p1d1, O: s2p2d1 |
|---|---|
| Cut-off Energy | 160 Ry |
| k-point Mesh Electrode region (Electrode) | 141 × 3 × 5 |
| Channel formation region (transverse) (Channel(transverse)) | SCF: 3 × 5, NEGF: 21 × 35 |
| U-parameters | Metal: 10 eV, O: 3.7 eV |

Here, a DFT+U method is employed in the first-principles calculation. As shown in Table 3, the U parameter of each metal atom (In, Ga, and Zn) is set to 10 eV and the U parameter of an oxygen atom is set to 3.7 eV in the case where OpenMX is used as the first-principles calculation software. Accordingly, the value of the band gap obtained by the simulation can be close to the actually measured value of the band gap.

Figure 10A:
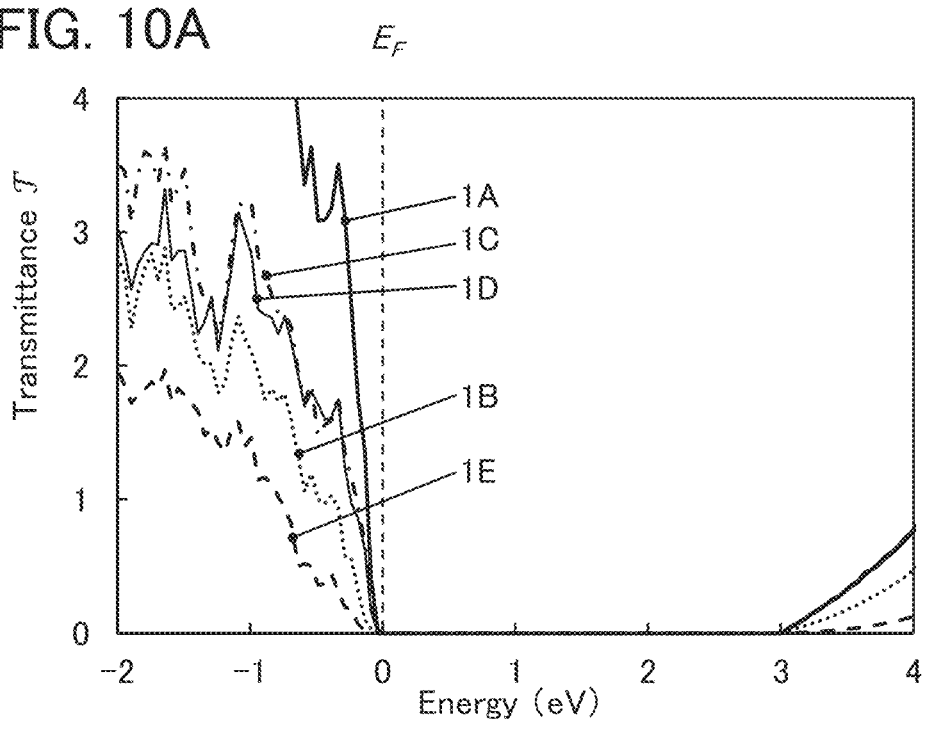
FIG. 10A and FIG. 10B are diagrams each illustrating transmittance.
Figure 10B:
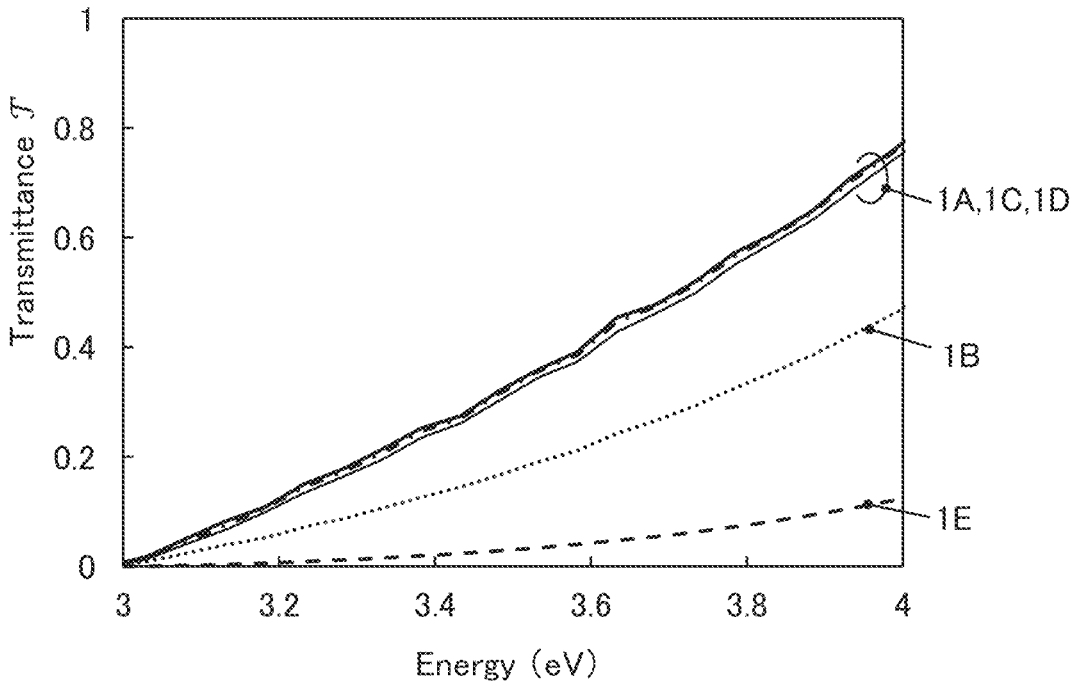

Transmittance spectra of Model 1A to Model 1E obtained by the simulation using the NEGF method are shown in FIG. 10A and FIG. 10B. FIG. 10A shows spectra of the transmittance around the band gap of each model, and FIG. 10B shows spectra of the transmittance at the conduction band minimum and its vicinity of each model. In FIG. 10A and FIG. 10B, the horizontal axis represents energy [eV], and the vertical axis represents transmittance T.

FIG. 10A and FIG. 10B reveal that Model 1A exhibits the highest transmittance among Model 1A to Model 1E. In addition, Model 1E exhibits the lowest transmittance. Note that the transmittance at the conduction band minimum and its vicinity of each of Model 1C and Model 1D is almost equal to the transmittance of Model 1A.

In view of the above results and the above-described simulation results concerning the bending of the band, it is found that the transmittance is significantly reduced in a structure where the band is significantly bent. This indicates that carriers tend to be scattered owing to cation valences biased in the conduction direction. In other words, the above indicates that a reduction in electron mobility can be inhibited by diminishing the cation valence bias in the conduction direction.

Figure 11:
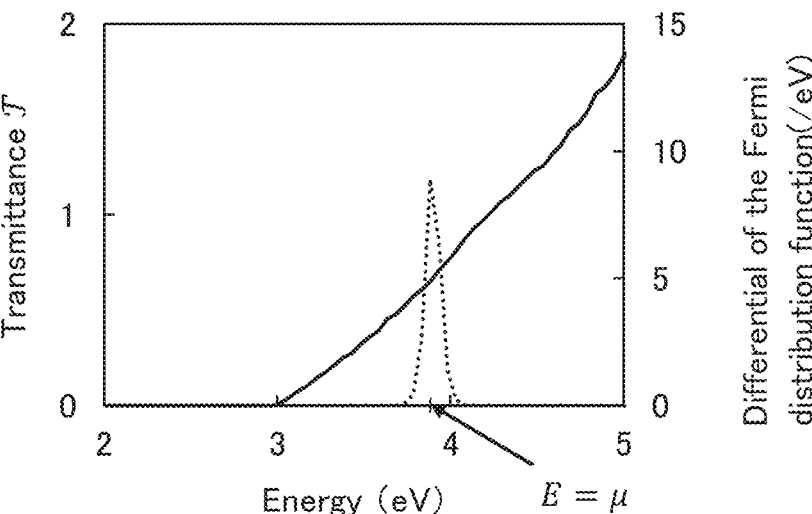
FIG. 11 is a diagram illustrating transmittance and the differential of a Fermi distribution function.

FIG. 11 shows a transmittance spectrum of Model 1A and a form obtained by differentiating the Fermi distribution function. In FIG. 11, the horizontal axis represents energy [eV], the first vertical axis (left vertical axis) represents transmittance T, and the second vertical axis (right vertical axis) represents the differential of the Fermi distribution function [/eV]. The solid line in FIG. 11 represents the spectrum of the transmittance of Model 1A, and the dotted line in FIG. 11 represents the form obtained by differentiating the Fermi distribution function. Note that the Fermi distribution function is calculated at a carrier concentration set to $6\times10^{20}$ cm$^{-3}$ and an electron temperature set to 300 K.

Table 4 shows the conductance calculated for each of Model 1A to Model 1E.

TABLE 4

| Model | Conductance (×e²/h) |
|---|---|
| 1A | 6.67 |
| 1B | 3.96 |
| 1C | 6.62 |
| 1D | 6.47 |
| 1E | 0.96 |

According to Table 4, the conductance of Model 1A is the highest and the conductance of Model 1E is the lowest. The conductances of Model 1C and Model 1D are almost equal to the conductance of Model 1A.

FIG. 12 and FIG. 13A to FIG. 13D show transmission electron density in Model 1A to Model 1E. In FIG. 12 and FIG. 13A to FIG. 13D, a plane indicated by a mesh is an isosurface of electron density where the carrier concentration is $6 \times 10^{20}$ cm$^{-3}$ and the isosurface level is 22 nm$^{-3}$.

Figure 12:
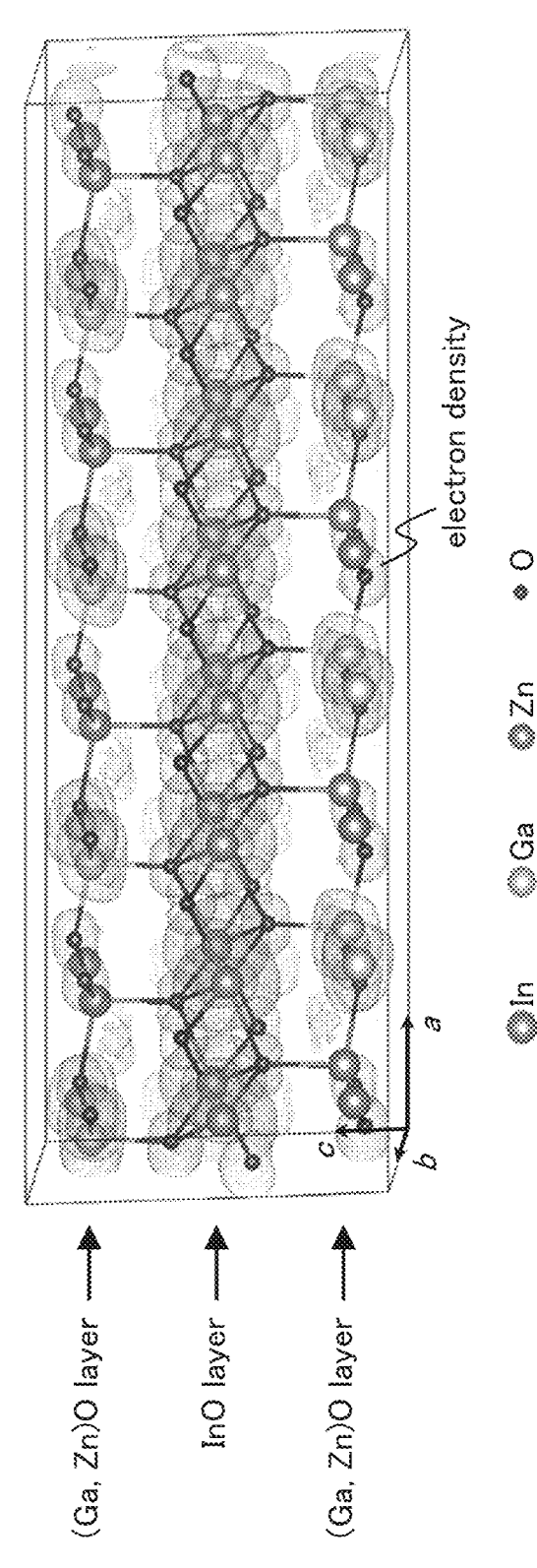
FIG. 12 is a diagram illustrating transmission electron density.

FIG. 12 shows that the density of transmitted electrons is continuously present in the InO layer. Furthermore, it is found that the density of transmitted electrons is present around a Ga atom compared with around a Zn atom. This indicates that a Ga atom more contributes to carrier transport than a Zn atom. In addition, the existence of the density of a transmitted electron derived from the s-orbital of an O atom is confirmed. Thus, presumably, conduction through the s-orbital of an O atom is not negligible.

Figures 13A, 13B, 13C, 13D:
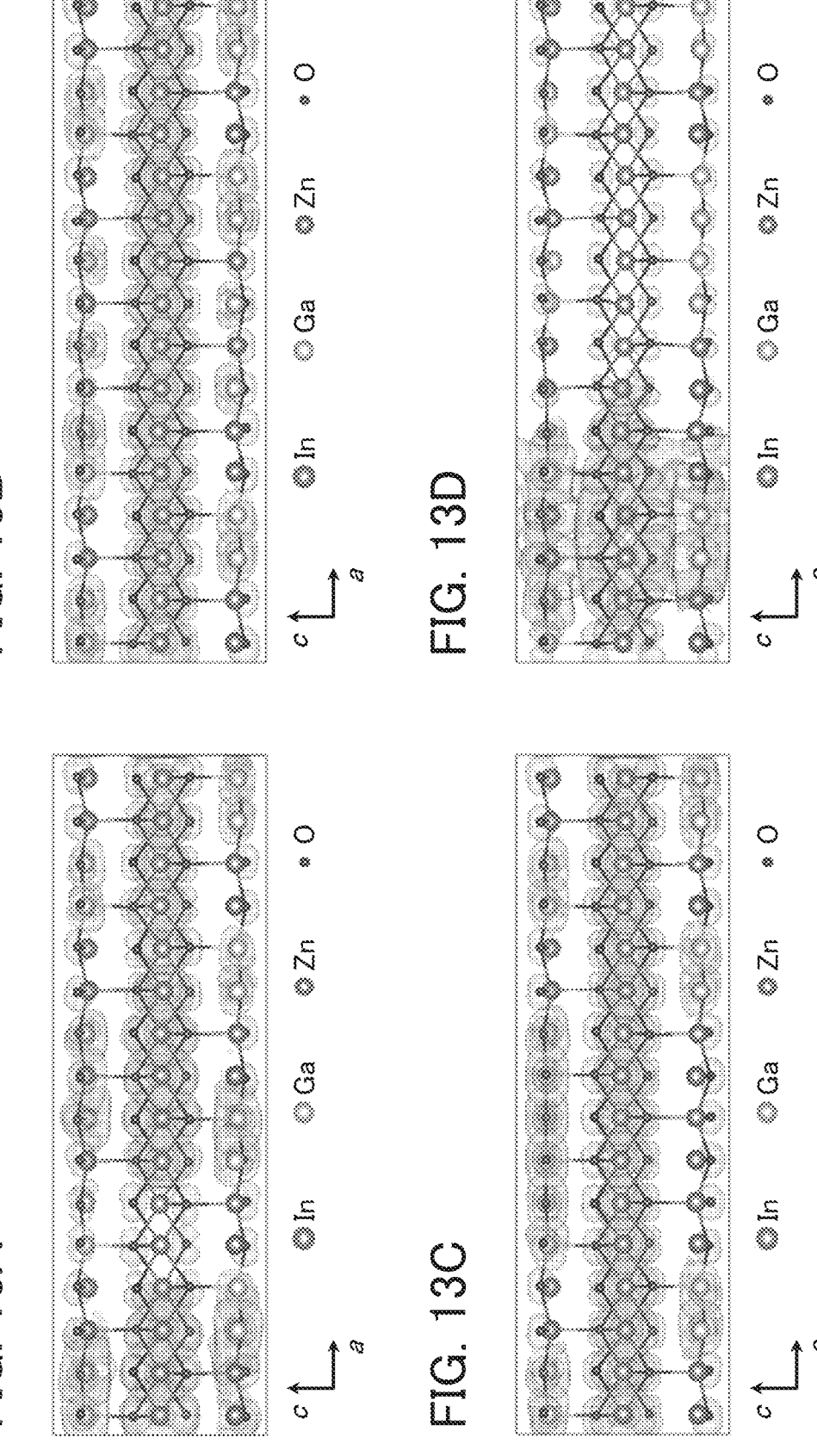
FIG. 13A to FIG. 13D are diagrams each illustrating transmission electron density.
Figure 14A:
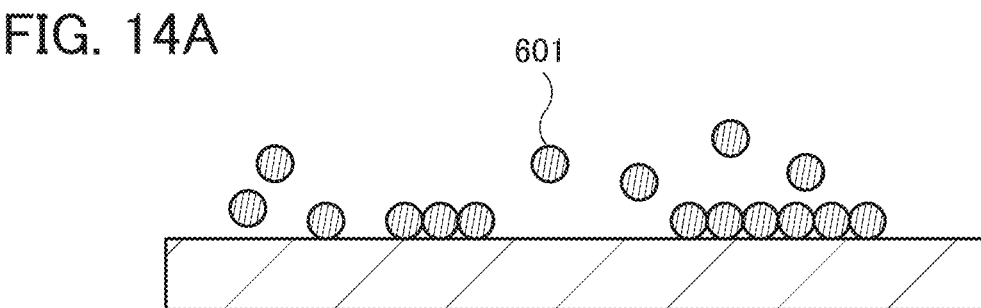
FIG. 14A to FIG. 14D are cross-sectional views illustrating a deposition method.
Figure 14B:
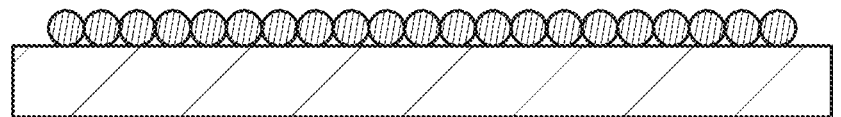
Figure 14C:
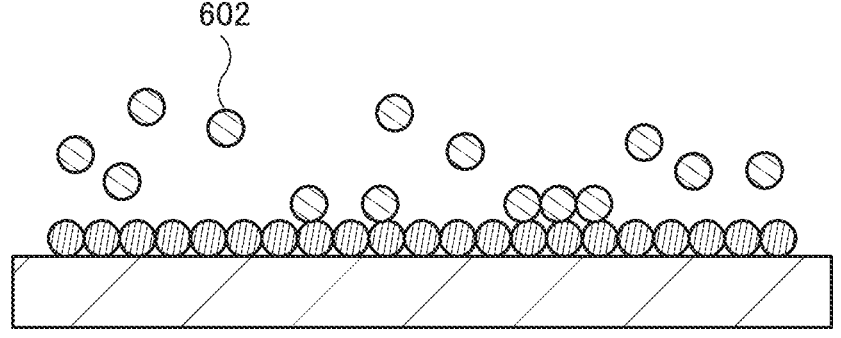
Figure 14D:
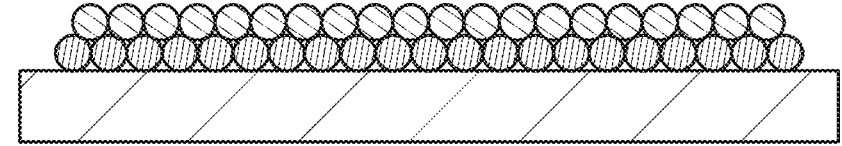

FIG. 8C and FIG. 13A reveal that although carrier scattering occurs in the region where the band is curved and its vicinity, some carriers are transmitted in Model 1B. According to FIG. 13B, carrier scattering is not clearly observed in Model 1C. FIG. 13C indicates selective conduction of carriers through the positions of Ga atoms in Model 1D. FIG. 9D and FIG. 13D reveal that carrier scattering occurs in the region where the band is curved and its vicinity and carriers are hardly transmitted in Model 1E.

The above demonstrates that random arrangement in cations (Ga and Zn) reduces transmittance. This tendency is found to be evident particularly in the structure where the number of Ga atoms is not biased in the conduction direction. It is also found that the band is significantly bent in the structure involving a significant reduction in transmittance. It is also found that the conduction path exists in In and Ga, which have a high valence. In addition, it is found that the transmittance is significantly reduced in the region where the band is curved and its vicinity.

The above is the description of the influence of the random arrangement in cations in the metal oxide.

As examples of a deposition method of a metal oxide, a sputtering method, a chemical vapor deposition (CVD) method, a molecular beam epitaxy (MBE) method, a pulsed laser deposition (PLD) method, an atomic layer deposition (ALD) method, and the like can be given.

For the formation of a crystalline metal oxide with reduced cation disorder, atoms are preferably deposited for each layer. For example, as a formation method of the metal oxide, an ALD method can be used.

In an ALD method, one atomic layer can be deposited at a time using self-regulating characteristics of precursor molecules or atoms included in the precursor. Hence, an ALD method has effects such as deposition of an extremely thin film, deposition of a film on a component with a large aspect ratio, deposition of a film with a small number of defects such as pinholes, deposition of a film with excellent coverage, and deposition of a film at a low temperature. An ALD method includes a plasma ALD (PEALD: Plasma Enhanced ALD) method, which is a deposition method using plasma. The use of plasma is sometimes preferable because deposition at a lower temperature is possible. Note that a precursor used in an ALD method sometimes contains an element such as carbon or chlorine. Thus, in some cases, a film provided by an ALD method contains a larger amount of an element such as carbon or chlorine than a film provided by another deposition method. Note that these elements can be quantified by X-ray photoelectron spectroscopy (XPS).

Unlike a deposition method in which particles ejected from a target or the like are deposited, an ALD method is a deposition method in which a film is formed by reaction at a surface of an object. Thus, an ALD method is a deposition method that enables favorable step coverage almost regardless of the shape of an object. In particular, an ALD method enables excellent step coverage and excellent thickness uniformity and thus is suitable for covering a surface of an opening portion with a high aspect ratio, for example. Note that an ALD method has a relatively low deposition rate; thus, it is sometimes preferable to combine an ALD method with another deposition method with a high deposition rate such as a CVD method.

When an ALD method is employed, the composition of a film to be formed can be controlled with the amount of introduced source gases. For example, a film with a certain composition can be deposited depending on the amount of introduced source gases and the number of times of introduction (also referred to as the number of pulses) in an ALD method. Moreover, for example, when the source gas is changed during the deposition in an ALD method, a film in which the composition is continuously changed can be deposited. In the case of depositing a film while changing the source gas, time taken for the deposition can be shortened because time taken for transfer and pressure adjustment is omitted, as compared with the case of depositing a film with the use of a plurality of deposition chambers. Thus, the productivity of semiconductor devices can be improved in some cases.

<Deposition Method Using ALD Apparatus and ALD Method>

Here, a deposition apparatus using an ALD method (hereinafter, also referred to as an ALD apparatus) which can be used for forming the metal oxide of one embodiment of the present invention and a deposition method using an ALD method are described.

In a deposition apparatus utilizing an ALD method, deposition is performed in such a manner that a first source gas (also referred to as a precursor or a metal precursor) and a second source gas (also referred to as a reactant or a nonmetallic precursor) are alternately introduced into a chamber, and then the introduction of these source gases is repeated. Note that the source gases to be introduced can be switched by switching the respective switching valves (also referred to as high-speed valves), for example. When the source gases are introduced, an inert gas such as nitrogen (N$_2$) or argon (Ar) may be introduced as a carrier gas with the source gases into the chamber. With the use of a carrier gas, the source gases can be inhibited from being adsorbed onto an inner side of a pipe or an inner side of a valve and can be introduced into the chamber, even in the case where the volatility of the source gases is low or the vapor pressure is low. Moreover, uniformity of the formed film is improved, which is preferable.

An example of a deposition method using an ALD method is described with reference to FIG. 14A to FIG. 14D. First, a first source gas is introduced into a chamber (see FIG. 14A) and a precursor 601 is adsorbed onto a substrate surface (a first step). Here, the precursor 601 is adsorbed onto the substrate surface, whereby a self-limiting mechanism of surface chemical reaction works and no more precursor is adsorbed onto a layer of the precursor over the substrate (see FIG. 14B). Note that the proper range of substrate temperatures at which the self-limiting mechanism of surface chemical reaction works is also referred to as an ALD Window. The ALD Window is determined by the temperature characteristics, vapor pressure, decomposition temperature, and the like of a precursor and is set to higher than or equal to 100° C. and lower than or equal to 500° C., preferably higher than or equal to 200° C. and lower than or equal to 400° C. Next, an excessive precursor, a reaction product, and the like are released from the chamber by vacuum evacuation (a second step). Alternatively, instead of performing vacuum evacuation, an inert gas (e.g., argon or nitrogen) or the like may be introduced into the chamber to release an excessive precursor, a reaction product, and the like from the chamber. The second step is also called purge. Next, a reactant 602 (e.g., an oxidizer (ozone ($O_3$), oxygen ($O_2$), water ($H_2O$), and plasma, a radical, and an ion thereof)) is introduced as a second source gas into the chamber (see FIG. 14C) to react with the precursor 601 adsorbed onto the substrate surface, whereby part of components contained in the precursor 601 is released while the component molecules of the film are kept adsorbed onto the substrate (a third step) (see FIG. 14D). After that, an excessive reactant 602, a reaction product, and the like are released from the chamber by vacuum evacuation or introduction of an inert gas (a fourth step).

Note that in the following description of this specification, in the case of using ozone, oxygen, and water as a reactant or an oxidizer, they include not only those in gas and molecular states but also those in a plasma state, a radical state, and in an ion state, unless otherwise specified. In the case where a film is deposited using an oxidizer in a plasma state, a radical state, or an ion state, a radical ALD apparatus or a plasma ALD apparatus, which will be described later, is used.

Water is preferably used as an oxidizer to remove carbon contained in the precursor. Hydrogen contained in water reacts with carbon contained in the precursor, whereby carbon can be released from the precursor efficiently. On the other hand, in order to reduce hydrogen contained in a film to be formed as much as possible, ozone or oxygen, which does not contain hydrogen, is preferably used as the oxidizer. Alternatively, after water is introduced as a first oxidizer to the chamber to remove carbon contained in the precursor, vacuum evacuation is performed, hydrogen is removed by introducing ozone or oxygen, which does not contain hydrogen, as a second oxidizer to the chamber, and vacuum evacuation is performed. After that, the first step to the fourth step are repeated until a desired thickness is obtained.

Note that in the above description, an example in which the second source gas is introduced into the chamber after the first source gas is introduced into the chamber is shown; however, one embodiment of the present invention is not limited thereto. The first source gas may be introduced into the chamber after the second source gas is introduced into the chamber. That is, deposition may be performed in such a manner that the third step is performed first, the fourth step is performed subsequently, and then the first step, the second step, the third step, and the fourth step are repeated. Alternatively, deposition may be performed in such a manner that the third step and the fourth step are repeated a plurality of times, and then the first step to the fourth step are repeated.

In this manner, the third step and the fourth step are preferably performed once or more before the first step because the deposition atmosphere in the chamber can be controlled. For example, an oxidizer is introduced as the third step, so that the chamber can have an oxygen atmosphere. Deposition began in an oxygen atmosphere is preferable because the formed film can have a high concentration of oxygen. Furthermore, oxygen can also be supplied to the insulator and the oxide that are to be bases of the film. A semiconductor device formed by such a method can have favorable characteristics and obtain high reliability.

After the first step and the second step, introduction of the second source gas in the third step and vacuum evacuation or introduction of an inert gas in the fourth step may be repeated a plurality of times. That is, after the first step, the second step, the third step, the fourth step, the third step, and the fourth step are performed, that is, after the third step and the fourth step are repeated, the first step and the second step may be performed.

For example, $O_3$ and $O_2$ are introduced as oxidizers in the third step, vacuum evacuation is performed in the fourth step, and then these steps may be repeated a plurality of times.

In the case where the third step and the fourth step are repeated, it is not necessary to repeat the introduction of the same kind of source gas. For example, $H_2O$ may be used as an oxidizer in the third step in the first cycle, and $O_3$ may be used as an oxidizer in the third steps in and after the second cycle.

In this manner, the introduction of an oxidizer and vacuum evacuation (or the introduction of an inert gas) in the chamber are repeated a plurality of times in a short time, whereby excess hydrogen atoms, carbon atoms, chlorine atoms, and the like can be more certainly removed from the precursor adsorbed onto the substrate surface and released to the outside of the chamber. When the number of the kinds of the oxidizer is increased to two, more excess hydrogen atoms and the like can be removed from the precursor adsorbed onto the substrate surface. In this manner, hydrogen atoms are prevented from being taken into the film during the deposition, so that water, hydrogen, and the like contained in the formed film can be reduced.

With the use of such a method, it is possible to form a film of which the released amount of water molecules is greater than or equal to $1.0\times10^{13}$ molecules/cm$^2$ and less than or equal to $1.0\times10^{16}$ molecules/cm$^2$, preferably greater than or equal to $1.0\times10^{13}$ molecules/cm$^2$ and less than or equal to $3.0\times10^{15}$ molecule/cm$^2$ in TDS analysis in a film-surface temperature range of 100° C. to 700° C. or 100° C. to 500° C.

A first layer can be deposited on the substrate surface in the above manner, and a second layer can be stacked over the first layer by performing the first step to the fourth step again. The first step to the fourth step are repeated a plurality of times until a desired film thickness is obtained, whereby a thin film with excellent step coverage can be formed. The thickness of the thin film can be adjusted by the number of repetitions; therefore, an ALD method makes it possible to accurately adjust a film thickness and thus is suitable for a case of fabricating a miniaturized transistor.

A film formed by the above method has a layered structure in some cases. In addition, when a film formed by the above method has a crystal structure, the c-axis of the film is aligned in a direction approximately parallel to the normal direction of the deposition surface. That is, the c-axis of the film is aligned perpendicularly to the deposition surface. In this specification, such a crystal structure may be referred to as a CAAC structure, and an oxide semiconductor (metal oxide) having the CAAC structure may be referred to as a CAAC-OS, the details of which will be described later. It is possible to form a metal oxide having a CAAC structure by an ALD method.

An ALD method is a method in which deposition is performed through reaction of a precursor and a reactant using thermal energy. A temperature required for the reaction between the precursor and the reactant is determined by the temperature characteristics, vapor pressure, decomposition temperature, and the like thereof and is set to higher than or equal to 100° C. and lower than or equal to 500° C., preferably higher than or equal to 200° C. and lower than or equal to 400° C. Moreover, an ALD method in which treatment is performed by introducing a plasma-excited reactant into the chamber as a third source gas in addition to the precursor and the reactant which react with each other is referred to as a plasma ALD method in some cases. In this case, a plasma generation apparatus is provided in the introduction portion of the third source gas. Inductively coupled plasma (ICP) can be used for plasma generation. On the other hand, an ALD method in which reaction between the precursor and the reactant is performed using thermal energy is sometimes referred to as a thermal ALD method.

In a plasma ALD method, deposition is performed by introducing a plasma-excited reactant in the third step. Alternatively, deposition is performed in such a manner that the first step to the fourth step are repeated while a plasma-excited reactant (a second reactant) is introduced. In this case, the reactant introduced in the third step is referred to as a first reactant. In the plasma ALD method, the same material as the above-described oxidizer can be used for the second reactant used as the third source gas. In other words, plasma-excited ozone, oxygen, and water can be used as the second reactant. Other than oxidizer, a nitriding agent may be used as the second reactant. As the nitriding agent, nitrogen ($N_2$) or ammonia ($NH_3$) can be used. A mixed gas of nitrogen ($N_2$) and hydrogen ($H_2$) can also be used as the nitriding agent. For example, a mixed gas of nitrogen ($N_2$) of 5% and hydrogen ($H_2$) of 95% can be used as the nitriding agent. Deposition is performed while plasma-excited nitrogen or ammonia is introduced, whereby a nitride film such as a metal nitride film can be formed.

Argon (Ar) or nitrogen ($N_2$) may be used as a carrier gas for the second reactant. The use of a carrier gas such as argon or nitrogen is preferable because plasma is easily discharged and the plasma-excited second reactant is easily generated. Note that in the case where an oxide film such as a metal oxide film is formed by a plasma ALD method and nitrogen is used as a carrier gas, nitrogen enters the film and a desired film quality cannot be obtained in some cases. In this case, argon is preferably used as the carrier gas.

By an ALD method, an extremely thin film can be deposited to have a uniform thickness. In addition, the coverage of an uneven surface with the film is high.

When deposition is performed by a plasma ALD method, deposition can be performed at a lower temperature than that by a thermal ALD method. By a plasma ALD method, for example, deposition can be performed without decreasing the deposition rate even at 100° C. or lower. Furthermore, in a plasma ALD method, not only an oxidizer but also any of a variety of reactants such as a nitriding agent can be used; therefore, it is possible to form various kinds of films of a nitride, a fluoride, a metal, and the like as well as an oxide.

In the case where a plasma ALD method is employed, as in an ICP method or the like, plasma can be generated in a state apart from a substrate. When plasma is generated in this manner, plasma damage can be reduced.

By the above method, a film that includes, as a component, atoms included in the first source, an oxide film, or a nitride film can be formed.

On the other hand, in the case where a film containing a plurality of metals is formed as the metal oxide, a plurality of precursors are prepared for every metal and sequentially introduced into the chamber.

In the case where an In-M-Zn oxide is formed as the metal oxide, a source gas that contains a first precursor containing indium is introduced into the chamber, and an excess source gas is evacuated (purged). Then, an oxidizer is introduced as a reactant into the chamber, and an excess reactant is evacuated. Next, a source gas that contains a second precursor containing the element M is introduced into the chamber, and an excess source gas is evacuated (purged). Then, an oxidizer is introduced as a reactant into the chamber, and an excess reactant is evacuated. After that, a source gas that contains a third precursor containing zinc is introduced into the chamber, and an excess source gas is evacuated (purged). Subsequently, an oxidizer is introduced as a reactant into the chamber, and an excess reactant is evacuated. The above steps are repeated, whereby a metal oxide including a layer containing indium, a layer containing the element M, and a layer containing zinc can be formed.

The order of introduction of the source gases is not limited to the above. After the source gas containing the first precursor is introduced, the source gas containing the third precursor may be introduced, and then the source gas containing the second precursor may be introduced; the order can be determined as appropriate by a practitioner in accordance with required film properties. In addition, evacuation of an excess source gas and introduction and evacuation of a reactant can be performed as appropriate after the introduction of any of the source gases. Note that the metal oxide is not limited to an In-M-Zn oxide. As described above, the metal oxide preferably contains at least indium or zinc, further preferably contains indium and zinc. Alternatively, the number of kinds of metals contained in the metal oxide may be two, four, or more.

Although an example of forming the In-M-Zn oxide whose composition is In:M:Zn=1:1:1 [atomic ratio] is described above, the order of introducing the source gases is not limited to the above when a crystalline In-M-Zn oxide whose composition formula is represented by $In_{(1+\alpha)}M_{(1-\alpha)}O_3(ZnO)_m$ ($\alpha$ is a real number greater than 0 and less than 1 and m is a positive number) is formed. In the case where m is a real number greater than 0 and less than 1, the source gas containing the first precursor is introduced and then the source gas containing the second precursor is introduced, followed by the step of introducing the source gas containing the first precursor in some cases. Note that evacuation of an excess source gas and introduction and evacuation of a reactant can be performed as appropriate after the introduction of any of the source gases. In the case where m is a real number greater than 1, the source gas containing the first precursor is introduced, the source gas containing the second precursor is then introduced, and the source gas containing the third precursor is further introduced a plurality of times, followed by the step of introducing the source gas containing the first precursor in some cases. Note that the order of introducing the source gas containing the second precursor and the source gas containing the third precursor is not limited to the above. In addition, evacuation of an excess source gas and introduction and evacuation of a reactant can be performed as appropriate after the introduction of any of the source gases.

The atomic ratio of the metals contained in the metal oxide can be controlled by adjusting the number of introduction of the source gases containing precursors containing the desired metals into the chamber and the deposition temperature. For example, in order to increase the atomic ratio of the element M to indium or zinc, the source gas containing the second precursor containing the element M is introduced into the chamber; an excess source gas is evacuated, an oxidizer is introduced as a reactant into the chamber, an excess reactant is evacuated, then the source gas containing the second precursor containing the element M is introduced again into the chamber, an excess source gas is evacuated, an oxidizer is introduced as a reactant into the chamber, and an excess reactant is evacuated.

A plurality of precursors may be introduced into the chamber; for example, the metal oxide containing an In-M-Zn oxide may be formed in the following manner: a source gas containing the first precursor and the second precursor is introduced into the chamber, an excess source gas is evacuated, a reactant is introduced into the chamber, an excess reactant is evacuated, a source gas containing the first precursor and the second precursor is introduced into the chamber, an excess source gas is evacuated, a reactant is introduced into the chamber, an excess reactant is evacuated, a source gas containing the third precursor is introduced into the chamber, an excess source gas is evacuated, a reactant is introduced into the chamber, and an excess reactant is evacuated. Note that the above combination of precursors introduced into the chamber is intended for the case where the valence of the element M is +3; in the case where the valence of the element M is +2, a source gas containing the second precursor and the third precursor is preferably introduced into the chamber.

Alternatively, source gases that contain different precursors may be introduced into the chamber successively. For example, the metal oxide containing an In-M-Zn oxide may be formed in the following manner: a source gas containing the first precursor is introduced into the chamber, an excess source gas is evacuated, then without introduction of a reactant, a source gas containing the second precursor is introduced into the chamber, an excess source gas is evacuated, a reactant is introduced into the chamber, an excess reactant is evacuated, a source gas containing the first precursor is introduced into the chamber, an excess source gas is evacuated, then without introduction of a reactant, a source gas containing the second precursor is introduced into the chamber, an excess source gas is evacuated, a reactant is introduced into the chamber, an excess reactant is evacuated, a source gas containing the third precursor is introduced into the chamber, an excess source gas is evacuated, a reactant is introduced into the chamber, and an excess reactant is evacuated. Note that the order of introduction and combination of the precursors that are successively introduced into the chamber are not limited to the above. After the source gas containing the second precursor is introduced into the chamber, the source gas containing the first precursor may be introduced into the chamber. The above combination of precursors introduced into the chamber is intended for the case where the valence of the element M is +3; in the case where the valence of the element M is +2, after the source gas containing the second precursor is introduced into the chamber, without introduction of a reactant, the source gas containing the third precursor may be introduced into the chamber.

The metal oxide may be formed using a precursor containing a plurality of metals. For example, the metal oxide may be formed using a precursor containing indium and the element M having a valence of +3 in one molecule, a precursor containing indium and zinc in one molecule, a precursor containing the element M having a valence of +2 and zinc in one molecule, or the like.

The above-described CAAC-OS is described below in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of $31°$ or around $31°$. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable.

Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

<Transistor Including Oxide Semiconductor>
Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>
Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor in which impurities are sufficiently reduced is used in a channel formation region of a transistor, stable electrical characteristics can be given.

As described above, an ALD method enables deposition of a film on a component with a large aspect ratio and also enables deposition of a film with excellent coverage on a side surface of a structure body. By using an ALD method, a metal oxide having a CAAC structure can be easily formed regardless of the orientation of the deposition surface. For example, a metal oxide with favorable coverage can be formed on a top surface, a bottom surface, and a surface with a slope of a structure body even when the structure body has a projected shape or a recessed shape. In other words, a metal oxide that has a substantially uniform thickness in the normal direction can be formed on each deposition surface. As for the metal oxide that is formed on each of the top surface, the bottom surface, and the surface with the slope of the structure body, the ratio of the minimum thickness to the maximum thickness can be greater than or equal to 0.5 and less than or equal to 1, preferably greater than or equal to 0.7 and less than or equal to 1, more preferably greater than or equal to 0.9 and less than or equal to 1. At this time, in the case where the metal oxide has a crystal, the c-axis thereof is aligned in a direction substantially parallel to the normal direction of each of the deposition surfaces. In other words, the c-axis is aligned perpendicularly to each of the deposition surfaces.

Figure 15A:
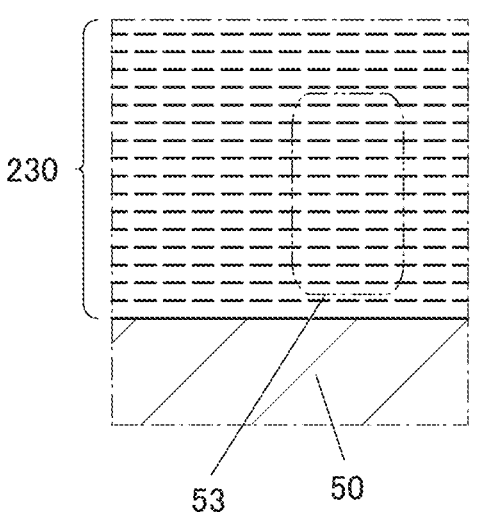
FIG. 15A to FIG. 15D are cross-sectional views of a metal oxide which is one embodiment of the present invention.
Figure 15B:
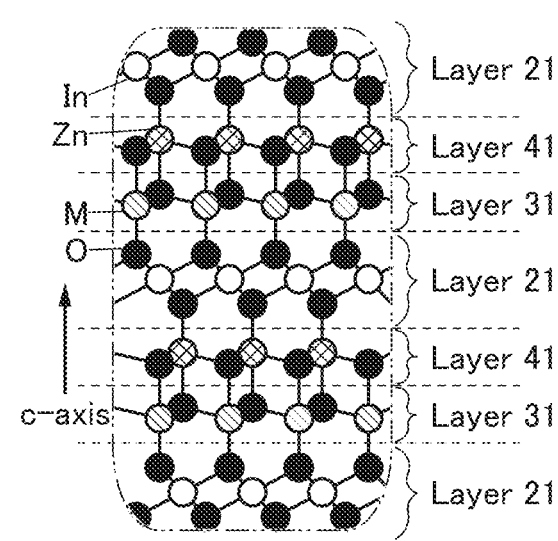

FIG. 15A is a diagram illustrating the oxide 230 including an In-M-Zn oxide formed on a structure body 50. Here, the structure body refers to a component included in a semiconductor device such as a transistor. The structure body 50 includes a substrate, conductors such as a gate electrode, a source electrode, and a drain electrode, an insulator such as a gate insulating film, an interlayer insulating film, and a base insulating film, a semiconductor such as a metal oxide or silicon, and the like. In FIG. 15A, a deposition surface of the structure body 50 is positioned parallel to a substrate (or a base, not illustrated). FIG. 15B is an enlarged view of a region 53 that is part of the oxide 230 in FIG. 15A. FIG. 15B illustrates a state in which a layer containing indium (In), a layer containing the element M, and a layer containing zinc (Zn) are stacked over the top surface or the bottom surface of the structure body 50. The layer containing indium is positioned parallel to the deposition surface of the structure body 50, the layer containing the element M is positioned thereover to be parallel to the deposition surface of the structure body 50, and further the layer containing zinc is positioned thereover to be parallel to the deposition surface of the structure body 50. That is, the a-b plane of the oxide 230 is substantially parallel to the deposition surface of the structure body 50, and the c-axis of the oxide 230 is substantially parallel to the normal direction of the deposition surface of the structure body 50.

Figure 15C:
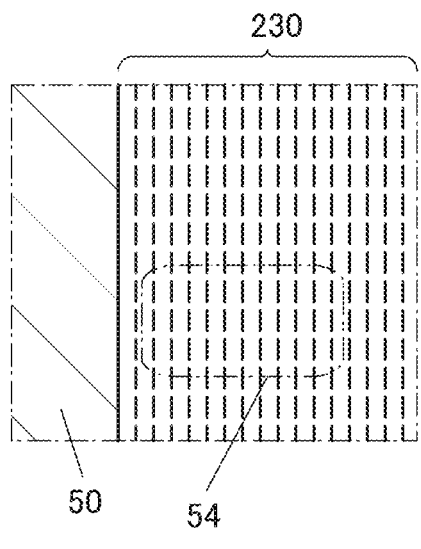
Figure 15D:
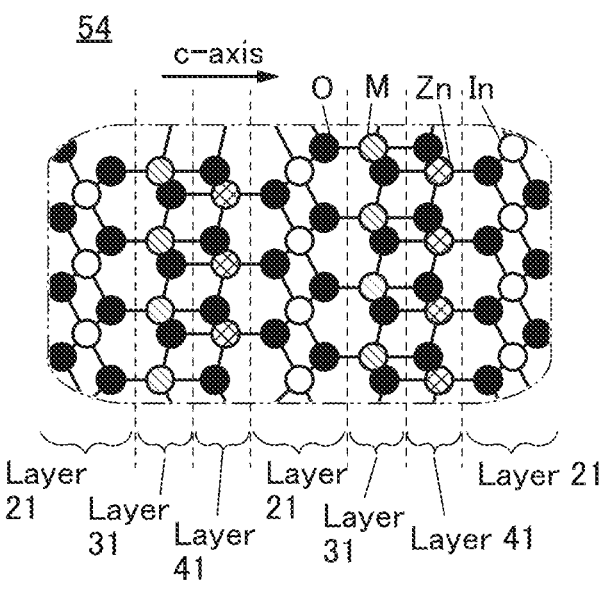

In FIG. 15C, a deposition surface of the structure body 50 is positioned perpendicular to a substrate (or a base, not illustrated). FIG. 15D is an enlarged view of a region 54 that is part of the oxide 230 in FIG. 15C. FIG. 15D illustrates a state in which a layer containing indium (In), a layer containing the element M, and a layer containing zinc (Zn) are stacked over the side surface of the structure body 50. The layer containing indium is positioned parallel to the deposition surface of the structure body 50, the layer containing the element M is positioned thereover to be parallel to the deposition surface of the structure body 50, and further the layer containing zinc is positioned thereover to be parallel to the deposition surface of the structure body 50. That is, the a-b plane of the oxide 230 is substantially parallel to the deposition surface of the structure body 50, and the c-axis of the oxide 230 is substantially parallel to the normal direction of the deposition surface of the structure body 50.

Here, details of a method for forming the oxide 230 including an In-M-Zn oxide are described with reference to FIG. 16A to FIG. 17C. FIG. 16A to FIG. 17C illustrate an example in which the layer 21 containing indium is formed, the layer 31 containing the element M is formed thereover, and further the layer 41 containing zinc is formed thereover; however, this embodiment is not limited thereto. One of the layer 31 and the layer 41 may be formed, the layer 21 may be formed thereover, and further the other of the layer 31 and the layer 41 may be formed thereover. Alternatively, one of the layer 31 and the layer 41 may be formed, the other of the layer 31 and the layer 41 may be formed thereover, and further the layer 21 may be formed thereover.

First, a source gas that contains a precursor containing indium is introduced into a chamber, so that the precursor is adsorbed onto a surface of the structure body 50 (see FIG. 16A). Here, the source gas contains a carrier gas such as argon or nitrogen in addition to the precursor. Triethylindium, tris(2,2,6,6-tetramethyl-3,5-heptanedione acid)indium, cyclopentadienylindium, or the like can be used as the precursor containing indium. Next, the chamber is purged, whereby an excess precursor, a reaction product, and the like are released from the chamber.

Then, an oxidizer introduced as a reactant into the chamber is reacted with the adsorbed precursor, and components other than indium are released while indium is adsorbed onto the substrate, so that the layer 21 composed of indium and oxygen is formed (see FIG. 16B). Ozone, oxygen, water, or the like can be used as the oxidizer. After that, the chamber is purged, whereby an excess reactant, a reaction product, and the like are released from the chamber.

Subsequently, a source gas that contains a precursor containing the element M and a precursor containing zinc is introduced into the chamber, so that the precursors are adsorbed onto the layer 21 (see FIG. 16C). Here, the source gas contains a carrier gas such as argon or nitrogen in addition to the precursors. In the case where gallium is used as the element M, trimethylgallium, triethylgallium, gallium trichloride, tris(dimethylamide)gallium, gallium(III) acetylacetonate, tris(2,2,6,6-tetramethyl-3,5-heptanedione acid) gallium, dimethylchlorogallium, diethylchlorogallium, or the like can be used as the precursor containing gallium. Next, the chamber is purged, whereby an excess precursor, a reaction product, and the like are released from the chamber.

Then, an oxidizer introduced as a reactant into the chamber is reacted with the adsorbed precursor, and components other than the element M are released while the element M is adsorbed onto the substrate, so that the layer 31 composed of the element M and oxygen is formed (see FIG. 16D). At this time, part of oxygen contained in the layer 41 is adsorbed onto the layer 31 in some cases. After that, the chamber is purged, whereby an excess reactant, a reaction product, and the like are released from the chamber.

Figure 17A:
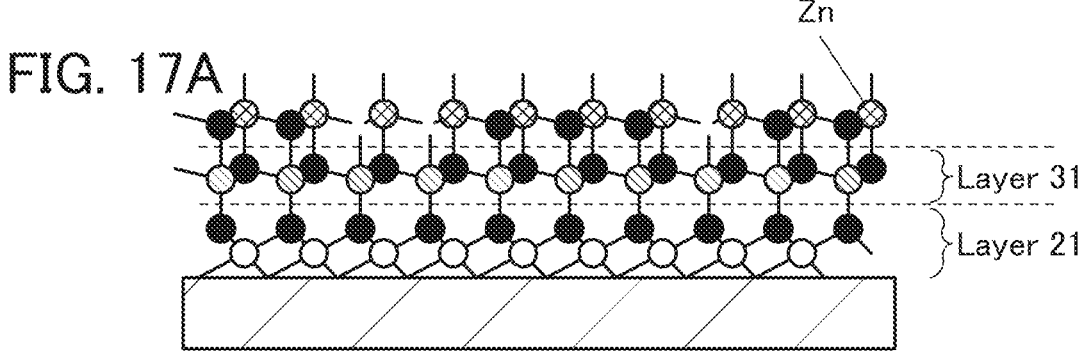
FIG. 17A to FIG. 17C are cross-sectional views illustrating a deposition method.

Next, a source gas that contains a precursor containing zinc is introduced into the chamber, so that the precursor is adsorbed onto the layer 31 (see FIG. 17A). At this time, part of the layer 41 composed of zinc and oxygen is formed in some cases. Here, the source gas contains a carrier gas such as argon or nitrogen in addition to the precursors. Dimethylzinc, diethylzinc, bis(2,2,6,6,tetramethyl-3,5-heptanedione acid)zinc, or the like can be use as the precursor containing zinc. Next, the chamber is purged, whereby an excess precursor, a reaction product, and the like are released from the chamber.

Figure 17B:
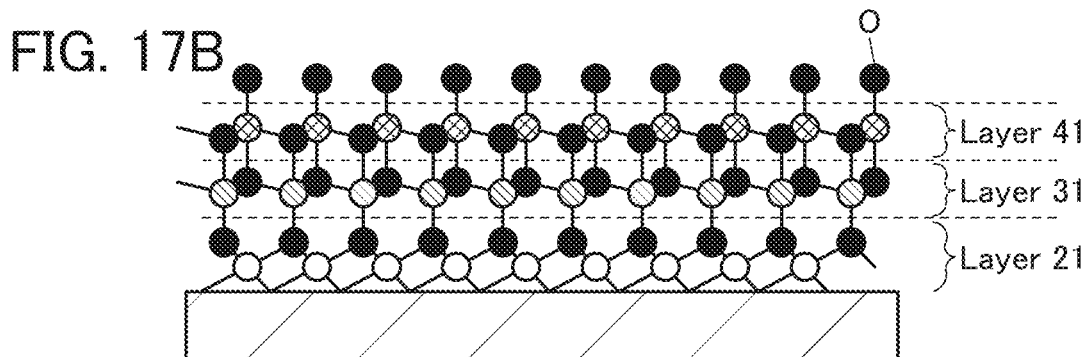

Then, an oxidizer introduced as a reactant into the chamber is reacted with the adsorbed precursor, and components other than zinc are released while zinc is adsorbed onto the substrate, so that the layer 41 composed of zinc and oxygen is formed (see FIG. 17B). After that, the chamber is purged, whereby an excess reactant, a reaction product, and the like are released from the chamber. Note that a stack of the layers 31 and the layers 41 with a desired number of atoms, a desired number of layers, and a desired thickness may be formed between the two layers 21 when the layer 31 and the layer 41 are each formed a plurality of times before the formation of the subsequent layer 21.

Figure 17C:
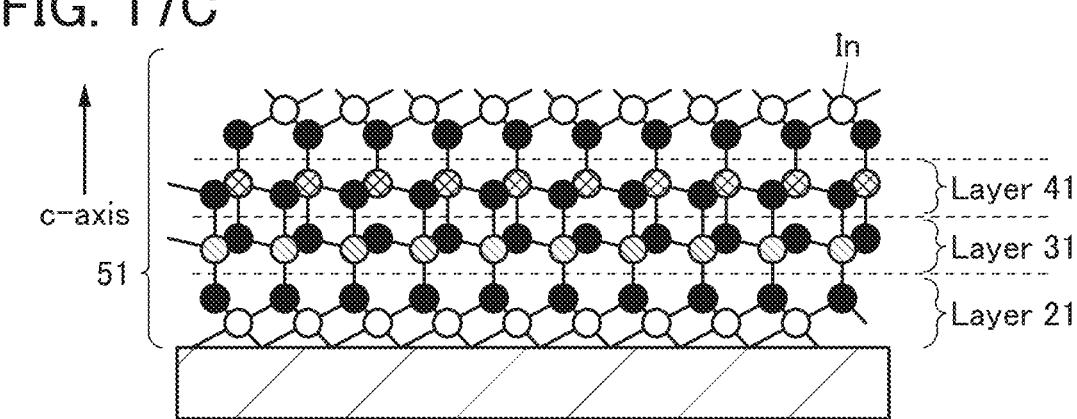

Next, the layer 21 is formed again over the layer 41 by the above-described method (see FIG. 17C). By repeating the above-described method, the oxide 230 can be formed over the substrate or the structure body.

Other than above-described precursors containing the metal elements, there is a precursor that contains one or both of carbon and chlorine. A film that is formed using a precursor containing carbon may contain carbon. A film that is formed using a precursor containing chlorine may contain chlorine.

As described above, the oxide 230 is formed by an ALD method, whereby the metal oxide having a CAAC structure, in which the c-axis is aligned substantially parallel to the normal direction of the deposition surface, can be obtained.

Figures 18A, 18B:
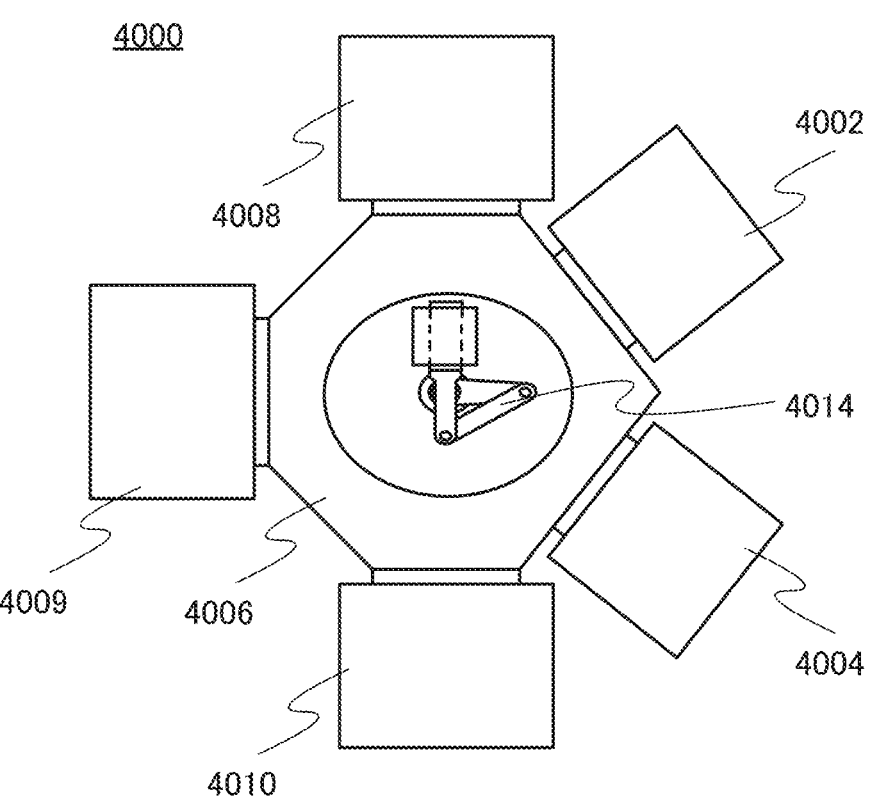
FIG. 18A and FIG. 18B are a top view and a cross-sectional view illustrating a deposition apparatus.

Here, the structure of a deposition apparatus 4000 is described with reference to FIG. 18A and FIG. 18B as an example of an apparatus with which deposition can be performed by an ALD method. FIG. 18A is a schematic view of the multi-chamber type deposition apparatus 4000, and FIG. 18B is a cross-sectional view of an ALD apparatus that can be used for the deposition apparatus 4000.
Structure Example of Deposition Apparatus The deposition apparatus 4000 includes a carrying-in/out chamber 4002, a carrying-in/out chamber 4004, a transfer chamber 4006, a deposition chamber 4008, a deposition chamber 4009, a deposition chamber 4010, and a transfer arm 4014. Here, the carrying-in/out chamber 4002, the carrying-in/out chamber 4004, the deposition chamber 4008, the deposition chamber 4009, and the deposition chamber 4010 are each independently connected to the transfer chamber 4006. Thus, successive deposition can be performed in the deposition chamber 4008, the deposition chamber 4009, and the deposition chamber 4010 without exposure to the air, whereby entry of impurities into a film can be prevented. Moreover, contamination of an interface between a substrate and a film and interfaces between films can be reduced, so that clean interfaces can be obtained.

Note that in order to prevent attachment of moisture and the like, the carrying-in/out chamber 4002, the carrying-in/out chamber 4004, the transfer chamber 4006, and the deposition chamber 4008 to the deposition chamber 4010 are preferably filled with an inert gas (such as a nitrogen gas) whose dew point is controlled, and desirably maintain reduced pressure.

An ALD apparatus can be used as the deposition chamber 4008 to the deposition chamber 4010. Alternatively, a structure may be employed in which a deposition apparatus other than an ALD apparatus is used as any of the deposition chamber 4008 to the deposition chamber 4010. Examples of the deposition apparatus that can be used as any of the deposition chamber 4008 to the deposition chamber 4010 include a sputtering apparatus, a plasma CVD (PECVD: Plasma Enhanced CVD) apparatus, a thermal CVD (TCVD) apparatus, a photo CVD apparatus, a metal CVD (MCVD) apparatus, and a metal organic CVD (MOCVD) apparatus. An apparatus having a function other than a deposition apparatus may be provided in one or more of the deposition chamber 4008 to the deposition chamber 4010. Examples of the apparatus include a heating apparatus (typically, a vacuum heating apparatus) and a plasma generation apparatus (typically, a μ-wave plasma generation apparatus).

For example, in the case where the deposition chamber 4008 is an ALD apparatus, the deposition chamber 4009 is a PECVD apparatus, and the deposition chamber 4010 is a metal CVD apparatus, a metal oxide can be formed in the deposition chamber 4008, an insulating film functioning as a gate insulating film can be formed in the deposition chamber 4009, and a conductive film functioning as a gate electrode can be formed in the deposition chamber 4010. At that time, the metal oxide, the insulating film thereover, and the conductive film thereover can be formed successively without exposure to the air.

Although the deposition apparatus 4000 has a structure including the carrying-in/out chamber 4002, the carrying-in/out chamber 4004, and the deposition chamber 4008 to the deposition chamber 4010, one embodiment of the present invention is not limited thereto. The number of the deposition chambers in the deposition apparatus 4000 may be four or more. The deposition apparatus 4000 may be of a single-wafer type or may be of a batch type, in which case deposition is performed on a plurality of substrates at a time.
<ALD Apparatus>

Next, a structure of an ALD apparatus that can be used as the deposition apparatus 4000 is described with reference to FIG. 18B. The ALD apparatus includes a deposition chamber (a chamber 4020), a source material supply portion 4021 (a source material supply portion 4021a and a source material supply portion 4021b), a source material supply portion 4031, a high-speed valve 4022a and a high-speed valve 4022b that are introduction amount controllers, a source material introduction port 4023 (a source material introduction port 4023a and a source material introduction port 4023b), a source material introduction port 4033, a source material exhaust port 4024, and an evacuation unit 4025. The source material introduction port 4023a, the source material introduction port 4023b, and the source material introduction port 4033 provided in the chamber 4020 are connected to the source material supply portion 4021a, the source material supply portion 4021b, and the source material supply portion 4031, respectively, through supply tubes and valves, and the source material exhaust port 4024 is connected to the evacuation unit 4025 through an exhaust tube, a valve, and a pressure controller.

A plasma generation apparatus 4028 is connected to the chamber 4020 as illustrated in FIG. 18B, whereby deposition can be performed by a plasma ALD method as well as a thermal ALD method. It is preferable that the plasma generation apparatus 4028 be an ICP-type plasma generation apparatus using a coil 4029 connected to a high frequency power source. The high frequency power source is capable of outputting power with a frequency higher than or equal to 10 kHz and lower than or equal to 100 MHz, preferably higher than or equal to 1 MHz and lower than or equal to 60 MHz, more preferably higher than or equal to 10 MHz and lower than or equal to 60 MHz. For example, power with a frequency of 13.56 MHz, 60 MHz can be output. A plasma ALD method enables deposition without decreasing the deposition rate even at low temperatures, and thus is preferably used for a single-wafer type deposition apparatus with low deposition efficiency.

A substrate holder 4026 exists in the chamber, and a substrate 4030 is put over the substrate holder 4026. The substrate holder 4026 may be provided with a mechanism to which a constant potential or a high-frequency wave is applied. Alternatively, the substrate holder 4026 may be floating or grounded. A heater 4027, which is provided on an outside wall of the chamber, can control the temperature inside the chamber 4020 and the temperatures of the substrate holder 4026, the surface of the substrate 4030, and the like. The heater 4027 is preferably capable of controlling the temperature of the surface of the substrate 4030 to higher than or equal to 100° C. and lower than or equal to 500° C., preferably higher than or equal to 200° C. and lower than or equal to 400° C., and is capable of setting the temperature of the heater 4027 itself to higher than or equal to 100° C. and lower than or equal to 500° C.

In the source material supply portion 4021a, the source material supply portion 4021b, and the source material supply portion 4031, a source gas is formed from a solid source material or a liquid source material using a vaporizer, a heating unit, or the like. Alternatively, the source material supply portion 4021a, the source material supply portion 4021b, and the source material supply portion 4031 may supply a source gas.

Although FIG. 18B illustrates the example in which two source material supply portions 4021 and one source material supply portion 4031 are provided, this embodiment is not limited thereto. One or three or more source material supply portions 4021 may be provided. In addition, two or more source material supply portions 4031 may be provided. The high-speed valve 4022a and the high-speed valves 4022b can be precisely controlled by time and are configured to control supply of a source gas from the source material supply portion 4021a and supply of a source gas from the source material supply portion 4021b.

In the deposition apparatus illustrated in FIG. 18B, a thin film is formed over a substrate surface in such a manner that after the substrate 4030 is transferred onto the substrate holder 4026 and the chamber 4020 is sealed, the substrate 4030 is set to a desired temperature (e.g., higher than or equal to 100° C. and lower than or equal to 500° C., preferably higher than or equal to 200° C. and lower than or equal to 400° C.) by the heater 4027, and supply of the source gas from the source material supply portion 4021a, evacuation with the evacuation unit 4025, supply of the source gas from the source material supply portion 4031, and evacuation with the evacuation unit 4025 are repeated. Furthermore, in the deposition of the thin film, supply of a source gas supplied from the source material supply portion 4021b and evacuation with the evacuation unit 4025 may further be performed. The temperature of the heater 4027 is determined as appropriate depending on the kind of the film to be formed, the source gas, a desired film quality, and heat resistances of a substrate and a film and an element that are provided thereover. For example, the deposition may be performed when the temperature of the heater 4027 is set to higher than or equal to 200° C. and lower than or equal to 300° C. or higher than or equal to 300° C. and lower than or equal to 500° C.

When deposition is performed while the substrate 4030 is heated by the heater 4027, heat treatment for the substrate 4030 that is necessary in a later step can be omitted. That is, with the use of the chamber 4020 or the deposition apparatus 4000 provided with the heater 4027, formation of a film over the substrate 4030 can also serve as heat treatment for the substrate 4030.

In the deposition apparatus illustrated in FIG. 18B, a metal oxide can be formed by appropriate selection of source materials (e.g., a volatile organic compound) used in the source material supply portion 4021 and the source material supply portion 4031. In the case where an In—Ga—Zn oxide, which contains indium, gallium, and zinc, is formed as the metal oxide, it is preferable to use a deposition apparatus provided with at least three source material supply portions 4021 and at least one source material supply portion 4031. It is preferable that a precursor containing indium be supplied from the first source material supply portion 4021, a precursor containing gallium be supplied from the second source material supply portion 4021, and a precursor containing zinc be supplied from the third source material supply portion 4021. In the case where precursors containing indium and gallium are used to form the metal oxide, at least two source material supply portions 4021 are provided. Any of the above-described precursors can be used as the precursor containing indium, the precursor containing gallium, and the precursor containing zinc.

A reactant is supplied from the source material supply portion 4031. An oxidizer containing at least one of ozone, oxygen, and water can be used as the reactant.

Figures 19A, 19B, 19C:
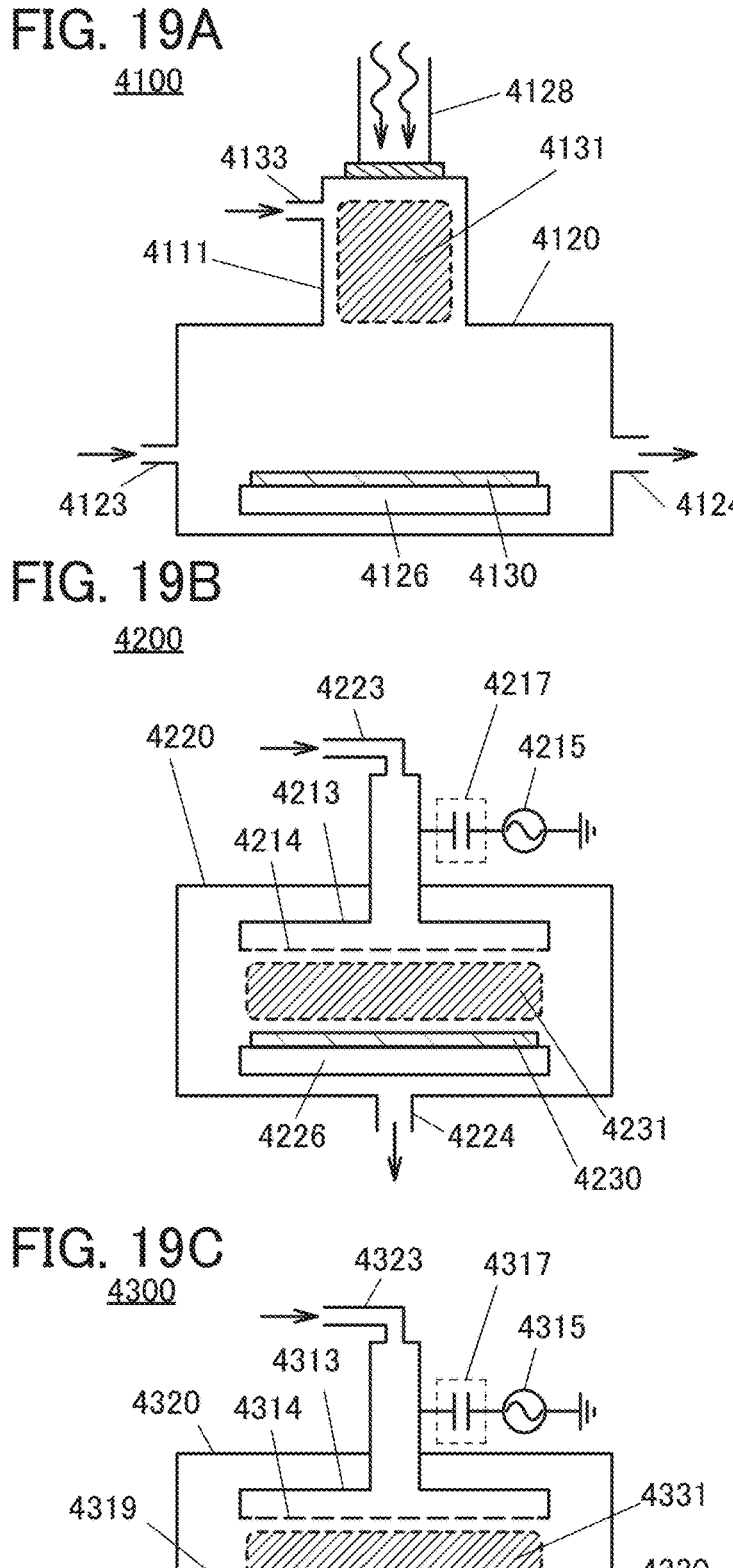
FIG. 19A to FIG. 19C are cross-sectional views illustrating a deposition apparatus.

FIG. 19A to FIG. 19C illustrate a different structure of an ALD apparatus that can be used for the deposition apparatus 4000. Note that detailed description on structures and functions similar to those of the ALD apparatus in FIG. 18B are omitted in some cases.

FIG. 19A is a schematic view illustrating one embodiment of a plasma ALD apparatus. A plasma ALD apparatus 4100 is provided with a reaction chamber 4120 and a plasma generation chamber 4111 above the reaction chamber 4120. The reaction chamber 4120 can be referred to as a chamber. Alternatively, the reaction chamber 4120 and the plasma generation chamber 4111 can be collectively referred to as a chamber. The reaction chamber 4120 includes a source material introduction port 4123 and a source material exhaust port 4124, and the plasma generation chamber 4111 includes a source material introduction port 4133. Furthermore, by plasma generation apparatus 4128, a high-frequency wave such as RF or a microwave can be applied to a gas introduced to the generation chamber 4111, so that plasma 4131 can be generated in the plasma generation chamber 4111. In the case where the plasma 4131 is generated using a microwave, a microwave with a frequency of 2.45 GHz is typically used. Such plasma generated by the microwave is referred to as ECR (Electron Cyclotron Resonance) plasma in some cases.

A substrate holder 4126 is included in the reaction chamber 4120, and a substrate 4130 is provided thereover. A source gas introduced from the source material introduction port 4123 is decomposed by heat from a heater provided in the reaction chamber 4120 and is deposited over the substrate 4130. A source gas introduced from the source material introduction port 4133 turns into a plasma state by the plasma generation apparatus 4128. The source gas in the plasma state is recombined with electrons and other molecules to be in a radical state before it reaches the surface of the substrate 4130, and reaches the substrate 4130. An ALD apparatus that performs deposition using a radical in such a manner may also be referred to as a radical ALD (Radical-Enhanced ALD) apparatus. In the plasma ALD apparatus 4100, the plasma generation chamber 4111 is provided above the reaction chamber 4120; however, this embodiment is not limited to this structure. The plasma generation chamber 4111 may be provided in contact with a side surface of the reaction chamber 4120.

FIG. 19B is a schematic view illustrating one embodiment of a plasma ALD apparatus. A plasma ALD apparatus 4200 includes a chamber 4220. The chamber 4220 includes an electrode 4213, a source material exhaust port 4224, and a substrate holder 4226, and a substrate 4230 is put over the substrate holder 4226. The electrode 4213 includes a source material introduction port 4223 and a shower head 4214 that supplies the introduced source gas into the chamber 4220. A power source 4215 capable of applying a high-frequency wave through a capacitor 4217 is connected to the electrode 4213. The substrate holder 4226 may be provided with a mechanism to which a constant potential or a high-frequency wave is applied. Alternatively, the substrate holder 4226 may be floating or grounded. The electrode 4213 and the substrate holder 4226 function as an upper electrode and a lower electrode for generating plasma 4231, respectively. A source gas introduced from the source material introduction port 4223 is decomposed by heat from a heater provided in the chamber 4220 and is deposited over the substrate 4230. Alternatively, the source gas introduced from the source material introduction port 4223 becomes in a plasma state between the electrode 4213 and the substrate holder 4226. The source gas in the plasma state enters the substrate 4230 owing to a potential difference (also referred to as an ion sheath) generated between the plasma 4231 and the substrate 4230.

FIG. 19C is a schematic view illustrating one mode of a plasma ALD apparatus different form that in FIG. 19B. A plasma ALD apparatus 4300 includes a chamber 4320. The chamber 4320 includes an electrode 4313, a source material exhaust port 4324, and a substrate holder 4326, and a substrate 4330 is put over the substrate holder 4326. The electrode 4313 includes a source material introduction port 4323 and a shower head 4314 that supplies the introduced source gas into the chamber 4320. A power source 4315 capable of applying a high-frequency wave through a capacitor 4317 is connected to the electrode 4313. The substrate holder 4326 may be provided with a mechanism to which a constant potential or a high-frequency wave is applied.

Alternatively, the substrate holder 4326 may be floating or grounded. The electrode 4313 and the substrate holder 4326 function as an upper electrode and a lower electrode for generating plasma 4331, respectively. The plasma ALD apparatus 4300 is different from the plasma ALD apparatus 4200 in that a mesh 4319 to which a power source 4321 capable of applying a high-frequency wave through a capacitor 4322 is connected is provided between the electrode 4313 and the substrate holder 4326. With the mesh 4319, the plasma 4231 can be away from the substrate 4130. A source gas introduced from the source material introduction port 4323 is decomposed by heat from a heater provided in the chamber 4320 and is deposited over the substrate 4330. Alternatively, the source gas introduced from the source material introduction port 4323 becomes in a plasma state between the electrode 4313 and the substrate holder 4326. Charge of the source gas in the plasma state is removed by the mesh 4319 and the source gas reaches the substrate 4130 while being in an electrically neutral state such as a radical. Therefore, it is possible to perform deposition with small damage due to entering of ions or plasma.

<Deposition Sequence>

FIG. 20A shows a deposition sequence using the ALD apparatus illustrated in FIG. 18B. First, the substrate 4030 is set on the substrate holder 4026 in the chamber 4020 (Step S101). Next, the temperature of the heater 4027 is adjusted (Step S102). Then, the substrate 4030 is held on the substrate holder 4026 so that the temperature of the substrate 4030 becomes uniform in the substrate surface (Step S103). After that, deposition is performed through the first step to the fourth step that are described above. In other words, the first source gas and the second source gas are alternately introduced into the chamber 4020 to perform deposition over the substrate 4030 (Step S104). In addition, treatment for setting the inside of the chamber 4020 in an oxygen atmosphere may be performed between Step S103 and Step S104. The inside of the chamber 4020 is set in an oxygen atmosphere after setting and holding the substrate 4030, whereby oxygen can be added to the substrate 4030 and the film provided over the substrate 4030 in some cases. Furthermore, hydrogen can be released from the substrate 4030 before deposition and the film provided over the substrate 4030 in some cases. Hydrogen in the substrate 4030 or the film sometimes reacts with oxygen added to the substrate 4030 or the film, and is released from the substrate 4030 or the film as water ($H_2O$).

FIG. 20B shows a specific example of the above deposition sequence. In accordance with Step S101 to Step S103 described above, the substrate 4030 is set on the substrate holder 4026, the temperature of the heater 4027 is adjusted, and the substrate 4030 is held.

Next, the first source gas and the second source gas are alternately introduced to perform deposition over the substrate 4030 (Step S104). The first source gas and the second source gas are introduced in a pulsed form. In FIG. 20B, introductions of the first source gas and the second source gas are each indicated by ON, and periods during which the source gases are not introduced are each indicated by OFF. In periods during which neither the first source gas nor the second source gas is introduced, the chamber 4020 is evacuated. The pulse time of introducing the first source gas into the chamber 4020 is preferably longer than or equal to 0.1 seconds and shorter than or equal to 1 second, further preferably longer than or equal to 0.1 seconds and shorter than or equal to 0.5 seconds. The period during which the first source gas is not introduced, that is, the time for evacuating the chamber 4020, is longer than or equal to 1 second and shorter than or equal to 15 seconds, preferably longer than or equal to 1 second and shorter than or equal to 5 seconds. The pulse time of introducing the second source gas into the chamber 4020 is preferably longer than or equal to 0.1 seconds and shorter than or equal to 30 seconds, further preferably longer than or equal to 0.3 seconds and shorter than or equal to 15 seconds. The period during which the second source gas is not introduced, that is, the time for evacuating the chamber 4020, is longer than or equal to 1 second and shorter than or equal to 15 seconds, preferably longer than or equal to 1 second and shorter than or equal to 5 seconds.

In the deposition, introduction of the first source gas (the first step), evacuation of the first source gas (the second step), introduction of the second source gas (the third step), and evacuation of the second source gas (the fourth step) are regarded as one cycle, and a film having a desired thickness is formed by repetition of this cycle.

In the case where treatment for setting the inside of the chamber 4020 in an oxygen atmosphere is performed between Step S103 and Step S104, the second source gas may be introduced into the chamber 4020. It is preferable that one or more selected from ozone ($O_3$), oxygen ($O_2$), and water ($H_2O$), which function as oxidizers, be introduced as the second source gas. In this embodiment, ozone ($O_3$) and oxygen ($O_2$) are used as the second source gas. In that case, the second source gas is preferably introduced in a pulsed form in a manner similar to that in Step S104; however, one embodiment of the present invention is not limited thereto. The second source gas may be successively introduced. In the period during which the second source gas is not introduced, the chamber 4020 is evacuated. The pulse time of introducing the second source gas into the chamber 4020 is preferably longer than or equal to 0.1 seconds and shorter than or equal to 30 seconds, further preferably longer than or equal to 0.3 seconds and shorter than or equal to 15 seconds. The period during which the second source gas is not introduced, that is, the time for evacuating the chamber 4020, is longer than or equal to 1 second and shorter than or equal to 15 seconds, preferably longer than or equal to 1 second and shorter than or equal to 5 seconds. When the second source gas such as an oxidizer is introduced into the chamber 4020, the substrate 4030 or the film provided over the substrate 4030 is exposed to the second source gas such as an oxidizer.

Note that after setting the substrate 4030 (Step S101), adjusting the temperature of the heater 4027 may be omitted if not needed. Moreover, after holding the substrate 4030 (Step S103), setting the inside of the chamber 4020 in an oxygen atmosphere may be omitted if not needed.

FIG. 20C shows an example of a sequence in the case where deposition is performed using two or more kinds of source gases containing precursors. In FIG. 20C, source gases containing precursors correspond to the first source gas, the third gas, and the fourth source gas, and a source gas containing an oxidizer corresponds to the second source gas. In accordance with Step S101 to Step S103 described above, the substrate 4030 is set on the substrate holder 4026, the temperature of the heater 4027 is adjusted, and the substrate 4030 is held.

Next, the first source gas, the second source gas, the third source gas, the second source gas, the fourth source gas, and the second source gas are sequentially introduced to perform deposition over the substrate 4030 (Step S104). The first source gas to the fourth source gas are introduced in a pulsed form. In FIG. 20C, introductions of the first source gas to the fourth source gas are each indicated by ON, and periods during which the source gases are not introduced are each indicated by OFF. In periods during which none of the first source gas to the fourth source gas are introduced, the chamber 4020 is evacuated. The pulse time of introducing the first source gas, the third source gas, and the fourth source gas into the chamber 4020 is preferably longer than or equal to 0.1 seconds and shorter than or equal to 1 second, further preferably longer than or equal to 0.1 seconds and shorter than or equal to 0.5 seconds. The period during which the first source gas, the third source gas, and the fourth source gas are not introduced, that is, the time for evacuating the chamber 4020, is longer than or equal to 1 second and shorter than or equal to 15 seconds, preferably longer than or equal to 1 second and shorter than or equal to 5 seconds. The pulse time of introducing the second source gas into the chamber 4020 is preferably longer than or equal to 0.1 seconds and shorter than or equal to 30 seconds, further preferably longer than or equal to 0.3 seconds and shorter than or equal to 15 seconds. The period during which the second source gas is not introduced, that is, the time for evacuating the chamber 4020, is longer than or equal to 1 second and shorter than or equal to 15 seconds, preferably longer than or equal to 1 second and shorter than or equal to 5 seconds.

In the deposition, introduction of the first source gas, evacuation of the first source gas, introduction of the second source gas, evacuation of the second source gas, introduction of the third source gas, evacuation of the third second source gas, introduction of the second source gas, evacuation of the second source gas, introduction of the fourth source gas, evacuation of the fourth source gas, introduction of the second source gas, and evacuation of the second source gas are regarded as one cycle, and a film having a desired thickness is formed by repetition of this cycle.

For example, in the case where the first source gas contains a precursor containing indium, the third source gas contains a precursor containing gallium, and the fourth source gas contains a precursor containing zinc, an In—Ga—Zn oxide can be formed by the sequence shown in FIG. 20C.

Note that in the sequence shown in FIG. 20C, the order of introduction of the first source gas, the third source gas, and the fourth source gas is not limited thereto. Furthermore, the number of times of introduction of the first source gas, the third source gas, and the fourth source gas in one cycle is not necessarily one. A certain source gas is introduced a plurality of times in one cycle, whereby a film that has a high concentration of a metal element contained in the source gas can be formed. That is, the atomic ratio of a film to be formed can be controlled by change in the number of times of introduction of the gases. The first source gas, the third source gas, and the fourth source gas, or two kinds of source gases selected from these source gases may be introduced into the chamber 4020 concurrently.

This embodiment can be implemented in an appropriate combination with the structures described in the other embodiments.

Embodiment 2

In this embodiment, an example of a semiconductor device including a transistor including the metal oxide described in the above embodiment and a manufacturing method thereof will be described with reference to FIG. 21A to FIG. 44B.

Structure Example of Semiconductor Device

A structure of a semiconductor device including a transistor 200 including the metal oxide described in the above embodiment is described with reference to FIG. 21A to FIG. 21D. FIG. 21A to FIG. 21D are a top view and cross-sectional views of a semiconductor device including the transistor 200. FIG. 21A is a top view of the semiconductor device. FIG. 21B to FIG. 21D are cross-sectional views of the semiconductor device. Here, FIG. 21B is a cross-sectional view of a portion indicated by the dashed-dotted line A1-A2 in FIG. 21A, and is also a cross-sectional view of the transistor 200 in the channel length direction. FIG. 21C is a cross-sectional view of a portion indicated by the dashed-dotted line A3-A4 in FIG. 21A, and is also a cross-sectional view of the transistor 200 in the channel width direction. FIG. 21D is a cross-sectional view of a portion indicated by the dashed-dotted line A5-A6 in FIG. 21A. Note that for clarity of the drawing, some components are not illustrated in the top view of FIG. 21A.

The semiconductor device of one embodiment of the present invention includes an insulator 212 over a substrate (not illustrated), an insulator 214 over the insulator 212, the transistor 200 over the insulator 214, an insulator 280 over the transistor 200, an insulator 282 over the insulator 280, an insulator 283 over the insulator 282, and an insulator 284 over the insulator 283. The insulator 212, the insulator 214, the insulator 280, the insulator 282, the insulator 283, and the insulator 284 function as interlayer films. The semiconductor device also includes a conductor 240a and a conductor 240b that are electrically connected to the transistor 200 and function as plugs. An insulator 241a is provided in contact with the side surface of the conductor 240a, and an insulator 241b is provided in contact with the side surface of the conductor 240b. A conductor 246a that is electrically connected to the conductor 240a and functions as a wiring and a conductor 246b that is electrically connected to the conductor 240b and functions as a wiring are provided over the insulator 284, the conductor 240a, and the conductor 240b. An insulator 286 is provided over the conductor 246a, the conductor 246b, and the insulator 284.

The insulator 241a is provided in contact with the inner wall of an opening in the insulator 280, the insulator 282, the insulator 283, the insulator 284, and the like; a first conductor of the conductor 240a is provided in contact with the side surface of the insulator 241a; and a second conductor of the conductor 240a is provided on the inner side thereof. The insulator 241b is provided in contact with the inner wall of an opening in the insulator 280, the insulator 282, the insulator 283, the insulator 284, and the like; a first conductor of the conductor 240b is provided in contact with the side surface of the insulator 241b; and a second conductor of the conductor 240b is provided on the inner side thereof. Here, the level of the top surface of the conductor 240a (conductor 240b) and the level of the top surface of the insulator 284 in a region overlapping with the conductor 246a (conductor 246b) can be substantially the same. Note that although the transistor 200 has a structure in which the first conductor of each of the conductor 240a and the conductor 240b and the second conductor of the conductor 240 are stacked and the first conductor of the conductor 240b and the second conductor of the conductor 240b are stacked, the present invention is not limited thereto. For example, the conductor 240a and the conductor 240b may each have a single-layer structure or a stacked-layer structure of three or more layers. In the case where a structure body has a stacked-layer structure, layers may be distinguished by ordinal numbers corresponding to the formation order.

[Transistor 200]

As illustrated in FIG. 21A to FIG. 21D, the transistor 200 includes an insulator 216 over the insulator 214; a conductor 205 (a conductor 205a and a conductor 205b) positioned to be embedded in the insulator 214 and/or the insulator 216; an insulator 222 over the insulator 216 and the conductor 205; an insulator 224 over the insulator 222; an oxide 230a over the insulator 224; an oxide 230b over the oxide 230a; an oxide 243a, an oxide 243b, and an oxide 230c over the oxide 230b; a conductor 242a over the oxide 243a; a conductor 242b over the oxide 243b; an oxide 230d over the oxide 230c; an insulator 250 over the oxide 230d; a conductor 260 (a conductor 260a and a conductor 260b) that is positioned over the insulator 250 and overlaps with part of the oxide 230c; and an insulator 254 in contact with the top surface of the insulator 224, the side surface of the oxide 230a, the side surface of the oxide 230b, the side surface of the conductor 242a, the top surface of the conductor 242a, the side surface of the conductor 242b, and the top surface of the conductor 242b. The oxide 230c is in contact with the side surface of the oxide 243a, the side surface of the oxide 243b, the side surface of the conductor 242a, and the side surface of the conductor 242b. The insulator 282 is in contact with the top surfaces of the conductor 260, the insulator 250, the oxide 230d, the oxide 230c, and the insulator 280.

An opening reaching the oxide 230b is formed in the insulator 280. The oxide 230c, the oxide 230d, the insulator 250, and the conductor 260 are positioned in the opening. In addition, in the channel length direction of the transistor 200, the conductor 260, the insulator 250, the oxide 230d, and the oxide 230c are provided between the conductor 242a and the oxide 243a and the conductor 242b and the oxide 243b. The insulator 250 includes a region in contact with the side surface of the conductor 260 and a region in contact with the bottom surface of the conductor 260. The oxide 230c includes a region in contact with the oxide 230b, a region overlapping with the side surface of the conductor 260 with the oxide 230d and the insulator 250 therebetween, and a region overlapping with the bottom surface of the conductor 260 with the oxide 230d and the insulator 250 therebetween.

The oxide 230 preferably includes the oxide 230a positioned over the insulator 224, the oxide 230b positioned over the oxide 230a, the oxide 230c that is positioned over the oxide 230b and is at least partly in contact with the oxide 230b, and the oxide 230d positioned over the oxide 230c.

Although a structure in which the oxide 230 has a four-layer stacked structure of the oxide 230a, the oxide 230b, the oxide 230c, and the oxide 230d in the transistor 200 is described, the present invention is not limited thereto. For example, the oxide 230 may be a single layer of the oxide 230b or has a two-layer structure of the oxide 230a and the oxide 230b, a two-layer structure of the oxide 230b and the oxide 230c, a three-layer structure of the oxide 230a, the oxide 230b, and the oxide 230c, a three-layer structure of the oxide 230a, the oxide 230b, and the oxide 230d, or a stacked-layer structure including five or more layers. Alternatively, each of the oxide 230a, the oxide 230b, the oxide 230c, and the oxide 230d may have a stacked-layer structure.

The conductor 260 functions as a first gate (also referred to as top gate) electrode, and the conductor 205 functions as a second gate (also referred to as back gate) electrode. The insulator 250, the insulator 224, and the insulator 222 function as gate insulators. The conductor 242a functions as one of a source and a drain, and the conductor 242b functions as the other of the source and the drain. The oxide 230 functions as a channel formation region.

The oxide 230 includes a region 234 (not illustrated) functioning as the channel formation region of the transistor 200 and a region 236 (not illustrated) that function as a source region or a drain region are provided such that the region 234 is interposed therebetween. At least part of the region 234 overlaps with the conductor 260. The conductor 242a and the conductor 242b are provided over the oxide 230b, and lower-resistance regions are formed in the vicinity of the conductor 242a and in the vicinity of the conductor 242b in the region 236.

The region 236 functioning as the source region or the drain region are each a region that has a low oxygen concentration or contains impurities such as hydrogen, nitrogen, and a metal element, for example, and thus has an increased carrier concentration and reduced resistance. In other words, the region 236 is a region having a higher carrier concentration and lower resistance than region 234. The region 234 functioning as the channel formation region is a higher-resistance region with a lower carrier concentration because it has a higher oxygen concentration or a lower impurity concentration than region 236, for example. A region having an oxygen concentration higher than or equal to an oxygen concentration of the region 236 and lower than or equal to an oxygen concentration of the region 234 may be formed between the region 234 and the region 236.

In the transistor 200, the metal oxide described in the above embodiment can be used as the oxide 230 (the oxide 230a, the oxide 230b, the oxide 230c, and the oxide 230d) including the channel formation region.

The oxide 230 preferably has a stacked-layer structure of a plurality of oxide layers with different chemical compositions. The oxide 230 preferably has a stacked-layer structure of a plurality of oxide layers containing a common element (as a main component) besides oxygen.

Specifically, the atomic ratio of the element M to In in the metal oxide used as the oxide 230a or the oxide 230d is preferably greater than atomic ratio of the element M to In in the metal oxide used as the oxide 230b or the oxide 230c. The greater the atomic ratio of the element M to In is, the more likely the diffusion of impurities or oxygen is to be inhibited. Thus, including the oxide 230a below the oxide 230b makes it possible to inhibit diffusion of impurities into the oxide 230b from the components formed below the oxide 230a. Moreover, including the oxide 230d over the oxide 230c makes it possible to inhibit diffusion of impurities into the oxide 230c from the components formed above the oxide 230d.

In other words, the atomic ratio of In to the element M in the metal oxide used as the oxide 230b or the oxide 230c is preferably greater than atomic ratio of In to the element M in the metal oxide used as the oxide 230a or the oxide 230d. In that case, a main carrier path is the oxide 230b, the oxide 230c, or the vicinity thereof, for example, the interface between the oxide 230b and the oxide 230c. Since the oxide 230b and the oxide 230c contain a common element (as a main component) besides oxygen, the density of defect states at the interface between the oxide 230b and the oxide 230c can be decreased; accordingly, the influence of interface scattering on carrier conduction is small and a high on-state current can be obtained.

In order to make the oxide 230c serve as a main carrier path, the atomic ratio of indium to a metal element that is a main component in the oxide 230c is preferably greater than atomic ratio of indium to a metal element that is a main component in the oxide 230b. When a metal oxide having a high content of indium is used for a channel formation region, the on-state current of the transistor can be increased. Accordingly, such a structure enables the oxide 230c to serve as a main carrier path.

Furthermore, in order to make the oxide 230c serve as a main carrier path, the conduction band minimum of the oxide 230c is preferably more apart from the vacuum level than conduction band minimum of each of the oxide 230a, the oxide 230b, and the oxide 230d is. In other words, the electron affinity of the oxide 230c is preferably larger than electron affinity of each of the oxide 230a, the oxide 230b, and the oxide 230d.

The oxide 230b and the oxide 230c preferably have crystallinity. It is particularly preferable to use the metal oxide described in the above embodiment as the oxide 230b and the oxide 230c. The oxide 230d may also have crystallinity.

The use of the above metal oxide as the oxide 230b and the oxide 230c can reduce impurities and oxygen vacancies in the channel formation region in the oxide 230b and the oxide 230c. Accordingly, a transistor that has stable electrical characteristics with a small variation in electrical characteristics and improved reliability can be provided.

Furthermore, extraction of oxygen from the oxide 230b by the source electrode or the drain electrode can be inhibited. This can reduce oxygen extraction from the oxide 230b even when heat treatment is performed; thus, the transistor 200 is stable with respect to high temperatures in a manufacturing process (what is called thermal budget).

The above metal oxide has a property of making oxygen move easily in the direction perpendicular to the c-axis of the crystal included in the metal oxide. Thus, oxygen contained in the oxide 230c can be efficiently supplied to the oxide 230b.

The above metal oxide is a metal oxide having a dense structure with high crystallinity and a small amount of impurities or defects (oxygen vacancies and the like). In particular, after the formation of a metal oxide, heat treatment is performed at a temperature at which the metal oxide does not become a polycrystal (e.g., 400° C. to 600° C.), whereby the above metal oxide can have a dense structure with higher crystallinity. As the density of the above metal oxide is increased in such a manner, diffusion of impurities or oxygen in the above metal oxide can be further reduced.

A transistor using an oxide semiconductor is likely to have its electrical characteristics changed by impurities and oxygen vacancies in a channel formation region of the oxide semiconductor, which may affect the reliability. In some cases, hydrogen in the vicinity of an oxygen vacancy forms a defect that is an oxygen vacancy into which hydrogen enters (hereinafter, sometimes referred to as a VoH defect), which generates an electron serving as a carrier. Therefore, when the channel formation region in the oxide semiconductor includes oxygen vacancies, the transistor tends to have normally-on characteristics (the channel is generated even when no voltage is applied to the gate electrode and current flows through the transistor). Therefore, the impurities and oxygen vacancies are preferably reduced as much as possible in the channel formation region of the oxide semiconductor. In other words, the oxide semiconductor preferably includes an i-type (intrinsic) or substantially i-type channel formation region with a low carrier concentration.

As a countermeasure to the above, an insulator containing oxygen that is released by heating (hereinafter, sometimes referred to as excess oxygen) is provided in the vicinity of the oxide semiconductor so that oxygen can be supplied from the insulator to the oxide semiconductor when heat treatment is performed. As a result, oxygen vacancies in the channel formation region in the oxide semiconductor can be filled with supplied oxygen. Furthermore, hydrogen remaining in the oxide semiconductor reacts with supplied oxygen, so that the hydrogen can be removed as $H_2O$ (dehydration). This can inhibit formation of a VoH defect in the oxide semiconductor.

However, when an excess amount of oxygen is supplied to the source region or the drain region, the carrier concentration in the source region or the drain region is reduced, so that the on-state current or field-effect mobility of the transistor 200 might be decreased. Furthermore, a variation in the amount of oxygen supplied to the source region or the drain region on the substrate plane leads to a variation in characteristics of the semiconductor device including the transistor.

Hence, the region 234 functioning as the channel formation region in the oxide semiconductor is preferably i-type or substantially i-type with a low carrier concentration, whereas the region 236 functioning as the source region or the drain region are preferably n-type with a high carrier concentration. That is, it is preferable that oxygen be supplied to the region 234 in the oxide semiconductor and the region 236 not be supplied with an excess amount of oxygen.

As described above, a defect that is an oxygen vacancy which hydrogen enters (a VoH defect) generates an electron serving as a carrier in some cases. Hence, diffusion of VoH defects is preferably inhibited in an oxide semiconductor. Note that VoH defects might diffuse as VoH defects, or might diffuse in such a manner that hydrogen released from an oxygen vacancy diffuses and enters another oxygen vacancy.

For example, an increase in the crystallinity of the metal oxide used as the oxide 230b can inhibit release of hydrogen in an oxygen vacancy from the oxygen vacancy or inhibit diffusion of the hydrogen. This leads to prevention of the diffusion of VoH defects from the source region or the drain region into the channel formation region. Consequently, the i-type or substantially i-type region and the n-type region can be retained in the oxide semiconductor. Thus, a semiconductor device including a transistor with high reliability can be manufactured. A semiconductor device with less variations in transistor characteristics can be manufactured. Note that the diffusion of hydrogen in an oxygen vacancy or release of hydrogen from an oxygen vacancy is described later.

The insulator 254 is deposited by a sputtering method, whereby oxygen can be injected into the insulator 224, for example. Then, the oxygen injected into the insulator 224 is supplied to the oxide 230b through the oxide 230c. Accordingly, oxygen can be selectively supplied to the oxide 230c and a region of the oxide 230b that is in contact with the oxide 230c, which account for a large portion of the region 234.

When the metal oxide described in the above embodiment is used as the oxide 230b, diffusion of impurities and oxygen in the oxide 230b can be reduced. Accordingly, oxygen supplied to the region 234 of the oxide 230b can be inhibited from diffusing to the region 236 of the oxide 230b.

Part of excess oxygen diffusing to the oxide 230c also diffuses to the oxide 230d. Oxygen is less likely to diffuse to the oxide 230d than to the oxide 230c; thus, diffusion of oxygen to the insulator 250 is relatively inhibited. Thus, oxidation of the conductor 260 through the insulator 250 can be inhibited.

As described above, oxygen is selectively supplied to the region 234 of the oxide semiconductor to make the region 234 i-type or substantially i-type, and diffusion of oxygen to the region 236 functioning as the source region or the drain region is inhibited to maintain the n-type of the region 236. As a result, changes in the electrical characteristics of the transistor 200 can be inhibited, and thus variation in electrical characteristics of the transistor 200 on the substrate plane can be inhibited.

<Diffusion of Hydrogen in Oxygen Vacancy or Release of Hydrogen from Oxygen Vacancy>

In this section, the diffusion of hydrogen in an oxygen vacancy or release of hydrogen from an oxygen vacancy in a metal oxide is evaluated using simulation. Specifically, first-principles molecular dynamics simulation and first-principles calculation employing a method for finding a chemical reaction path are used.

<<Simulation Model 1>>

Here, a simulation model used for first-principles molecular dynamics simulation is described.

As a simulation model, a single crystal In—Ga—Zn oxide model and an In—Ga—Zn oxide model in an amorphous state are prepared. Hereinafter, the single crystal In—Ga—Zn oxide model is referred to as a c-IGZO model and the In—Ga—Zn oxide model in an amorphous state is referred to as an a-IGZO model. The a-IGZO model is formed by a melt-quench method.

The compositions of the c-IGZO model and the a-IGZO model are each In:Ga:Zn:O=1:1:1:4 [atomic ratio]. The c-IGZO model includes 56 atoms, and the a-IGZO model includes 84 atoms. The density of the a-IGZO model is 5.8 g/cm³.

Next, one oxygen atom in each of the c-IGZO model and the a-IGZO model is replaced with one hydrogen atom. The c-IGZO model and a-IGZO model after the replacement each have a defect that is an oxygen vacancy in which hydrogen is located (referred to as a VoH defect or a Ho defect in some cases).

Figure 22A:
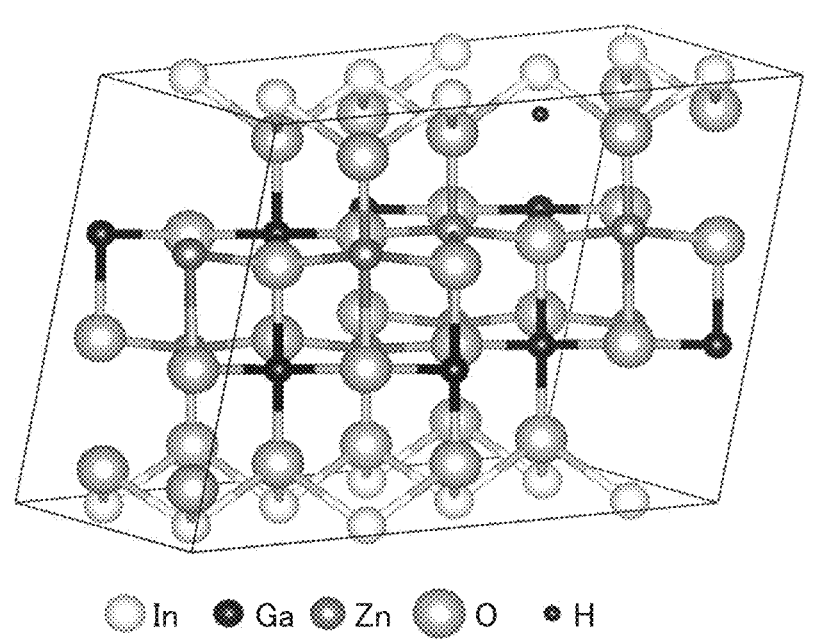
FIG. 22A and FIG. 22B are diagrams each illustrating a simulation model.
Figure 22B:
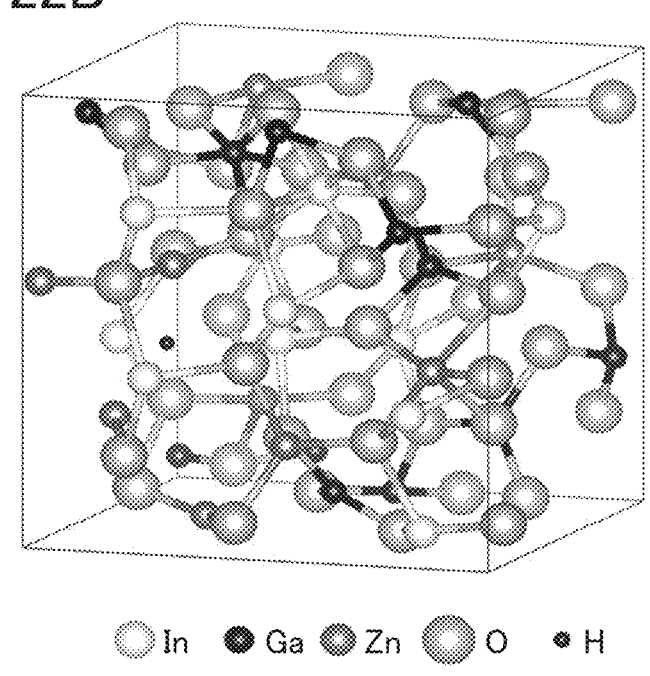

The c-IGZO model and the a-IGZO model each including a VoH defect are illustrated in FIG. 22A and FIG. 22B, respectively.

The above is the description of the simulation models.

<<Simulation Condition 1>>

Next, simulation conditions for the first-principles molecular dynamics simulation are described.

For the first-principles molecular dynamics simulation, first-principles electronic state simulation package VASP was used. The simulation conditions are listed in Table 5.

TABLE 5

| Simulation program | VASP |
| --- | --- |
| Basis function | Plane wave |
| Functional | GGA-PBE |
| Pseudopotential | PAW |
| Cut-off energy | 500 eV |
| The number of electrons | Neutral |

As a pseudopotential of electronic states, a potential generated by a PAW method was used, and as a functional, GGA-PBE was used. The k-point grid was 1×1×1.

The lattice vector (the length of an axis and the angle between axes) of the simulation model is fixed. In other words, the first-principles molecular dynamics simulation is performed under conditions where the number of particles (N), volume (V), and temperature (T) are constant (NVT ensemble). In addition, in the first-principles molecular dynamics simulation, a Nose-Hoover thermostat is used as a method for controlling the temperature.

The c-IGZO model including a VoH defect and the a-IGZO model including a VoH defect are subjected to the first-principles molecular dynamics simulation with the temperature set to 600° C., 800° C., or 1000° C. and the simulation time set to 50 p ($=5 \times 10^{-11}$) seconds.

<<Diffusion of Hydrogen in Oxygen Vacancies>>

Figure 23A:
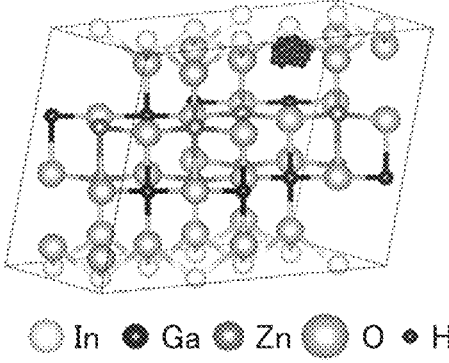
FIG. 23A to FIG. 23F are diagrams each illustrating a trajectory of hydrogen.
Figure 23B:
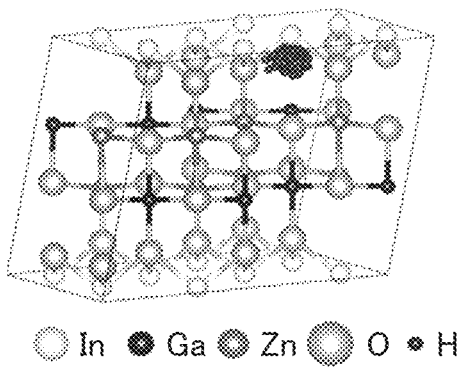
Figure 23C:
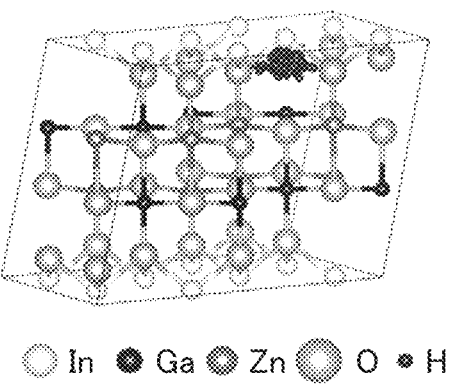
Figure 23D:
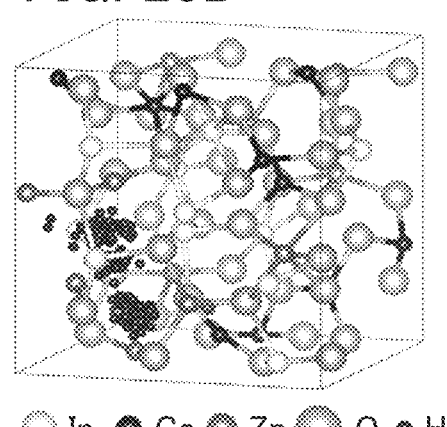
Figure 23E:
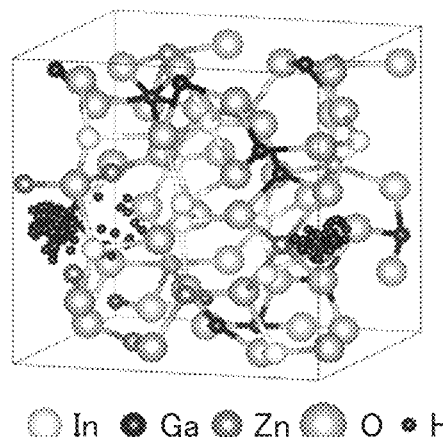
Figure 23F:
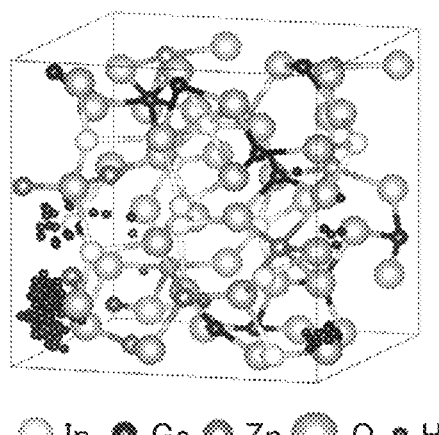

Trajectories of hydrogen in the first-principles molecular dynamics simulation are illustrated in FIG. 23A to FIG. 23F. FIG. 23A to FIG. 23C are diagrams illustrating trajectories of hydrogen in the c-IGZO model including a VoH defect in the first-principles molecular dynamics simulation. FIG. 23D to FIG. 23F are diagrams illustrating trajectories of hydrogen in the a-IGZO model including a VoH defect in the first-principles molecular dynamics simulation. FIG. 23A and FIG. 23D are diagrams illustrating the trajectories of hydrogen in the first-principles molecular dynamics simulation with the temperature set to 600° C. FIG. 23B and FIG. 23E are diagrams illustrating the trajectories of hydrogen in the first-principles molecular dynamics simulation with the temperature set to 800° C. FIG. 23C and FIG. 23F are diagrams illustrating the trajectories of hydrogen in the first-principles molecular dynamics simulation with the temperature set to 1000° C.

As can be observed from FIG. 23A to FIG. 23C, in the c-IGZO model including a VoH defect, hydrogen remained in oxygen vacancies and did not exhibited the behavior of being released from the oxygen vacancies at any of the temperatures.

As can be observed from FIG. 23D to FIG. 23F, in the a-IGZO model including a VoH defect, hydrogen in oxygen vacancies exhibited the behavior of being released from the oxygen vacancies to diffuse into the model at each of the temperatures. It was also confirmed that hydrogen released from the oxygen vacancies exhibited the behavior of bonding to lattice oxygen to diffuse.

The above indicates that, with an increase in the crystallinity of the metal oxide, hydrogen in oxygen vacancies becomes more unlikely to release from the oxygen vacancies.

<<Simulation Model 2>>

Next, simulation models used for the first-principles calculation employing a method for finding a chemical reaction path are described.

As the simulation models, a c-IGZO model and a-IGZO model each including a VoH defect are prepared.

Although the composition and density of the c-IGZO model including a VoH defect are the same as those of the c-IGZO model including a VoH defect described in <<Simulation model 1>>, there is a difference in the number of constituent atoms. Specifically, the c-IGZO model including a VoH defect includes 112 atoms.

As the a-IGZO model including a VoH defect, the a-IGZO model including a VoH defect described in <<Simulation model 1>> is used.

<<Simulation Condition 2>>

Next, simulation conditions for the first-principles calculation employing a method for finding a chemical reaction path are described.

With the use of the first-principles electron state simulation package VASP, the NEB (Nudged Elastic Band) method, which is a method for finding a chemical reaction path, was employed for the first-principles calculation. The NEB method is a technique for finding the state where required energy is the minimum, from the states in transition between the two states, the initial state and the final state. The activation energy is the difference between the highest energy on the path and an energy of the most stable structure on the path.

The simulation conditions shown in Table 5 were used for the first-principles calculation employing the NEB method. The k-point grid was 2×2×3 for the c-IGZO model including a VoH defect and 2×2×2 for the a-IGZO model including a VoH defect.

Figure 24:
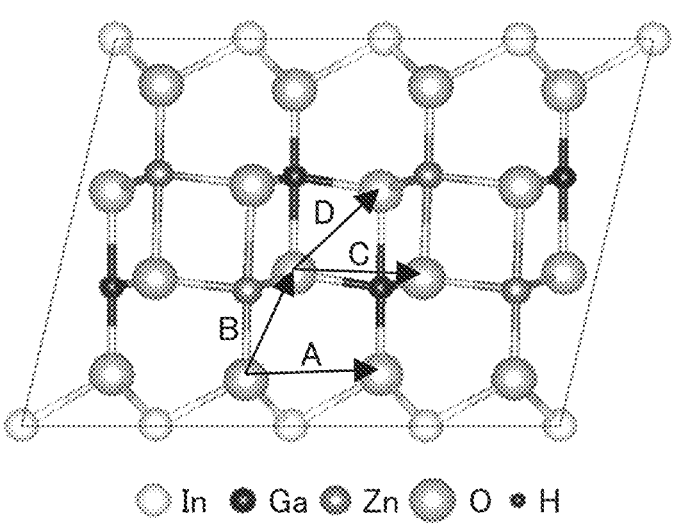
FIG. 24 is a diagram illustrating paths through which hydrogen in oxygen vacancies is released from the oxygen vacancies.

FIG. 24 illustrates paths through which hydrogen in oxygen vacancies is released from the oxygen vacancies in the c-IGZO model including a VoH defect. In the c-IGZO model including a VoH defect, four paths (Path A to Path D) indicated by the arrows in FIG. 24 are subjected to simulation employing the NEB method.

The structure in an amorphous state is indeterminate, which makes simulation employing the NEB method difficult. In view of this, in the first-principles molecular dynamics simulation of the a-IGZO model including a VoH defect with the temperature set to 600° C., an atomic structure before release of hydrogen in an oxygen vacancy from the oxygen vacancy is regarded as an initial state and an atomic structure after release of hydrogen in an oxygen vacancy from the oxygen vacancy is regarded as a final state. The atomic structure in the initial state and the atomic structure in the final state are used to perform simulation employing the NEB method. In this simulation, 45 sets of the atomic structure in the initial state and the atomic structure in the final state are prepared. In other words, for the a-IGZO model including a VoH defect, 45 paths are subjected to simulation employing the NEB method.

<<Activation Energy>>

Figure 25A:
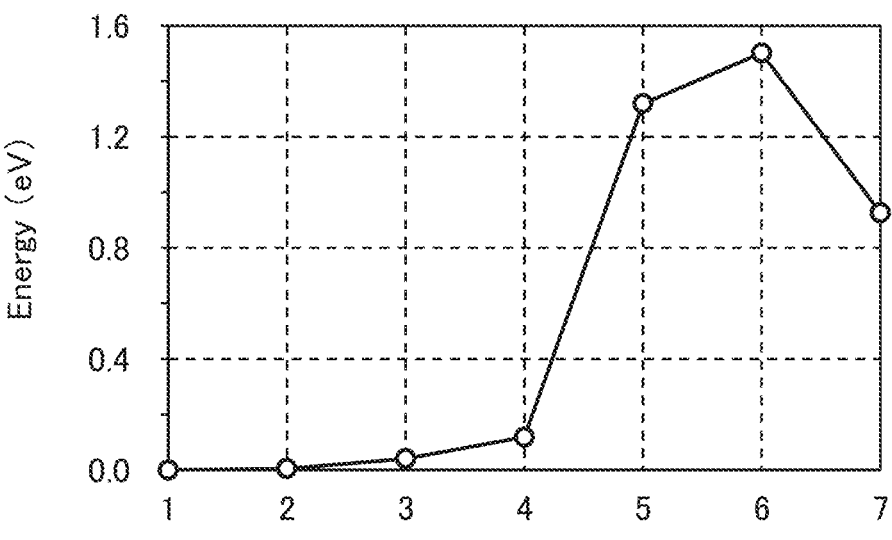
FIG. 25A and FIG. 25B are diagrams showing energy changes.
Figure 25B:
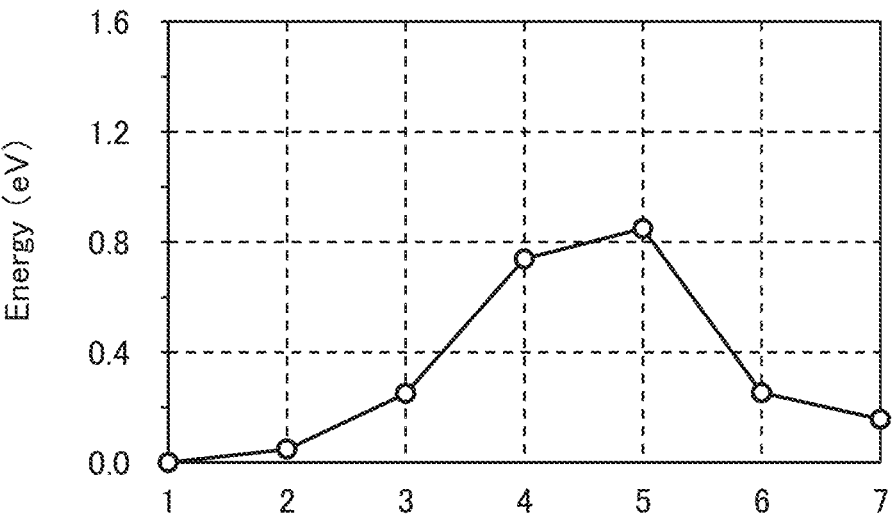

Energy changes in the process of release of hydrogen in an oxygen vacancy from the oxygen vacancy, which is obtained by the simulation employing the NEB method, are shown in FIG. 25A and FIG. 25B. FIG. 25A shows an energy change in Path C (see FIG. 24) of the c-IGZO model including a VoH defect. FIG. 25B shows an energy change in a certain path of the a-IGZO model including a VoH defect. In FIG. 25A and FIG. 25B, the horizontal axis represents reaction coordinate and the vertical axis represents energy (eV).

According to FIG. 25A and FIG. 25B, the energy necessary for release of hydrogen in an oxygen vacancy from the oxygen vacancy (activation energy) is 1.50 eV in Path C of the c-IGZO model including a VoH defect and 0.85 eV in the a-IGZO model including a VoH defect.

Atomic structures of the reaction coordinates of the figures represented by the horizontal axis in FIG. 25A are illustrated in FIG. 26A to FIG. 26G. FIG. 26A to FIG. 26G are the atomic structures of the reaction coordinates of the FIGS. 1 to 7, respectively, represented by the horizontal axis in FIG. 25A. Atomic structures of the reaction coordinates of the figures represented by the horizontal axis in FIG. 25B are illustrated in FIG. 27A to FIG. 27G. FIG. 27A to FIG. 27G are the atomic structures of the reaction coordinates of the FIGS. 1 to 7, respectively, represented by the horizontal axis in FIG. 25B.

FIG. 27A to FIG. 27G reveal that the a-IGZO model including a VoH defect exhibits the following behavior: oxygen that traps hydrogen approaches the hydrogen to assist the release of the hydrogen from an oxygen vacancy. Thus, the activation energy relating to the release of hydrogen from an oxygen vacancy is presumably lower in the a-IGZO model including a VoH defect than in the c-IGZO model including a VoH defect.

Next, the calculated activation energy and the reaction frequency Γ were calculated by the following formula.

$$\Gamma = \nu \exp\left(\frac{E_a}{k_B T}\right)$$ [Formula 4]

In the above formula, $E_a$ is the activation energy, $k_B$ is the Boltzmann constant, T is the absolute temperature, and ν is the frequency factor.

The calculated reaction frequency Γ is shown in Table 6. Note that the reaction frequency Γ is calculated on the assumption that the frequency factor ν is $10^{13}$ s$^{-1}$ and the absolute temperature T is 125° C.

TABLE 6

| Model | Activation energy $E_a$ [eV] | Reaction frequency Γ [s$^{-1}$] |
|---|---|---|
| c-IGZO including VoH defect | 1.50 | 9.62 × 10$^{-7}$ |
| a-IGZO including VoH defect | 0.85 | 1.69 × 10$^2$ |

The value of the reaction frequency Γ shown in Table 6 reveals that the a-IGZO model including a VoH defect is likely to cause the release of hydrogen from the oxygen vacancy at 125° C. By contrast, the c-IGZO model including a VoH defect is found to be unlikely to cause the release of hydrogen from the oxygen vacancy at 125° C. Furthermore, the c-IGZO model including a VoH defect is found to be less likely to cause the release of hydrogen from the oxygen vacancy than the a-IGZO model including a VoH defect at 125° C. This indicates that, with an increase in the crystallinity of the metal oxide, hydrogen in oxygen vacancies becomes more unlikely to release from the oxygen vacancies.

Table 7 shows the activation energy of each of the four paths (Path A to Path D) indicated by the arrows in FIG. 24.

TABLE 7

| Path | Activation energy $E_a$ (eV) |
| --- | --- |
| A | 1.82 |
| B | 1.52 |
| C | 1.50 |
| D | 1.71 |

Table 7 reveals that Path C exhibits the lowest activation energy among Path A to Path D in the c-IGZO model including a VoH defect.

Figure 28:
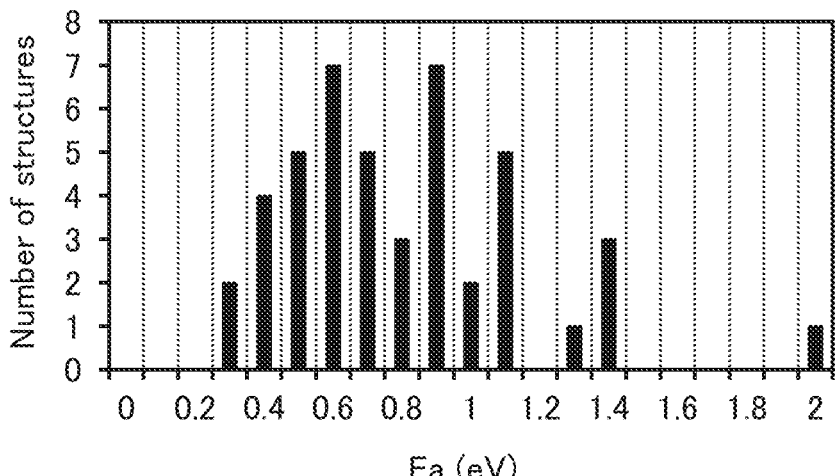
FIG. 28 is a histogram of activation energy.
Figure 30A:
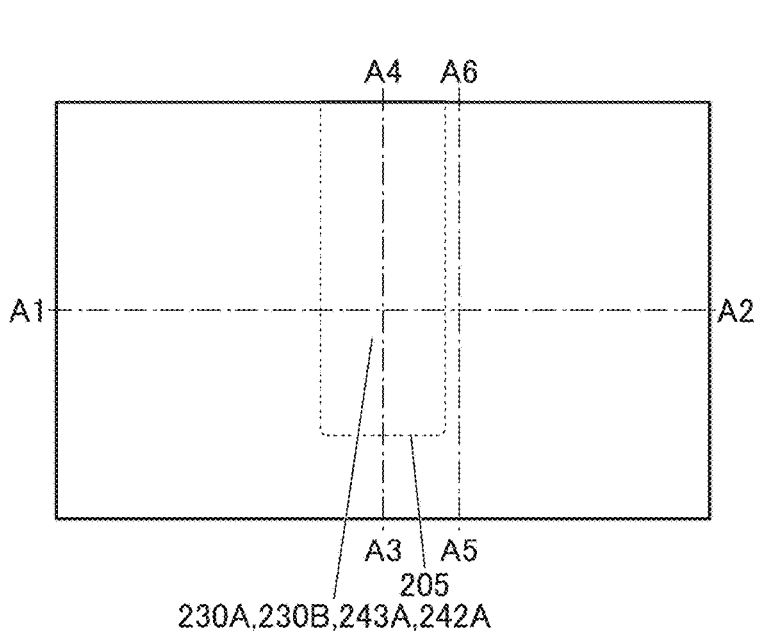
FIG. 30A is a top view illustrating a method for manufacturing the semiconductor device.
Figure 30C:
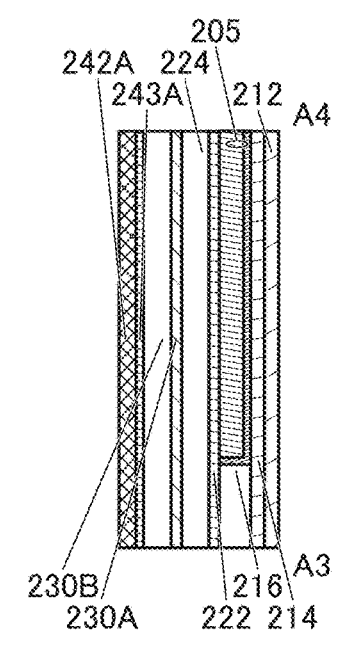
FIG. 30B to FIG. 30D are cross-sectional views illustrating the method for manufacturing the semiconductor device.
Figure 30B:
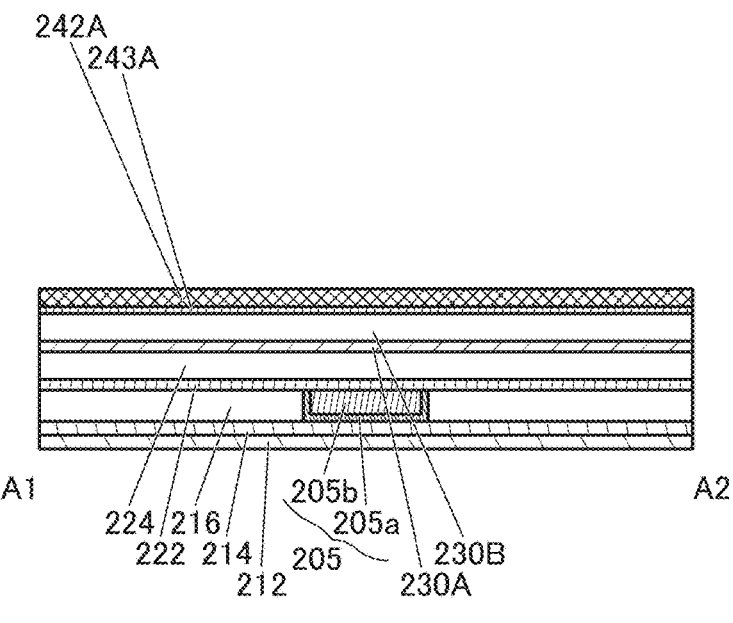
Figure 30D:
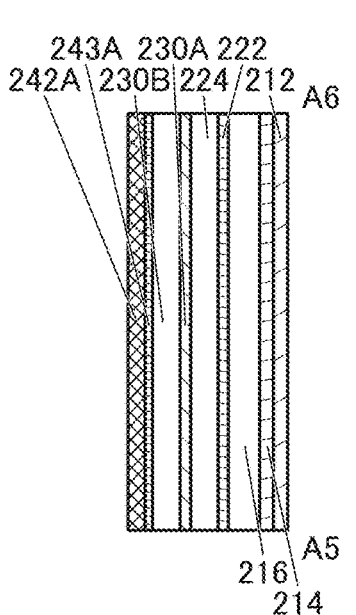
Figure 37A:
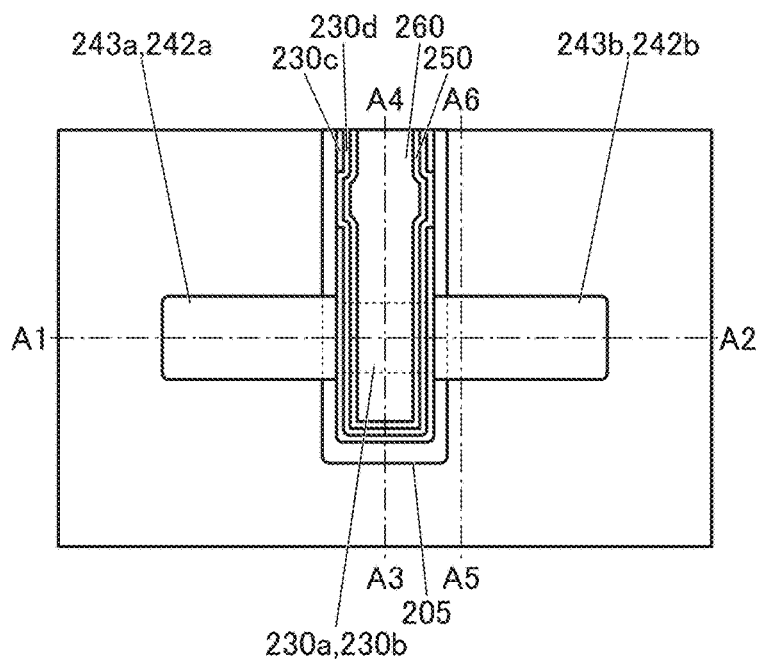
FIG. 37A is a top view illustrating the method for manufacturing the semiconductor device.
Figure 37C:
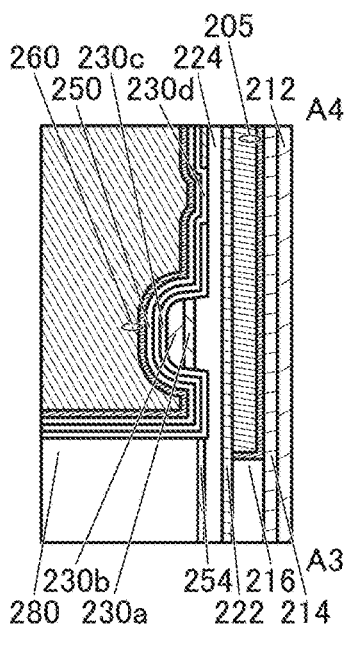
FIG. 37B to FIG. 37D are cross-sectional views illustrating the method for manufacturing the semiconductor device.
Figure 37B:
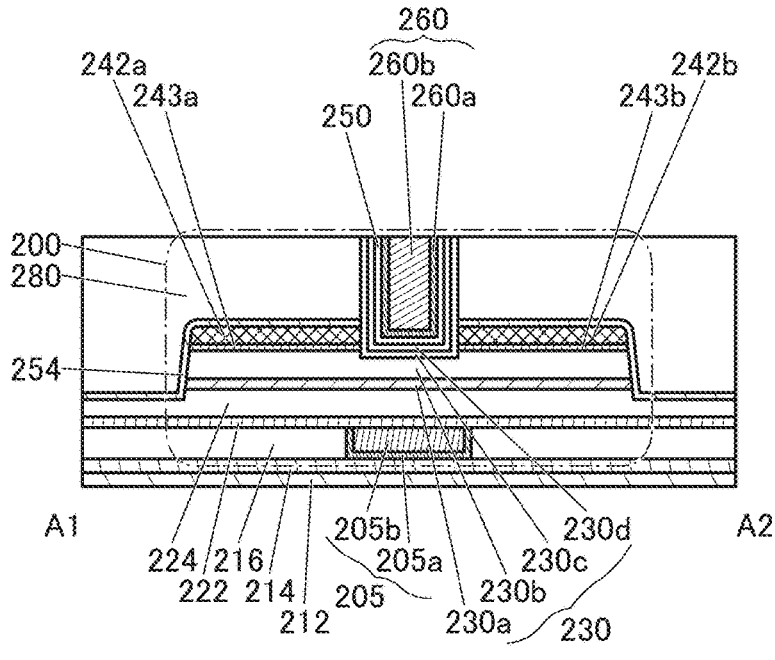
Figure 37D:
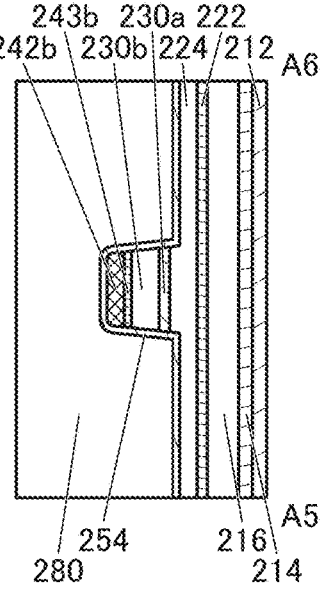

A histogram of the activation energy of the 45 paths in the a-IGZO model including a VoH defect is shown in FIG. 28. In FIG. 28, the horizontal axis represents activation energy $E_a$ (eV) and the vertical axis represents the number of paths (Number of structures). In the 45 paths in the a-IGZO model including a VoH defect, the average value of the activation energy $E_a$ is 0.75 eV and the minimum value of the activation energy $E_a$ is 0.25 eV.

Table 7 and FIG. 28 demonstrate that the energy necessary for release of hydrogen in an oxygen vacancy from the oxygen vacancy (activation energy) in the a-IGZO model including a VoH defect is much lower than that in the c-IGZO model including a VoH defect.

As described above, an increase in the crystallinity of the metal oxide can inhibit the release of hydrogen in an oxygen vacancy. Thus the use of a metal oxide with high crystallinity as the oxide 230 can inhibit diffusion of hydrogen from the source region or the drain region into the channel formation region. Consequently, the i-type or substantially i-type region and the n-type region can be retained in the oxide semiconductor. Thus, a semiconductor device including a transistor with high reliability can be manufactured. A semiconductor device with less variations in transistor characteristics can be manufactured. A semiconductor device that can be miniaturized can be provided.

The above is the description of the diffusion of hydrogen in an oxygen vacancy or the release from the oxygen vacancy in the metal oxide.

The oxide 230*d* preferably contains at least one of the metal elements contained in the metal oxide used as the oxide 230*c*, and further preferably contains all of the metal elements. For example, it is preferable that an In-M-Zn oxide, an In—Zn oxide, or indium oxide be used as the oxide 230*c*, and an In-M-Zn oxide, an M-Zn oxide, or an oxide of the element M be used as the oxide 230*d*. Accordingly, the density of defect states at the interface between the oxide 230*c* and the oxide 230*d* can be decreased.

The oxide 230*d* is preferably a metal oxide that inhibits diffusion or passage of oxygen, compared to the oxide 230*c*. Providing the oxide 230*d* between the insulator 250 and the oxide 230*c* can inhibit diffusion of oxygen contained in the insulator 280 into the insulator 250. Thus, the oxygen can be efficiently supplied to the oxide 230*b* through the oxide 230*c*.

When the atomic ratio of In to the metal element that is the main component in the metal oxide used as the oxide 230*d* is smaller than atomic ratio of In to the metal element that is the main component in the metal oxide used as the oxide 230*c*, diffusion of In to the insulator 250 side can be inhibited. Since the insulator 250 functions as a gate insulator, the transistor exhibits poor characteristics when In enters the insulator 250 and the like. Thus, the oxide 230*d* provided between the oxide 230*c* and the insulator 250 enables a semiconductor device to have high reliability.

Here, the conduction band minimum gradually changes at junction portions of the oxide 230*a*, the oxide 230*b*, the oxide 230*c*, and the oxide 230*d*. In other words, the conduction band minimum at the junction portions of the oxide 230*a*, the oxide 230*b*, the oxide 230*c*, and the oxide 230*d* continuously changes or is continuously connected to obtain this, the density of defect states in a mixed layer formed at the interface between the oxide 230*a* and the oxide 230*b*, the interface between the oxide 230*b* and the oxide 230*c*, and the interface between the oxide 230*c* and the oxide 230*d* is preferably decreased.

Specifically, when the oxide 230*a* and the oxide 230*b*, the oxide 230*b* and the oxide 230*c*, and the oxide 230*c* and the oxide 230*d* contain the same element as a main component in addition to oxygen, a mixed layer with a low density of defect states can be formed. For example, in the case where the oxide 230*b* is an In-M-Zn oxide, an In-M-Zn oxide, an M-Zn oxide, an oxide of the element M, an In—Zn oxide, indium oxide, or the like may be used as the oxide 230*a*, the oxide 230*c*, and the oxide 230*d*.

Specifically, as the oxide 230*a*, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 230*b* and the oxide 230*c*, a metal oxide with a composition of In:M:Zn=1:1:1 [atomic ratio] or in the neighborhood thereof, or a composition of In:M:Zn=4:2:3 [atomic ratio] or in the neighborhood thereof is used. As the oxide 230*d*, a metal oxide with a composition of In:M:Zn=1:3:4 [atomic ratio] or in the neighborhood thereof, a composition of M:Zn=2:1 [atomic ratio] or in the neighborhood thereof, a composition of M:Zn=2:5 [atomic ratio] or in the neighborhood thereof, or an oxide of the element M is used. Note that a composition in the neighborhood includes ±30% of an intended atomic ratio. Gallium is preferably used as the element M.

When the oxide 230*a*, the oxide 230*b*, the oxide 230*c*, and the oxide 230*d* have the above structure, the density of defect states at the interface between the oxide 230*a* and the oxide 230*b*, the interface between the oxide 230*b* and the oxide 230*c*, and the interface between the oxide 230*c* and the oxide 230*d* can be made low. Thus, the influence of interface scattering on carrier conduction is small, and the transistor 200 can have a high on-state current and excellent frequency characteristics.

In a cross-sectional view of the transistor in the channel length direction, it is preferable that a groove be provided in the oxide 230*b* and the oxide 230*c* including the CAAC-OS be embedded in the groove. At this time, the oxide 230*c* is provided to cover the inner wall (the side wall and the bottom surface) of the groove.

In a cross-sectional view of the transistor in the channel length direction, the depth of the groove portion of the oxide 230*b* is preferably substantially the same as the thickness of the oxide 230*c*. In other words, the top surface of the oxide 230*c* in a region overlapping with the oxide 230*b* is preferably level or substantially level with the interface between the oxide 230*b* and the oxide 243*a* or the oxide 243*b*. For example, when the bottom surface of the insulator 222 is a reference, a difference between the level of the interface between the oxide 230*b* and the oxide 243*a* or the oxide 243*b* and the level of the interface between the oxide 230*c* and the oxide 230*d* is preferably smaller than or equal to the thickness of the oxide 230*c*, further preferably smaller than or equal to half of the thickness of the oxide 230*c*.

Such a structure reduces the effect of defects such as VoH or impurities in the transistor, whereby a channel can be formed in the oxide 230c. As a result, the transistor can have favorable electrical characteristics. Furthermore, a semiconductor device with a small variation in transistor characteristics and high reliability can be provided.

FIG. 21B illustrates the structure in which the side wall of the opening in which the conductor 260 and the like are embedded is substantially perpendicular to the formation surface of the oxide 230b including the groove of the oxide 230b; one embodiment of the present invention is not limited thereto. The opening may have a U-shape with a bottom portion having a gentle curve.

Here, in the oxide 230c, it is preferable that the c-axis of the crystal included in the metal oxide described in the above embodiment be substantially perpendicular to the formation surface of the oxide 230c or the surface of the oxide 230c that is in contact with the oxide 230d. Thus, the oxide 230c includes a region where crystal layers extend to be substantially parallel to the bottom surface and the side surface of the opening. The oxide 230d further preferably has a crystal structure similar to that of the oxide 230c.

As illustrated in FIG. 21C, a curved surface may be provided between the side surface of the oxide 230b and the top surface of the oxide 230b in a cross-sectional view of the transistor 200 in the channel width direction. That is, an end portion of the side surface and an end portion of the top surface may be curved (such a shape is hereinafter also referred to as a rounded shape).

The radius of curvature of the curved surface is preferably greater than 0 nm and less than thickness of the oxide 230b in the region overlapping with the conductor 242a or the conductor 242b or less than half of the length of the region not having the curved surface of the top surface of the oxide 230b. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the groove with the insulator 250 and the conductor 260, which are formed in a later step. Furthermore, a decrease in the length of the region not having the curved surface of the top surface of the oxide 230b can be prevented, and reductions in the on-state current and mobility of the transistor 200 can be inhibited. Thus, a semiconductor device having favorable electrical characteristics can be provided.

The oxide 230c may be provided for each of the transistors 200. That is, the oxide 230c of the transistor 200 is not necessarily in contact with the oxide 230c of another transistor 200 adjacent to the transistor 200. Furthermore, the oxide 230c of the transistor 200 may be apart from the oxide 230c of another transistor 200 adjacent to the transistor 200. In other words, a structure in which the oxide 230c is not located between the transistor 200 and another transistor 200 adjacent to the transistor 200 may be employed.

When the above structure is employed for the semiconductor device where a plurality of transistors 200 are located in the channel width direction, the oxide 230c is independently provided for each transistor 200. Accordingly, generation of a parasitic transistor between the transistor 200 and another transistor 200 adjacent to the transistor 200 can be inhibited, and generation of a leakage path along the conductor 260 can be inhibited. Thus, a semiconductor device that has favorable electrical characteristics and can be miniaturized or highly integrated can be provided.

For example, when a distance between a side end portion of the oxide 230c of the transistor 200 and a side end portion of the oxide 230c of another transistor 200 adjacent to the transistor 200, which face each other in the channel width direction of the transistor 200, is denoted by $L_1$, $L_1$ is made greater than 0 nm. When a distance between a side end portion of the oxide 230a of the transistor 200 and a side end portion of the oxide 230a of another transistor 200 adjacent to the transistor 200, which face each other in the channel width direction of the transistor 200, is denoted by $L_2$, a value of a ratio of $L_1$ to $L_2$ ($L_1/L_2$) is preferably greater than 0 and less than 1, further preferably greater than or equal to 0.1 and less than or equal to 0.9, still further preferably greater than or equal to 0.2 and less than or equal to 0.8. Note that $L_2$ may be a distance between a side end portion of the oxide 230b of the transistor 200 and a side end portion of the oxide 230b of another transistor 200 adjacent to the transistor 200, which face each other.

By a reduction in the ratio of $L_1$ to $L_2$ ($L_1/L_2$), even when misalignment of a region where the oxide 230c is not located between the transistor 200 and another transistor 200 adjacent to the transistor 200 occurs, the oxide 230c of the transistor 200 can be apart from the oxide 230c of another transistor 200 adjacent to the transistor 200.

By an increase in the ratio of $L_1$ to $L_2$ ($L_1/L_2$), even when the interval between the transistor 200 and another transistor 200 adjacent to the transistor 200 is decreased, the width of the minimum feature size can be secured, and further miniaturization or higher integration of the semiconductor device can be achieved.

Note that each of the conductor 260 and the insulator 250 may be shared by the adjacent transistors 200. In other words, the conductor 260 of the transistor 200 includes a region continuous with the conductor 260 of another transistor 200 adjacent to the transistor 200. In addition, the insulator 250 of the transistor 200 includes a region continuous with the insulator 250 of another transistor 200 adjacent to the transistor 200.

In the above structure, the oxide 230d includes a region in contact with the insulator 224 between the transistor 200 and another transistor 200 adjacent to the transistor 200. Note that the oxide 230d of the transistor 200 may be apart from the oxide 230d of another transistor 200 adjacent to the transistor 200. In that case, the insulator 250 includes a region in contact with the insulator 224 between the transistor 200 and another transistor 200 adjacent to the transistor 200.

The insulator 212, the insulator 214, the insulator 254, the insulator 282, the insulator 283, the insulator 284, and the insulator 286 preferably function as barrier insulating films, each of which inhibits diffusion of impurities such as water and hydrogen into the transistor 200 from the substrate side or above the transistor 200. Thus, for each of the insulator 212, the insulator 214, the insulator 254, the insulator 282, the insulator 283, the insulator 284, and the insulator 286, an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), and copper atoms (through which the impurities are less likely to pass) is preferably used. Alternatively, it is preferable to use an insulating material having a function of inhibiting diffusion of oxygen (e.g., at least one of oxygen atoms, oxygen molecules, and the like) (through which the above oxygen is less likely to pass).

Note that in this specification, a barrier insulating film refers to an insulating film having a barrier property. A barrier property in this specification means a function of inhibiting diffusion of a targeted substance (also referred to as low permeability). Alternatively, a barrier property in this specification means a function of trapping or fixing (also referred to as gettering) a targeted substance.

For example, it is preferable that the insulator 212, the insulator 283, and the insulator 284 be formed using silicon nitride or the like, and the insulator 214, the insulator 254, and the insulator 282 be formed using aluminum oxide or the like. Accordingly, impurities such as water and hydrogen can be inhibited from diffusing to the transistor 200 side from the substrate side through the insulator 212 and the insulator 214. Alternatively, oxygen contained in the insulator 224 or the like can be inhibited from diffusing to the substrate side through the insulator 212 and the insulator 214. In this manner, the transistor 200 is preferably surrounded by the insulator 212, the insulator 214, the insulator 254, the insulator 282, the insulator 283, and the insulator 284 having a function of inhibiting diffusion of oxygen and impurities such as water and hydrogen.

The resistivities of the insulator 212, the insulator 284, and the insulator 286 are preferably low in some cases. For example, by setting the resistivities of the insulator 212, the insulator 284, and the insulator 286 to approximately $1 \times 10^{13}$ Ωcm, the insulator 212, the insulator 284, and the insulator 286 can sometimes reduce charge up of the conductor 205, the conductor 242a, the conductor 242b, the conductor 260, the conductor 246a, or the conductor 246b in treatment using plasma or the like in the manufacturing process of a semiconductor device. The resistivities of the insulator 212, the insulator 284, and the insulator 286 are preferably higher than or equal to $1 \times 10^{10}$ Ωcm and lower than or equal to $1 \times 10^{15}$ Ωcm.

Note that the insulator 283 or the insulator 284 is not necessarily provided.

The insulator 216 and the insulator 280 preferably have a lower dielectric constant than insulator 214. When a material with a low dielectric constant is used for an interlayer film, parasitic capacitance generated between wirings can be reduced. As the insulator 216 and the insulator 280, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The conductor 205 sometimes functions as a second gate electrode. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be higher, and its off-state current can be reduced. Thus, a drain current at the time when a potential applied to the conductor 260 is 0 V can be lower in the case where a negative potential is applied to conductor 205 than in the case where the negative potential is not applied.

The conductor 205 is positioned to overlap with the oxide 230 and the conductor 260.

As illustrated in FIG. 21A, the conductor 205 is preferably larger than region of the oxide 230 that does not overlap with the conductor 242a or the conductor 242b. In particular, as illustrated in FIG. 21C, the conductor 205 preferably extends to a region outside end portions of the oxide 230a and the oxide 230b that intersect with the channel width direction. That is, the conductor 205 and the conductor 260 preferably overlap with each other with the insulator therebetween, in a region beyond the side surface of the oxide 230 in the channel width direction. With this structure, the channel formation region of the oxide 230 can be electrically surrounded by the electric field of the conductor 260 functioning as the first gate electrode and the electric field of the conductor 205 functioning as the second gate electrode. In this specification, such a transistor structure in which a channel formation region is electrically surrounded by the electric fields of the first gate electrode and the second gate electrode is referred to as a surrounded channel (S-channel) structure.

In this specification and the like, the S-channel structure refers to a transistor structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

Furthermore, as illustrated in FIG. 21C, the conductor 205 extends to function as a wiring as well. However, without limitation to this structure, a structure in which a conductor functioning as a wiring is provided below the conductor 205 may be employed. In addition, the conductor 205 does not necessarily have to be provided in each transistor. For example, the conductor 205 may be shared by a plurality of transistors.

Although the transistor 200 having a structure in which the conductor 205 has a stacked structure of the conductor 205a and the conductor 205b is illustrated, the present invention is not limited thereto. For example, the conductor 205 may have a single-layer structure or a stacked-layer structure of three or more layers. In the case where a structure body has a stacked-layer structure, layers may be distinguished by ordinal numbers corresponding to the formation order.

Here, for the conductor 205a, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom is preferably used. Alternatively, the conductor 205a is preferably formed using a conductive material having a function of inhibiting diffusion of oxygen (e.g., at least one of oxygen atoms, oxygen molecules, and the like).

When a conductive material having a function of inhibiting diffusion of oxygen is used for the conductor 205a, the conductivity of the conductor 205b can be inhibited from being lowered because of oxidation. As a conductive material having a function of inhibiting diffusion of oxygen, for example, tantalum, tantalum nitride, ruthenium, or ruthenium oxide is preferably used. Thus, the conductor 205a is a single layer or a stacked layer of the above conductive materials. For example, the conductor 205a may be a stack of tantalum, tantalum nitride, ruthenium, or ruthenium oxide and titanium or titanium nitride.

The conductor 205b is preferably formed using a conductive material containing tungsten, copper, or aluminum as its main component. Note that the conductor 205b is illustrated as a single layer but may have a stacked-layer structure, for example, a stack of any of the above conductive materials and titanium or titanium nitride.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

As the insulator 222, an insulator containing an oxide of one or both of aluminum and hafnium that is an insulating material is preferably used. It is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen inside the transistor 200 and inhibit generation of oxygen vacancies in the oxide 230.

Furthermore, the conductor 205 can be inhibited from reacting with oxygen contained in the insulator 224 or the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used as the insulator 222.

A single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST) may be used as the insulator 222. With miniaturization and high integration of a transistor, a problem such as leakage current may arise because of a thinner gate insulator. When a high-k material is used for an insulator functioning as the gate insulator, a gate potential at the time of operating the transistor can be reduced while the physical thickness of the gate insulator is kept.

It is preferable that oxygen be released from the insulator 224 in contact with the oxide 230 by heating. Silicon oxide, silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

For the insulator 224, specifically, an oxide material from which part of oxygen is released by heating, in other words, an insulating material including an excess-oxygen region is preferably used. An oxide film that releases oxygen by heating is an oxide film in which the amount of released oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

One or more of heat treatment, microwave treatment, and RF treatment may be performed in a state in which the insulator including an excess-oxygen region and the oxide 230 are in contact with each other. By the treatment, water or hydrogen in the oxide 230 can be removed. Part of hydrogen is diffused into or gettered by the conductor 242a and the conductor 242b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and RF application to the substrate side allows the oxygen radicals generated by the high-density plasma to be efficiently introduced into the oxide 230 or an insulator near the oxide 230. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In a manufacturing process of the transistor 200, the heat treatment is preferably performed with the surface of the oxide 230 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 230 can promote a reaction in which oxygen vacancies in the oxide 230 are filled with supplied oxygen. Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and formation of VoH.

Note that the insulator 222 and the insulator 224 may each have a stacked-layer structure of two or more layers. In that case, without limitation to a stacked-layer structure formed of the same material, a stacked-layer structure formed of different materials may be employed.

The oxide 243a and the oxide 243b may be provided over the oxide 230b.

The oxide 243a and the oxide 243b preferably have a function of inhibiting the passage of oxygen. The oxide 243a (the oxide 243b) having a function of inhibiting the passage of oxygen is preferably provided between the oxide 230b and the conductor 242a (the conductor 242b) functioning as the source electrode or the drain electrode, in which case the electric resistance between the conductor 242a (the conductor 242b) and the oxide 230b can be reduced. Such a structure can improve the electrical characteristics of the transistor 200 and the reliability of the transistor 200. In the case where the electric resistance between the oxide 230b and the conductor 242a (the conductor 242b) can be sufficiently reduced, the oxide 243a (the oxide 243b) is not necessarily provided.

A metal oxide containing the element M may be used as the oxide 243*a* and the oxide 243*b*. In particular, aluminum, gallium, yttrium, or tin is preferably used as the element M. The concentration of the element M in the oxide 243*a* and the oxide 243*b* is preferably higher than that in the oxide 230*b*. Alternatively, gallium oxide may be used as the oxide 243*a* and the oxide 243*b*. Further alternatively, a metal oxide such as an In-M-Zn oxide may be used as the oxide 243*a* and the oxide 243*b*. Specifically, the atomic ratio of the element M to In in the metal oxide used as the oxide 243*a* and the oxide 243*b* is preferably greater than atomic ratio of the element M to In in the metal oxide used as the oxide 230*b*. The thicknesses of the oxide 243*a* and the oxide 243*b* are preferably larger than or equal to 0.5 nm and smaller than or equal to 5 nm, further preferably larger than or equal to 1 nm and smaller than or equal to 3 nm, still further preferably larger than or equal to 1 nm and smaller than or equal to 2 nm. The oxide 243*a* and the oxide 243*b* preferably have crystallinity. With the oxide 243*a* and the oxide 243*b* having crystallinity, release of oxygen in the oxide 230 can be suitably inhibited. When the oxide 243*a* and the oxide 243*b* have a hexagonal crystal structure, for example, release of oxygen in the oxide 230 can sometimes be inhibited.

The conductor 242*a* is provided over the oxide 243*a* and the conductor 242*b* is provided over the oxide 243*b*. The conductor 242*a* and the conductor 242*b* function as the source electrode and the drain electrode of the transistor 200.

For the conductor 242*a* and the conductor 242*b*, for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

A curved surface is sometimes included between the side surface of the conductor 242*a* (the conductor 242*b*) and the top surface of the conductor 242*a* (the conductor 242*b*). That is, an end portion of the side surface and an end portion of the top surface might be curved. The radius of curvature of the curved surface at an end portion of each of the conductor 242*a* and the conductor 242*b* is greater than or equal to 3 nm and less than or equal to 10 nm, preferably greater than or equal to 5 nm and less than or equal to 6 nm, for example. When the end portions are not angular, the coverage with films in later deposition steps is improved.

When the oxide 243*a* (oxide 243*b*) is not provided, the contact between the conductor 242*a* (conductor 242*b*) and the oxide 230*b* or the oxide 230*c* may make oxygen in the oxide 230*b* or the oxide 230*c* diffuse into the conductor 242*a* (conductor 242*b*), resulting in oxidation of the conductor 242*a* (conductor 242*b*). It is highly probable that oxidation of the conductor 242*a* and the conductor 242*b* lowers the conductivity of the conductor 242*a* and the conductor 242*b*. Note that diffusion of oxygen in the oxide 230*b* or the oxide 230*c* into the conductor 242*a* and the conductor 242*b* can be rephrased as absorption of oxygen in the oxide 230*b* or the oxide 230*c* by the conductor 242*a* and the conductor 242*b*.

When oxygen in the oxide 230*b* or the oxide 230*c* diffuses into the conductor 242*a* and the conductor 242*b*, a layer is sometimes formed between the conductor 242*a* and the oxide 230*b* and between the conductor 242*b* and the oxide 230*b*, or between the conductor 242*a* and the oxide 230*c* and between the conductor 242*b* and the oxide 230*c*. Since the layer contains a larger amount of oxygen than conductor 242*a* or the conductor 242*b*, the layer seems to have an insulating property. In this case, a three-layer structure of the conductor 242*a* or the conductor 242*b*, the layer, and the oxide 230*b* or the oxide 230*c* can be regarded as a three-layer structure of a metal, an insulator, and a semiconductor and is sometimes referred to as an MIS (Metal-Insulator-Semiconductor) structure or a diode-junction structure mainly with an MIS structure.

Note that hydrogen contained in the oxide 230*b*, the oxide 230*c*, or the like diffuses into the conductor 242*a* or the conductor 242*b* in some cases. In particular, when a nitride containing tantalum is used for the conductor 242*a* and the conductor 242*b*, hydrogen contained in the oxide 230*b*, the oxide 230*c*, or the like is likely to diffuse into the conductor 242*a* or the conductor 242*b*, and the diffused hydrogen is bonded to nitrogen contained in the conductor 242*a* or the conductor 242*b* in some cases. That is, hydrogen contained in the oxide 230*b*, the oxide 230*c*, or the like is sometimes absorbed by the conductor 242*a* or the conductor 242*b*.

The insulator 254 is provided to cover the side surface of the oxide 230*a*, the side surface of the oxide 230*b*, the side surface of the oxide 243*a*, the side surface of the oxide 243*b*, the side surface of the conductor 242*a*, the top surface of the conductor 242*a*, the side surface of the conductor 242*b*, and the top surface of the conductor 242*b*.

The insulator 254 preferably a function of inhibiting diffusion of oxygen. For example, the insulator 254 preferably has a function of further inhibiting diffusion of oxygen as compared to the insulator 280. An insulator containing an oxide of one or both of aluminum and hafnium is preferably deposited as the insulator 254, for example.

As the insulator 254, aluminum oxide or hafnium oxide is preferably deposited in an oxygen-containing atmosphere by a bias sputtering method. The bias sputtering method is a method in which sputtering is performed while RF power is applied to a substrate. The potential of the substrate applied with the RF power becomes a negative potential (bias potential) with respect to a plasma potential, and cations in plasma are accelerated by the bias potential and implanted into the substrate. The bias potential can be controlled by the amount of RF power applied to the substrate. Therefore, aluminum oxide or hafnium oxide is deposited using the bias sputtering method in an oxygen-containing atmosphere, whereby oxygen can be implanted into the insulator 224.

In the bias sputtering method, the amount of oxygen implanted into the insulator 224 serving as a base of the insulator 254 can be controlled by the amount of RF power applied to the substrate. For example, as the RF power, a bias with the power density of 0.31 W/cm$^2$ or more, preferably 0.62 W/cm$^2$ or more, further preferably 1.86 W/cm$^2$ or more is applied to the substrate. In other words, an appropriate amount of oxygen for the transistor characteristics can be implanted by changing the amount of RF power used for the deposition of the insulator 254. Moreover, an appropriate amount of oxygen for improving the reliability of the transistor can be implanted. The RF frequency is preferably greater than or equal to 10 MHz. Typically, the RF frequency is 13.56 MHz. The higher the RF frequency is, the less damage the substrate gets. Therefore, the amount of oxygen to be implanted into the insulator 224 can be controlled by adjusting the amount of RF power applied to the substrate, so that the optimal amount of oxygen can be implanted into the insulator 224.

As described above, although the insulator 254 has a function of implanting oxygen into the film serving as a base, the insulator 254 itself has a function of inhibiting oxygen transmission. Accordingly, when the insulator 280 is formed over the insulator 254 and oxygen is diffused from the insulator 280 in a later step, the oxygen can be prevented from being directly diffused from the insulator 280 into an oxide layer to be the oxide 230a, the oxide 230b, the oxide 243a, and the oxide 243b and a conductive layer to be the conductor 242a and the conductor 242b.

Providing the insulator 254 described above can isolate the oxide 230a, the oxide 230b, the oxide 243a, the oxide 243b, the conductor 242a, and the conductor 242b from the insulator 280. Thus, oxygen can be inhibited from directly diffusing from the insulator 280 to the oxide 230a, the oxide 230b, the oxide 243a, the oxide 243b, the conductor 242a, and the conductor 242b. This can prevent a reduction in the carrier concentration in the source region and the drain region of the oxide 230 due to supply of excess oxygen to the source region and the drain region. Furthermore, the conductor 242a and the conductor 242b can be inhibited from being excessively oxidized to have increased resistivity, and thus a reduction in on-state current can be inhibited.

The insulator 250 is preferably positioned in contact with at least part of the oxide 230d. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Like the insulator 224, the insulator 250 is preferably formed using an insulator that releases oxygen by heating. When an insulator that releases oxygen by heating is provided as the insulator 250 in contact with at least part of the oxide 230d, oxygen can be effectively supplied to the channel formation region of the oxide 230 and oxygen vacancies in the channel formation region of the oxide 230 can be reduced. Thus, a transistor that has stable electrical characteristics with a small variation in electrical characteristics and improved reliability can be provided. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Although the insulator 250 is a single layer in FIG. 21B and FIG. 21C, a stacked-layer structure of two or more layers may be employed. In the case where the insulator 250 has a stacked-layer structure of two layers, it is preferable that a lower layer of the insulator 250 be formed using an insulator that releases oxygen by heating and an upper layer of the insulator 250 be formed using an insulator having a function of inhibiting diffusion of oxygen. With such a structure, oxygen contained in the lower layer of the insulator 250 can be inhibited from diffusing into the conductor 260. That is, a reduction in the amount of oxygen supplied to the oxide 230 can be inhibited. In addition, oxidation of the conductor 260 due to oxygen contained in the lower layer of the insulator 250 can be inhibited. For example, the lower layer of the insulator 250 can be formed using the above-described material that can be used for the insulator 250, and the upper layer of the insulator 250 can be formed using a material similar to that for the insulator 222.

In the case where silicon oxide, silicon oxynitride, or the like is used for the lower layer of the insulator 250, the upper layer of the insulator 250 may be formed using an insulating material that is a high-k material having a high relative dielectric constant. The gate insulator having a stacked-layer structure of the lower layer of the insulator 250 and the upper layer of the insulator 250 can be thermally stable and can have a high relative dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like, or a metal oxide that can be used as the oxide 230 can be used as the upper layer of the insulator 250. In particular, an insulator containing an oxide of one or both of aluminum and hafnium is preferably used.

The insulator 250 has a stacked-layer structure of the two layers to have a physical thickness, which ensures the distance between the conductor 260 and the oxide 230 and accordingly can reduce leakage current between the conductor 260 and the oxide 230. Moreover, the physical distance between the conductor 260 and the oxide 230 and the intensity of an electric field applied to the oxide 230 from the conductor 260 can be easily adjusted as appropriate.

A metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. Moreover, oxidation of the conductor 260 due to oxygen in the insulator 250 can be inhibited.

The metal oxide preferably has a function of part of the first gate electrode. For example, a metal oxide that can be used as the oxide 230 can be used as the metal oxide. In that case, when the conductor 260a is deposited by a sputtering method, the metal oxide can have a reduced electric resistance value to be a conductor. Such a conductor can be referred to as an OC (Oxide Conductor) electrode.

With the metal oxide, the on-state current of the transistor 200 can be increased without a reduction in the influence of the electric field from the conductor 260.

The conductor 260 preferably includes the conductor 260a and the conductor 260b positioned over the conductor 260a. For example, the conductor 260a is preferably positioned to cover a bottom surface and a side surface of the conductor 260b. Moreover, as illustrated in FIG. 21B and FIG. 21C, the top surface of the conductor 260 is substantially level with the top surface of the insulator 250, the top surface of the oxide 230d, and the top surface of the oxide 230c. Although the conductor 260 has a two-layer structure of the conductor 260a and the conductor 260b in FIG. 21B and FIG. 21C, the conductor 260 may have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, the conductor 260a is preferably formed using a conductive material having a function of inhibiting diffusion of oxygen (e.g., at least one of oxygen atoms, oxygen molecules, and the like).

When the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stacked-layer structure of titanium or titanium nitride and the above conductive material.

In the transistor 200, the conductor 260 is formed in a self-aligned manner to fill an opening formed in the insulator 280 and the like. The formation of the conductor 260 in this manner allows the conductor 260 to be positioned certainly in a region between the conductor 242a and the conductor 242b without alignment.

As illustrated in FIG. 21C, in the channel width direction of the transistor 200, the level of the bottom surface of the conductor 260 in a region where the conductor 260 and the oxide 230b do not overlap with each other is preferably lower than level of the bottom surface of the oxide 230b. When the conductor 260 functioning as the gate electrode covers the side surface and the top surface of the channel formation region of the oxide 230b with the insulator 250 and the like therebetween, the electric field of the conductor 260 is likely to act on the entire channel formation region of the oxide 230b. Thus, the on-state current of the transistor 200 can be increased and the frequency characteristics can be improved. When the bottom surface of the insulator 222 is a reference, the difference between the level of the bottom surface of the conductor 260 in a region where the oxide 230a and the oxide 230b do not overlap with the conductor 260 and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 254. In addition, the top surface of the insulator 280 may be planarized.

The concentration of impurities such as water and hydrogen in the insulator 280 is preferably reduced. Moreover, the insulator 280 preferably has a low hydrogen concentration and includes an excess-oxygen region or excess oxygen, and may be formed using a material similar to that for the insulator 216, for example. The insulator 280 may have a stacked-layer structure of the above materials; silicon oxide deposited by a sputtering method and silicon oxynitride deposited by a CVD method stacked thereover. Furthermore, silicon nitride may be stacked thereover.

The insulator 282 or the insulator 283 preferably functions as a barrier insulating film that inhibits impurities such as water and hydrogen from diffusing into the insulator 280 from above. The insulator 282 or the insulator 283 preferably functions as a barrier insulating film for inhibiting passage of oxygen. As the insulator 282 and the insulator 283, for example, an insulator such as aluminum oxide, silicon nitride, or silicon nitride oxide may be used. The insulator 282 may be formed using aluminum oxide that has a high blocking property against oxygen and the insulator 283 may be formed using silicon nitride that has a high blocking property against hydrogen, for example.

For the conductor 240a and the conductor 240b, a conductive material containing tungsten, copper, or aluminum as its main component is preferably used.

The conductor 240a and the conductor 240b may each have a stacked-layer structure. In the case where the conductor 240a and the conductor 240b each have a stacked-layer structure, a conductive material having a function of inhibiting the passage of impurities such as water and hydrogen is preferably used for a conductor in contact with the insulator 284, the insulator 283, the insulator 282, the insulator 280, and the insulator 254. For example, tantalum, tantalum nitride, titanium, titanium nitride, ruthenium, ruthenium oxide, or the like is preferably used. The conductive material having a function of inhibiting the passage of impurities such as water and hydrogen may be used as a single layer or stacked layers. Moreover, impurities such as water and hydrogen contained in a layer above the insulator 284 can be inhibited from entering the oxide 230 through the conductor 240a and the conductor 240b.

As the insulator 241a and the insulator 241b, for example, an insulator such as silicon nitride, aluminum oxide, or silicon nitride oxide may be used. Since the insulator 241a and the insulator 241b are provided in contact with the insulator 254, respectively, impurities such as water and hydrogen contained in the insulator 280 or the like can be inhibited from entering the oxide 230 through the conductor 240a and the conductor 240b. In particular, silicon nitride is suitable because of its high blocking property against hydrogen. Furthermore, oxygen contained in the insulator 280 can be prevented from being absorbed by the conductor 240a and the conductor 240b.

The conductor 246a functioning as a wiring may be provided in contact with the top surface of the conductor 240a, and the conductor 246b functioning as a wiring may be provided in contact with the top surface of the conductor 240b. For the conductor 246a and the conductor 246b, a conductive material containing tungsten, copper, or aluminum as its main component is preferably used. The conductor 246a and the conductor 246b may each have a stacked-layer structure, for example, may be stacked layers of titanium or titanium nitride and the above conductive material. Note that the conductor may be formed to be embedded in an opening formed in an insulator.

The insulator 286 is provided over the conductor 246a, the conductor 246b, and the insulator 284. Thus, the top surface of the conductor 246a, the side surface of the conductor 246a, the top surface of the conductor 246b, and the side surface of the conductor 246b are in contact with the insulator 286, and the bottom surface of the conductor 246a and the bottom surface of the conductor 246b are in contact with the insulator 284. In other words, each of the conductor 246a and the conductor 246b can be surrounded by the insulator 284 and the insulator 286. With such a structure, the passage of oxygen from the outside can be inhibited and oxidation of the conductor 246a and the conductor 246b can be prevented. Furthermore, the above structure is preferably employed, in which case impurities such as water and hydrogen can be prevented from diffusing from the conductor 246a and the conductor 246b to the outside.

<Constituent Material of Semiconductor Device>

Constituent materials that can be used for the semiconductor device will be described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used for the insulator functioning as a gate insulator, the voltage during operation of the transistor can be lowered while the physical thickness of the gate insulator is maintained. By contrast, when a material with a low relative dielectric constant is used for the insulator functioning as an interlayer film, parasitic capacitance generated between wirings can be reduced. Accordingly, a material is preferably selected in accordance with the function of an insulator.

Examples of the insulator with a high relative dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using a metal oxide is surrounded by insulators having a function of inhibiting passage of oxygen and impurities such as hydrogen, the electrical characteristics of the transistor can be stable. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where a channel is formed. A conductive material containing any of the above metal elements and nitrogen may also be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may also be used. With the use of such a material, hydrogen contained in the metal oxide where the channel is formed can be captured in some cases. Alternatively, hydrogen entering from an external insulator or the like can be captured in some cases.

Modification Examples of Semiconductor Device

An example of the semiconductor device of one embodiment of the present invention will be described below with reference to FIG. 29A to FIG. 29D.

FIG. 29A is a top view of the semiconductor device. FIG. 29B is a cross-sectional view corresponding to a portion indicated by the dashed-dotted line A1-A2 in FIG. 29A. FIG. 29C is a cross-sectional view corresponding to a portion indicated by the dashed-dotted line A3-A4 in FIG. 29A. FIG. 29D is a cross-sectional view corresponding to a portion indicated by the dashed-dotted line A5-A6 in FIG. 29A. For simplification of the drawing, some components are not illustrated in the top views of FIG. 29A.

In the semiconductor device illustrated in FIG. 29A to FIG. 29D, components having the same functions as the components included in the semiconductor device described in <Structure example of semiconductor device> are denoted by the same reference numerals. Note that the materials described in detail in <Structure example of semiconductor device> can also be used as constituent materials of the semiconductor device in this section.

Modification Example 1 of Semiconductor Device

The semiconductor device illustrated in FIG. 29A to FIG. 29D is a modification example of the semiconductor device illustrated in FIG. 21A to FIG. 21D. The semiconductor device illustrated in FIG. 29A to FIG. 29D is different from the semiconductor device illustrated in FIG. 21A to FIG. 21D in the shape of the insulator 283, in including an insulator 287 and an insulator 274, and in not including the insulator 284.

In the semiconductor device illustrated in FIG. 29A to FIG. 29D, the insulator 214, the insulator 216, the insulator 222, the insulator 224, the insulator 254, the insulator 280, and the insulator 282 are patterned. The insulator 287 and the insulator 283 cover the insulator 214, the insulator 216, the insulator 222, the insulator 224, the insulator 254, the insulator 280, and the insulator 282. Specifically, the insulator 287 is in contact with a top surface of the insulator 282, a side surface of the insulator 282, a side surface of the insulator 280, a side surface of the insulator 254, a side surface of the insulator 224, a side surface of the insulator 222, a side surface of the insulator 216, a side surface of the insulator 214, and a top surface of the insulator 212, and the insulator 283 is in contact with a top surface and a side surface of the insulator 287. Accordingly, the oxide 230, the insulator 214, the insulator 216, the insulator 222, the insulator 224, the insulator 254, the insulator 280, and the insulator 282 are isolated from the outside by the insulator 287, the insulator 283, and the insulator 212. In other words, the transistor 200 is provided in a region sealed by the insulator 287, the insulator 283, and the insulator 212.

For example, the insulator 214, the insulator 282, and the insulator 287 are preferably formed using materials having a function of capturing and fixing hydrogen, and the insulator 212 and the insulator 283 are preferably formed using materials having a function of inhibiting diffusion of hydrogen and oxygen. Typically, aluminum oxide can be used for the insulator the insulator 214, the insulator 282, and the insulator 287. Moreover, typically, silicon nitride can be used for the insulator 212 and the insulator 283.

With the above structure, entry of hydrogen contained in the region outside the sealed region into the sealed region can be inhibited. Accordingly, the low hydrogen concentration in the transistor can be kept.

The transistor 200 illustrated in FIG. 29A to FIG. 29D has a structure in which the insulator 212, the insulator 287, and the insulator 283 are each provided as a single layer; however, the present invention is not limited thereto. For example, a structure in which the insulator 212, the insulator 287, and the insulator 283 each have a stacked-layer structure of two or more layers may be employed.

The insulator 287 is not necessarily provided. Such a structure places the transistor 200 in a region sealed with the insulator 212 and the insulator 283. This structure can further inhibit entry of hydrogen, which is contained in a region outside the sealed region, into the sealed region. Accordingly, the low hydrogen concentration in the transistor can further be kept.

The insulator 274 functions as an interlayer film. The dielectric constant of the insulator 274 is preferably lower than that of the insulator 214. When a material with a low dielectric constant is used for the interlayer film, parasitic capacitance generated between wirings can be reduced. The insulator 274 can be formed using a material similar to that for the insulator 280, for example.

<Method for Manufacturing Semiconductor Device>

Next, a method for manufacturing the semiconductor device of one embodiment of the present invention illustrated in FIG. 29A to FIG. 29D will be described with reference to FIG. 30A to FIG. 42D.

FIG. 30A, FIG. 31A, FIG. 32A, FIG. 33A, FIG. 34A, FIG. 35A, FIG. 36A, FIG. 37A, FIG. 38A, FIG. 39A, FIG. 40A, FIG. 41A, and FIG. 42A illustrate top views. FIG. 30B, FIG. 31B, FIG. 32B, FIG. 33B, FIG. 34B, FIG. 35B, FIG. 36B, FIG. 37B, FIG. 38B, FIG. 39B, FIG. 40B, FIG. 41B, and FIG. 42B are cross-sectional views corresponding to portions indicated by the dashed-dotted lines A1-A2 in FIG. 30A, FIG. 31A, FIG. 32A, FIG. 33A, FIG. 34A, FIG. 35A, FIG. 36A, FIG. 37A, FIG. 38A, FIG. 39A, FIG. 40A, FIG. 41A, and FIG. 42A, respectively, and are also cross-sectional views of the transistor 200 in the channel length direction. FIG. 30C, FIG. 31C, FIG. 32C, FIG. 33C, FIG. 34C, FIG. 35C, FIG. 36C, FIG. 37C, FIG. 38C, FIG. 39C, FIG. 40C, FIG. 41C, and FIG. 42C are cross-sectional views corresponding to portions indicated by the dashed-dotted lines A3-A4 in FIG. 30A, FIG. 31A, FIG. 32A, FIG. 33A, FIG. 34A, FIG. 35A, FIG. 36A, FIG. 37A, FIG. 38A, FIG. 39A, FIG. 40A, FIG. 41A, and FIG. 42A, respectively, and are also cross-sectional views of the transistor 200 in the channel width direction. FIG. 30D, FIG. 31D, FIG. 32D, FIG. 33D, FIG. 34D, FIG. 35D, FIG. 36D, FIG. 37D, FIG. 38D, FIG. 39D, FIG. 40D, FIG. 41D, and FIG. 42D are cross-sectional views corresponding to portions indicated by the dashed-dotted lines A5-A6 in FIG. 30A, FIG. 31A, FIG. 32A, FIG. 33A, FIG. 34A, FIG. 35A, FIG. 36A, FIG. 37A, FIG. 38A, FIG. 39A, FIG. 40A, FIG. 41A, and FIG. 42A, respectively. Note that for simplification of the drawings, some components are not illustrated in the top views of FIG. 30A, FIG. 31A, FIG. 32A, FIG. 33A, FIG. 34A, FIG. 35A, FIG. 36A, FIG. 37A, FIG. 38A, FIG. 39A, FIG. 40A, FIG. 41A, and FIG. 42A.

First, a substrate (not illustrated) is prepared, and the insulator 212 is deposited over the substrate. The insulator 212 can be deposited by a sputtering method, a CVD method, an MBE method, a PLD method, an ALD method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

A plasma CVD method enables a high-quality film to be obtained at a relatively low temperature. A thermal CVD method does not use plasma and thus causes less plasma damage to an object. For example, a wiring, an electrode, an element (e.g., a transistor or a capacitor), or the like included in a semiconductor device might be charged up by receiving charge from plasma. In that case, accumulated charge might break the wiring, electrode, element, or the like included in the semiconductor device. By contrast, in the case of a thermal CVD method not using plasma, such plasma damage is not caused and the yield of the semiconductor device can be increased. Furthermore, a film with few defects can be obtained with a thermal CVD method because plasma damage during deposition is not caused.

As an ALD method, a thermal ALD method, in which a precursor and a reactant react with each other only by thermal energy, a PEALD (Plasma Enhanced ALD) method, in which a plasma-enhanced reactant is used, or the like can be used.

In an ALD method, one atomic layer can be deposited at a time using self-regulating characteristics of atoms. Thus, the ALD method has advantages such as deposition of an extremely thin film, deposition on a component with a high aspect ratio, deposition of a film with few defects such as pinholes, deposition with good coverage, and low-temperature deposition. The use of plasma in a PEALD (Plasma Enhanced ALD) method is sometimes preferable because deposition at a lower temperature is possible. Note that a precursor used in an ALD method sometimes contains impurities such as carbon. Thus, a film formed by an ALD method may contain impurities such as carbon in a larger amount than a film formed by another deposition method. Note that impurities can be quantified by XPS.

Unlike in a deposition method in which particles ejected from a target or the like are deposited, a film is formed by reaction at a surface of an object in a CVD method and an ALD method. Thus, a CVD method and an ALD method are deposition methods that enable good step coverage almost regardless of the shape of an object. In particular, an ALD method has excellent step coverage and excellent thickness uniformity and thus is suitable for covering a surface of an opening portion with a high aspect ratio, for example. Note that an ALD method has a relatively low deposition rate; hence, in some cases, an ALD method is preferably combined with another deposition method with a high deposition rate, such as a CVD method.

A CVD method and an ALD method enable control of the composition of a film to be deposited with the flow rate ratio of the source gases. For example, by a CVD method and an ALD method, a film with a certain composition can be deposited depending on the flow rate ratio of the source gases. Moreover, for example, by a CVD method and an ALD method, a film whose composition is continuously changed can be deposited by changing the flow rate ratio of the source gases during the deposition. In the case where a film is deposited while the flow rate ratio of the source gases is changed, as compared to the case where a film is deposited using a plurality of deposition chambers, the time taken for the deposition can be shortened because the time taken for transfer and pressure adjustment is omitted. Thus, the productivity of the semiconductor device can be increased in some cases.

In this embodiment, silicon nitride is deposited for the insulator 212 by a sputtering method. When an insulator through which copper is less likely to pass, such as silicon nitride, is used for the insulator 212 in such a manner, even in the case where a metal that is likely to diffuse, such as copper, is used for a conductor in a layer (not illustrated) below the insulator 212, diffusion of the metal into an upper portion through the insulator 212 can be inhibited. The use of an insulator through which impurities such as water and hydrogen are less likely to pass, such as silicon nitride, can inhibit diffusion of impurities such as water and hydrogen contained in a layer below the insulator 212.

Then, the insulator 214 is deposited over the insulator 212. The insulator 214 can be deposited by a sputtering method, a CVD method, an MBE method, a PLD method, an ALD method, or the like. In this embodiment, aluminum oxide is used for the insulator 214.

It is preferable that the hydrogen concentration of the insulator 214 be lower than that of the insulator 212. The insulator 212 formed using silicon nitride by a sputtering method can have low hydrogen concentration. The insulator 214 formed using aluminum oxide can have lower hydrogen concentration than insulator 212.

The transistor 200 is formed over the insulator 214 in a later step. It is preferable that a film near the transistor 200 have a relatively low hydrogen concentration and a film with a relatively high hydrogen concentration be positioned away from the transistor 200.

Next, the insulator 216 is deposited over the insulator 214. The insulator 216 can be deposited by a sputtering method, a CVD method, an MBE method, a PLD method, an ALD method, or the like. In this embodiment, silicon oxide or silicon oxynitride is used for the insulator 216. The insulator 216 is preferably deposited by a deposition method using the gas in which hydrogen atoms are reduced or removed. Thus, the hydrogen concentration of the insulator 216 can be reduced.

Then, an opening reaching the insulator 214 is formed in the insulator 216. Examples of the opening include a groove and a slit. A region where an opening is formed may be referred to as an opening portion. The opening may be formed by wet etching; however, dry etching is preferable for microfabrication. As the insulator 214, it is preferable to select an insulator that functions as an etching stopper film used in forming a groove by etching of the insulator 216. For example, in the case where silicon oxide or silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an ICP etching apparatus or the like can be used, for example.

After the formation of the opening, a conductive film to be the conductor 205a is deposited. The conductive film preferably contains a conductor having a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be deposited by a sputtering method, a CVD method, an MBE method, a PLD method, an ALD method, or the like.

In this embodiment, the conductive film to be the conductor 205a has a multilayer structure. First, a tantalum nitride film is deposited by a sputtering method, and a titanium nitride film is stacked over the tantalum nitride film. Even when a metal that easily diffuses, such as copper, is used for a conductive film to be the conductor 205b described later, the use of such a metal nitride film as a layer below the conductor 205b can prevent diffusion of the metal to the outside from the conductor 205a.

Next, the conductive film to be the conductor 205b is deposited. The conductive film can be deposited by a plating method, a sputtering method, a CVD method, an MBE method, a PLD method, an ALD method, or the like. In this embodiment, for the conductive film, a low-resistance conductive material such as copper is deposited.

Next, CMP treatment is performed, thereby removing part of the conductive film to be part of the conductor 205a and part of the conductive film to be the conductor 205b to expose the insulator 216. As a result, the conductor 205a and the conductor 205b remain only in the opening portion. Thus, the conductor 205 whose top surface is flat can be formed (see FIG. 30A to FIG. 30D). Note that the insulator 216 is partly removed by the CMP treatment in some cases.

Although the conductor 205 is embedded in the opening of the insulator 216 in the above description, one embodiment of the present invention is not limited to this structure. For example, the surface of the conductor 205 may be exposed in the following manner: the conductor 205 is formed over the insulator 214, the insulator 216 is formed over the conductor 205, and the insulator 216 is subjected to the CMP treatment so that the insulator 216 is partly removed.

Then, the insulator 222 is deposited over the insulator 216 and the conductor 205. An insulator containing an oxide of one or both of aluminum and hafnium is preferably deposited as the insulator 222. The insulator containing an oxide of one or both of aluminum and hafnium has a barrier property against oxygen, hydrogen, and water. When the insulator 222 has a barrier property against hydrogen and water, diffusion of hydrogen and water contained in a structure body provided around the transistor 200 into the transistor 200 through the insulator 222 is inhibited, and generation of oxygen vacancies in the oxide 230 can be inhibited.

The insulator 222 can be deposited by a sputtering method, a CVD method, an MBE method, a PLD method, an ALD method, or the like.

Subsequently, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the insulator 222 and the like as much as possible.

In this embodiment, as the heat treatment, after the deposition of the insulator 222, heat treatment at 400° C. for one hour is performed with a flow rate of a nitrogen gas of 4 slm and a flow rate of an oxygen gas of 1 slm. By the heat treatment, impurities such as water and hydrogen contained in the insulator 222 can be removed, for example. In the case where an oxide containing hafnium is used for the insulator 222, the heat treatment can improve the crystallinity of the insulator 222. The heat treatment can also be performed after the deposition of the insulator 224, for example.

Then, the insulator 224 is deposited over the insulator 222. The insulator 224 can be deposited by a sputtering method, a CVD method, an MBE method, a PLD method, an ALD method, or the like. In this embodiment, for the insulator 224, silicon oxide or silicon oxynitride is deposited by a CVD method. The insulator 224 is preferably deposited by a deposition method using the gas in which hydrogen atoms are reduced or removed. Thus, the hydrogen concentration of the insulator 224 can be reduced. The hydrogen concentration of the insulator 224 is preferably reduced because the insulator 224 is in contact with the oxide 230a in a later step.

Here, in order to form an excess-oxygen region in the insulator 224, plasma treatment with oxygen may be performed under reduced pressure. The plasma treatment with oxygen is preferably performed with an apparatus including a power source for generating high-density plasma using microwaves, for example. Alternatively, a power source for applying an RF (Radio Frequency) to the substrate side may be included. The use of high-density plasma enables high-density oxygen radicals to be generated, and application of the RF to the substrate side allows the oxygen radicals generated by the high-density plasma to be efficiently introduced into the insulator 224. Furthermore, after plasma treatment with an inert gas is performed using the apparatus, plasma treatment with oxygen may be performed in order to compensate for released oxygen. Note that impurities such as water and hydrogen contained in the insulator 224 can be removed by selecting the conditions of the plasma treatment as appropriate. In that case, the heat treatment does not need to be performed.

Here, after aluminum oxide is deposited over the insulator 224 by a sputtering method, for example, CMP treatment may be performed until the insulator 224 is exposed. The CMP treatment can planarize and smooth the surface of the insulator 224. When the CMP treatment is performed on the aluminum oxide placed over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can sometimes prevent deterioration of the coverage with an oxide deposited later and a decrease in yield of the semiconductor device. Moreover, it is preferable to deposit aluminum oxide over the insulator 224 by a sputtering method, in which case oxygen can be added to the insulator 224.

Next, an oxide film 230A and an oxide film 230B are deposited in this order over the insulator 224 (see FIG. 30A to FIG. 30D). Note that it is preferable to deposit the oxide film 230A and the oxide film 230B successively without exposure to the air. By the deposition without exposure to the air, impurities or moisture from the air can be prevented from being attached to the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like.

When the oxide film 230A and the oxide film 230B are deposited by a sputtering method, for example, oxygen or a mixed gas of oxygen and a rare gas is used as a sputtering gas. An increase in the proportion of oxygen contained in the sputtering gas can increase the amount of excess oxygen in the oxide film to be deposited. In the case where the oxide films are deposited by a sputtering method, the above In-M-Zn oxide target or the like can be used.

In particular, in the deposition of the oxide film 230A, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. A transistor using an oxygen-excess oxide semiconductor in a channel formation region can have relatively high reliability. However, one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. A transistor using an oxygen-deficient oxide semiconductor in a channel formation region can have relatively high field-effect mobility. Furthermore, when the deposition is performed while the substrate is being heated, the crystallinity of the oxide film can be improved.

In this embodiment, as the oxide film 230A and the oxide film 230B, metal oxide films described in the above embodiment are deposited by an ALD method described in the above embodiment.

Next, an oxide film 243A is deposited over the oxide film 230B (see FIG. 30A to FIG. 30D). The oxide film 243A can be deposited by a sputtering method, a CVD method, an MBE method, a PLD method, an ALD method, or the like. The atomic ratio of Ga to In in the oxide film 243A is preferably greater than atomic ratio of Ga to In in the oxide film 230B. In this embodiment, the oxide film 243A is deposited by a sputtering method using an oxide target with In:Ga:Zn=1:3:4 [atomic ratio].

Note that the insulator 222, the insulator 224, the oxide film 230A, the oxide film 230B, and the oxide film 243A are preferably deposited without exposure to the air. For example, a multi-chamber deposition apparatus is used.

Next, heat treatment is preferably performed. The heat treatment is performed in a temperature range where the oxide film 230A, the oxide film 230B, and the oxide film 243A do not become polycrystalline, i.e., at a temperature higher than or equal to 250° C. and lower than or equal to 650° C., preferably higher than or equal to 400° C. and lower than or equal to 600° C.

Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the oxide film 230A, the oxide film 230B, the oxide film 243A, and the like as much as possible.

In this embodiment, the heat treatment is performed in such a manner that treatment is performed at 550° C. in a nitrogen atmosphere for one hour, and then another treatment is successively performed at 550° C. in an oxygen atmosphere for one hour. By the heat treatment, impurities such as water and hydrogen in the oxide film 230A, the oxide film 230B, and the oxide film 243A can be removed, for example. Furthermore, the heat treatment improves the crystallinity of the oxide film 230B, thereby offering a dense structure with higher density. Thus, diffusion of oxygen or impurities in the oxide film 230B can be inhibited.

Next, a conductive film 242A is deposited over the oxide film 243A (see FIG. 30A to FIG. 30D). The conductive film 242A can be deposited by a sputtering method, a CVD method, an MBE method, a PLD method, an ALD method, or the like. Note that heat treatment may be performed before the deposition of the conductive film 242A. This heat treatment may be performed under reduced pressure, and the conductive film 242A may be successively deposited without exposure to the air. The treatment can remove moisture and hydrogen adsorbed onto a surface of the oxide film 243A and the like, and further can reduce the moisture concentration and the hydrogen concentration in the oxide film 230A, the oxide film 230B, and the oxide film 243A. The temperature of the heat treatment is preferably higher than or equal to 100° C. and lower than or equal to 400° C. In this embodiment, the temperature of the heat treatment is 200° C.

Next, the oxide film 230A, the oxide film 230B, the oxide film 243A, and the conductive film 242A are processed into an island shape by a lithography method to form the oxide 230a, the oxide 230b, an oxide layer 243B, and a conductive layer 242B. A dry etching method or a wet etching method can be used for the processing. Processing by a dry etching method is suitable for microfabrication. The oxide film 230A, the oxide film 230B, the oxide film 243A, and the conductive film 242A may be processed under different conditions. Note that in this step, the thickness of the insulator 224 in a region that does not overlap with the oxide 230a is reduced in some cases (see FIG. 31A to FIG. 31D).

Here, the oxide 230a, the oxide 230b, the oxide layer 243B, and the conductive layer 242B are formed to at least partly overlap with the conductor 205. It is preferable that the side surfaces of the oxide 230a, the oxide 230b, the oxide layer 243B, and the conductive layer 242B be substantially perpendicular to the top surface of the insulator 222. When the side surfaces of the oxide 230a, the oxide 230b, the oxide layer 243B, and the conductive layer 242B are substantially perpendicular to the top surface of the insulator 222, a plurality of transistors 200 can be provided in a smaller area and at a higher density. Alternatively, a structure may be employed in which an angle formed by the side surfaces of the oxide 230a, the oxide 230b, the oxide layer 243B, and the conductive layer 242B and the top surface of the insulator 222 is a small angle. With such a shape, in later steps, the coverage with the insulator 254 and the like can be improved, so that defects such as a void can be reduced.

There is a curved surface between the side surface of the conductive layer 242B and the top surface of the conductive layer 242B. That is, an end portion of the side surface and an end portion of the top surface are preferably curved. The radius of curvature of the curved surface at the end portion of the conductive layer 242B is greater than or equal to 3 nm and less than or equal to 10 nm, preferably greater than or equal to 5 nm and less than or equal to 6 nm, for example. When the end portions are not angular, the coverage with films in later deposition steps is improved.

Next, the insulator 254 is deposited over the insulator 224, the oxide 230a, the oxide 230b, the oxide layer 243B, and the conductive layer 242B (see FIG. 32B to FIG. 32D). The insulator 254 can be deposited by a sputtering method, a CVD method, an MBE method, a PLD method, an ALD method, or the like. In this embodiment, as the insulator 254, an aluminum oxide film is deposited by a sputtering method.

Next, an insulating film to be the insulator 280 is deposited over the insulator 254. The insulating film can be deposited by a sputtering method, a CVD method, an MBE method, a PLD method, an ALD method, or the like. For example, as the insulating film, a silicon oxide film is deposited by a sputtering method, and a silicon oxide film is deposited thereover by a PEALD method or a thermal ALD method. The insulating film is preferably deposited by the deposition method using a gas in which hydrogen atoms are reduced or removed. Thus, the hydrogen concentration of the insulator 280 can be reduced. Note that heat treatment may be performed before the insulating film is deposited. The heat treatment may be performed under reduced pressure, and the insulating film may be successively deposited without exposure to the air. Such treatment can remove moisture and hydrogen adsorbed on a surface of the insulator 254 and the like, and further can reduce the moisture concentration and the hydrogen concentration of the oxide 230a, the oxide 230b, the oxide layer 243B, and the insulator 224. For the heat treatment, the conditions for the above heat treatment can be used.

Next, the insulating film is subjected to CMP treatment, so that the insulator 280 having a flat top surface is formed (see FIG. 32B to FIG. 32D). Note that as in the insulator 224, aluminum oxide may be deposited over the insulator 280 by a sputtering method, for example, and the aluminum oxide may be subjected to CMP until the insulator 280 is reached.

Here, microwave treatment may be performed. The microwave treatment is preferably performed in an atmosphere containing oxygen under reduced pressure. Performing the microwave treatment can reduce the hydrogen concentration in the oxide 230b and the oxide 230a. Part of hydrogen is gettered by the conductive layer 242B through the insulator 254 in some cases. In addition, Vo in the oxide 230a and the oxide 230b can be repaired or filled.

After the microwave treatment, heat treatment may be performed with the reduced pressure being maintained. Such treatment enables hydrogen in the insulator 280, the oxide 230b, and the oxide 230a to be removed efficiently. Note that the temperature of the heat treatment is preferably higher than or equal to 300° C. and lower than or equal to 500° C.

Performing the microwave treatment improves the film quality of the insulator 280, thereby inhibiting diffusion of hydrogen, water, impurities, and the like. Accordingly, hydrogen, water, impurities, and the like can be inhibited from diffusing into the oxide 230 through the insulator 280 in the following step after the formation of the insulator 280, heat treatment, or the like.

Then, part of the insulator 280, part of the insulator 254, part of the conductive layer 242B, and part of the oxide layer 243B are processed to form an opening reaching the oxide 230b. The opening is preferably formed to overlap with the conductor 205. By formation of the opening, the conductor 242a, the conductor 242b, the oxide 243a, and the oxide 243b are formed (see FIG. 33A to FIG. 33D).

An upper portion of the oxide 230b is removed when the opening is formed. Removal of part of the oxide 230b forms a groove in the oxide 230b. The groove may be formed in the same step as the formation of the opening or in a step different from the formation of the opening in accordance with the depth of the groove.

The part of the insulator 280, the part of the insulator 254, the part of the conductive layer 242B, the part of the oxide layer 243B, and the part of the oxide 230b can be processed by a dry etching method or a wet etching method. Processing by a dry etching method is suitable for microfabrication. The processing may be performed under different conditions. For example, the part of the insulator 280 may be processed by a dry etching method, the part of the insulator 254 may be processed by a wet etching method, and the part of the oxide layer 243B, the part of the conductive layer 242B, and the part of the oxide 230b may be processed by a dry etching method. Processing of the part of the oxide layer 243B and the part of the conductive layer 242B and processing of the part of the oxide 230b may be performed under different conditions.

When the oxide 230b is partly removed to form a groove by a dry etching method, a strong bias power is preferably applied during treatment. A bias power density is, for example, preferably more than or equal to 0.03 W/cm$^2$, further preferably more than or equal to 0.06 W/cm$^2$. The dry etching treatment time may be set as appropriate depending on the depth of the groove.

Here, it is preferable to remove impurities that are attached onto the surfaces of the oxide 230a, the oxide 230b, and the like or diffused into the oxide 230a, the oxide 230b, and the like. The impurities result from components contained in the insulator 280, the insulator 254, and the conductive layer 242B; components contained in a member of an apparatus used to form the opening; and components contained in a gas or a liquid used for etching, for instance. Examples of the impurities include aluminum, silicon, tantalum, fluorine, and chlorine.

In order to remove the impurities and the like, cleaning treatment is performed.

Examples of the cleaning method include wet cleaning using a cleaning solution and the like, plasma treatment using plasma, and cleaning by heat treatment, and any of these cleanings may be performed in appropriate combination. The cleaning treatment sometimes makes the groove deeper.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate.

Note that in this specification and the like, in some cases, an aqueous solution in which commercial hydrofluoric acid is diluted with pure water is referred to as diluted hydrofluoric acid, and an aqueous solution in which commercial ammonia water is diluted with pure water is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid may be higher than or equal to 0.01 ppm and lower than or equal to 100 ppm, preferably higher than or equal to 0.1 ppm and lower than or equal to 10 ppm.

A frequency greater than or equal to 200 kHz, preferably greater than or equal to 900 kHz is preferably used for the ultrasonic cleaning. Damage to the oxide 230b and the like can be reduced with this frequency.

The cleaning treatment may be performed a plurality of times, and the cleaning solution may be changed in every cleaning treatment. For example, first cleaning treatment may be performed using diluted hydrofluoric acid or diluted ammonia water, and second cleaning treatment may be performed using pure water or carbonated water.

As the cleaning treatment in this embodiment, wet cleaning using diluted hydrofluoric acid is performed, and then wet cleaning using pure water or carbonated water is performed. The cleaning treatment can remove impurities that are attached onto the surfaces of the oxide 230a, the oxide 230b, and the like or diffused into the oxide 230a, the oxide 230b, and the like. The crystallinity of the oxide 230c formed over the oxide 230b can be increased.

By the processing such as dry etching or the cleaning treatment, the thickness of the insulator 224 in a region that overlaps with the opening and does not overlap with the oxide 230b might become smaller than thickness of the insulator 224 in a region that overlaps with the oxide 230b.

After the etching or the cleaning, heat treatment may be performed. The heat treatment is performed at a temperature higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230a and the oxide 230b to reduce oxygen vacancies. This heat treatment can improve the crystallinity of the oxide 230b and the crystallinity of the oxide 230c formed in the groove of the oxide 230b. The heat treatment may be performed under reduced pressure. Alternatively, the heat treatment may be performed in an oxygen atmosphere, and then another heat treatment may be successively performed in a nitrogen atmosphere without exposure to the air.

Next, an oxide film 230C is deposited. The heat treatment may be performed before the oxide film 230C is deposited. It is preferable that the heat treatment be performed under reduced pressure and the oxide film 230C be successively deposited without exposure to the air. The heat treatment is preferably performed in an oxygen-containing atmosphere. Such treatment can remove moisture and hydrogen adsorbed on the surface of the oxide 230b or the like and can reduce the moisture concentration and the hydrogen concentration of the oxide 230a and the oxide 230b. The temperature of the heat treatment is preferably higher than or equal to 100° C. and lower than or equal to 400° C. In this embodiment, the temperature of the heat treatment is 200° C.

Here, the oxide film 230C is preferably provided in contact with at least the inner wall of the groove formed in the oxide 230b, part of the side surface of the oxide 243a, part of the side surface of the oxide 243b, part of the side surface of the conductor 242a, part of the side surface of the conductor 242b, part of the side surface of the insulator 254, and part of the side surface of the insulator 280. The conductor 242a (conductor 242b) is surrounded by the oxide 243a (oxide 243b), the insulator 254, and the oxide film 230C; thus, a reduction in the conductivity of the conductor 242a (conductor 242b) due to the oxidation thereof in the following steps can be inhibited.

The oxide film 230C can be deposited by a sputtering method, a CVD method, an MBE method, a PLD method, an ALD method, or the like. The oxide film 230C is deposited by a deposition method similar to that for the oxide film 230A or the oxide film 230B in accordance with characteristics required for the oxide film 230C.

When the oxide film 230C is deposited by a sputtering method, part of oxygen contained in the sputtering gas is sometimes supplied to the oxide 230a and the oxide 230b. Alternatively, during the deposition of the oxide film 230C, part of oxygen contained in the sputtering gas is sometimes supplied to the insulator 280. Therefore, the proportion of oxygen contained in the sputtering gas for the oxide film 230C is higher than or equal to 70%, preferably higher than or equal to 80%, further preferably 100%. By depositing the oxide film 230C under an atmosphere containing much oxygen, the oxide film 230C is likely to be a CAAC-OS.

The oxide film 230C is preferably deposited while the substrate is being heated. In that case, the substrate temperature is set to higher than or equal to 200° C., so that oxygen vacancies in the oxide film 230C and the oxide 230b can be reduced. The deposition is performed while the substrate is being heated, whereby the crystallinity of the oxide film 230C and the oxide 230b can be improved.

In this embodiment, as the oxide film 230C, a metal oxide film described in the above embodiment is deposited by an ALD method described in the above embodiment.

Then, part of the oxide film 230C is selectively removed using the mask by a lithography method (see FIG. 34A, FIG. 34C, and FIG. 34D). Note that the part of the oxide film 230C is preferably removed by a wet etching method or the like. Through this step, the part of the oxide film 230C located between the adjacent transistors 200 in the channel width direction can be removed.

In a region where part of the oxide film 230C is removed through the above step, the surface of the insulator 224 and the surface of the insulator 280 are exposed. In that case, the thickness of the insulator 224 and the thickness of the insulator 280 in the region are sometimes reduced. In some cases, the insulator 224 in the region is removed and the surface of the insulator 222 is exposed.

Next, an oxide film 230D is formed (see FIG. 35A to FIG. 35D). The oxide film 230D can be deposited by a sputtering method, a CVD method, an MBE method, a PLD method, an ALD method, or the like. The oxide film 230D is deposited by a deposition method similar to that for the oxide film 230A or the oxide film 230B in accordance with characteristics required for the oxide film 230D. In this embodiment, the oxide film 230D is deposited by a sputtering method using an oxide target with In:Ga:Zn=1:3:4 [atomic ratio].

Part of oxygen contained in the sputtering gas is sometimes supplied to the oxide film 230C during the deposition of the oxide film 230D. Alternatively, during the deposition of the oxide film 230D, part of oxygen contained in the sputtering gas is sometimes supplied to the insulator 280. Therefore, the proportion of oxygen contained in the sputtering gas for the oxide film 230D is higher than or equal to 70%, preferably higher than or equal to 80%, further preferably 100%.

Next, an insulating film 250A is deposited (see FIG. 35A to FIG. 35D). Heat treatment may be performed before the insulating film 250A is deposited; the heat treatment may be performed under reduced pressure, and the insulating film 250A may be successively deposited without exposure to the air. The heat treatment is preferably performed in an oxygen-containing atmosphere. The treatment can remove moisture and hydrogen adsorbed onto the surface of the oxide film 230D and the like, and further can reduce the moisture concentration and the hydrogen concentration in the oxide 230a, the oxide 230b, the oxide film 230C, and the oxide film 230D. The temperature of the heat treatment is preferably higher than or equal to 100° C. and lower than or equal to 400° C.

The insulating film 250A can be deposited by a sputtering method, a CVD method, an MBE method, a PLD method, an ALD method, or the like. The insulating film 250A is preferably deposited by a deposition method using the gas in which hydrogen atoms are reduced or removed. Thus, the hydrogen concentration of the insulating film 250A can be reduced. The hydrogen concentration is preferably reduced because the insulating film 250A becomes the insulator 250 that is in contact with the oxide 230d in a later step.

Here, after the insulating film 250A is deposited, the microwave treatment may be performed in an atmosphere containing oxygen under reduced pressure. Performing the microwave treatment in such a manner can reduce the hydrogen concentration in the insulating film 250A, the oxide film 230D, the oxide film 230C, the oxide 230b, and the oxide 230a. Part of hydrogen is sometimes gettered by the conductor 242a and the conductor 242b. In addition, Vo in the oxide 230a, the oxide 230b, the oxide film 230C, and the oxide film 230D can be repaired or filled.

After the microwave treatment, heat treatment may be performed with the reduced pressure being maintained. Such treatment enables hydrogen in the insulating film 250A, the oxide film 230D, the oxide film 230C, the oxide 230b, and the oxide 230a to be removed efficiently. Part of hydrogen is sometimes gettered by the conductor 242a and the conductor 242b. Alternatively, it is possible to repeat the step of performing microwave treatment and the step of performing heat treatment with the reduced pressure being maintained after the microwave treatment. The repetition of the heat treatment enables hydrogen in the insulating film 250A, the oxide film 230D, the oxide film 230C, the oxide 230b, and the oxide 230a to be removed more efficiently. Note that the temperature of the heat treatment is preferably higher than or equal to 300° C. and lower than or equal to 500° C.

Furthermore, the microwave treatment improves the film quality of the insulating film 250A, whereby diffusion of hydrogen, water, impurities, and the like can be inhibited.

Accordingly, hydrogen, water, impurities, and the like can be inhibited from diffusing into the oxide 230b, the oxide 230a, and the like through the insulator 250 in the following step such as deposition of a conductive film to be the conductor 260 or the following treatment such as heat treatment.

Next, a conductive film 260A and a conductive film 260B are deposited in this order (see FIG. 36A to FIG. 36D). The conductive film 260A and the conductive film 260B can be deposited by a sputtering method, a CVD method, an MBE method, a PLD method, an ALD method, or the like. In this embodiment, the conductive film 260A is deposited by an ALD method, and the conductive film 260B is deposited by a CVD method.

Then, the oxide film 230C, the oxide film 230D, the insulating film 250A, the conductive film 260A, and the conductive film 260B are polished by CMP treatment until the insulator 280 is exposed, whereby the oxide 230c, the oxide 230d, the insulator 250, and the conductor 260 (the conductor 260a and the conductor 260b) are formed (see FIG. 37A to FIG. 37D). Accordingly, the oxide 230c is positioned to cover the inner wall (the side wall and bottom surface) of the opening reaching the oxide 230b and the groove of the oxide 230b. The oxide 230d is positioned to cover the inner wall of the opening and the groove with the oxide 230c therebetween. The insulator 250 is positioned to cover the inner wall of the opening and the groove with the oxide 230c and the oxide 230d therebetween. The conductor 260 is positioned to fill the opening and the groove with the oxide 230c, the oxide 230d, and the insulator 250 therebetween.

Next, heat treatment may be performed. In this embodiment, treatment is performed at 400° C. in a nitrogen atmosphere for one hour. The heat treatment can reduce the moisture concentration and the hydrogen concentration in the insulator 250 and the insulator 280. After the heat treatment, the insulator 282 may be successively deposited without exposure to the air.

Next, the insulator 282 is formed over the oxide 230c, the oxide 230d, the insulator 250, the conductor 260, and the insulator 280 (see FIG. 38B to FIG. 38D). The insulator 282 can be deposited by a sputtering method, a CVD method, an MBE method, a PLD method, an ALD method, or the like. Aluminum oxide is preferably deposited for the insulator 282 by a sputtering method, for example. The insulator 282 is deposited by a sputtering method in an oxygen-containing atmosphere, whereby oxygen can be added to the insulator 280 during the deposition. At this time, the insulator 282 is preferably deposited while the substrate is being heated. It is preferable to form the insulator 282 in contact with the top surface of the conductor 260 because oxygen contained in the insulator 280 can be inhibited from being absorbed into the conductor 260 in later heat treatment.

Subsequently, part of the insulator 282, part of the insulator 280, part of the insulator 254, part of the insulator 224, part of the insulator 222, part of the insulator 216, and part of the insulator 214 are processed to form an opening reaching the insulator 212 (see FIG. 39A to FIG. 39D). The opening is formed to surround the transistor 200 in some cases. Alternatively, the opening is sometimes formed to surround a plurality of transistors 200. Thus, the side surface of the insulator 282, the side surface of the insulator 280, the side surface of the insulator 254, the side surface of the insulator 224, the side surface of the insulator 222, the side surface of the insulator 216, and the side surface of the insulator 214 are exposed in the opening.

The part of the insulator 282, the part of the insulator 280, the part of the insulator 254, the part of the insulator 224, the part of the insulator 222, the part of the insulator 216, and the part of the insulator 214 can be processed using a dry etching method or a wet etching method. Processing using a dry etching method is suitable for microfabrication. The processing may be performed under different conditions. Note that in this step, the thickness of the insulator 212 in a region overlapped by the opening is reduced in some cases.

Then, the insulator 287 is formed to cover the insulator 282, the insulator 280, the insulator 254, the insulator 224, the insulator 222, the insulator 216, and the insulator 214 (see FIG. 40B to FIG. 40D). The insulator 287 can be deposited with a sputtering method, a CVD method, an MBE method, a PLD method, an ALD method, or the like. In addition, the insulator 287 may be a multilayer. For example, aluminum oxide may be deposited by a sputtering method and silicon nitride may be deposited over the aluminum oxide by a sputtering method. As shown in FIG. 40B to FIG. 40D, the insulator 287 is in contact with the insulator 212 at the bottom surface of the opening. That is, a top surface and a side surface of the transistor 200 are surrounded by the insulator 287 and a bottom surface of the transistor 200 is surrounded by the insulator 212. Surrounding the transistor 200 by the insulator 287 and the insulator 212 having high barrier properties can prevent entry of moisture and hydrogen from the outside.

Next, the insulator 283 may be formed over the insulator 287 (see FIG. 40B to FIG. 40D). Note that the insulator 283 is preferably deposited by a deposition method that enables high coverage. For example, the insulator 283 can be deposited by a sputtering method, a CVD method, an MBE method, a PLD method, an ALD method, or the like. The insulator 283 is preferably deposited using the same material as those for the insulator 212.

Specifically, silicon nitride is preferably deposited by a CVD method. It is particularly preferable that the insulator 283 be deposited by a CVD method using a compound gas containing no hydrogen atom or having a low hydrogen atom content.

Then, an insulating film to be the insulator 274 is deposited over the insulator 283. The insulating film can be deposited by a sputtering method, a CVD method, an MBE method, a PLD method, an ALD method, or the like. For example, a silicon oxide film is preferably deposited by a CVD method. The insulating film is preferably deposited by a deposition method using the gas in which hydrogen atoms are reduced or removed. Thus, the hydrogen concentration of the insulating film can be reduced.

Next, the insulating film to be the insulator 274 is subjected to CMP treatment, whereby the insulator 274 having a flat top surface is formed (see FIG. 40B to FIG. 40D).

Next, heat treatment may be performed. In this embodiment, treatment is performed at 400° C. in a nitrogen atmosphere for one hour. Through the heat treatment, oxygen added at the time of depositing the insulator 282 can diffuse into the insulator 280 and then can be supplied to the oxide 230a and the oxide 230b through the oxide 230c. Note that the heat treatment is not necessarily performed after the formation of the insulator 274 and may be performed after the deposition of the insulator 282 or the deposition of the insulator 283, for example.

Subsequently, an opening reaching the conductor 242a and an opening reaching the conductor 242b are formed in the insulator 254, the insulator 280, the insulator 282, the insulator 287, and the insulator 283 (see FIG. 41A and FIG. 41B). The openings are formed by a lithography method. Note that the openings in the top view in FIG. 41A each have a circular shape; however, the shapes of the openings are not limited thereto. For example, the openings in the top view may each have an almost circular shape such as an elliptical shape, a polygonal shape such as a quadrangular shape, or a polygonal shape such as a quadrangular shape with rounded corners.

Subsequently, an insulating film to be the insulator 241a and the insulator 241b is deposited and the insulating film is subjected to anisotropic etching, so that the insulator 241a and the insulator 241b are formed (see FIG. 41A and FIG. 41B). The insulating film can be deposited by a sputtering method, a CVD method, an MBE method, a PLD method, an ALD method, or the like. As the insulating film, an insulating film having a function of inhibiting passage of oxygen is preferably used. For example, an aluminum oxide film is preferably deposited by an ALD method. Alternatively, a silicon nitride film is preferably deposited by a PEALD method. Silicon nitride is preferable because of its high blocking property against hydrogen.

For the anisotropic etching of the insulating film to be the insulator 241a and the insulator 241b, a dry etching method is employed, for example. Providing the insulator 241a and the insulator 241b on the side wall portions of the openings can inhibit passage of oxygen from the outside and can prevent oxidation of the conductor 240a and the conductor 240b to be formed next. Furthermore, impurities such as water and hydrogen can be prevented from diffusing from the conductor 240a and the conductor 240b to the outside.

Next, a conductive film to be the conductor 240a and the conductor 240b is deposited. The conductive film preferably has a stacked-layer structure including a conductor having a function of inhibiting passage of impurities such as water and hydrogen. For example, stacked layers of a film of tantalum nitride, titanium nitride, or the like and a film of tungsten, molybdenum, copper, or the like can be employed. The conductive film can be deposited by a sputtering method, a CVD method, an MBE method, a PLD method, an ALD method, or the like.

Then, part of the conductive film to be the conductor 240a and the conductor 240b is removed by CMP treatment to expose the top surfaces of the insulator 283 and the insulator 274. As a result, the conductive film remains only in the openings, so that the conductor 240a and the conductor 240b having flat top surfaces can be formed (see FIG. 41A and FIG. 41B). Note that the top surfaces of the insulator 283 and the insulator 274 are partly removed by the CMP treatment in some cases.

Next, a conductive film to be the conductor 246a and the conductor 246b is deposited. The conductive film can be deposited by a sputtering method, a CVD method, an MBE method, a PLD method, an ALD method, or the like.

Next, the conductive film to be the conductor 246a and the conductor 246b is processed by a lithography method to form the conductor 246a in contact with the top surface of the conductor 240a and the conductor 246b in contact with the top surface of the conductor 240b. At this time, the insulator 283 in a region not overlapping with the conductor 246*a* or the conductor 246*b* is sometimes partly removed (see FIG. 42A and FIG. 42B).

Next, the insulator 286 is deposited over the conductor 246*a*, the conductor 246*b*, and the insulator 283 (see FIG. 29A to FIG. 29D). The insulator 286 can be deposited by a sputtering method, a CVD method, an MBE method, a PLD method, an ALD method, or the like. The insulator 286 may be a multilayer. For example, silicon nitride may be deposited by a sputtering method, and silicon nitride may be deposited over the silicon nitride by a CVD method.

Through the above process, the semiconductor device including the transistor 200 illustrated in FIG. 29A to FIG. 29D can be manufactured. As illustrated in FIG. 30A to FIG. 42D, the transistor 200 can be manufactured by the method for manufacturing the semiconductor device described in this embodiment.

Modification Example 2 of Semiconductor Device

An example of the semiconductor device of one embodiment of the present invention will be described below with reference to FIG. 43A to FIG. 43D.

FIG. 43A illustrates a top view of a semiconductor device including a transistor 200A. FIG. 43B is a cross-sectional view corresponding to a portion indicated by the dashed-dotted line A1-A2 in FIG. 43A. FIG. 43C is a cross-sectional view corresponding to a portion indicated by the dashed-dotted line A3-A4 in FIG. 43A. FIG. 43D is a cross-sectional view corresponding to a portion indicated by the dashed-dotted line A5-A6 in FIG. 43A. For simplification of the drawing, some components are not illustrated in the top views of FIG. 43A.

In the semiconductor device illustrated in FIG. 43A to FIG. 43D, components having the same functions as the components included in the semiconductor device described in <Structure example of semiconductor device> and <Modification example 1 of semiconductor device> are denoted by the same reference numerals. Note that the materials described in detail in <Structure example of semiconductor device> and <Modification example 1 of semiconductor device> can also be used as constituent materials of the semiconductor device in this section.

The semiconductor device illustrated in FIG. 43A to FIG. 43D is a modification example of the semiconductor device illustrated in FIG. 29A to FIG. 29D. The semiconductor device illustrated in FIG. 43A to FIG. 43D is different from the semiconductor device illustrated in FIG. 29A to FIG. 29D in including an insulator 271*a* and an insulator 271*b* and in not including the oxide 230*c* and the oxide 230*d*.

In the semiconductor device illustrated in FIG. 43A to FIG. 43D, the insulator 271*a* is provided between the conductor 242*a* and the insulator 254, and the insulator 271*b* is provided between the conductor 242*b* and the insulator 254.

Here, the insulator 271*a* and the insulator 271*b* preferably have a function of inhibiting diffusion of oxygen. In that case, absorption of excess oxygen contained in the insulator 280 by the conductor 242*a* and the conductor 242*b* functioning as the source electrode and the drain electrode can be inhibited. Furthermore, inhibiting oxidation of the conductor 242*a* and the conductor 242*b* can inhibit an increase in the contact resistance between the transistor 200A and a wiring. Consequently, the transistor 200A can have favorable electrical characteristics and reliability. The insulator 271*a* and the insulator 271*b* can be provided using a material similar to that for the insulator 254, for example.

In the method for manufacturing the semiconductor device illustrated in FIG. 43A to FIG. 43D, an insulating layer to be the insulator 271*a* and the insulator 271*b* and a conductive layer provided over the insulating layer function as a mask for the conductive film 242A; hence, end portions at the intersections of the side surfaces and the top surfaces of the conductor 242*a* and the conductor 242*b* are angular. The cross-sectional area of the conductor 242*a* (the conductor 242*b*) is larger in the case where the end portion at the intersection of the side surface and the top surface of the conductor 242*a* (the conductor 242*b*) is angular than in the case where the end portion is rounded. Accordingly, the resistance of the conductor 242*a* and the conductor 242*b* is reduced, so that the on-state current of the transistor 200A can be increased.

When the oxide 230*c* and the oxide 230*d* are not provided, generation of a parasitic transistor between the transistor 200A and another transistor 200A adjacent to the transistor 200A can be inhibited, and generation of a leakage path along the conductor 260 can be inhibited. Thus, a semiconductor device that has favorable electrical characteristics and can be miniaturized or highly integrated can be provided.

Application Example of Semiconductor Device

An example of a semiconductor device including the transistor 200 of one embodiment of the present invention which is different from the semiconductor device described above in <Structure example of semiconductor device> and <Modification example of semiconductor device> will be described below with reference to FIG. 44A and FIG. 44B. Note that in the semiconductor device illustrated in FIG. 44A and FIG. 44B, components having the same functions as the components in the semiconductor device described in <Modification example of semiconductor device> (see FIG. 29A to FIG. 29D) are denoted by the same reference numerals. Note that in this section, the materials described in detail in <Structure example of semiconductor device> and <Modification example of semiconductor device> can be used as the materials for the transistor 200.

Figures 44A, 44B:
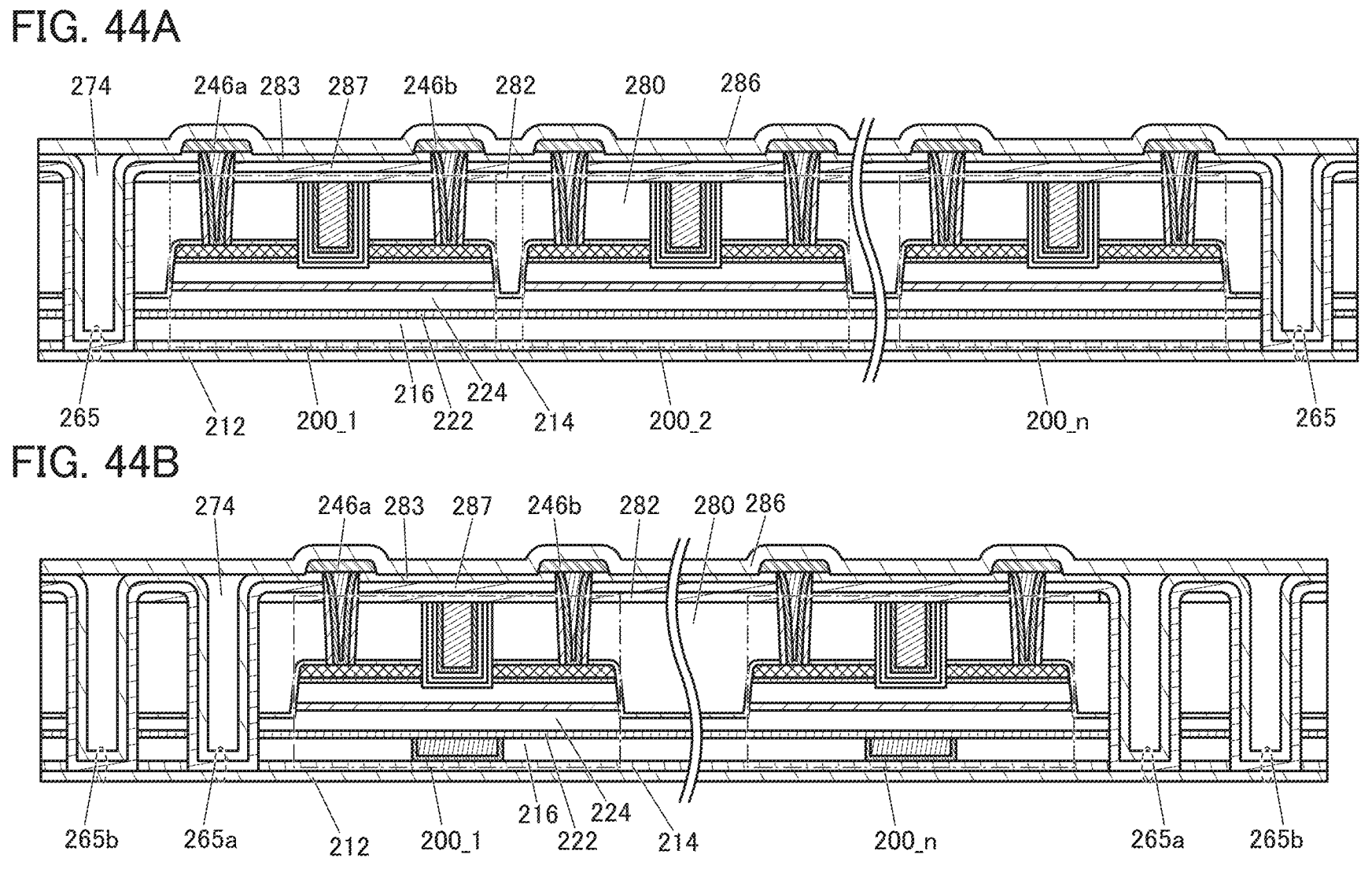

FIG. 44A and FIG. 44B each illustrate a structure in which a plurality of transistors (a transistor 200_1 to a transistor 200_*n*) are collectively sealed by the insulator 287, the insulator 283, and the insulator 212. Note that although the plurality of transistors appear to be arranged in the channel length direction in FIG. 44A and FIG. 44B, the present invention is not limited to this structure. The plurality of transistors may be arranged in the channel width direction or in a matrix. Depending on the design, the transistors may be arranged without regularity.

As illustrated in FIG. 44A, a portion where the insulator 287 and the insulator 283 are in contact with the insulator 212 (hereinafter, sometimes referred to as a sealing portion 265) is formed outside the plurality of transistors (the transistor 200_1 to the transistor 200_*n*). The sealing portion 265 is formed to surround the plurality of transistors (also referred to as a transistor group). With such a structure, the plurality of transistors can be surrounded by the insulator 287, the insulator 283, and the insulator 212. Thus, a plurality of transistor groups surrounded by the sealing portion 265 are provided over a substrate.

A dicing line (sometimes referred to as a scribe line, a dividing line, or a cutting line) may be provided to overlap with the sealing portion 265. The above substrate is divided at the dicing line, so that the transistor groups surrounded by the sealing portion 265 are taken out as one chip.

Although FIG. 44A illustrates an example in which the plurality of transistors (the transistor 200_1 to the transistor 200_*n*) are surrounded by one sealing portion 265, the present invention is not limited thereto. As illustrated in FIG. 44B, the plurality of transistors may be surrounded by a plurality of sealing portions. In FIG. 44B, the plurality of transistors are surrounded by a sealing portion 265a and are further surrounded by an outer sealing portion 265b.

When the plurality of transistors (the transistor 200_1 to the transistor 200_n) are surrounded by a plurality of sealing portions in this manner, the area of a portion where the insulator 287 is in contact with the insulator 212 increases, which can further improve adhesion between the insulator 287 and the insulator 212. Accordingly, the plurality of transistors can be more reliably sealed.

In that case, a dicing line may be provided to overlap with the sealing portion 265a or the sealing portion 265b, or a dicing line may be provided between the sealing portion 265a and the sealing portion 265b.

According to one embodiment of the present invention, a semiconductor device with a small variation in transistor characteristics can be provided. According to another embodiment of the present invention, a highly reliable semiconductor device can be provided. According to another embodiment of the present invention, a semiconductor device having favorable electrical characteristics can be provided. According to another embodiment of the present invention, a semiconductor device having a high on-state current can be provided. According to another embodiment of the present invention, a semiconductor device that can be miniaturized or highly integrated can be provided.

The structure, method, and the like described in this embodiment can be used in an appropriate combination with structures, methods, and the like described in the other embodiments.

Embodiment 3

In this embodiment, one embodiment of a semiconductor device will be described with reference to FIG. 45 and FIG. 46.

[Memory Device 1]

Figure 45:
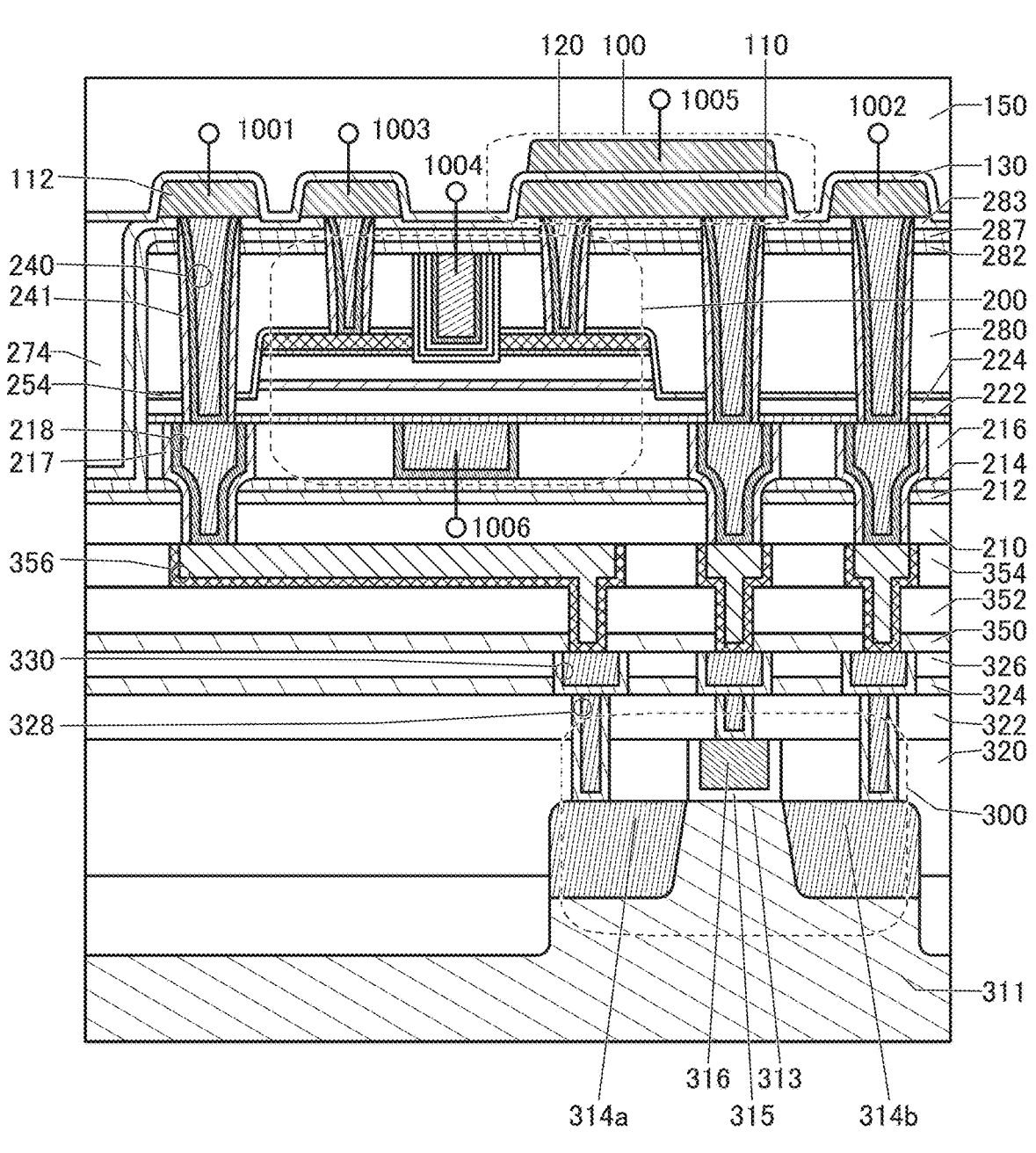
FIG. 45 is a cross-sectional view illustrating a structure of a memory device.

FIG. 45 illustrates an example of a semiconductor device (memory device) of one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200.

The transistor 200 is a transistor whose channel is formed in a semiconductor layer including an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 45, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to the first gate of the transistor 200. A wiring 1006 is electrically connected to the second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

The memory devices illustrated in FIG. 45 can form a memory cell array when arranged in a matrix.

<Transistor 300>

The transistor 300 is provided over a substrate 311 and includes a conductor 316 functioning as a gate, an insulator 315 functioning as a gate insulator, a semiconductor region 313 that is a part of the substrate 311, and a low-resistance region 314a and a low-resistance region 314b functioning as a source region and a drain region. The transistor 300 may be a p-channel transistor or an n-channel transistor.

Here, in the transistor 300 illustrated in FIG. 45, the semiconductor region 313 (part of the substrate 311) in which the channel is formed has a convex shape. Furthermore, the conductor 316 is provided to cover the top surface and the side surface of the semiconductor region 313 with the insulator 315 therebetween. Note that the conductor 316 may be formed using a material adjusting the work function. Such a transistor 300 is also referred to as a FIN-type transistor because the convex portion of the semiconductor substrate is utilized. An insulator functioning as a mask for forming the convex portion may be provided in contact with an upper portion of the convex portion. Although the case where the convex portion is formed by processing part of the semiconductor substrate is described here, a semiconductor film having a convex shape may be formed by processing an SOI substrate.

Note that the transistor 300 illustrated in FIG. 45 is an example and the structure is not limited thereto; an appropriate transistor can be used in accordance with a circuit structure or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric. Here, as the insulator 130, the insulator that can be used as the insulator 286 described in the above embodiment is preferably used.

For example, a conductor 112 and the conductor 110 over the conductor 240 can be formed at the same time. Note that the conductor 112 functions as a plug or a wiring that is electrically connected to the capacitor 100, the transistor 200, or the transistor 300.

Although the conductor 112 and the conductor 110 having a single-layer structure are illustrated in FIG. 45, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

The insulator 130 can be formed to have a stacked-layer structure or a single-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, the insulator 130 preferably has a stacked-layer structure using a material with high dielectric strength such as silicon oxynitride and a high dielectric constant (high-k) material. In the capacitor 100 having such a structure, a sufficient capacitance can be ensured owing to the high dielectric constant (high-k) insulator, and the dielectric strength can be increased owing to the insulator with high dielectric strength, so that the electrostatic breakdown of the capacitor 100 can be inhibited.

Examples of the high dielectric constant (high-k) material (material having a high relative dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the material having high dielectric strength (material having a low relative dielectric constant) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

Wiring layers provided with an interlayer film, a wiring, a plug, and the like may be provided between the structure bodies. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring.

The insulator functioning as an interlayer film may function as a planarization film that covers a roughness thereunder. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 45, an insulator 350, an insulator 352, and an insulator 354 are stacked in this order. Furthermore, a conductor 356 is formed in the insulator 350, the insulator 352, and the insulator 354. The conductor 356 functions as a plug or a wiring.

Similarly, a conductor 218, a conductor (the conductor 205) included in the transistor 200, and the like are embedded in an insulator 210, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

Here, like the insulator 241a and the insulator 241b described in the above embodiment, an insulator 217 is provided in contact with the side surface of the conductor 218 functioning as a plug. The insulator 217 is provided in contact with the inner wall of the opening formed in the insulator 210, the insulator 212, the insulator 214, and the insulator 216. That is, the insulator 217 is provided between the conductor 218 and the insulator 210, the insulator 212, the insulator 214, and the insulator 216. Note that the conductor 205 and the conductor 218 can be formed in parallel; thus, the insulator 217 is sometimes formed in contact with the side surface of the conductor 205.

As the insulator 217, for example, an insulator such as silicon nitride, aluminum oxide, or silicon nitride oxide can be used. The insulator 217 is provided in contact with the insulator 212, the insulator 214, and the insulator 222; thus, impurities such as water and hydrogen can be inhibited from entering the oxide 230 from the insulator 210, the insulator 216, or the like through the conductor 218. In particular, silicon nitride is suitable because of its high blocking property against hydrogen. Furthermore, oxygen contained in the insulator 210 or the insulator 216 can be prevented from being absorbed by the conductor 218.

The insulator 217 can be formed in a manner similar to that of the insulator 241a and the insulator 241b. For example, silicon nitride is deposited by a PEALD method and an opening reaching the conductor 356 is formed by anisotropic etching.

Examples of an insulator that can be used as an interlayer film include an oxide, a nitride, an oxynitride, a nitride oxide, a metal oxide, a metal oxynitride, and a metal nitride oxide, each of which has an insulating property.

For example, when a material having a low relative dielectric constant is used for the insulator functioning as an interlayer film, the parasitic capacitance between wirings can be reduced. Accordingly, a material is preferably selected in accordance with the function of an insulator.

For example, the insulator 150, the insulator 210, the insulator 352, the insulator 354, and the like preferably include an insulator having a low relative dielectric constant. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, a combination of silicon oxide or silicon oxynitride with a resin allows the stacked-layer structure to be thermally stable and have a low relative dielectric constant. Examples of the resin include polyester, polyolefin, polyamide (e.g., nylon and aramid), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen is used as the insulator 214, the insulator 212, the insulator 350, and the like.

The insulator having a function of inhibiting passage of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

The conductors that can be used as wirings or plugs can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having high electrical conductivity, typified by polycrystalline silicon containing an impurity element such as phosphorus, or silicide such as nickel silicide may be used.

For example, the conductor 328, the conductor 330, the conductor 356, the conductor 218, the conductor 112, and the like may have a single-layer structure or a stacked-layer structure using a conductive material such as a metal material, an alloy material, a metal nitride material, or a metal oxide material which is formed using the above materials. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, in FIG. 45, the insulator 241 is preferably provided between the conductor 240 and the insulator 224 and the insulator 280 that contain excess oxygen. Since the insulator 241 is provided in contact with the insulator 222, the insulator 282, the insulator 287, and the insulator 283, the insulator 224 and the transistor 200 can be sealed by the insulators having a barrier property.

That is, the insulator 241 can inhibit excess oxygen contained in the insulator 224 and the insulator 280 from being absorbed by the conductor 240. In addition, the insulator 241 can inhibit diffusion of hydrogen, which is an impurity, into the transistor 200 through the conductor 240.

Note that the insulator 241 is preferably formed using an insulating material having a function of inhibiting diffusion of oxygen and impurities such as water and hydrogen. For example, silicon nitride, silicon nitride oxide, aluminum oxide, hafnium oxide, or the like is preferably used. Silicon nitride is particularly preferable because of its high blocking property against hydrogen. Alternatively, for example, a metal oxide such as magnesium oxide, gallium oxide, germanium oxide, yttrium oxide, zirconium oxide, lanthanum oxide, neodymium oxide, or tantalum oxide can be used.

As in the above embodiment, the transistor 200 is preferably sealed with the insulator 212, the insulator 214, the insulator 282, the insulator 287, and the insulator 283. Such a structure can inhibit entry of hydrogen contained in the insulator 274, the insulator 150, or the like into the insulator 280 or the like.

Note that the conductor 240 penetrates the insulator 283, the insulator 287, and the insulator 282, and the conductor 218 penetrates the insulator 214 and the insulator 212; however, as described above, the insulator 241 is provided in contact with the conductor 240, and the insulator 217 is provided in contact with the conductor 218. This can reduce the amount of hydrogen entering the inside of the insulator 212, the insulator 214, the insulator 282, the insulator 287, and the insulator 283 through the conductor 240 and the conductor 218. In this manner, the transistor 200 is sealed more surely with the insulator 212, the insulator 214, the insulator 282, the insulator 287, the insulator 283, the insulator 241, and the insulator 217, so that impurities such as hydrogen contained in the insulator 274 or the like can be inhibited from entering from the outside.

As described in the above embodiment, the insulator 216, the insulator 224, the insulator 280, the insulator 250, and the insulator 274 are preferably formed by a deposition method using the gas in which hydrogen atoms are reduced or removed. This can reduce the hydrogen concentration of the insulator 216, the insulator 224, the insulator 280, the insulator 250, and the insulator 274.

In this manner, the hydrogen concentration of silicon-based insulating films near the transistor 200 can be reduced; thus, the hydrogen concentration of the oxide 230 can be reduced.

<Dicing Line>

A dicing line (sometimes referred to as a scribe line, a dividing line, or a cutting line) that is provided when a large-sized substrate is divided into semiconductor elements so that a plurality of semiconductor devices are each formed in a chip form is described below. Examples of a dividing method include the case where a groove (a dicing line) for separating the semiconductor elements is formed on the substrate, and then the substrate is cut along the dicing line to divide (split) it into a plurality of semiconductor devices.

Here, for example, as illustrated in FIG. 45, a region where the insulator 287 is in contact with the insulator 212 preferably overlaps with the dicing line. That is, an opening is formed in the insulator 282, the insulator 280, the insulator 254, the insulator 224, the insulator 222, the insulator 216, and the insulator 214 in the vicinity of a region to be the dicing line that is provided on the outer edge of a memory cell including the plurality of transistors 200.

That is, in the above opening formed in the insulator 282, the insulator 280, the insulator 254, insulator 224, insulator 222, insulator 216, and insulator 214, the insulator 212 is in contact with the insulator 287. Alternatively, an opening may be formed in the insulator 282, the insulator 280, the insulator 254, insulator 224, insulator 222, insulator 216, and insulator 214, and the insulator 212 and the insulator 287 may be in contact with each other. In that case, for example, the insulator 212 and the insulator 287 may be formed using the same material and the same method. When the insulator 212 and the insulator 287 are formed using the same material and the same method, the adhesion therebetween can be increased. For example, silicon nitride is preferably used.

With such a structure, the transistor 200 can be surrounded by the insulator 212, insulator 214, insulator 282, insulator 287, and the insulator 283. At least one of the insulator 212, insulator 214, insulator 282, insulator 287, and the insulator 283 has a function of inhibiting diffusion of oxygen, hydrogen, and water; thus, even when the substrate is divided into circuit regions each of which is provided with the semiconductor elements in this embodiment to form a plurality of chips, entry and diffusion of impurities such as hydrogen and water from the direction of a side surface of the divided substrate to the transistor 200 can be prevented.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Note that although the capacitor 100 of the memory device illustrated in FIG. 45 has a planar shape, the capacitor 100 of the memory device described in this embodiment is not limited thereto. For example, the capacitor 100 may be a cylindrical capacitor as illustrated in FIG. 46. Note that the structure below and including the insulator 150 of a memory device illustrated in FIG. 46 is similar to that of the semiconductor device illustrated in FIG. 45.

The insulator 150 is provided over the insulator 130, and the insulator 142 is provided over the insulator 150. Note that an opening is formed in the insulator 150 and the insulator 142.

Figure 46:
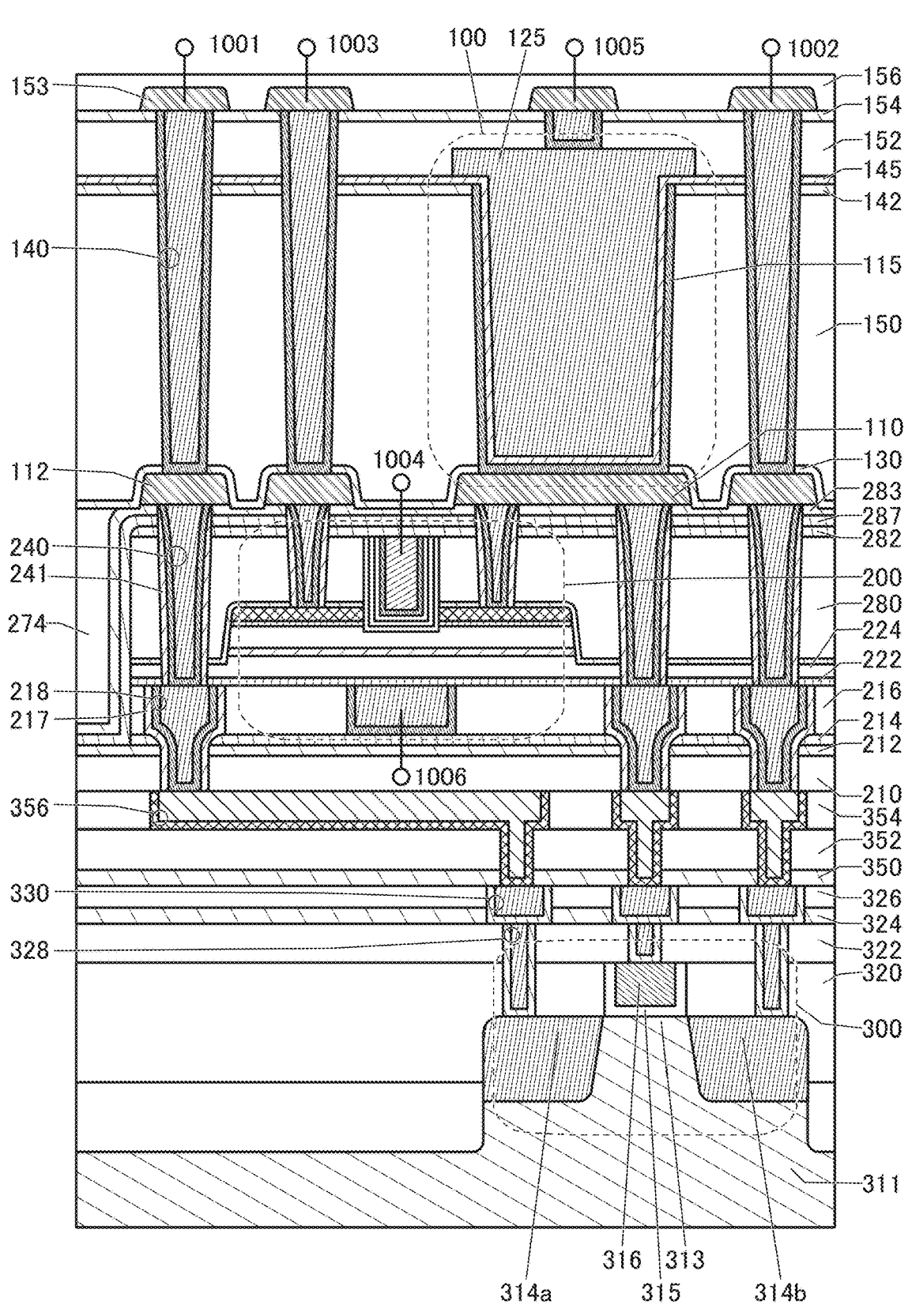
FIG. 46 is a cross-sectional view illustrating a structure of a memory device.

The capacitor 100 illustrated in FIG. 46 includes a conductor 115, an insulator 145 over the conductor 115 and the insulator 142, and a conductor 125 over the insulator 145. Here, at least parts of the conductor 115, the insulator 145, and the conductor 125 are provided in the above opening.

The conductor 115 functions as a lower electrode of the capacitor 100, the conductor 125 functions as an upper electrode of the capacitor 100, and the insulator 145 functions as a dielectric of the capacitor 100. The upper electrode and the lower electrode of the capacitor 100 face each other with the dielectric therebetween, along the side surface as well as the bottom surface of the opening in the insulator 150 and the insulator 142; thus, the capacitance per unit area can be increased. Accordingly, the deeper the opening is, the larger the capacitance of the capacitor 100 can be. Increasing the capacitance per unit area of the capacitor 100 in this manner enhances miniaturization and integration of the semiconductor device.

An insulator 152 is provided over the conductor 125 and the insulator 145.

An insulator that can be used as the insulator 280 is used as the insulator 152. The insulator 142 preferably functions as an etching stopper at the time of forming the opening in the insulator 150 and is formed using an insulator that can be used as the insulator 214.

The shape of the opening formed in the insulator 150 and the insulator 142 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably larger in the top view. Such a structure can reduce the area occupied by the semiconductor device including the capacitor 100 and the transistor 200.

The conductor 115 is provided in contact with the opening formed in the insulator 142 and the insulator 150. It is preferable that a top surface of the conductor 115 be substantially level with a top surface of the insulator 142. Furthermore, a bottom surface of the conductor 115 is in contact with the conductor 110 in an opening in the insulator 130. The conductor 115 is preferably deposited by an ALD method, a CVD method, or the like, and a conductor that can be used as the conductor 205 is used, for example.

The insulator 145 is positioned to cover the conductor 115 and the insulator 142. The insulator 145 is preferably deposited by an ALD method or a CVD method, for example. The insulator 145 can be provided to have a stacked-layer structure or a single-layer structure using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, hafnium nitride, or the like. As the insulator 145, an insulating film in which zirconium oxide, aluminum oxide, and zirconium oxide are stacked in this order can be used, for instance.

The insulator 145 is preferably formed using a material with high dielectric strength, such as silicon oxynitride, or a high dielectric constant (high-k) material. Alternatively, a stacked-layer structure using a material with high dielectric strength and a high dielectric constant (high-k) material may be employed.

Examples of a high dielectric constant (high-k) material (material having a high relative dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material enables sufficient capacitance of the capacitor 100 to be ensured even when the insulator 145 has a large thickness. The insulator 145 having a large thickness can inhibit leakage current generated between the conductor 115 and the conductor 125.

Examples of a material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride deposited by an ALD method, silicon oxide deposited by a PEALD method, and silicon nitride deposited by an ALD method are stacked in this order. The use of such an insulator having high dielectric strength can increase the dielectric strength and inhibit electrostatic breakdown of the capacitor 100.

The conductor 125 is provided to fill the opening formed in the insulator 142 and the insulator 150. The conductor 125 is electrically connected to the wiring 1005 through a conductor 140 and a conductor 153. The conductor 125 is preferably deposited by an ALD method, a CVD method, or the like, and a conductor that can be used as the conductor 205 is used, for example.

The conductor 153 is provided over an insulator 154 and is covered with an insulator 156. A conductor that can be used as the conductor 112 is used as the conductor 153, and an insulator that can be used as the insulator 152 is used as the insulator 156. Here, the conductor 153 is in contact with a top surface of the conductor 140 and functions as a terminal of the capacitor 100, the transistor 200, or the transistor 300.

The structure, method, and the like described in this embodiment can be used in an appropriate combination with structures, methods, and the like described in the other embodiments.

Embodiment 4

In this embodiment, a memory device including a transistor in which an oxide is used as a semiconductor (hereinafter, sometimes referred to as an OS transistor) and a capacitor (hereinafter, sometimes referred to as an OS memory device) of one embodiment of the present invention will be described with reference to FIG. 47A, FIG. 47B, and FIG. 48A to FIG. 48H. The OS memory device is a memory device that includes at least a capacitor and an OS transistor that controls the charging and discharging of the capacitor. Since the OS transistor has an extremely low off-state current, the OS memory device has excellent retention characteristics and thus can function as a nonvolatile memory.

Structure Example of Memory Device

Figures 47A, 47B:
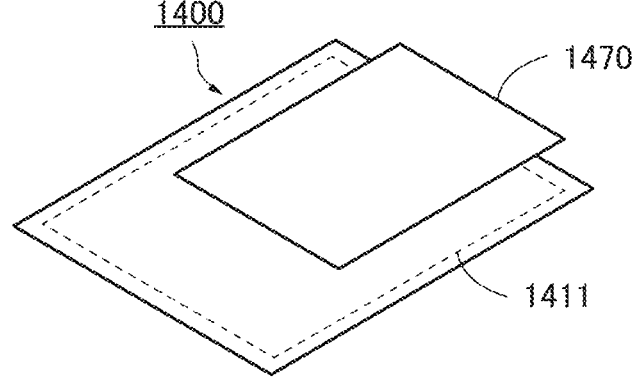
FIG. 47A is a block diagram illustrating a structure example of a memory device.
FIG. 47B is a schematic diagram illustrating a structure example of a memory device.

FIG. 47A illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 to the row circuit 1420 depends on the structure of the memory cell MC, the number of memory cells MC in a column, and the like. The number of wirings that connect the memory cell array 1470 to the column circuit 1430 depends on the structure of the memory cell MC, the number of memory cells MC in a row, and the like.

Note that FIG. 47A illustrates an example in which peripheral circuit 1411 and the memory cell array 1470 are formed on the same plane; however, this embodiment is not limited thereto. For example, as illustrated in FIG. 47B, the memory cell array 1470 may be provided over the peripheral circuit 1411 to partly overlap with the peripheral circuit 1411. For example, the sense amplifier may be provided below the memory cell array 1470 so that they overlap with each other.

FIG. 48A to FIG. 48H illustrate structure examples of a memory cell that can be used as the memory cell MC.

[DOSRAM]

Figure 48A:
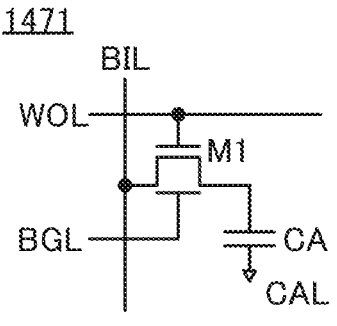
FIG. 48A to FIG. 48H are circuit diagrams illustrating structure examples of a memory device.
Figure 48B:
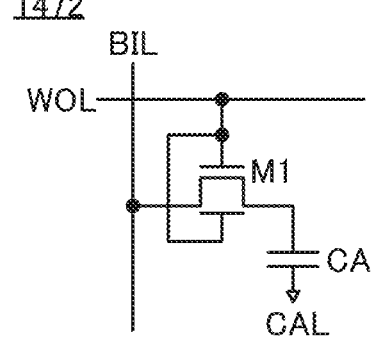
Figure 48C:
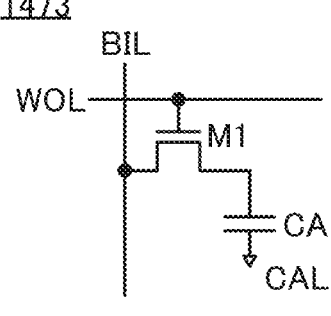

FIG. 48A to FIG. 48C illustrate circuit structure examples of a memory cell of a DRAM. In this specification and the like, a DRAM using a memory cell including one OS transistor and one capacitor is referred to as a DOSRAM (Dynamic Oxide Semiconductor Random Access Memory) in some cases. A memory cell 1471 illustrated in FIG. 48A includes a transistor M1 and a capacitor CA. Note that the transistor M1 includes a gate (sometimes referred to as a top gate) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. When a given potential is applied to the wiring BGL, the threshold voltage of the transistor M1 can be increased or decreased.

Here, the transistor M1 in the memory cell 1471 illustrated in FIG. 48A corresponds to the transistor 200.

The circuit structure of the memory cell MC is not limited to that of the memory cell 1471, and the circuit structure can be changed. For example, as in a memory cell 1472 illustrated in FIG. 48B, the back gate of the transistor M1 may be connected not to the wiring BGL but to the wiring WOL in the memory cell MC. Alternatively, for example, the transistor M1 may be a single-gate transistor, that is, a transistor without a back gate in the memory cell MC as in a memory cell 1473 illustrated in FIG. 48C.

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. Alternatively, refresh operation for the memory cell can be omitted. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. This reduces bit line capacitance, which can reduce the storage capacitance of the memory cell.

[NOSRAM]

FIG. 48D to FIG. 48G each illustrate a circuit structure example of a gain-cell memory cell including two transistors and one capacitor. A memory cell 1474 illustrated in FIG. 48D includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back
gate of the transistor M2 is connected to the wiring BGL. A
second terminal of the capacitor CB is connected to the
wiring CAL. A first terminal of the transistor M3 is con-
nected to a wiring RBL. A second terminal of the transistor
M3 is connected to a wiring SL. A gate of the transistor M3
is connected to the first terminal of the capacitor CB.

The wiring WBL functions as a write bit line, the wiring
RBL functions as a read bit line, and the wiring WOL
functions as a word line. The wiring CAL functions as a
wiring for applying a predetermined potential to the second
terminal of the capacitor CB. In the time of data writing, data
retaining, and data reading, a low-level potential is prefer-
ably applied to the wiring CAL. The wiring BGL functions
as a wiring for applying a potential to the back gate of the
transistor M2. When a given potential is applied to the
wiring BGL, the threshold voltage of the transistor M2 can
be increased or decreased.

Figure 48D:
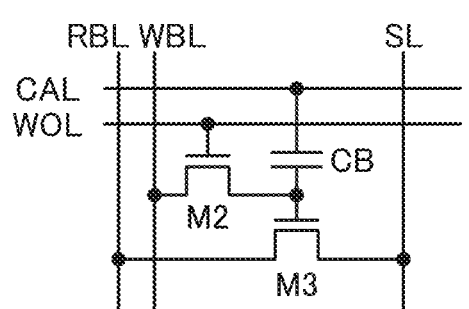
Figure 48E:
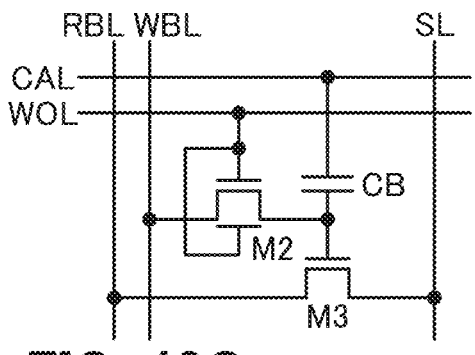
Figure 48F:
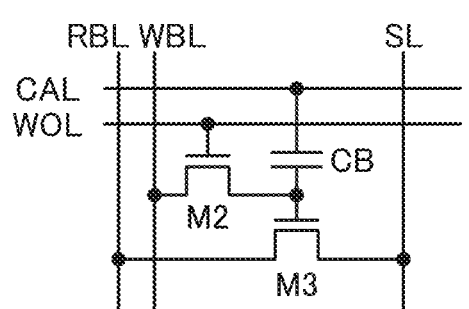
Figure 48G:
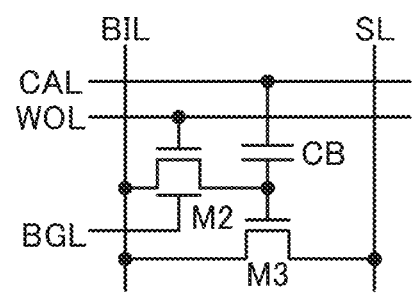

Here, the memory cell 1474 illustrated in FIG. 48D
corresponds to the memory device illustrated in FIG. 45.
That is, the transistor M2, the capacitor CB, the transistor
M3, the wiring WBL, the wiring WOL, the wiring BGL, the
wiring CAL, the wiring RBL, and the wiring SL correspond
to the transistor 200, the capacitor 100, the transistor 300,
the wiring 1003, the wiring 1004, the wiring 1006, the
wiring 1005, the wiring 1002, and the wiring 1001, respec-
tively.

The circuit structure of the memory cell MC is not limited
to that of the memory cell 1474, and the circuit structure can
be changed as appropriate. For example, as in a memory cell
1475 illustrated in FIG. 48E, the back gate of the transistor
M2 may be connected not to the wiring BGL but to the
wiring WOL in the memory cell MC. Alternatively, for
example, the transistor M2 may be a single-gate transistor,
that is, a transistor without a back gate in the memory cell
MC as in a memory cell 1476 illustrated in FIG. 48F. For
example, the memory cell MC may have a structure in which
the wiring WBL and the wiring RBL are combined into one
wiring BIL as in a memory cell 1477 illustrated in FIG. 48G.

In the case where the semiconductor device described in
any of the above embodiments is used in the memory cell
1474 and the like, the transistor 200 can be used as the
transistor M2, the transistor 300 can be used as the transistor
M3, and the capacitor 100 can be used as the capacitor CB.
When an OS transistor is used as the transistor M2, the
leakage current of the transistor M2 can be extremely low.
Consequently, with the use of the transistor M2, written data
can be retained for a long time, and thus the frequency of the
refresh operation for the memory cell can be decreased.
Alternatively, refresh operation for the memory cell can be
omitted. In addition, since the transistor M2 has an
extremely low leakage current, multi-level data or analog
data can be retained in the memory cell 1474. The same
applies to the memory cell 1475 to the memory cell 1477.

Note that the transistor M3 may be a transistor containing
silicon in a channel formation region (hereinafter, some-
times referred to as a Si transistor). The Si transistor may be
either an n-channel transistor or a p-channel transistor. A Si
transistor has higher field-effect mobility than an OS tran-
sistor in some cases. Therefore, a Si transistor may be used
as the transistor M3 functioning as a reading transistor.
Furthermore, the transistor M2 can be stacked over the
transistor M3 when a Si transistor is used as the transistor
M3, in which case the area occupied by the memory cell can
be reduced, leading to high integration of the memory
device.

Alternatively, the transistor M3 may be an OS transistor.
When an OS transistor is used as each of the transistor M2
and the transistor M3, the circuit of the memory cell array
1470 can be formed using only n-channel transistors.

Figure 48H:
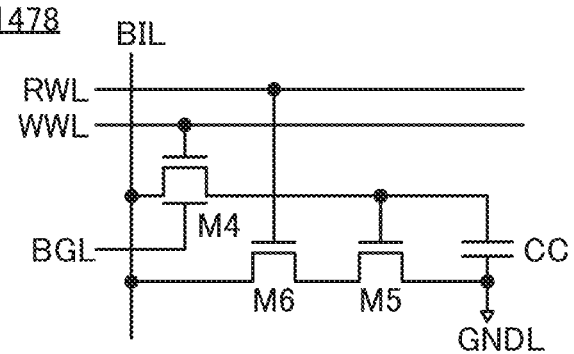

FIG. 48H illustrates an example of a gain-cell memory
cell including three transistors and one capacitor. A memory
cell 1478 illustrated in FIG. 48H includes a transistor M4 to
a transistor M6 and a capacitor CC. The capacitor CC is
provided as appropriate. The memory cell 1478 is electri-
cally connected to the wiring BIL, a wiring RWL, a wiring
WWL, the wiring BGL, and a wiring GNDL. The wiring
GNDL is a wiring for supplying a low-level potential. Note
that the memory cell 1478 may be electrically connected to
the wiring RBL and the wiring WBL instead of the wiring
BIL.

The transistor M4 is an OS transistor with a back gate, and
the back gate is electrically connected to the wiring BGL.
Note that the back gate and the gate of the transistor M4 may
be electrically connected to each other. Alternatively, the
transistor M4 does not necessarily include the back gate.

Note that each of the transistor M5 and the transistor M6
may be an n-channel Si transistor or a p-channel Si transis-
tor. Alternatively, the transistor M4 to the transistor M6 may
be OS transistors. In that case, the circuit of the memory cell
array 1470 can be formed using only n-channel transistors.

In the case where the semiconductor device described in
any of the above embodiments is used in the memory cell
1478, the transistor 200 can be used as the transistor M4, the
transistor 300 can be used as the transistor M5 and the
transistor M6, and the capacitor 100 can be used as the
capacitor CC. When an OS transistor is used as the transistor
M4, the leakage current of the transistor M4 can be
extremely low.

Note that the structures of the peripheral circuit 1411, the
memory cell array 1470, and the like described in this
embodiment are not limited to the above. The arrangement
and functions of these circuits and the wirings, circuit
components, and the like connected to the circuits can be
changed, removed, or added as needed.

The structure described in this embodiment can be used in
an appropriate combination with the structures described in
the other embodiments.

Embodiment 5

In this embodiment, an example of a chip 1200 on which
the semiconductor device of the present invention is
mounted will be described with reference to FIG. 49A and
FIG. 49B. A plurality of circuits (systems) are mounted on
the chip 1200. A technique for integrating a plurality of
circuits (systems) on one chip is referred to as system on
chip (SoC) in some cases.

Figure 49A:
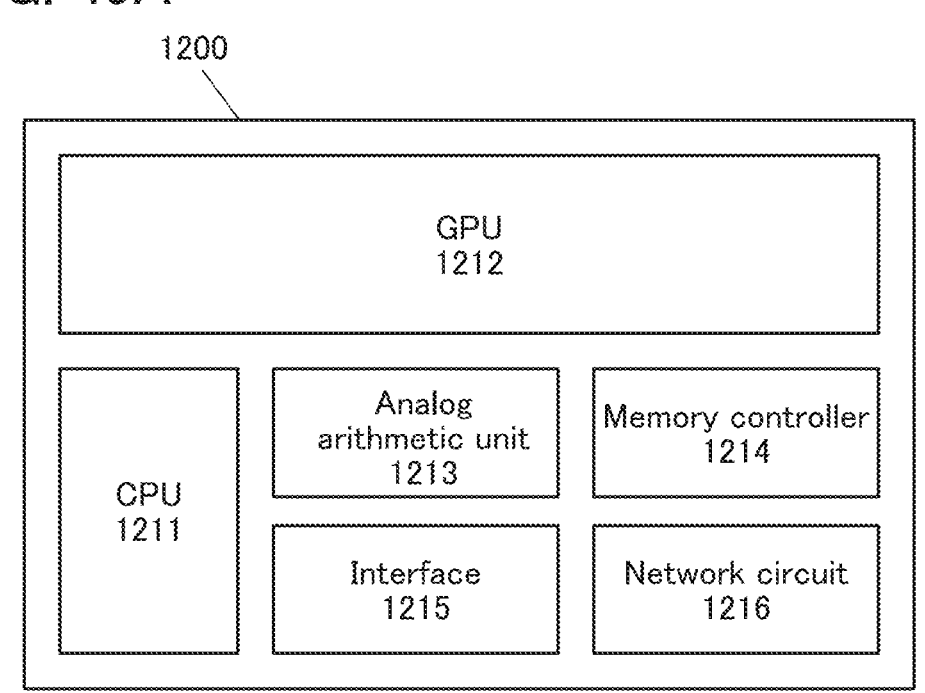
FIG. 49A is a block diagram of a semiconductor device.

As illustrated in FIG. 49A, the chip 1200 includes a CPU
1211, a GPU 1212, one or more analog arithmetic units
1213, one or more memory controllers 1214, one or more
interfaces 1215, one or more network circuits 1216, and the
like.

Figure 49B:
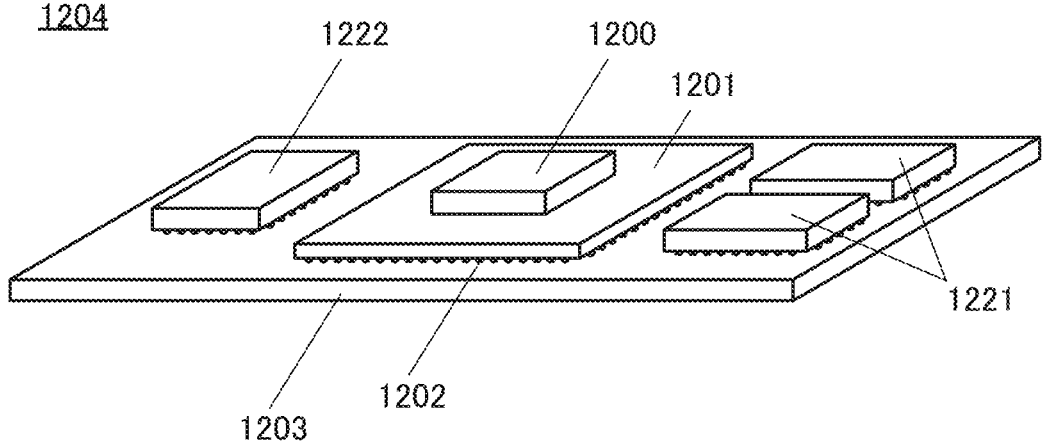
FIG. 49B is a schematic diagram of the semiconductor device.

A bump (not illustrated) is provided on the chip 1200 and
is connected to a first surface of a printed circuit board
(PCB) 1201 as illustrated in FIG. 49B. A plurality of bumps
1202 are provided on the rear side of the first surface of the
PCB 1201, and the PCB 1201 is connected to a motherboard
1203.

A memory device such as a DRAM 1221 or a flash
memory 1222 may be provided over the motherboard 1203.
For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

Since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. The analog arithmetic unit 1213 may include the above-described product-sum operation circuit.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a circuit for a network such as a LAN (Local Area Network). The network circuit 1216 may include a circuit for network security.

The circuits (systems) can be formed in the chip 1200 through the same manufacturing process. Thus, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 using the SoC technology and thus can have a small size. Furthermore, the GPU module 1204 is excellent in image processing and thus is suitably used in a portable electronic device such as a smartphone, a tablet terminal, a laptop PC, or a portable (mobile) game console. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments.

Embodiment 6

In this embodiment, examples of electronic components and electronic devices in which the memory device or the like described in the above embodiments is incorporated will be described.

<Electronic Component>

First, examples of electronic components in which a memory device 720 is incorporated are described with reference to FIG. 50A and FIG. 50B.

Figure 50A:
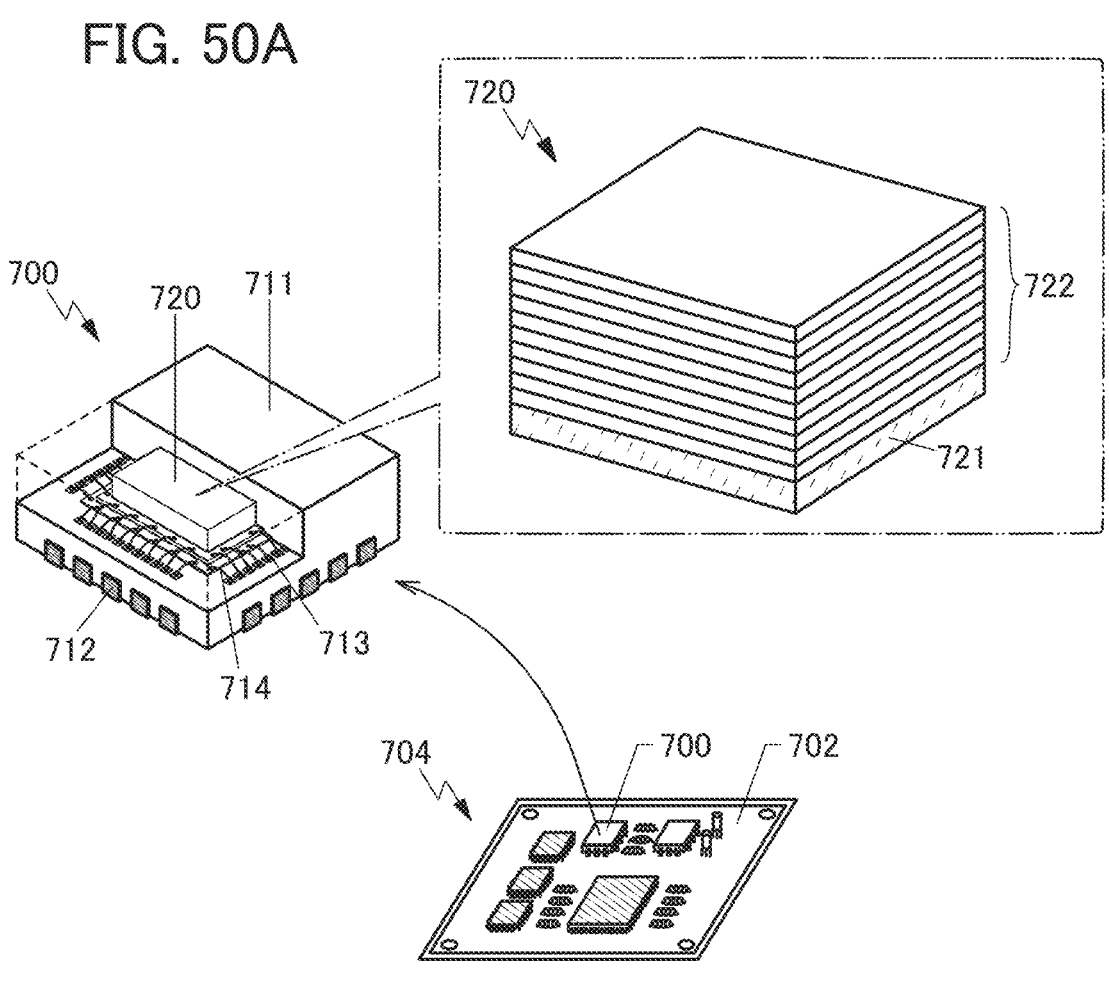
FIG. 50A and FIG. 50B are diagrams illustrating examples of electronic components.

FIG. 50A is a perspective view of an electronic component 700 and a substrate (a mounting board 704) on which the electronic component 700 is mounted. The electronic component 700 illustrated in FIG. 50A includes the memory device 720 in a mold 711. FIG. 50A omits part of the electronic component to show the inside of the electronic component 700. The electronic component 700 includes a land 712 outside the mold 711. The land 712 is electrically connected to an electrode pad 713, and the electrode pad 713 is electrically connected to the memory device 720 via a wire 714. The electronic component 700 is mounted on a printed circuit board 702, for example. A plurality of such electronic components are combined and electrically connected to each other on the printed circuit board 702, whereby the mounting board 704 is completed.

The memory device 720 includes a driver circuit layer 721 and a memory circuit layer 722.

Figure 50B:
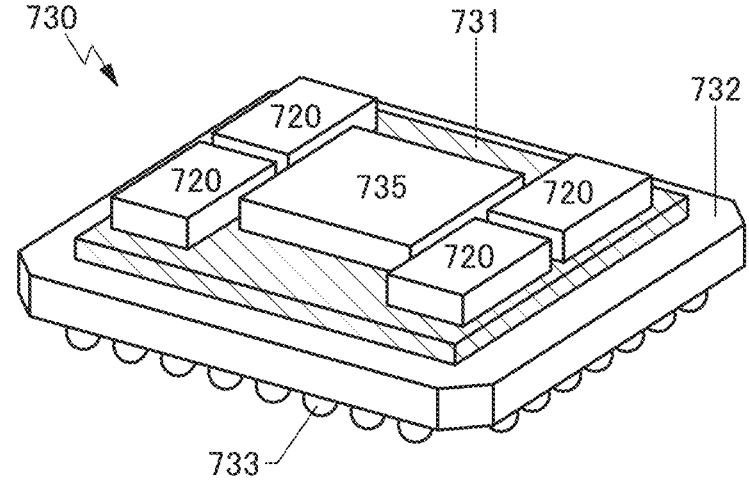

FIG. 50B is a perspective view of an electronic component 730. The electronic component 730 is an example of a SiP (System in package) or an MCM (Multi Chip Module). In the electronic component 730, an interposer 731 is provided on a package substrate 732 (printed circuit board), and a semiconductor device 735 and a plurality of memory devices 720 are provided on the interposer 731.

The electronic component 730 using the memory devices 720 as high bandwidth memory (HBM) is illustrated as an example. An integrated circuit (semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the memory devices 720 and the semiconductor device 735 are preferably equal to each other.

An electrode 733 may be provided on the bottom portion of the package substrate 732 to mount the electronic component 730 on another substrate. FIG. 50B illustrates an example in which the electrode 733 is formed of a solder ball. When solder balls are provided in a matrix on the bottom portion of the package substrate 732, BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods, not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be implemented in an appropriate combination with the structures described in the other embodiments.

Embodiment 7

In this embodiment, application examples of the memory device using the semiconductor device described in the above embodiment will be described. The semiconductor device described in the above embodiment can be used for, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is used for a variety of removable memory devices such as memory cards (e.g., SD cards), USB memories, and SSDs (solid state drives). FIG. 51A to FIG. 51E schematically illustrate some structure examples of removable memory devices. The semiconductor device described in the above embodiment is processed into a packaged memory chip and used in a variety of storage devices and removable memories, for example.

Figures 51A, 51B, 51C, 51D, 51E:
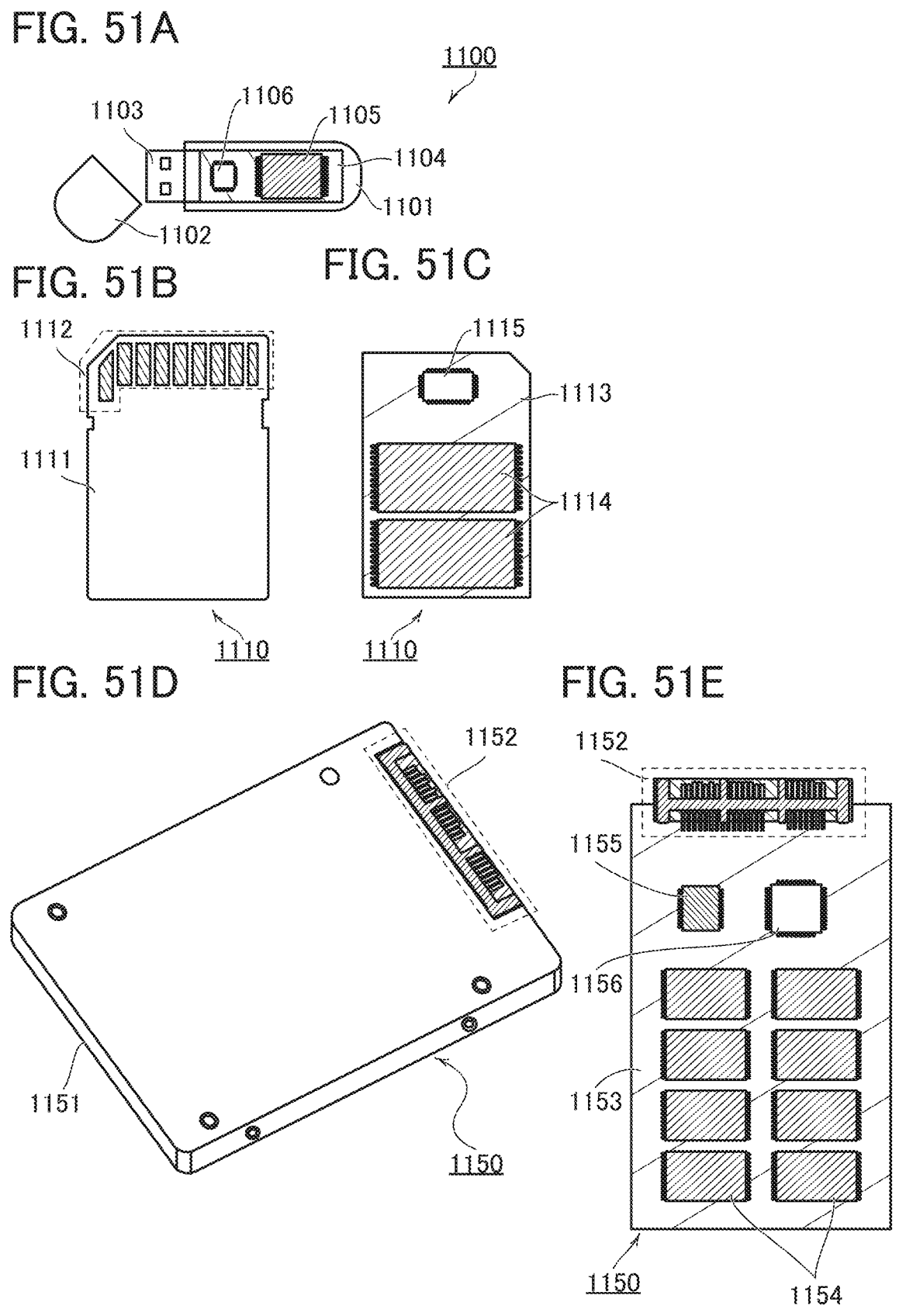

FIG. 51A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

FIG. 51B is a schematic external view of an SD card, and FIG. 51C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

FIG. 51D is a schematic external view of an SSD, and FIG. 51E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example.

The memory chip 1155 is a work memory of the controller chip 1156, and a DOSRAM chip can be used, for example. When the memory chip 1154 is also provided on the rear surface side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments.

Embodiment 8

The semiconductor device of one embodiment of the present invention can be used as a processor such as a CPU and a GPU or a chip. FIG. 52A to FIG. 52H illustrate specific examples of electronic devices including a chip or a processor such as a CPU or a GPU of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. In addition, when the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 52A to FIG. 52H illustrate examples of electronic devices.

[Information Terminal]

Figure 52A:
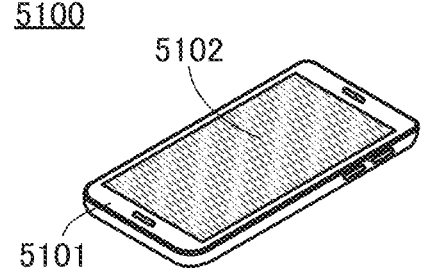
FIG. 52A to FIG. 52H are diagrams illustrating electronic devices.

FIG. 52A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is used in the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 52B:
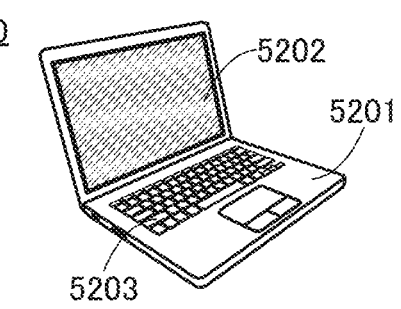

FIG. 52B illustrates a notebook information terminal 5200. The notebook information terminal 5200 includes a main body 5201 of the information terminal, a display portion 5202, and a keyboard 5203.

Like the information terminal 5100 described above, when the chip of one embodiment of the present invention is used in the notebook information terminal 5200, the notebook information terminal 5200 can execute an application utilizing artificial intelligence. Examples of the application utilizing artificial intelligence include design-support software, text correction software, and software for automatic menu generation. Furthermore, with use of the notebook information terminal 5200, novel artificial intelligence can be developed.

Note that although FIG. 52A and FIG. 52B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machine]

Figure 52C:
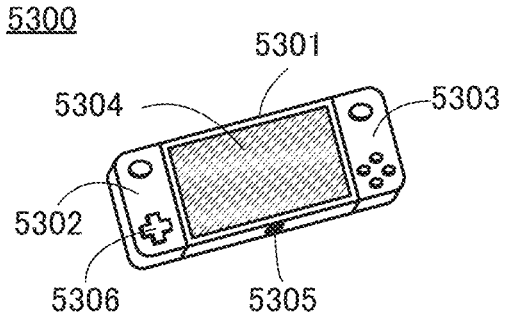

FIG. 52C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), a video to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into the chip provided on a substrate in the housing 5301, the housing 5302 and the housing 5303.

Figure 52D:
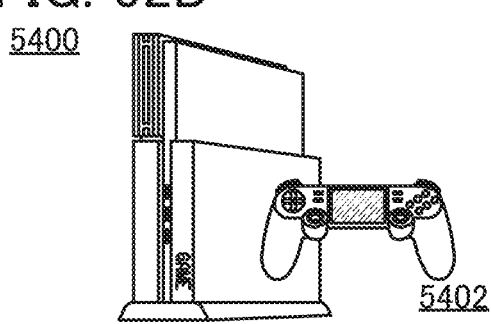

FIG. 52D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is used in the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, questions posed by the player, the progress of the game, timing when an event occurs in the game, the actions and words of the game characters, and the like can be changed for various expressions without being limited by the game program.

In addition, when a game requiring a plurality of players is played on the portable game machine 5300, the artificial intelligence can create a virtual game player; thus, the game can be played alone with the game player created by artificial intelligence as an opponent.

Although the portable game machine and the stationary game machine are illustrated as examples of game machines in FIG. 52C and FIG. 52D, the game machine using the GPU or the chip of one embodiment of the present invention is not limited thereto. Examples of the game machine using the GPU or the chip of one embodiment of the present invention include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 52E:
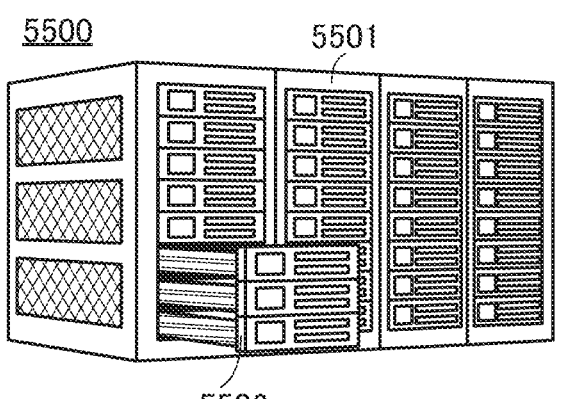
Figure 52F:
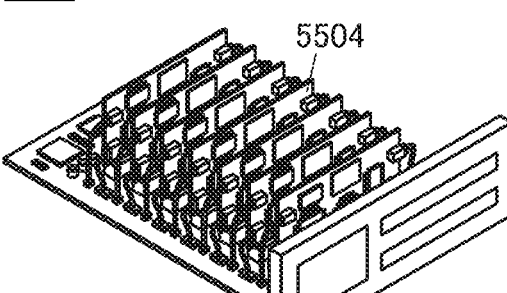

FIG. 52E illustrates a supercomputer 5500 as an example of a large computer. FIG. 52F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip described in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is illustrated as an example of a large computer in FIG. 52E and FIG. 52F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be used for an automobile, which is a moving vehicle, and the periphery of a driver's seat in the automobile.

Figure 52G:
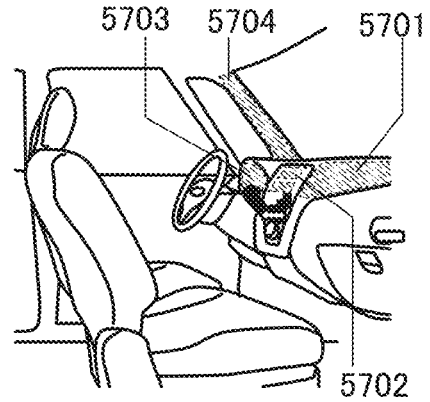

FIG. 52G illustrates an area around a windshield inside an automobile, which is an example of a moving vehicle. FIG. 52G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for the view obstructed by the pillar (a blind spot) by showing an image taken by an imaging device (not illustrated) provided on the outside of the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be used as a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is used for each of these moving vehicles.

[Household Appliance]

Figure 52H:
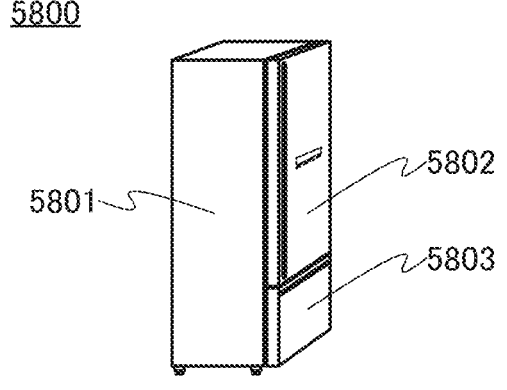

FIG. 52H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used for the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as an example of a household appliance, other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in an appropriate combination with the structures described in the other embodiments.

REFERENCE NUMERALS

10: transistor, 21: layer, 22: layer, 31: layer, 32: layer, 41: layer, 50: structure body, 51: region, 53: region, 54: region, 100: capacitor, 110: conductor, 112: conductor, 115: conductor, 120: conductor, 125: conductor, 130: insulator, 140: conductor, 142: insulator, 145: insulator, 150: insulator, 152: insulator, 153: conductor, 154: insulator, 156: insulator, 200: transistor, **200_*n*: transistor, 200_1: transistor, 200A: transistor, 205: conductor, 205***a*: conductor, 205*b*: conductor, 210: insulator, 212: insulator, 214: insulator, 216: insulator, 217: insulator, 218: conductor, 222: insulator, 224: insulator, 230: oxide, 230*a*: oxide, 230A: oxide film, 230*b*: oxide, 230B: oxide film, 230*c*: oxide, 230C: oxide film, 230*d*: oxide, 230D: oxide film, 231*a*: region, 231*b*: region, 234: region, 236: region, 240: conductor, 240*a*: conductor, 240*b*: conductor, 241: insulator, 241*a*: insulator, 241*b*: insulator, 242*a*: conductor, 242A: conductive film, 242*b*: conductor, 242B: conductive layer, 243*a*: oxide, 243A: oxide film, 243*b*: oxide, 243B: oxide layer, 246*a*: conductor, 246*b*: conductor, 250: insulator, 250A: insulating film, 254: insulator, 260: conductor, 260*a*: conductor, 260A: conductive film, 260*b*: conductor, 260B: conductive film, 265: sealing portion, 265*a*: sealing portion, 265*b*: sealing portion, 271*a*: insulator, 271*b*: insulator, 274: insulator, 280: insulator, 282: insulator, 283: insulator, 284: insulator, 286: insulator, 287: insulator, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 601: precursor, 602: reactant, 700: electronic component, 702: printed circuit board, 704: mounting board, 711: mold, 712: land, 713: electrode pad, 714: wire, 720: memory device, 721: driver circuit layer, 722: memory circuit layer, 730: electronic component, 731: interposer, 732: package substrate, 733: electrode, 735: semiconductor device, 901: region, 902: region, 903: region, 911*a*: region, 911*b*: region, 911*c*: region, 911*d*: region, 911*e*: region, 912*a*: region, 912*b*: region, 912*c*: region, 912*d*: region, 912*e*: region, 913*a*: region, 913*b*: region, 913*c*: region, 913*d*: region, 913*e*: region, 1001: wiring, 1002: wiring, 1003: wiring, 1004: wiring, 1005: wiring, 1006: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: memory device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 4000: deposition apparatus, 4002: carrying-in/out chamber, 4004: carrying-in/out chamber, 4006: transfer chamber, 4008: deposition chamber, 4009: deposition chamber, 4010: deposition chamber, 4014: transfer arm, 4020: chamber, 4021: source material supply portion, 4021*a*: source material supply portion, 4021*b*: source material supply portion, 4022*a*: high-speed valve, 4022*b*: high-speed valve, 4023: source material introduction port, 4023*a*: source material introduction port, 4023*b*: source material introduction port, 4024: source material exhaust port, 4025: evacuation unit, 4026: substrate holder, 4027: heater, 4028: plasma generation device, 4029: coil, 4030: substrate, 4031: source material supply portion, 4033: source material introduction port, 4100: plasma ALD apparatus, 4111: plasma generation chamber, 4120: reaction chamber, 4123: source material introduction port, 4124: source material exhaust port, 4126: substrate holder, 4128: plasma generation apparatus, 4130: substrate, 4131: plasma, 4133: source material introduction port, 4200: plasma ALD apparatus, 4213: electrode, 4214: shower head, 4215: power source, 4217: capacitor, 4220: chamber, 4223: source material introduction port, 4224: source material exhaust port, 4226: substrate holder, 4230: substrate, 4231: plasma, 4300: plasma ALD apparatus, 4313: electrode, 4314: shower head, 4315: power source, 4317: capacitor, 4319: mesh, 4320: chamber, 4321: power source, 4322: capacitor, 4323: source material introduction port, 4324: source material exhaust port, 4326: substrate holder, 4330: substrate, 4331: plasma, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: stationary game machine, 5402: controller, 5500: supercomputer, 5501: rack, 5502: computer, 5504: substrate, 5701: display panel, 5702: display panel, 5703: display panel, 5704:

display panel, 5800: electric refrigerator-freezer, 5801: housing, 5802: refrigerator door, 5803: freezer door

The invention claimed is:

1. A metal oxide comprising a crystal region, the metal oxide comprising chlorine, wherein the crystal region has a structure in which a first layer, a second layer, and a third layer are stacked, wherein one of the first layer and the second layer is in contact with a surface of a structure body, wherein the first layer, the second layer, and the third layer are each substantially parallel to a formation surface of the metal oxide, wherein the first layer comprises a first metal and oxygen, wherein the second layer comprises a second metal and oxygen, wherein the third layer comprises a third metal and oxygen, wherein the first layer has an octahedral structure, wherein the second layer has a trigonal bipyramidal structure or a tetrahedral structure, wherein the third layer has a trigonal bipyramidal structure or a tetrahedral structure, wherein in the octahedral structure of the first layer, an atom of the first metal exists at a center and an oxygen atom exists at a vertex, wherein in the trigonal bipyramidal structure or the tetrahedral structure of the second layer, an atom of the second metal exists at a center and an oxygen atom exists at a vertex, wherein in the trigonal bipyramidal structure or the tetrahedral structure of the third layer, an atom of the third metal exists at a center and an oxygen atom exists at a vertex, wherein a valence of the first metal is equal to a valence of the second metal, wherein the valence of the first metal is different from a valence of the third metal, wherein the first layer and the second layer do not comprise the third metal, wherein the first metal is indium, wherein the second metal is gallium, and wherein the third metal is zinc.

2. A metal oxide comprising a crystal region, the metal oxide comprising chlorine, wherein the crystal region has a structure in which a first layer, a second layer, and a third layer are stacked, wherein one of the first layer and the second layer is in contact with a surface of a structure body, wherein the first layer, the second layer, and the third layer are each substantially parallel to a formation surface of the metal oxide, wherein the first layer and the second layer each comprise a first metal, a second metal, and oxygen, wherein the third layer comprises a third metal and oxygen, wherein the first layer has an octahedral structure, wherein the second layer has a trigonal bipyramidal structure or a tetrahedral structure, wherein the third layer has a trigonal bipyramidal structure or a tetrahedral structure, wherein in the octahedral structure of the first layer, an atom of the first metal or the second metal exists at a center and an oxygen atom exists at a vertex, wherein in the trigonal bipyramidal structure or the tetrahedral structure of the second layer, an atom of the first metal or an atom of the second metal exists at a center and an oxygen atom exists at a vertex, wherein in the trigonal bipyramidal structure or the tetrahedral structure of the third layer, an atom of the third metal exists at a center and an oxygen atom exists at a vertex, wherein a valence of the first metal is equal to a valence of the second metal, wherein the valence of the first metal is different from a valence of the third metal, wherein the first layer and the second layer do not comprise the third metal, wherein the first metal is indium, wherein the second metal is gallium, and wherein the third metal is zinc.

3. The metal oxide according to claim 1, wherein the crystal region has a $YbFe_2O_4$ type structure or a $Yb_2FesO_7$ type structure.

4. A transistor comprising the metal oxide according to claim 1 in a channel formation region.

5. The metal oxide according to claim 2, wherein the crystal region has a $YbFe_2O_4$ type structure or a $Yb_2FesO_7$ type structure.

6. A transistor comprising the metal oxide according to claim 2 in a channel formation region.

7. A metal oxide comprising a crystal region, the metal oxide comprising chlorine, wherein the crystal region has a structure in which a first layer, a second layer, and a third layer are stacked, wherein one of the first layer, the second layer, and the third layer is in contact with a surface of a structure body, wherein the first layer, the second layer, and the third layer are each substantially parallel to a formation surface of the metal oxide, wherein the first layer comprises a first metal and oxygen, wherein the second layer comprises a second metal and oxygen, wherein the third layer comprises a third metal and oxygen, wherein the first layer has an octahedral structure, wherein the second layer has a trigonal bipyramidal structure or a tetrahedral structure, wherein the third layer has a trigonal bipyramidal structure or a tetrahedral structure, wherein in the octahedral structure of the first layer, an atom of the first metal exists at a center and an oxygen atom exists at a vertex, wherein in the trigonal bipyramidal structure or the tetrahedral structure of the second layer, an atom of the second metal exists at a center and an oxygen atom exists at a vertex, wherein in the trigonal bipyramidal structure or the tetrahedral structure of the third layer, an atom of the third metal exists at a center and an oxygen atom exists at a vertex, wherein a valence of the first metal is equal to a valence of the second metal, and wherein the valence of the first metal is different from a valence of the third metal.

8. The metal oxide according to claim 7, wherein the crystal region has a $YbFe_2O_4$ type structure or a $Yb_2FesO_7$ type structure.

9. The metal oxide according to claim 7, wherein the first metal is indium, wherein the second metal is gallium, and wherein the third metal is zinc.

10. A transistor comprising the metal oxide according to claim 7 in a channel formation region.

\* \* \* \* \*